United States Patent
Ciolfi et al.

(10) Patent No.: US 10,545,731 B1
(45) Date of Patent: Jan. 28, 2020

(54) VARIANT MODELING ELEMENTS IN GRAPHICAL PROGRAMS

(71) Applicant: The MathWorks, Inc., Natick, MA (US)

(72) Inventors: John E. Ciolfi, Wellesley, MA (US);
Sudha S. Dhoorjaty, Bangalore (IN);
Raju Kottamadal, Bangalore (IN);
Karthik Srinivasan, Bangalore (IN);
Rajesh Bandreddi, Bangaluru (IN)

(73) Assignee: The MathWorks, Inc., Natick, MA (US)

( * ) Notice: Subject to any disclaimer, the term of this patent is extended or adjusted under 35 U.S.C. 154(b) by 85 days.

(21) Appl. No.: 15/829,302

(22) Filed: Dec. 1, 2017

Related U.S. Application Data

(60) Provisional application No. 62/429,484, filed on Dec. 2, 2016.

(51) Int. Cl.
| | | |
|---|---|---|
| *G06F 9/44* | (2018.01) | |
| *G06F 8/34* | (2018.01) | |
| *G06F 8/35* | (2018.01) | |
| *G06F 17/50* | (2006.01) | |

(52) U.S. Cl.
CPC .......... *G06F 8/34* (2013.01); *G06F 8/35* (2013.01); *G06F 17/5009* (2013.01)

(58) Field of Classification Search
CPC ..... G06F 8/34; G06F 8/10; G06F 8/20; G06F 8/38; G06Q 10/06
USPC ........................................................ 717/105
See application file for complete search history.

(56) References Cited

U.S. PATENT DOCUMENTS

| | | |
|---|---|---|
| 5,005,119 A | 4/1991 | Rumbaugh et al. |
| 5,301,301 A | 4/1994 | Kodosky et al. |
| 5,475,851 A | 12/1995 | Kodosky et al. |
| 5,930,154 A | 7/1999 | Thalhammer-Reyero |
| 5,980,096 A | 11/1999 | Thalhammer-Reyero |
| 6,096,094 A | 8/2000 | Kay et al. |
| 6,349,274 B1 | 2/2002 | Kay et al. |
| 6,868,508 B2 | 3/2005 | Grey |
| 6,965,800 B2 | 11/2005 | Schmit et al. |
| 6,986,120 B2 | 1/2006 | Reddy et al. |
| 7,024,631 B1 | 4/2006 | Hudson et al. |

(Continued)

OTHER PUBLICATIONS

Antoulas, et al., "A survey of model reduction methods for large-scale systems," Contemporary Mathematics, Oct. 27, 2006, pp. 1-28.

(Continued)

*Primary Examiner* — Chuck O Kendall
(74) *Attorney, Agent, or Firm* — Cesari and McKenna, LLP.; Michael R. Reinemann

(57) ABSTRACT

Systems and methods provide, as part of an executable graphical model, a region for providing variants that includes one or more computational choices defining alternative execution implementations of the region. Conditions assigned to the one or more computational choices indicate which of the computational choices is active. The conditions specify logical expressions of variables that evaluate to True or False. For a given simulation of the executable graphical model, all of the logical expressions may evaluate to False, such that none of the computational choices are active. All of the computational choices of the executable graphical model may be removed for the given simulation.

25 Claims, 101 Drawing Sheets

(56) References Cited

U.S. PATENT DOCUMENTS

| | | | |
|---|---|---|---|
| 7,219,306 | B2 | 5/2007 | Kodosky et al. |
| 7,424,410 | B2 | 9/2008 | Orofino, II et al. |
| 7,434,183 | B2 | 10/2008 | McGaughy et al. |
| 7,509,244 | B1 | 3/2009 | Shakeri |
| 7,555,742 | B2 * | 6/2009 | Iborra ............... G06F 8/30 717/101 |
| 7,558,712 | B1 | 7/2009 | Aldrich |
| 7,680,632 | B1 | 3/2010 | Aldrich |
| 7,742,903 | B2 | 6/2010 | Ciolfi et al. |
| 7,752,138 | B1 | 7/2010 | Dean et al. |
| 7,809,545 | B2 | 10/2010 | Ciolfi et al. |
| 7,934,194 | B2 | 4/2011 | Kinnucan, Jr. et al. |
| 7,941,299 | B1 | 5/2011 | Aldrich et al. |
| 8,131,528 | B1 | 3/2012 | Vora et al. |
| 8,386,222 | B2 | 2/2013 | Ciolfi et al. |
| 8,490,067 | B2 | 7/2013 | Boettcher et al. |
| 8,700,368 | B1 | 4/2014 | Ciolfi et al. |
| 8,798,971 | B2 | 8/2014 | Aberg et al. |
| 8,812,276 | B2 | 8/2014 | Aldrich et al. |
| 8,983,823 | B1 | 3/2015 | Koh et al. |
| 9,176,640 | B1 | 11/2015 | Behboodian |
| 9,378,562 | B1 | 6/2016 | Ciolfi et al. |
| 2002/0184611 | A1 | 12/2002 | Endejan |
| 2003/0014234 | A1 | 1/2003 | Rehtanz et al. |
| 2003/0107595 | A1 | 6/2003 | Ciolfi |
| 2003/0167182 | A1 | 9/2003 | Bloom et al. |
| 2004/0073413 | A1 | 4/2004 | Aberg et al. |
| 2004/0210592 | A1 | 10/2004 | Ciolfi et al. |
| 2004/0210831 | A1 | 10/2004 | Feng et al. |
| 2005/0267721 | A1 | 12/2005 | Thalhammer-Reyero |
| 2005/0273305 | A1 | 12/2005 | Thalhammer-Reyero |
| 2005/0278162 | A1 | 12/2005 | Ciolfi et al. |
| 2006/0229742 | A1 | 10/2006 | Boutin et al. |
| 2007/0266366 | A1 | 11/2007 | Bucuvalas |
| 2008/0092109 | A1 | 4/2008 | Kinnucan, Jr. et al. |
| 2008/0092111 | A1 | 4/2008 | Kinnucan et al. |
| 2008/0098349 | A1 | 4/2008 | Lin et al. |
| 2008/0263506 | A1 | 10/2008 | Broadfoot et al. |
| 2008/0294406 | A1 | 11/2008 | Hachmeister |
| 2009/0006062 | A1 | 1/2009 | Sedukhin et al. |
| 2009/0044180 | A1 | 2/2009 | Luszczek |
| 2009/0044197 | A1 | 2/2009 | Stefansson |
| 2009/0049435 | A1 | 2/2009 | Luszczek |
| 2009/0077511 | A1 | 3/2009 | Wahler et al. |
| 2009/0098349 | A1 | 4/2009 | Ichikawa |
| 2009/0179921 | A1 | 7/2009 | Raghavan et al. |
| 2009/0234640 | A1 | 9/2009 | Boegle et al. |
| 2009/0254801 | A1 | 10/2009 | Pressman |
| 2009/0293044 | A1 | 11/2009 | Boettcher et al. |
| 2010/0153910 | A1 | 6/2010 | Ciolfi et al. |
| 2010/0175045 | A1 | 7/2010 | Ciolfi et al. |
| 2011/0067017 | A1 | 3/2011 | Ghosh-Roy et al. |
| 2011/0252411 | A1 | 10/2011 | Martin et al. |
| 2011/0283260 | A1 | 11/2011 | Bucuvalas |
| 2011/0295578 | A1 | 12/2011 | Aldrich et al. |
| 2012/0084695 | A1 | 4/2012 | Higgins et al. |
| 2014/0278307 | A1 | 9/2014 | Hosey |

OTHER PUBLICATIONS

Atasu, et al., "Automatic Application-Specific Instruction-Set Extensions under Microarchitectural Constraints" ACM, DAC 2003, Anaheim, CA, USA, Jun. 2-6, 2003, pp. 256-261.
Clarke, et al., "Model checking and abstraction," ACM Transactions on Programming Languages and Systems, vol. 16, No. 5, Sep. 1994, pp. 1512-1542.
Czarnecki, Krzysztof et al, "Variant Configuration of Software Systems," PESOA, Process Family Engineering in Service-Oriented Applications, BMBF-Project, PESOA-Report No. Jun. 2004, Feb. 10, 2004, pp. 1-32.
Czarnecki, Krzysztof et al, "Generative Programming for Embedded Software: An Industrial Experience Report," Springer-Verlag Berlin Heidelberg, Generative Programming and Component Engineering, ACM SigPlan/SigSoft Conference, GPCE 2002, Pittsburgh, PA, USA, Proceedings, Lecture Notes in Computer Science (LNCS), vol. 2487, Sep. 26, 2002, pp. 156-172.
"Definition of 'Alternative,'" Webster's Dictionary, accessed online Nov. 11, 2013, one page.
Fehnker, Ansgar et al., "Hybrid System Verification Is Not a Sinecure: The Electronic throttle Control Case Study," International Symposium on Automated Technology for Verification and Analysis, Automated Technology for Verification and Analysis, Springer-Verlag Berlin Heidelberg, Proceedings of the Second International Conference, ATVA 2004, Taipei, Taiwan, ROC, Lecture Notes in Computer Science (LNCS), vol. 3299, Oct. 31-Nov. 3, 2004, pp. 263-277.
Frey, et al., "An Extensible Architecture for Detecting Violations of a Cloud Environment Constraints During Legacy Software System Migration," 15th European Conference on Software Maintenance and Reengineering, IEEE, IEEE Computer Society, Mar. 2011, pp. 269-278.
Girard, et al., "Approximation metrics for discrete and continuous systems," University of Pennsylvania, Department of Computer & Information Science—Technical Reports (CIS), Nov. 2005, pp. 1-32.
Han, et al., "Detecting data store access conflict in Simulink by solving Boolean satisfiability problems," In American Control Conference (ACC'1 0), Jun. 2010, pp. 1-6.
Han, et al., "Reachability analysis of hybrid control systems using reduced-order models", In IEEE Proc of American Control Conference (ACC'04), Jun. 2004, pp. 1183-1189.
Han, et al., "Reachability analysis of nonlinear systems using trajectory piecewise linearized models," Proceedings of the 2006 American Control Conference, Jun. 14-16, 2006, pp. 1-6.
Heckel, "Graph transformation in a nutshell" Electron Notes Theory of Computer Science, Feb. 2006, pp. 187-198.
International Search Report Application No. PCT/US2005/020921, dated Dec. 12, 2005.
Johnson, et al., "The program structure tree: computing control regions in linear time," In Proceedings of the ACM SIGPLAN 1994 conference on Programming language design and implementation, PLDI '94,Orlando, Florida, USA, Jun. 20-24, 1994, pp. 171-185.
Kaga, et al., "Validation of control software specification using design interests extraction and model checking," In SAE 2012 World Congress and Exhibition, Apr. 24, 2012, pp. 1-13.
Matsubara, et al., "Model checking with program slicing based on variable dependence graphs," In Workshop on Formal Techniques for Safety-Critical Systems, Nov. 2012, pp. 56-68.
"Notification of Transmittal of the International Search Report and the Written Opinion of the International Searching Authority, or the Declaration," International Filing Date: May 27, 2011, International Application No. PCT/US2011/000965, Applicant: The Mathworks, Inc., dated Oct. 6, 2011, pp. 1-10.
Pappas, "Bisimilar linear systems," Automatica 39, Jan. 2002, pp. 2035-2047.
Rewienski, et al., "A trajectory piecewise-linear approach to model order reduction and fast simulation of nonlinear circuits and micromachined devices," IEEE Transaction on Computer-Aided Design of Integrated Circuits and Systems, vol. 22, No. 2, Feb. 2003, pp. 155-170.
Schlee, Max, "Generative Programming of Graphical User Interface," Proceedings of the Working Conference on Advanced Visual Interfaces, AVI '04, ACM, May 24-25, 2004, pp. 403-406.
"Simulink® Design Verifier 1: User's Guide," The MathWorks, Inc., May 2007, pp. i-xii, 1-1 to 1-20, 2-1 to 2-8. 3-1 t0 3-18, 4-1 to 4-18, 5-1 to 5-16, 6-1 to 6-30, 7-1 to 7-28, 8-1 to 8-26, A-1 to A-14, 9-1 to 9-16, 10-1 to 10-28, 11-1 to 11-6, 12-1 to 12-14, Glossary-1 to Glossary-4, B-1 to B-2, and Index-1 to Index-2.
"Simulink® Designer Verifier 1: User's Guide," The MathWorks, Inc., May 2007, pp. 1-485.
"Simulink® Verification and Validation 2: User's Guide," The Math Works, Inc., Sep. 2007, pp. i-xii, 1-1 to 1-6, 2-1 to 2-58, 3-1 to 3-32, 4-1 to 4-28, 5-1 to 5-66, 6-1 to 6-30, 7-1 to 7-4, 8-1 to 8-56, 9-1 to 9-4, 10-1 to 10-42, A-1 to A-4, and Index-1 to Index-4.
"Simulink® Verification and Validation 2: User's Guide," The MathWorks, Inc., Sep. 2007, pp. 1-829.

(56) References Cited

OTHER PUBLICATIONS

Tiihonen, J. et al, "A Practical Tool for Mass-Customizing Configurable Products," Proceedings of the 14th International Conference on Engineering Design, ICED '03, Stockholm, Sweden, Aug. 19-21, 2003.

Tip, "A Survey of Program Slicing Techniques," Journal of Programming Languages, vol. 3, 1995, pp. 121-189.

Weiser, "Program slicing," IEEE Transactions on Software Engineering, vol. SE-10, No. 4, Jul. 1984, pp. 352-357.

Aldrich, Bill, et al., "Managing Verification Activities Using SVM," Nov. 2004, pp. 1-15.

Dziobek, Christian, et al., "Model Diversity and Variability: Handling Functional Variants in Simulink Models," Elektronik Automotive, pp. 33-37.

Haber, Arne, et al., "First-Class Variability Modeling in Matlab/Simulink," Proceedings of the Seventh International Workshop on Variability Modeling of Software-Intensive Systems, ACM, New York, NY, Jan. 23-25, 2013, pp. 11-18.

Kobourov, S., "Spring Embedders and Force-Directed Graph Drawing Algorithms," Jan. 2012, pp. 1-23.

Koren, Yehuda, "Drawing Graphs by Eigenvectors: Theory and Practice," Journal Computers & Mathematics with Applications, Jun. 2005, pp. 1-28.

"Simulink®: User's Guide," R2016b, The Math Works, Inc., Sep. 2016, pp. 1-4022.

Sponemann, Miro, "On the Automatic Layout of Data Flow Diagrams," Diploma Thesis, Christian-Albrechts-Universität zu Kiel, Department of Computer Science, Mar. 19, 2009, pp. 1-99.

Kolassa, Carsten, et al., "Evaluation of Variability Concepts for Simulink in the Automotive Domain," IEEE Computer Society, 2015 48th Hawaii International Conference on System Sciences, Jan. 5-8, 2015, pp. 5373-5382, [retrieved on Aug. 9, 2019], Retrieved from the Internet.

Wenzel, Sven, et al., "Tracing Model Elements," IEEE, IEEE International Conference on Software Maintenance (ICSM) 2007, Oct. 2-5, 2007, pp. 104-113, [retrieved on Aug. 9, 2019], Retrieved from the Internet.

\* cited by examiner

Block Parameters: Vendor

Variant Source

The Variant Source provides variation on the source of a signal. Blocks connected to the input ports define variant choices and at most one input port can be active during simulation. Blocks connected to the inactive ports will be removed from the simulation. The variant control determines which input port, if any, is active. One input port must be active, unless 'Allow zero active variant controls' is selected.

Ports and associated conditions

| Port | Variant control | Condition (read-only) |
|---|---|---|
| 1 | Default ——2102 ▼ | (N/A) |
| 2 | R == 1 \|\| R == 2 ▼ | (N/A) |

☐ Override variant conditions and use the following variant:
Variant: (default)
☑ Allow zero active variant controls
☑ Show variant condition on block
☑ Analyze all choices during update diagram and generate preprocessor conditionals Open block in Variant Manager

[ OK ] [ Cancel ] [ Help ] [ Apply ]

```
void example_step(void)
{
#if V == 2  /* v:1 */
  real_T rtb_Sine2;
  real_T rtb_VariantMerge_For_Variant_So;
  rtb_Sine2 = sin( ( (real_T)example_DW.counter_j + example_P.Sine2_NumSamp) *
    3.1415926535897931 / example_P.Sine2_NumSamp) *
    example_P.Sine2_Amp + example_P.Sine2_Bias;
endif if V == 2 && W == 1   /* v:2 */
  rtb_VariantMerge_For_Variant_So = sin( ( (real_T)example_DW.counter_f +
    example_P.Sine3_Offset) * 2.0 * 3.1415926535897931 / example_P.Sine3_NumSamp)
    * example_P.Sine3_Amp + example_P.Sine3_Bias;
endif if V == 2 && W == 2   /* v:3 */
  rtb_VariantMerge_For_Variant_So = sin( ( (real_T)example_DW.counter_h +
    example_P.Sine4_Offset) * 2.0 * 3.1415926535897931 / example_P.Sine4_NumSamp)
    * example_P.Sine4_Amp + example_P.Sine4_Bias;
endif if V == 2   /* v:1 */
  example_Y.Out1 = (rtb_Sine2 + rtb_VariantMerge_For_Variant_So) *
    example_P.Gain3_Gain;
endif example_Y.Out2 = V;

if V == 1   /* v:0 */
  example_DW.counter++;
  if (example_DW.counter == example_P.Sine1_NumSum) {
    example_DW.counter = 0;
```

*FIG. 34A*

```
}
#elif V == 2   /* v:1 */
example_DW.counter_j++;
if (example_DW.counter_j == example_P.Sine2_NumSamp) {
   example_DW.counter_j = 0;
}
endif if V == 2 && W == 1   /* v:2 */
example_DW.counter_f++;bpb
if (example_DW.counter_f == example_P.Sine3_NumSamp) {
   example_DW.counter_f = 0;
}
endif if V == 2 && W == 2   /* v:3 */
example_DW.counter_h++;
if (example_DW.counter_h == example_P.Sine4_NumSamp) {
   example_DW.counter_h = 0;
}
endif
}
```

```
#define Va0  V == 1
#define Va1  V == 2
#define Va2  V == 2 && W == 1
define Va3  V == 2 && W == 2 void example_step(void)
{
#if Va1   /* v:1 */
  real_T rtb_Sine2;
  real_T rtb_VariantMerge_For_Variant_So;
  rtb_Sine2 = sin( ( (real_T)example_DW.counter_i  +  example_P.Sine2_Offset) * 2.0 *
    3.1415926535897931 / example_P.Sine2_NumSamp) *
    example_P.Sine2_Amp + example_P.Sine2_Bias;
endif if Va2   /* v:2 */
  rtb_VariantMerge_For_Variant_So = sin( ( (real_T)example_DW.counter_f +
    example_P.Sine3_Offset) * 2.0 * 3.1415926535897931 / example_P.Sine3_NumSamp)
    * example_P.Sine3_Amp + example_P.Sine3_Bias;
endif if Va3   /* v:3 */
  rtb_VariantMerge_For_Variant_So = sin( ( (real_T)example_DW.counter_h +
    example_P.Sine4_Offset) * 2.0 * 3.1415926535897931 / example_P.Sine4_NumSamp)
    * example_P.Sine4_Amp + example_P.Sine4_Bias;
endif if Va1   /* v:1 */
  example_Y.Out1 = (rtb_Sine2 + rtb_VariantMerge_For_Variant_So) *
    example_P.Gain3_Gain;
endif example_Y.Out2 = V;
```

```
#if Va0   /*  v:0 */
  example_DW.counter++;
  if (example_DW.counter == example_P.Sine1_NumSamp) {
    example_DW.counter = 0;
  }
#elif Va1  /*  v:1 */
  example_DW.counter_i++;
  if (example_DW.counter_i == example_P.Sine2_NumSamp) {
    example_DW.counter_i = 0;
  }
endif if Va2   /*  v:2 */
  example_DW.counter_f++;bpb
  if (example_DW.counter_f == example_P.Sine3_NumSamp) {
    example_DW.counter_f = 0;
  }
endif if Va3   /*  v:3 */
  example_DW.counter_h++;
  if (example_DW.counter_h == example_P.Sine4_NumSamp) {
    example_DW.counter_h = 0;
  }
endif
}
```

```
void ex_mixed_gpc_step(void)
{
#if V == 1 || V == 2
    real_T rtb_VariantMerge_For_Variant_So;
#endif
#if V == 1
    rtb_VariantMerge_For_Variant_So = (sin(((real_T)ex_mixed_gpc_DW.counter +
        ex_mixed_gpc_P.Sine1_Offset) * 2.0 * 3.1415926535897931 /
        ex_mixed_gpc_P.Sine1_NumSamp) * ex_mixed_gpc_P.Sine1_Amp +
        ex_mixed_gpc_P.Sine1_Bias) * ex_mixed_gpc_P.Gain1_Gain;
#endif
#if V == 2
    rtb_VariantMerge_ForVariant_So = (sin(((real_T)ex_mixed_gpc_DW.counter_i +
        ex_mixed_gpc_P.Sine2_Offset) * 2.0 3.1415926535897931 /
        ex_mixed_gpc_P.Sine2_NumSamp) * ex_mixed_gpc_P.Sine2_Amp +
        ex_mixed_gpc_P.Sine2_Bias) * ex_mixed_gpc_P.Gain2_Gain + (sin(((real_T)
        ex_mixed_gpc_DW.counter_f + ex_mixed_gpc_P.Sine3_Offset) * 2.0 *
        3.1415926535897931 / ex_mixed_gpc_P.Sine3_NumSamp) *
        ex_mixed_gpc_P.Sine3_Amp) + ex_mixed_gpc_P.Sine3_Bias) *
        ex_mixed_gpc_P.Gain3_Gain;
#endif
#if V == 1 || V == 2
    ex_mixed_gpc_Y.Out1 = ex_mixed_gpc_P.Gain5_Gain *
        rtb_VariantMerger_For_Variant_So;
#endif
#if V == 1
    ex_mixed_gpc_DW.counter++;
    if (ex_mixed_gpc_DW.counter == ex_mixed_gpc_P.Sine1_NumSamp) {
        ex_mixed_gpc_DW.counter = 0;
```

FIG. 38A

```
}
endif
#if V == 2
ex_mixed_gpc_DW.counter_i++;
if (ex_mixed_gpc_DW.counter_i == ex_mixed_gpc_P.Sine2_NumSamp) {
    ex_mixed_gpc_DW.counter_i = 0;
}
ex_mixed_gpc_DW.counter_f++;
if (ex_mixed_gpc_DW.counter_f == ex_mixed_gpc_P.Sine3_NumSamp) {
    ex_mixed_gpc_DW.counter_f = 0;
}
endif
}
```

FIG. 38B

| Variant Conditions Legend: ex_mixed_gpc | | |
|---|---|---|
| ☑ Show generated code conditions | | |
| | | Filter |
| Annotation — 3902 | Sim — 3904 | CodeGen — 3906 |
| v:0 | V == 1 \|\| V == 2 | V == 1 \|\| V == 2 |
| v:1 | V == 1 | V == 1 |
| v:2 | V == 2 && W == 1 | V == 2 |
| v:3 | V == 2 && W == 2 | false |
| v:4 | V == 2 | V == 2 |
| v:5 | W == 1 | unconditional |
| v:6 | W == 2 | false |

FIG. 39

| Annotation | Variant Condition |
|---|---|
| v:0 | A == 1 |
| v:1 | A == 1 && DSUPPLIER == 1 |
| V:2 | A == 2 |
| v:3 | A == 2 && DSUPPLIER == 1 |
| v:4 | B == 1 |
| v:5 | B == 1 && DSUPPLIER == 2 |
| v:6 | B == 2 |
| v:7 | B == 2 && DSUPPLIER == 2 |
| v:8 | C == 1 |
| v:9 | C == 1 && DSUPPLIER == 3 |
| v:10 | C == 2 |
| v:11 | C == 2 && DSUPPLIER == 3 |
| v:12 | DSUPPLIER == 1 |
| V:13 | DSUPPLIER == 1 \|\| DSUPPLIER == 2 \|\| DSUPPLIER == 3 |
| V:14 | DSUPPLIER == 2 |
| V:15 | DSUPPLIER == 2 \|\| DSUPPLIER == 3 |
| V:16 | DSUPPLIER == 3 |

| Configuration Name | Control Variable Values |
|---|---|
| config1a1 | DSUPPLIER = 1<br>A = 1 |
| config1a2 | DSUPPLIER = 1<br>A = 2 |
| config2b1 | DSUPPLIER = 2<br>B = 1 |
| config2b2 | DSUPPLIER = 2<br>B = 2 |
| config3c1 | DSUPPLIER = 3<br>C = 1 |
| config3c2 | DSUPPLIER = 3<br>C = 2 |

FIG. 41

```
function balanced placement(Graph v, Layers L)

find reference layer $L_r$ for which $size(L_r) = max\{s(L_i) : i \in 1,....k\}$ $\Delta(v) = 0 \; \forall v \in L_r$  \\Reference layer is not moved foreach L_j < L_r createDeltas ($L_j$)

validateDeltas ($L_j$)

end foreach L_j > L_r createDeltas ($L_j$)

validateDeltas ($L_j$)

end end
```

FIG. 47A

```
function createDeltas(L_i)

Δ = 0 foreach ν ∈ L_j in increasing order of τ(ν)

\\ Do not move isolated nodes
        if indegree(ν) && outdegree(ν) == 0
            Δ(ν) = 0
        else
            if L_i < L_ref
                P_ν = outPorts(ν)
```

$$\Delta(\nu) = \frac{1}{|P_\nu|} \sum_{(\nu,\upsilon) \in E_\upsilon(\nu)} (y(u) + \Delta(u) - y(\nu))$$

```
            else
                P_ν = inPorts(ν)
```

$$\Delta(\nu) = \frac{1}{|P_\nu|} \sum_{(\upsilon,\nu) \in E_T(\nu)} (y(u) + \Delta(u) - y(\nu))$$

```
            end
        end
    end
end
```

FIG. 47B

```
function validateDeltas(L_j)

Δ(ν) = 0 if node is vertically aligned
    foreach ν ∈ L_j in increasing order of τ(ν)
```
$h_1 = y(\nu_i) + h(\nu_i)$ \\ check the maximum y-coordinate of block
$h_2 = y(\nu_{i+1})$ \\ check y-coordinate of next block in rank
```
        if h_1 > h_2
```
$\Delta(\nu_i) = 0$
```
        end
    end
    foreach ν ∈ L_j in decreasing order of τ(ν)
```
$h_1 = y(\nu_i)$ \\ check the y-coordinate of block placed below
$h_2 = y(\nu_{i+1}) + h(\nu_{i+1})$ \\ check maximun y-coordinate of previous block in rank
```
        if h_2 > h_1
```
$\Delta(\nu_i) = 0$
```
        end
    end
end
```

FIG. 47C

```
#if V != 1 && V != 2
#error V must be defined as 1 or 2
endif void example_step( )
{
    float u;
    float y;

#if V == 1
    u=read16bitAD( );
#elif V == 2
    u=read32bitAD( );
endif y=Controller(u);

if V == 1
    write16bitAD(y);
#elif V == 2
    write32bitAD(y);
#endif
}
```

FIG. 58

| Annotation Variant Condition | | | |
|---|---|---|---|
| v:0 | | | |
| v:1 | CERROR == 1 | v:7 | R == 2 && VSimCodegenMode == 2 |
| v:2 | R == 1 | v:8 | VSimCodegenMode == 1 |
| v:3 | R == 1 && VSimCodegenMode == 1 | v:9 | VSimCodegenMode == 1 && ~(R == 1 \|\| R ==2) |
| v:4 | R == 1 && VSimCodegenMode == 2 | v:10 | VSimCodegenMode == 2 |
| v:5 | R == 1 \|\| R == 2 | v:11 | R == 2 && ~(R == 1 \|\| R == 2) |
| v:6 | R == 2 | v:12 | ~(R == 1 \|\| R == 2) |
| | R == 2 && VSimCodegenMode == 1 | | |

FIG. 92

VARIANT MODELING ELEMENTS IN GRAPHICAL PROGRAMS

CROSS-REFERENCE TO RELATED APPLICATIONS

The present application claims the benefit of U.S. Provisional Patent Application Ser. No. 62/429,484 filed Dec. 2, 2016, by John E. Ciolfi et al. for Variants Modeling Elements in Graphical Programs, which application is hereby incorporated by reference in its entirety.

BRIEF DESCRIPTION OF THE DRAWINGS

The description below refers to the accompanying drawings, of which:

FIG. 21 is an illustration of an example graphical affordance in accordance with one or more embodiments;

FIGS. 34A and 34B are partial views of an example code listing in accordance with one or more embodiments;

FIGS. 35A and 35B are partial views of an example code listing in accordance with one or more embodiments;

FIGS. 38A and 38B are partial views of an example code listing in accordance with one or more embodiments;

FIG. 39 is an illustration of an example graphical affordance in accordance with one or more embodiments;

FIGS. 40A and 40B are partial views of an illustration of an example model in accordance with one or more embodiments;

FIG. 41 is an illustration of an example data structure in accordance with one or more embodiments;

FIGS. 47A-C are partial views of example code in accordance with one or more embodiments;

FIG. 58 is an illustration of example code in accordance with one or more embodiments;

FIG. 92 is an illustration of an example data structure in accordance with one or more embodiments.

DETAILED DESCRIPTION OF ILLUSTRATIVE EMBODIMENTS

Summary

Figure 1:
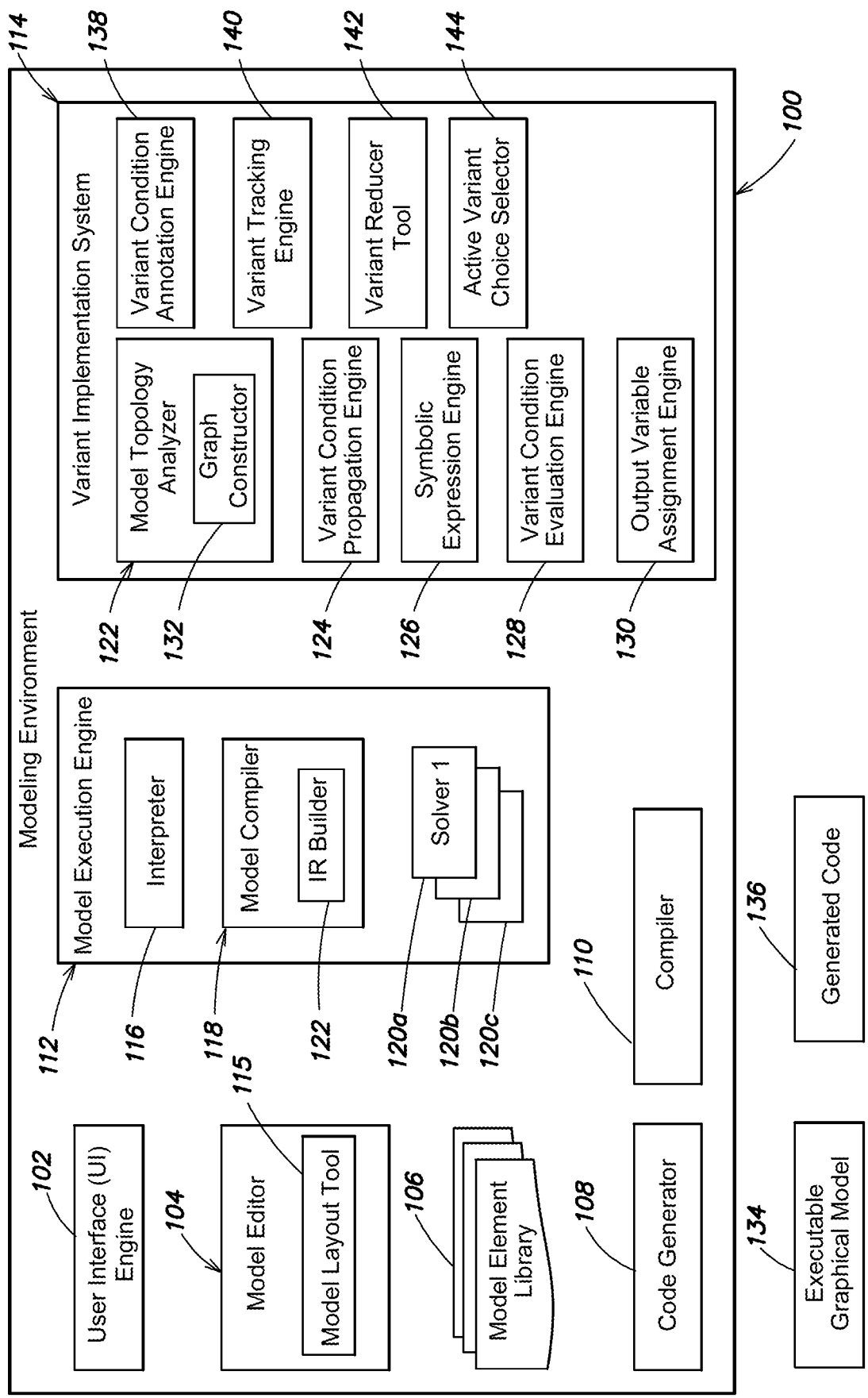
FIG. 1 is a partial, functional diagram of an example modeling environment in accordance with one or more embodiments.

Computer-based modeling environments may be used to create models of systems, such as control systems, communications systems, factory automation systems, etc. A user may construct a computer model within the modeling environment that, when executed, simulates operation of the system. Modeling environments may support the creation of models graphically and/or textually. A graphical model may include a plurality of model elements such as blocks or icons, that perform predetermined and/or custom defined functionality during execution of the model.

Groups of model elements may be organized as model components that establish hierarchy in the model. At a first hierarchical level, a component may be visually represented by a single block or icon, such as a subsystem block or a model reference block. Exemplary components include subsystems and submodels of the Simulink model-based design environment, Virtual Instruments (VIs) of the LabVIEW programming system, and SuperBlocks of the MatrixX modeling environment. A component may itself include one or more other components, establishing hierarchal levels through the model.

Model elements and components may be linked together by connections to exchange information, such as data, control, signals, events, and messages. The connections may establish information paths through the model, which may extend from the model's top-level inputs to its top-level outputs. The connections may establish relationships among the connected model elements. At least some of the connections may be visually represented in a display of a graphical model, for example, as arrows, wires, lines, etc.

The arrangement of model elements, connections, and components within a model may specify a procedure, algorithm, and/or behavior, and the model may have executable semantics. The model may be executed, e.g., simulated, by the modeling environment to perform the procedure, algorithm, and/or behavior. For example, the modeling environment may generate executable instructions for the model. During execution, a model may process input values, and may generate output values. A user may direct the modeling environment to execute, e.g., run, a model using sample input data, and may evaluate whether the model, when executed, generates expected output values. If it does not, the user may revise the model. When the user is satisfied that the model correctly represents operation of the system being modeled, e.g., to some degree of accuracy, a code generator may generate code, such as computer source code, for the model.

The code generator may be part of the modeling environment, it may be a separate, add-on tool, or it may be a separate computer program. The generated code, which may be run outside of the modeling environment, may be loaded onto a target hardware platform and run. For example, the code may be compiled and executed by a microprocessor, a digital signal processor (DSP), or other processing logic of a physical, deployed system. In some embodiments, the generated code may be in the form of a hardware description language (HDL) and may be used to synthesize one or more programmable hardware elements, such as a Field Programmable Gate Array (FPGA), an Application Specific Integrated Circuit (ASIC), a Complex Programmable Logic Device (CPLD), a System on a Chip (SoC), etc. The target hardware element may represent a production device, and may be a deployed in a real-world environment, such as a factory floor, a communication device, an automobile or other vehicle, an appliance, etc.

Modeling environments may support the creation of models of different domains, such as dynamic or time-based models, state-based models, event-based models, and data/control flow models, among others. A dynamic system is a system that changes with time. Time-based models can represent dynamic systems, and thus these "dynamic models" change with time. For example, time-based relationships may be defined between signals and state variables of a dynamic model, and the solution of the model may be obtained by evaluating these relationships over a time, e.g., the model's simulation time. The model may be solved repeatedly over the simulation time at intervals called time steps. The modeling environment may specify a default simulation time, for example from zero to ten seconds, although the simulation time, including the units of time, may be altered by a user. Simulation time differs from actual clock time. For example, even though a model's execution may be simulated from zero to ten seconds, it may take a small fraction of actual clock time to execute the model over that simulation time.

A modeling environment may include a model compiler, which may include or have access to one or more solvers, that generates a set of equations for the relationships between a model's signals and state variables. During model execution, a solver, which may be the same solver used in the generation of equations or may be another solver, solves these equations. The solver may determine the particular time steps, which may also be referred to as sample times, during which equations associated with the model's elements may be executed. An example of a time-based block diagram modeling environment is the Simulink® model-based design environment from The MathWorks, Inc. of Natick, Mass.

A state-based model, which may also be referred to as a statechart, may be represented graphically as a connected graph having nodes that represent states or junctions connected by edges representing transitions. The state-based model may be run within a time-based execution domain. At any given time-step, one or more of the state-based model's states may be active. Actions defined within the model may be triggered in response to the occurrence of events, which may also be defined within the model. Actions also may be predicated on the evaluation of a condition. An example of a state-based modeling environment is the Stateflow® programming system from The MathWorks, Inc.

When a system being modeled includes multiple, different configurations, separate models may need to be created, one for each configuration. While each model represents a different configuration, much of the overall structure of the models may be the same. The need to create multiple separate models may result in significant computer memory resources being used, e.g., to store the different models. In addition, if changes need to be made to the common portion, those same changes must be made to each separate model. Updating each separate model in the same manner can be error prone, e.g., the changes may not be made exactly each time.

To address these disadvantages, modeling environments, such as the Simulink® modeling environment, can be improved to support the creation of a single model that can implement multiple configurations alternatively. One portion of the model may represent a common algorithmic structure of the system whose behavior is fixed, while another portion of the model may include a plurality of alternative algorithmic substructures each implementing different configurations of the system being modeled. The alternative algorithmic substructures may have different execution behaviors. For any given execution of the model or generation of code for the model, one of the alternative algorithmic substructures may be determined to be active, and may be executed together with the model's fixed common algorithmic structure. The other algorithmic substructures are deemed to be inactive, and are not executed. The inactive algorithmic substructures may be ignored by a model execution engine of the modeling environment as though they were deleted from the model. With this feature, a single model may be created that nonetheless represents many different alternative configurations.

The alternative algorithmic structures may be called variant choices and may be disposed in region of the model called a variant region. In some embodiments, each variant choice may be implemented through a different arrangement of model elements, e.g., different model elements and/or different connections among model elements and/or components. The variant choices may receive at least some of the same input variables, which may be computed by the model's common algorithmic structure, and may compute at least some of the same output variables, which may be processed by the model's common algorithmic structure.

Each variant choice may be associated with a conditional expression called a variant control. The variant control may be a logical expression and may include one or more variables called variant control variables. During model compilation, values for the variable control variables may be determined, and the logical expressions of the variant controls may be evaluated. The variant controls may be defined so that no more than one variant control evaluates to True at a time. The one variant choice whose associated variant control evaluates to True may be deemed the active variant choice for that execution of or generation of code for the model. The other variant choices whose variant controls evaluate to False are deemed inactive. One of the variant choices may be designated the default variant choice, and it may be activated when none of the variant controls evaluates to True. By changing the values of the variable control variables, a user may control which variant choice is deemed active for a given execution or generation of code. Values for variable control variables may be specified in a workspace associated with the model and/or in a data dictionary, among other memory locations.

In some embodiments, a modeling environment may provide specific types of model elements that support the creation of variant choices. For example, the Simulink® model-based design environment includes a Variant Subsystem model element type, a Variant Submodel model element type, a Variant Source model element type, and a Variant Sink model element type. The Variant Submodel model element type may be referred to as a Variant Model block or a Model Variant block in some embodiments. The Variant Model block may also be used to reference another model, which may be referred to as a submodel. Instances of these various types of model element types may be included in a model to establish a variant region of the model in which variant choices are defined. These model elements, which may be called variant boundary blocks, may establish a demarcation between the variant region of a model and the model's common algorithmic structure. That is, the variant boundary blocks may define a boundary that separates the variant region from a model's common algorithmic structure. Inside the boundary are variant choices. Outside the boundary are the model elements, components, and connections that form the model's common algorithmic structure. Variant boundary blocks, unlike other model elements, may provide support for variant conditions to implement alternative execution semantics.

The Variant Subsystem model element type and the Variant Submodel model element type may act as containers for variant choices. Each variant choice contained within a Variant Subsystem model element or a Variant Submodel model element may be associated with a variant control. The variant choices may be represented by one or more subsystems, submodels, and/or model elements. The Variant Subsystem or Variant Submodel model elements may include one or more Input port model elements, such as Inport blocks, for receiving input information from the model's common algorithm structure, and one or more Output port model elements, such as Outport blocks, for providing information computed by the Variant Subsystem or Variant Submodel model element to the model's common algorithmic structure. For a given execution of the Variant Subsystem or Variant Submodel model element, one variant choice is active. The modeling environment may programmatically connect the active variant choice to the Inport and Outport blocks of the Variant Subsystem or Variant Submodel model elements during model compilation.

The variant choices contained in a Variant Subsystem or a Variant Submodel model element may have inputs and outputs that differ in number from the inputs and outputs of the Variant Subsystem or Variant Submodel model element. The user may need to manually resolve any such unused or disconnected inputs or outputs when switching between variant choices.

Variant Source and Variant Sink model elements may include multiple input ports and/or multiple output ports. Model elements defining different variant choices may be connected between the Variant Source and Variant Sink model elements. The variant choices may thus be enclosed between Variant Source and Variant Sink model elements. The input and/or output ports of the Variant Source and Variant Sink model elements may be associated with variant controls to determine which input and/or output ports are active for a given execution of or generation of code for the model. A Variant Source block may allow for variation on the source of a signal. A Variant Sink block may have a functionality that is similar to a Variant Source block, except that the Variant Sink block may allow for variation on the destination of a signal.

In some cases, depending on which variant choice is active, one or more model elements of a model's fixed, common algorithmic structure may run unnecessarily. For example, memory may be allocated for unused model elements and/or connections, and processor resources consumed addressing such unused model elements and/or connections. This may result in inefficient operation of the computer or data processing device running the model, e.g., by wasting computer memory and/or processor resources.

Modeling Environment

FIG. 1 is a partial, functional diagram of an example modeling environment 100 in accordance with an embodiment. The modeling environment 100 may include a User Interface (UI) engine 102, a model editor 104, a model element library 106, a code generator 108, a compiler 110, a model execution engine 112, and a variant implementation system 114. The UI engine 102 may create and present one or more User Interfaces (UIs), such as Graphical User Interfaces (GUIs) and/or Command Line Interfaces (CLIs), on the display of a workstation, laptop, tablet, or other data processing device. The GUIs and CLIs may provide a user interface to the modeling environment 100, such as a model editing window. The model element library 106 may contain a plurality of model element types, at least some of which may come preloaded with the modeling environment 100 and some may be custom created and saved in the library 106, e.g., by a user. A user may select model elements types from the library to add instances of the selected model element types to a model being created and/or edited. The model editor 104 may perform selected operations on a model, such as open, create, edit, and save, in response to user inputs or programmatically. The model editor 104 may include a model layout tool 115.

The model execution engine 112 may include an interpreter 116, a model compiler 118, and one or more solvers, such as solvers 120a-c. The model compiler 118 may include one or more Intermediate Representation (IR) builders, such as IR builder 122. In some implementations, one or more IR builders may be included or associated with the solvers 120. The IR may then be used by the interpreter 116 to perform a simulation or be used to generate code 136.

The variant implementation system 114 may include a model topology analyzer 122, a variant condition propagation engine 124, a symbolic expression engine 126, a variant condition evaluation engine 128, an output variable assignment engine 130, a variant condition annotation engine 138, a variant tracing engine 140, a variant reducer tool 142, and an active variant choice selector 144. The model topology analyzer 124 may include a graph constructor 132.

The modeling environment 100 may access one or more computer-based, executable models or a portion thereof, such as an executable model 134, which may be a graphical model. The execution engine 112 may execute, e.g., compile and run or interpret, the model 134 using one or more of the solvers 120a-c. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the *Simulink User's Guide* from The MathWorks, Inc. (September 2016 ed.)

The code generator 108 may generate code, such as generated code 136, for the model 134. For example, the user interface engine 102 may provide or support a Code Generation button in a GUI that may be selected by the user, or the user interface engine 102 may receive a code generation command entered by the user, e.g., in the GUI or the CLI. The code generation command also may be invoked programmatically, for example, when a particular event occurs. In response to the code generation command being activated, the code generator 108 may generate code, such as the generated code 136, for the model 134 or a portion thereof. The behavior of the generated code 136 may be functionally equivalent to the behavior of the executable model 134.

The generated code 136 may be textual code, such as textual source code, that may be compiled, for example by the compiler 110, and executed on a target machine or device, which may not include a modeling environment and/or a model execution engine. The generated code 136 may conform to one or more programming languages, such as Ada, Basic, C, C++, C#, SystemC, FORTRAN, VHDL, Verilog, a vendor or target specific HDL code, such as Xilinx FPGA libraries, assembly code, etc. The generated code 136 may include header, main, make, and other source files. The compiler 110 may compile the generated code for execution by target hardware, such as a microprocessor, a Digital Signal Processor (DSP), Central Processing Unit (CPU), etc. In some embodiments, the generated code 136 may be accessed by a hardware synthesis tool chain, which may configure a programmable hardware device, such as a Field Programmable Gate Array (FPGA), a System on a Chip (SoC), etc., from the generated code 136. The model 134 and the generated code 136 may be stored in memory, e.g., persistent memory, such as a hard drive or flash memory, of a data processing device. The modeling environment 100 may be loaded into and run from the main memory of a data processing device.

In some implementations, the code generator 108 and/or the compiler 110 may be separate from the modeling environment 100, for example one or both of them may be separate application programs. The code generator 108 and/or the compiler 110 may also be run on different data processing devices than the data processing device running the modeling environment 100. In such embodiments, the code generator 108 may access the model 134, e.g., from memory, and generate the generated code 136 without interacting with the modeling environment 100.

In some embodiments, one or more of the user interface engine 102, the model editor 104, the code generator 108, the compiler 110, the model execution engine 112, and the variant implementation system 114 may be implemented through one or more software modules or libraries containing program instructions that perform the methods described herein, among other methods. The software modules may be stored in one or more memories, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media.

In some embodiments, one or more of the user interface engine 102, the model editor 104, the code generator 108, the compiler 110, the model execution engine 112, and the variant implementation system 114 may comprise hardware registers and combinational logic configured and arranged to produce sequential logic circuits. In some embodiments, various combinations of software and hardware, including firmware, may be utilized to implement the described methods.

In some embodiments, the modeling environment 100 may implement a declarative language. A declarative language is a language that expresses the logic of a computation without describing its control flow. A declarative language may describe what a program must accomplish in terms of the problem domain, rather than describe how to accomplish it as a sequence of the programming language primitives. In some cases, a declarative language may implement single assignment in which variables are assigned once and only once. Examples of declarative languages include the Simulink® model-based design environment from The MathWorks, Inc. of Natick, Mass., the Modelica modeling language from the Modelica Association, the LabVIEW graphical programming system from National Instruments Corp., Hardware Description Language (HDL), the Prolog language, and the Haskell language, among others. Behaviors of at least some of the model elements and connection elements of a model constructed or opened in the modeling environment 100 may include computational implementations that are implicitly defined by a declarative language.

As described, the model 134 may include a common algorithmic structure that may be fixed, and one or more variant regions each containing a plurality of alternative algorithmic substructures, e.g., variant choices. The model 134 also may include multiple hierarchical levels. A component may itself include other components, establishing multiple hierarchical levels, for example through the use of components, such as subsystems and/or submodels within the model. A component, such as a subsystem, may be saved in the model element library 106, and may be reused at other locations in the model 134 or in other models. The execution behavior of a subsystem may be context dependent. That is, at least some of the parameters of the group of model elements included in a subsystem, such as data type, data dimension, and sample time, may be undefined. Values for these parameters may be inherited from the model in which the subsystem is executed. In some implementations, execution of the subset of model elements of a subsystem may be interleaved with the execution of other model elements of the model. In other implementations, the subset of model elements of a subsystem may execute atomically. In addition, in some implementations, a subsystem may be configured for conditional execution, and the subsystem may execute when the condition is satisfied. Examples of conditionally executed subsystems include triggered, enabled, action and iterator, triggered and enabled, and function call.

A sub-model also may include a group of model elements, and may be represented at a given hierarchical level by a single model reference block. A sub-model also may be saved in the library 106, and reused at other locations in the model 134 or in other models. The execution behavior of a sub-model may be independent of the model in which it is located, and the model elements of a sub-model may execute as a unit.

Propagation of Variant Conditions Outside of Variant Regions

Figure 2A:
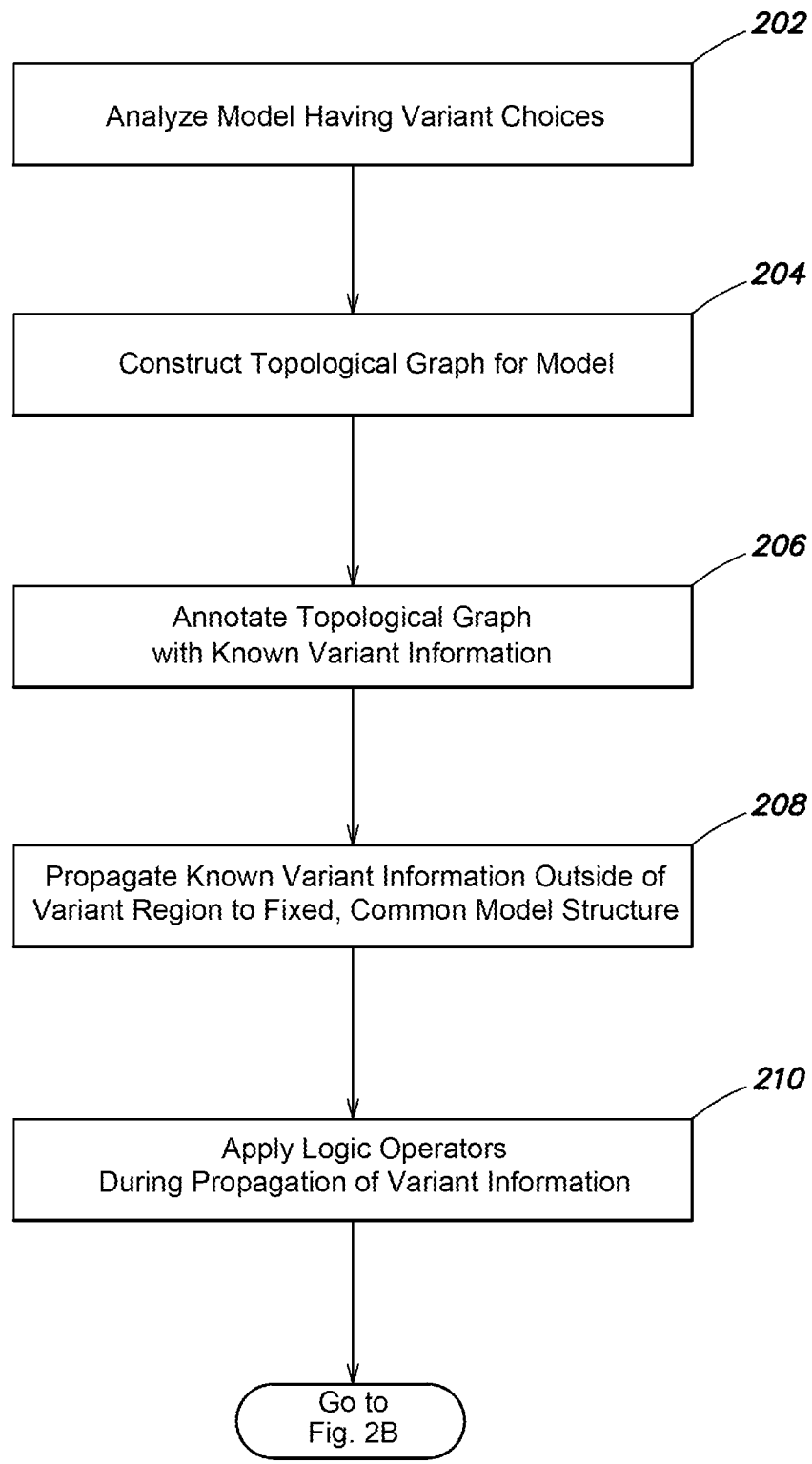
FIGS. 2A-2B are partial views of a flow diagram of an example method in accordance with one or more embodiments.
Figure 2B:
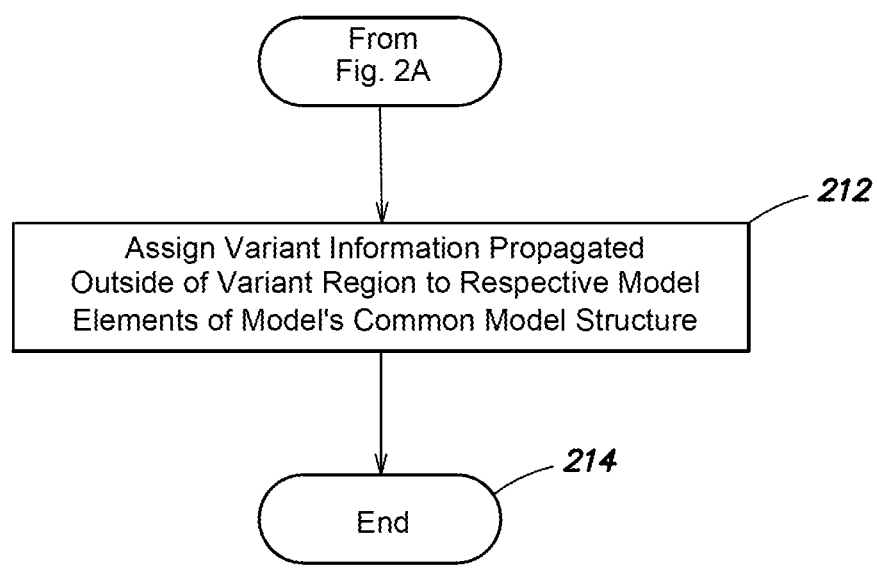

FIGS. 2A-2B are partial views of a flow diagram of an example method for propagating variant conditions outside of a variant region of a model in accordance with an embodiment. The model topology analyzer 122 may analyze a model, such as the model 134, or a portion thereof to determine the model's structure, as indicated at step 202. For example, the graph constructor 132 of the model topology analyzer 122 may construct or access a topological graph for the model 134, as indicated at step 204. The topology graph may include information concerning the operations or procedures included in the model 134, and the data and/or control dependencies among those operations or procedures. In some embodiments, the topology graph may be in the form of a dependency graph. The dependency graph may include nodes corresponding to model elements of the model, and edges corresponding to the connections among the model elements. The model topology analyzer 122 may determine the model's structure by tracing the connections through the model 134 backward starting at the model's top-level outputs and/or forward starting at the model's top-level inputs. The graph constructor 132 may construct the dependency graph to correspond to the model's determined structure. A portion of the dependency graph may correspond to a variant region of the model. The dependency graph may be implemented in one or more data structures, such as a linked list, and stored in computer memory, such as volatile or persistent memory.

As described herein, the variant region may include a plurality of variant choices, and variant conditions may be defined for the variant choices of the variant region. For example, Variant Subsystem and Variant Submodel model elements may contain variant choices, and variant conditions may be associated with the variant choices. Variant conditions also may be associated with input and/or output ports of Variant Source and Variant Sink model elements.

The graph constructor 124 may annotate the dependency graph with the variant condition information defined for the variant region of the model, as indicated at step 206. For example, edges of the dependency graph leading from a node representing a Variant Source model element may be annotated with the variant conditions associated with the input ports of the Variant Source model element. Edges of the dependency graph leading to a node representing a Variant Sink model element may be annotated with the variant conditions associated with the output ports of the Variant Sink model element. Edges of the dependency graph leading from a node representing an Inport model element of a Variant Subsystem or a Variant Submodel model element may be annotated with the variant conditions associated with the variant choices to which the Inport model element is connected. Also, edges of the dependency graph leading to a node representing an Outport model element of a Variant Subsystem or a Variant Submodel model element may be annotated with the variant conditions associated with the variant choices to which the Outport model element is connected.

With the portion of the dependency graph representing the variant region annotated with variant information, the variant condition propagation engine 124 may propagate that information along the edges of the dependency graph to portions of the graph that represent the model's common algorithmic structure, as indicated at step 208. For example, the variant information may be propagated along the edges of the dependency graph to nodes that represent model elements included in the model's common algorithmic structure. In some cases, two edges may lead to a given node of the dependency graph, and the two edges may be annotated with different variant information. In such cases, the symbolic expression engine 126 may apply one or more logic operators to the different variant information to produce new variant information for the respective node, as indicated at step 210.

In some embodiments, the connections of the model for which variant information being propagated may have a directional attribute. For example, if the model operates in a dataflow domain, data may flow from source model elements to sink model elements during execution. A dynamic or time-based model may describe a dynamic system of equations that defines time-based relationships between signals and state variables. Signals may represent quantities that change over time, and may have values at all points in time. The relationships between signals and state variables may be defined by the set of equations represented by the time-based blocks. Time-based model elements may include signal ports that may be interconnected with signal-based connections. The source of a signal corresponds to the block that writes to the signal during the evaluation of the block's equations, and the destination of the signal is the block that reads the signal during the evaluation of the destination block's equations.

The one or more logical operators applied by the symbolic expression engine 126 may be a function of the direction associated with the edges merging at a node of the topological graph. When propagating variant information in a forward direction through the topological graph, e.g., in the same direction relative to the respective connections of the model, the symbolic expression engine 126 may generate new variant information for the subject node by combining the variant information associated with the edges with a logical AND. When propagating variant information in a backward direction through the topological graph, e.g., in an opposite direction relative to the respective connections of the model, the symbolic expression engine 126 may generate new variant information for the subject node by combining the variant information associated with the edges with a logical OR.

Figure 17:
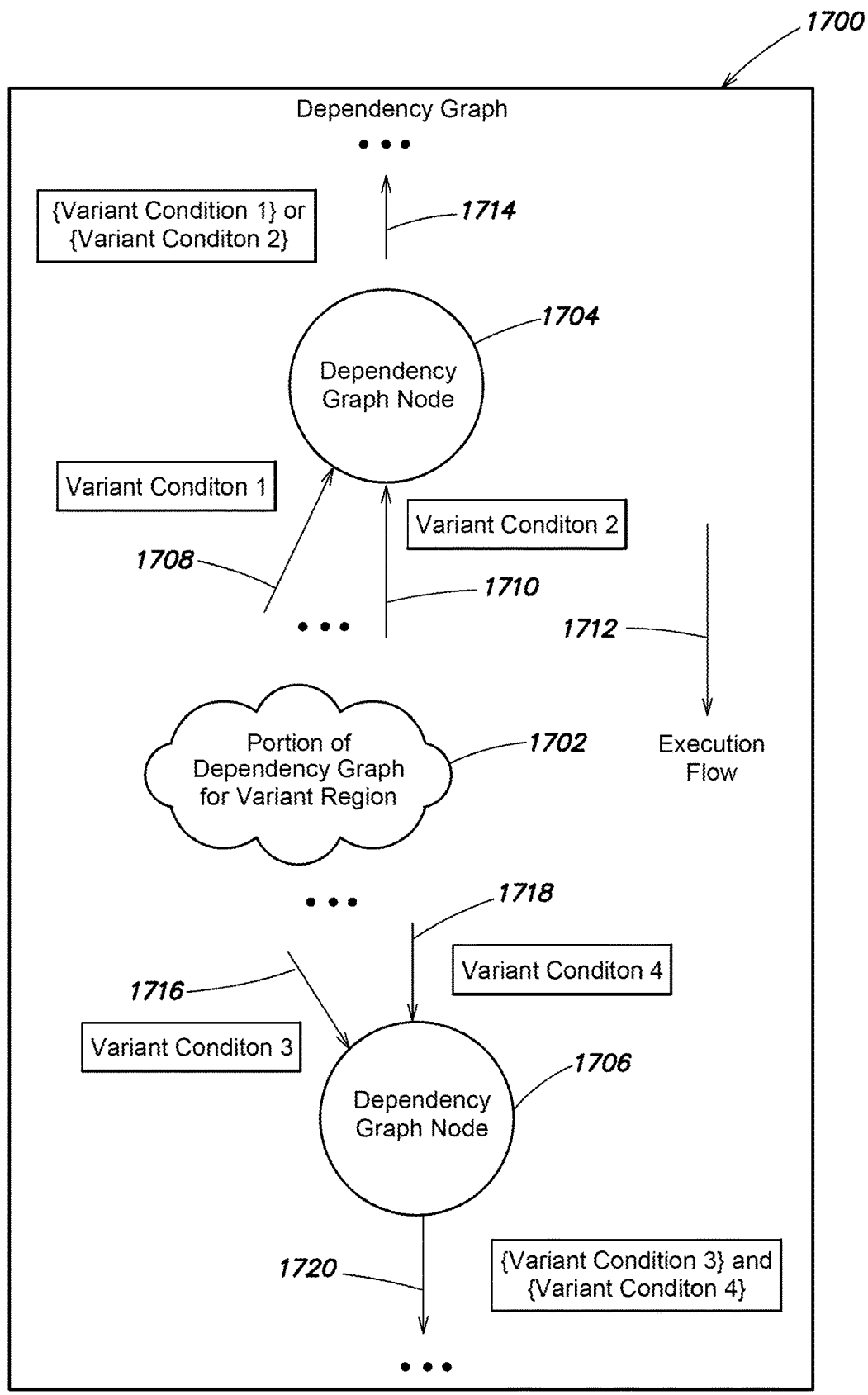
FIG. 17 is a schematic illustration of a dependency graph for a model in accordance with one or more embodiments.

FIG. 17 is a schematic illustration of a dependency graph 1700 that may be constructed for a model. The dependency graph 1700 may include a portion 1702 that corresponds to a variant region of the model, and nodes and edges corresponding to model elements and connections for a fixed, common algorithmic structure of the model. For example, the dependency graph may include a node 1704 representing a model element and another node 1706 representing another model element both of which may be located outside of the variant region 1702. Two edges 1708 and 1710 may lead to node 1704 from the variant region 1702 in a direction opposite an execution flow of the model as illustrated by arrow 1712. The two edges 1708 and 1710 may be annotated with different variant information, e.g., variant information 1 and variant information 2, respectively. As the variant information being propagated to node 1704 from the variant region 1702 is in a direction opposite the execution flow 1712, the symbolic expression engine 126 may generate new variant information for node 1704 using an OR operator. For example, the new variant information for node 1704 may be:

{variant information 1} OR {variant information 2}

This new variant information may be further propagated from node 1704 to other portions of the dependency graph 1700 as indicated by arrow 1714.

Two edges 1716 and 1718 may lead to node 1706 from the variant region 1702 in a direction along the execution flow 1712 of the model. The two edges 1716 and 1718 may be annotated with different variant information, e.g., variant information 3 and variant information 4, respectively. As the variant information being propagated to node 1706 from the variant region 1702 is along the direction of the model's execution flow 1712, the symbolic expression engine 126 may generate new variant information for node 1706 using an AND operator. For example, the new variant information for node 1706 may be:

{variant information 3} AND {variant information 4}

This new variant information may be further propagated from node 1706 to other portions of the dependency graph 1700 as indicated by arrow 1720.

The variant condition propagation engine 124 may continue propagating variant information through the dependency graph 1700 to portions that are outside of the variant region until there are no changes in the conditions associated with the nodes in the topology graph of the model.

Referring to FIG. 2B, after propagating the variant information outside of the variant region, the variant condition propagation engine 124 may assign the variant information propagated to the nodes of the topological graph to the model elements of the model associated with the respective nodes, as indicated at step 212. Processing may then be complete, as indicated by End step 214.

With variant information, such as variant conditions propagated to model elements disposed outside of a variant region of a model, the model may be executed and/or code may be generated for the model.

Model Execution/Code Generation

The execution engine 112 may generate an executable form of a model in order to execute it. This executable form may be for simulation or code generation. For example, the execution engine 112 may generate execution instructions that may be compiled and/or interpreted. In some embodiments, the generation of execution instructions, and the simulation of a model, such as the model 134, by the modeling environment 100 may involve multiple phases, such as an initialization phase, a simulation (or run) phase, zero, one or more reset phases, and a termination phase.

Model execution may involve processing input data and generating output data. As described, in some embodiments, execution of a model may be carried out over a time span, e.g., a simulation time, which may be user specified or machine specified. Simulation time is a logical execution time, and may begin at a simulation start time and end at a simulation end time. At successive points between the simulation start and end times inputs and outputs of model elements of the model may be computed. The points in time may be called simulation time steps, and the sizes of the time steps may be fixed or may vary. The sizes may be determined by the particular solver 120 selected and used in the execution of the model.

Model Compilation Phase

A compile stage may mark the start of execution of the model, and may involve preparing data structures, evaluating parameters, configuring and propagating block characteristics, determining block connectivity, and performing block reduction and block insertion. The preparation of data structures and the evaluation of parameters may result in the creation and initialization of one or more data structures for use in the compile stage. During the configuration and propagation of block and port/signal characteristics, the compiled attributes (such as data dimensions, data types, complexity, sample modes, and sample time) of each block and/or port/signal may be setup on the basis of the corresponding behaviors and the attributes of blocks and/or port/signal that are connected to the given block and/or port/signal, which connections may be graphically represented on the model through lines, arrows or other connectors. The attribute setup may be performed through a process during which block behaviors "ripple through" the model from one block to the next following signal, state, physical, message or other connectivity.

This process is referred to as inferencing. In the case of a block that has explicitly specified its block (or port) behaviors, inferencing helps ensure that the attributes of the block (or port) are compatible with the attributes of the blocks (or ports) connected to it. If not, a warning or an error may be issued. Secondly, in many cases, blocks (or ports) are implemented to be compatible with a wide range of attributes. Such blocks (or ports) may adapt their behavior in accordance with the attributes of the blocks (or ports) connected to them. The exact implementation of the block may be chosen on the basis of the model in which the block finds itself. Included within this step may be other aspects such as validating that all rate-transitions yield deterministic results, and that the appropriate rate transition blocks and/or delay blocks are being used. The compilation step also may determine actual block connectivity. For example, virtual blocks, which may play no semantic role in the execution of a model, may be optimized away, e.g., removed, and the remaining non-virtual blocks may be reconnected to each other appropriately. This compiled version of the design model with actual block connections may be used from this point forward in the execution process. The way in which blocks are interconnected in the model does not necessarily define the order in which the equations (e.g., included in methods) corresponding to the individual blocks will be solved (executed). These equations may include outputs equations, derivatives equations and update equations.

Block sample times may also be determined during the compilation stage. A block's sample time may be set explicitly, e.g., by setting a SampleTime parameter of the block, or it may be determined in an implicit manner based on the block's type or its context within the model. The SampleTime parameter may be a vector $[T_s, T_o]$ where $T_s$ is the sampling period and $T_o$ is the initial time offset.

The selected solver 120 may determine the size of the simulation time steps for the simulation of the model, and these simulation time steps may be selected to correspond with the sample times of the blocks of the model. When a simulation time step matches the sample time for a block, a sample time hit occurs, and the block is scheduled for execution during that simulation step.

The solvers 120 may include or access one or more schedulers that may generate execution lists for the blocks of the model. In particular, the schedulers may generate a block sorted order list and a method execution list. The schedulers may utilize one or more algorithms for generating the block sorted order and method execution lists. For example, a static scheduler may use the Rate Monotonic Scheduling (RMS), Earliest Deadline First Scheduling, Static Cyclic Scheduling, Round Robin Scheduling, or Deadline Monotonic Scheduling. A dynamic scheduler may use an event calendar to schedule future events, such as timeouts and alarms.

Link Phase

In the link stage, memory may be allocated and initialized for storing run-time information for blocks of the model.

Code Generation and Model Execution Phase

Following the model compilation and link stages, code may or may not be generated. For example, the code generator 108 and/or the model execution engine 112 may generate code for the model 134 or a portion thereof, and may execute this code during simulation of the model 134. If code is generated, the model may be executed through an accelerated execution mode in which the model, or portions of it, is translated into either software modules or hardware descriptions, which is broadly referred to herein as code. If this stage is performed, then the stages that follow may use the generated code during the execution of the model. If code is not generated, the model may execute in an interpretive mode in which the compiled and linked version of the model may be directly utilized to execute the model over the simulation time. The model may not be executed when code is generated for the model. Instead of executing the model within the modeling environment 100, the generated code may be compiled and deployed on a target device, such as a controller, test hardware, etc. Generated code may be stored in memory, e.g., persistent memory, such as a hard drive or flash memory.

Initialization Phase

During an initialization phase of model execution, implicit initialization operations and user-specified, e.g., explicit, initialization operations may be performed. Examples of implicit or explicit operations that may be performed during an initialization phase include calls to callbacks that that start Analog-to-Digital converters (ADC), Digital-to-Analog converters (DAC), actuators or other hardware or physical elements. Additional initialization operations include loading data from memory, reading sensor data, computing an initial condition, for example based on the sensor data, and setting an initial state of a model or model element, for example based on the computed initial condition. The initialization phase may occur once for a given execution of a model.

Run Phase

The run or simulation phase may follow the initialization phase. During the run phase, the model execution engine 112 may enter a simulation loop or iteration loop stage during which the execution engine 112 successively computes the states and outputs of the model elements at particular simulation time steps from the simulation start time to the simulation end time. At each step, new values for the model element's inputs, states, and outputs may be computed, and the model elements may be updated to reflect the computed values. The length of time between steps is called the step size. The step sizes depend on the type of solver 120 selected and used to simulate the model, the model's fundamental sample time, and whether the model's continuous states have discontinuities, such as zero crossings. The steps of the simulation or iteration loop may be repeated until the simulation end time is reached. At the end of the simulation time, the model reflects the final values of the model element's inputs, states, and outputs.

Reset Phase(s)

In some embodiments, the run phase may include no reset phases or it may include one or more reset phases. Explicit, e.g., user specified, reset operations may be performed during the reset phase. In some embodiments, the reset phase may additionally or alternatively include system-generated, e.g., implicit, reset operations.

Termination Phase

A termination phase may follow the run phase. During the termination phase, the model execution engine 112 may perform clean-up operations. For example, the execution engine 112 may release allocated memory, among other operations. In some embodiments, the termination phase may include explicit, e.g., user-specified, termination operations, which may be executed during the termination phase. Exemplary implicit or explicit operations that may be performed during the termination phase include downloading internal memory to persistent memory, such as a Non-Volatile Random Access Memory (NVRAM), turning off ADCs and DACs, and writing data out to data files and closing the data files. The termination phase may occur once during a given execution of a model.

Figure 3A:
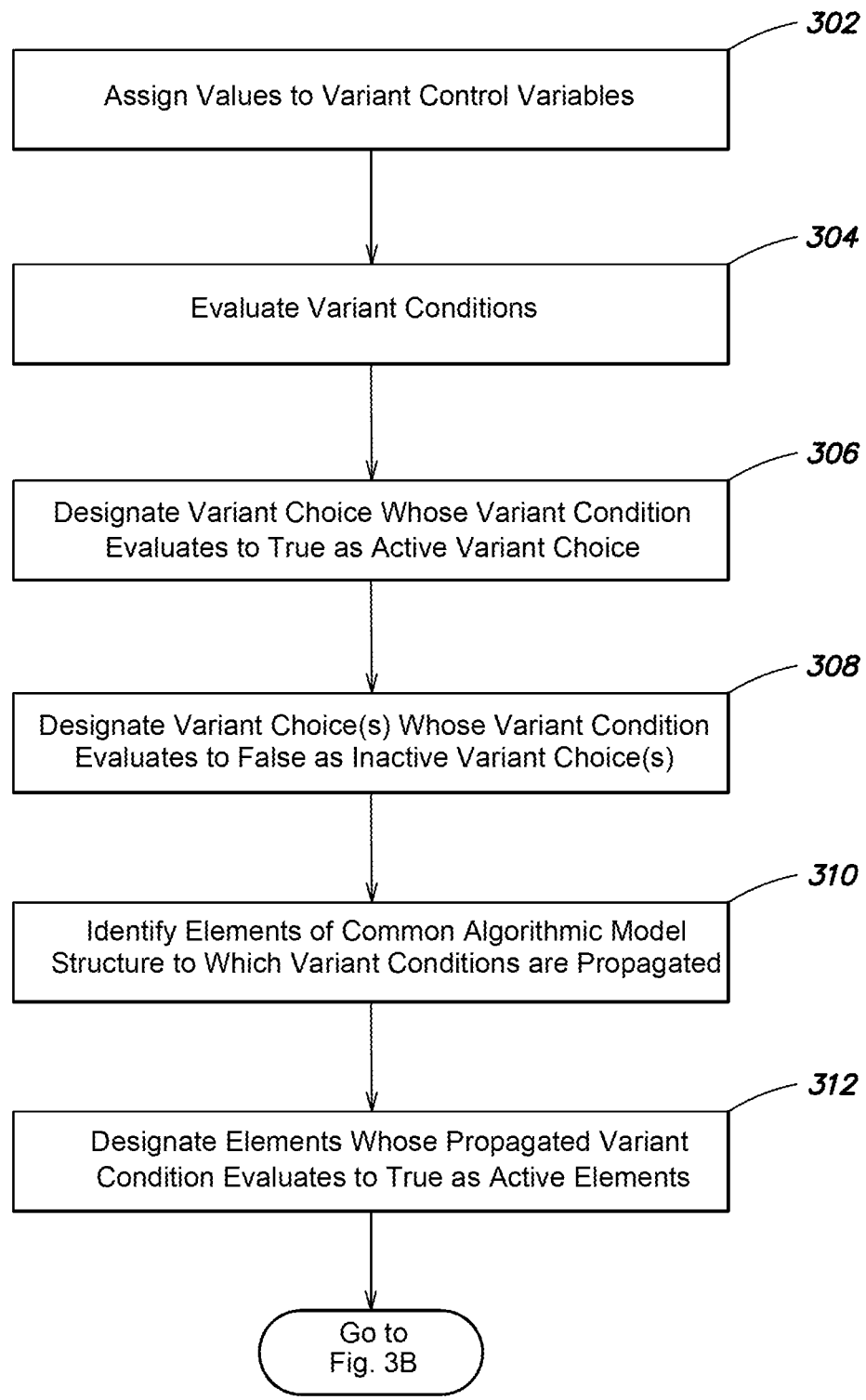
FIGS. 3A-3B are partial views of a flow diagram of an example method in accordance with one or more embodiments.
Figure 3B:
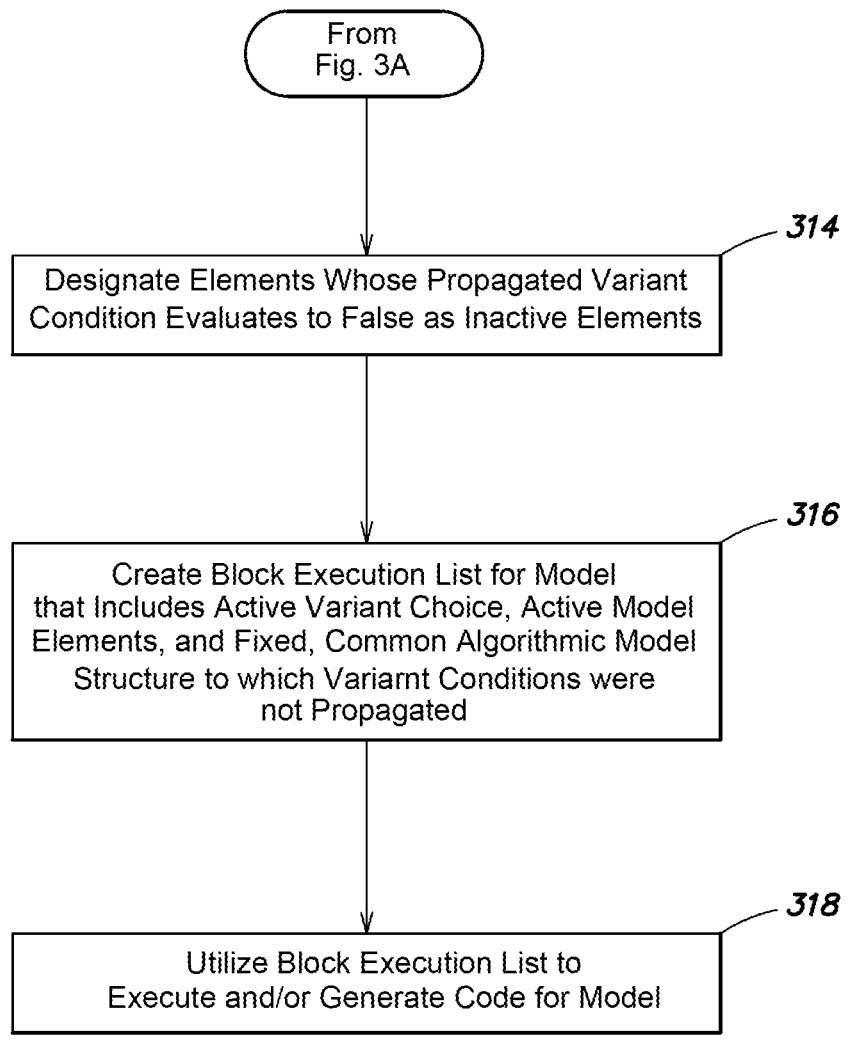

FIGS. 3A-3B are partial views of a flow diagram of an example method for executing and/or generating code for a model in accordance with an embodiment. The variant implementation system 114 may assign values to variant control variables, as indicated at step 302. The values may be provided by a user, for example through one or more graphical affordances. As described, variant conditions may be logical expressions used to identify an active variant, and may include one or more variant control variables. Values for variant control variables may be user-specified, for example in a workspace assigned to a model. For example, the modeling environment 100 may provide each model opened in the modeling environment 100, e.g., loaded from persistent memory into volatile memory, with its own model workspace that may be limited in scope to the respective model. Values for variables utilized by the model, such as variant control variables, may be stored in its model workspace. The UI engine 102 may present a graphical affordance, such as an interactive pane of a model editor window, listing variables defined for the model and through which a user may examine and set values for the model's variables.

The variant condition evaluation engine 128 may evaluate variant conditions specified for the model 134, as indicated at step 304. The evaluation may include variant conditions specified for the model's variant region as well as model elements outside of the variant region to which variant information was propagated. The variant condition evaluation engine 128 may designate the variant choice of the variant region whose variant condition evaluates to True as the active variant, as indicated at step 306, and designate the other variant choices whose variant conditions evaluate to False as inactive, as indicated at step 308. The variant propagation engine 124 may identify the model elements outside of the variant region to which variant information was propagated, as indicated at step 310. The variant condition evaluation engine 128 may designate model elements outside of the variant region whose variant condition evaluates to True as active model elements, as indicated at step 312. The variant condition evaluation engine 128 may designate model elements outside of the variant region to which variant conditions were propagated but which evaluate to False as inactive, as indicated at step 314 (FIG. 3B).

In some embodiments, the variant implementation system 114 may support two modes of variant choice selection. In an expression evaluation mode, a particular variant choice is selected as the active variant choice by the variant implementation system 114 based on an evaluation of the variant conditions. By changing one or more of the values of the variant control variables, a user may change which variant choice is active for a given simulation and/or generation of code. In an override mode, the variant implementation system 114 may receive a selection of the active variant choice, for example from the user. Labels may be associated with the variant choices, and a user may choose a particular variant choice as the active variant choice by selecting its label. In the override mode, the variant implementation system 114 may not evaluate or otherwise consider the variant conditions associated with the variant choices.

The model execution engine 112 during model execution, and/or the code generator 108 during code generation, may create a block execution list for the model that includes the active variant choice, the model elements outside of the variant region to which variant information was propagated and which are designated as active, and the model's common algorithmic structure, as indicated at step 316. The execution engine 112 and/or the code generator 108 may utilize the block execution list during model execution and/or code generation, as indicated at step 318.

Code generated for a model may be deployed on a physical system. For example, code may be deployed on one or more processors of an embedded system. The generated code may include one or more entry-point functions, and execution of the generated code may be invoked by calling the entry-point functions. For a single rate model, a step( ) function may defined in the generated code. The step( ) function may be periodically called, e.g., at the rate specified in the model. For a model having multiple rates, separate step( ) functions may be defined, e.g., one for each rate. The embedded system may implement the procedure and/or algorithm defined by the model.

Example Models

Figure 4:
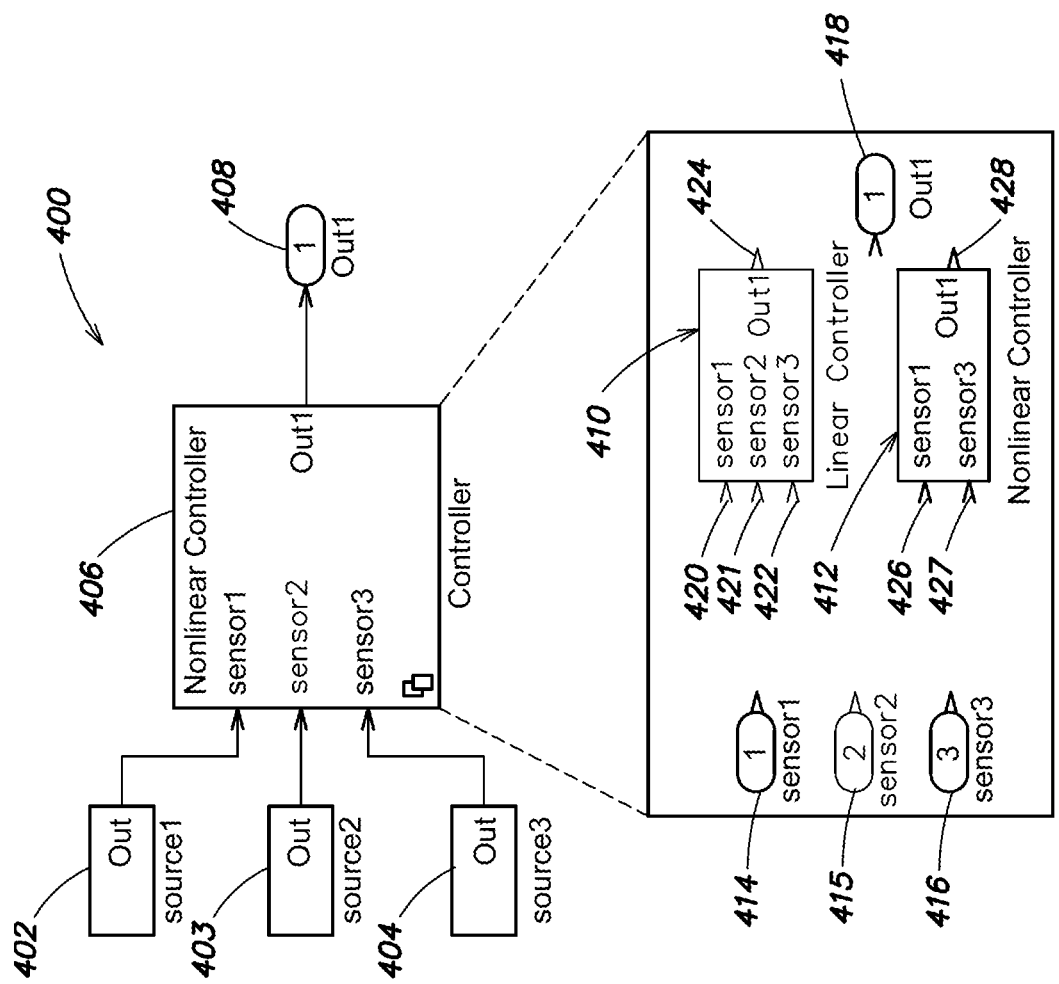
FIG. 4 is an illustration of an example model in accordance with one or more embodiments.

FIG. 4 is an illustration of an example model 400. The model 400 includes three source blocks 402, 403, and 404, labeled source1, source2, and source3, a Variant Subsystem block 406, labeled Controller, and an Outport block 408, labeled Out1. During execution of the model including model portion 400, the source blocks 402-404 may read signal information from hardware, e.g., sensors, or may model signal information using a set of dynamic systems to approximate the behavior of a physical system. The Controller block 406 may perform operations on the signals produced by the source blocks 402-404, compute a result, and write the result to the Outport block 408. The Outport block 408 block may be connected to one or more other model elements so that the computed result may be used by one or more other portions of the model. For example, the Outport block 408 may feed the result to another part of the model representing a larger system.

The Controller block 406 is a Variant Subsystem, and its contents consist of two variant choices 410 and 412, labeled 'Linear Controller' and the 'Nonlinear Controller', as shown in the expanded view of the Controller block 406. The Controller block 406 may also include three Inport blocks 414, 415, and 416, labeled 'sensor1', 'sensor2', and 'sensor3', and one Outport block 418 labeled 'Out1'. The Linear Controller variant choice 410 includes three input ports 420-422, which may be connected to the three Inport blocks 414-416, and one output port 424, which may be connected to the Outport block 418, when the Linear Controller variant choice 410 is active. The Nonlinear Controller variant choice 412 may include two input ports 426 and 427, which may be connected to the first and third Inport blocks 414 and 416, and an output port 428, which may be connected to the Outport block 418, when the Nonlinear Controller variant choice 412 is active. Inactive variant choices, such as the Linear Controller variant choice 410, may be visually represented by the UI engine 102 as grayed out.

The model 400 may be opened and presented in a model editor window, which may be generated by the UI engine 102, and presented on a display of a data processing system. The model editor window may include a plurality of user interface elements and/or windows elements (widgets), at least some of which may be operated by a user to open, construct, edit, run, and save a model, among other operations. For example, the model editor window may include a menu bar, a toolbar, and a canvas. The menu bar may include a plurality of commands, and the commands may be organized into drop-down categories, such as File, Edit, View, Display, etc. The toolbar may include a plurality of graphical command buttons for executing frequently used commands.

A graphical affordance, such as a window, may be opened that includes a listing of model element types contained in the model element library 106. A user may select particular model element types from the model element library 106, and add instances of the particular model element types to the canvas portion of the model editor window to construct or revise a model. The model may be a graphical, e.g., a block diagram, model, and at least some of the selected model elements may be graphical elements.

The model 400 is meant for explanation purposes and the present disclosure may be used with other models, such as larger and/or more complex models. The model 400 may be just a portion of a larger model.

Figure 5:
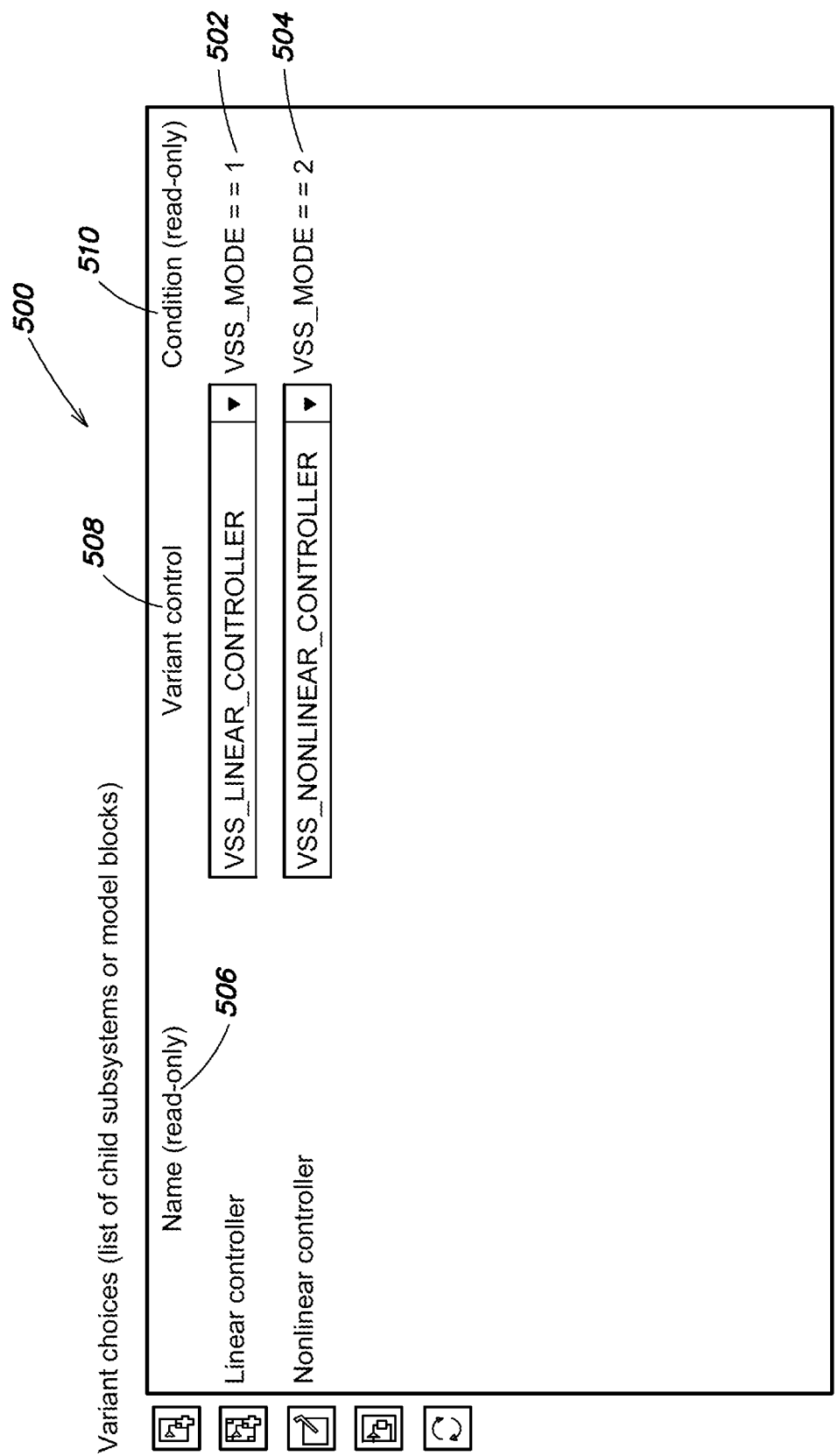
FIG. 5 is an illustration of an example graphical affordance in accordance with one or more embodiments.

FIG. 5 is a schematic illustration of an example user interface (UI) element 500 that may be presented by the UI engine 102 on a display of a workstation for specifying variant conditions. The UI element 500, which may be in the form of a dialog box, may be associated with the Controller block 406. The dialog box 500 includes two entries 502 and 504; one for each variant choice. For each entry 502 and 504, the dialog box 500 may include a name column 506 for indicating a name of the variant choice, and a variant control column 508 and a variant condition column 510 for indicating a Boolean expression that determines when the respective variant choice is active. In some cases, the Boolean expression for a variant choice may itself be provided in the variant control column 508. In other cases, the Boolean expression may be provided in the variant condition column 510, and the name of a data structure, such as an object, that stores, e.g., encapsulates, the Boolean expression may be provided in the variant control column 508. By storing a variant condition in a data structure, such as an object, it can be reused, for example in other models.

As indicated in the variant condition column 510, the variant conditions for the Linear Controller variant choice and the Nonlinear Controller variant both utilize a variant control variable named VSS_MODE. When the value of the variant control variable, VSS_MODE, is 1, the Linear Controller variant choice is active and the Nonlinear Controller is inactive, e.g., removed from execution. When the value of the variant control variable, VSS_MODE, is 2, the Nonlinear Controller variant choice is active and the Linear Controller variant choice is inactive. As illustrated, the variant condition for the linear controller variant choice is encapsulated in an object named VSS_LINEAR_CONTROLLER. The variant condition for the nonlinear controller variant choice is encapsulated in an object named VSS_NONLINEAR_CONTROLLER.

The variant implementation system 114 may connect the active variant choice to the Inport blocks 414-415 and the Outport block 418 of the Controller block 406.

As described, one or more graphical affordances may be used to indicate which variant choice is active. For example, inactive variant choices may be grayed out. It should be understood that other graphical affordances may be used.

The Controller block 406 may be configured such that, when the Nonlinear Controller variant choice 412 is active, it is only using Inport blocks 414 and 416, which correspond to the sensor1 and sensor3 signals. The Nonlinear Controller variant choice 412 may not use the Inport block 415, which corresponds to the sensor2 signal, which is provided by the second source block 403 labeled source2.

In some cases, this may result in an inefficiency operation of a computer or other data processing device and/or potential modeling error. For example, when the Nonlinear Controller variant choice is active, the source2 source block 403 should become inactive, e.g., removed from execution. However, this may require placing the source2 source block 403 in its own Variant Subsystem block.

Figure 6:
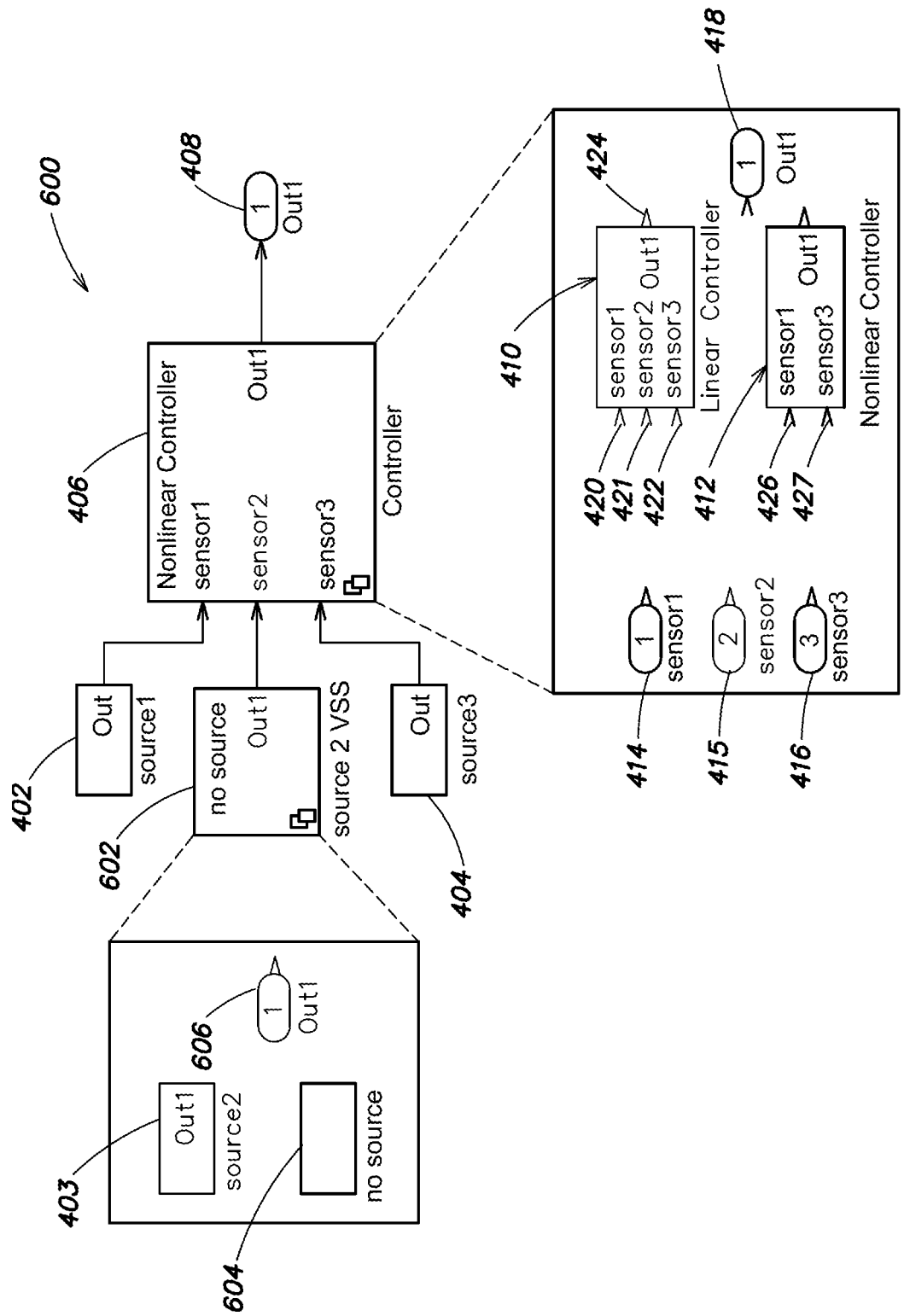
FIG. 6 is an illustration of an example model in accordance with one or more embodiments.

FIG. 6 is an illustration of an example model 600 with this modification. The model 600 includes a Variant Subsystem block 602 labeled 'source2 VSS', and it contains two variant choices. One variant choice includes the source2 source block 403, which is active when variant condition VSS_MODE==1 is True. The other variant choice is a source block 604 labeled 'no source', which may be an empty subsystem. The Variant Subsystem 602 may also contain an Outport block 606. This other variant choice may be active when variant condition VSS_MODE==2 is True. This setup ensures that, when the Nonlinear Controller variant choice is active, the source2 source block 403 within the source2 VSS Variant Subsystem block 602 is inactive, and no unnecessary work is done. Nonetheless, this process of having to specify variant conditions on dependent blocks such as the source2 source block 403 via a Variant Subsystem, e.g., the Variant Subsystem block 602, is error prone and time consuming to do. In addition, it also results in additional computer memory resources being consumed, and requires additional computer processing when executing the model 600.

Figure 7:
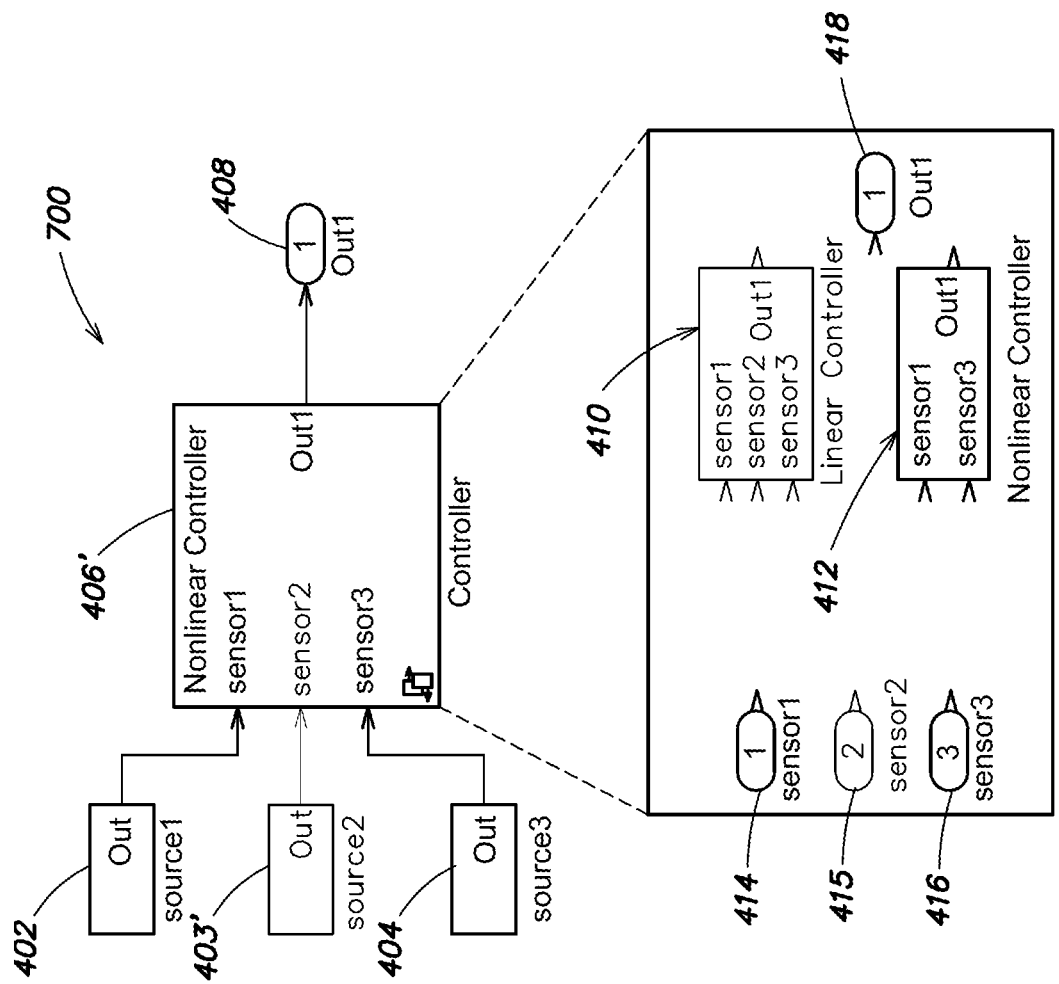
FIG. 7 is an illustration of an example model in accordance with one or more embodiments.

To address this situation, the variant propagation engine 124 may propagate variant conditions outside of a Variant Subsystem and/or Variant Submodel model element to one or more dependent model elements. FIG. 7 is an illustration of an example model 700 in which a variant condition has been propagated. The variant propagation engine 124 may propagate a variant condition out of a Controller Variant Subsystem block designed as 406' to distinguish it from block 406 to a source2 source block 403' to distinguish it from block 403. The variant condition propagation engine 124 may assign automatically the variant condition VSS_MODE==1 to the source2 source 403' block. As a result of the propagation of the variant condition, the variant condition evaluation engine 412 may only designate the source2 source block 403' as active when the 'Linear Controller' variant choice of the Controller Variant Subsystem block 406' is active.

The propagation of variant conditions outside of Variant Subsystem and/or Variant Submodel model elements may be automatic or it may be optional. When the propagation of variant conditions outside of variant component is optional, a parameter may be associated with the respective component. The value of this parameter may control whether the variant propagation engine 124 propagates variant conditions outside of a variant component. The value of this parameter may be user settable.

Figure 8:
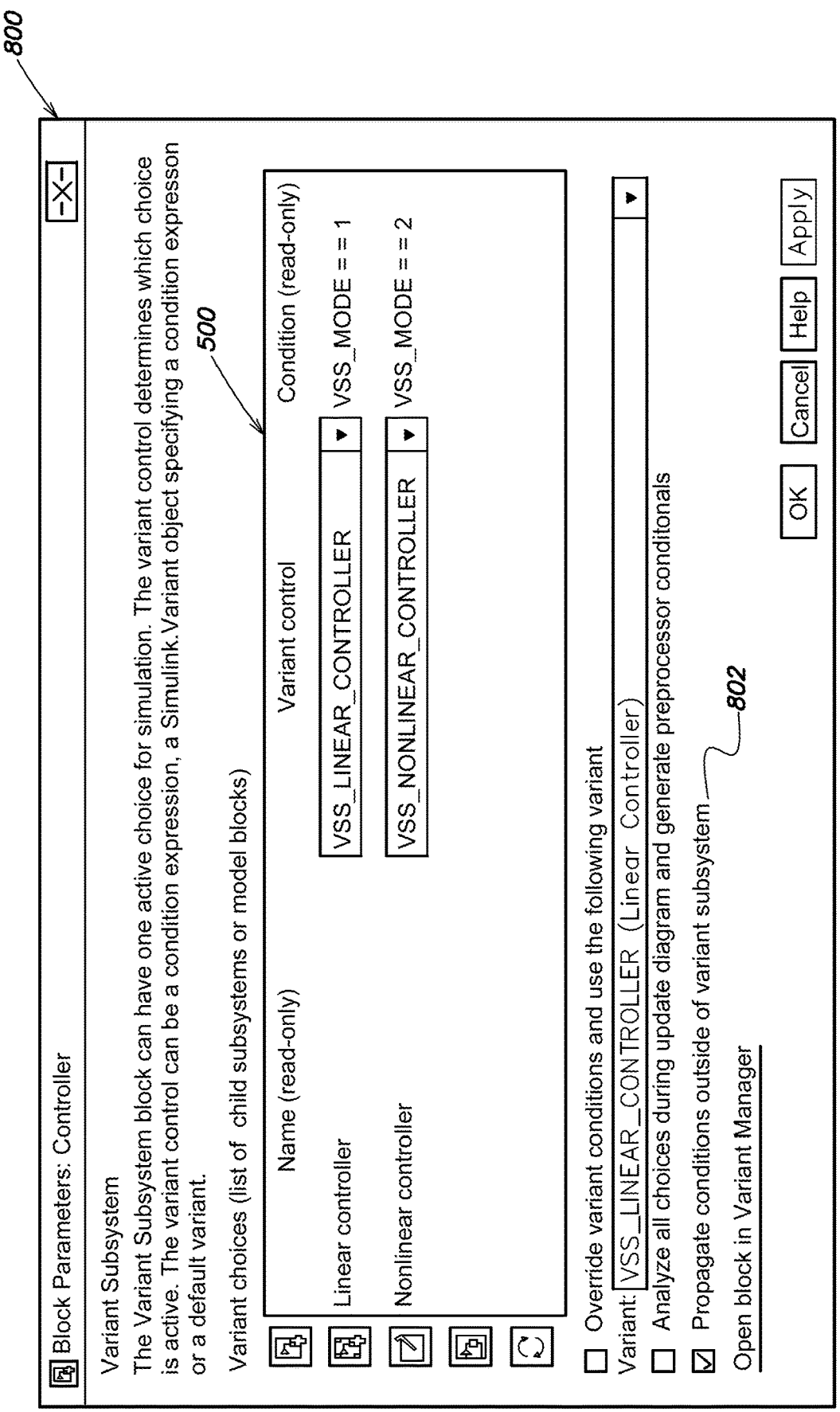
FIG. 8 is an illustration of an example graphical affordance in accordance with one or more embodiments.

FIG. 8 is a schematic illustration of an example User Interface (UI) element that may be presented by the UI engine 102 on a display of a workstation for indicating whether to propagate variant information outside of a variant region. The UI element 800, which may be in the form of a dialog box, may be associated with the Controller Variant Subsystem block 406', and may include the dialog box 500 used to specify variant conditions for the Controller Variant Subsystem block 406'. The dialog box 800 also may include a checkbox 802 labeled 'Propagate conditions outside of variant subsystem'. Checking the checkbox 802 may set the parameter to one value, e.g., 1, and unchecking the checkbox 802 may set the parameter to another value, e.g., 0. If the value of the parameter is 1, the variant condition propagation engine 124 may propagate variant conditions outside of the Controller Variant Subsystem block 406'. If the value of the parameter is 0, the variant condition propagation engine 124 may not propagate variant conditions outside of the Controller Variant Subsystem block 406'.

In the example dialog box 800 illustrated in FIG. 8, the Linear Controller variant choice is assigned the variant condition VSS_MODE==1, and the Nonlinear Controller variant choice is assigned the variant condition VSS_MODE==2. In addition, the 'Propagate conditions outside of the variant subsystem' checkbox 802 is selected. As a result, the variant propagation engine 124 propagates the variant condition VSS_MODE==1 from the Controller Variant Subsystem block 406' to the source2 source block 403'. When the variant control variable VSS_MODE is 1, the Linear Controller variant choice and the source2 source block 403' are both active, and the Nonlinear Controller variant choice is inactive, e.g., it is not part of the model execution or code generation. When the VSS_MODE is 2, the Nonlinear Controller variant choice is active, and both the Linear Controller variant choice and the source2 source block 403' are inactive, e.g., not part of the execution. The propagation of variant conditions outside of Variant Subsystem and/or Variant Submodel blocks, or any hierarchical node in a graphical program, may greatly improve the accuracy of the model, and may simplify model construction, for example because a user need not manually compute the variant condition to assign to dependent blocks such as the source2 source block 403'.

As indicated, the variant condition propagation engine 412 may propagate variant conditions backwards and forwards through a model, for example relative to a block execution order of the model, to the model elements connected to a variant component. This may be at the input and/or output side of a variant component, if the semantics of the model have a notion of source and destination, for example of signal and/or data lines in the model. If the semantics of the model are physical, such as in electrical circuits or mechanical block diagrams, the lines between model elements may not have direction. In this case, the variant condition propagation engine 124 may propagate variant conditions to all sides of variant components.

Figure 9:
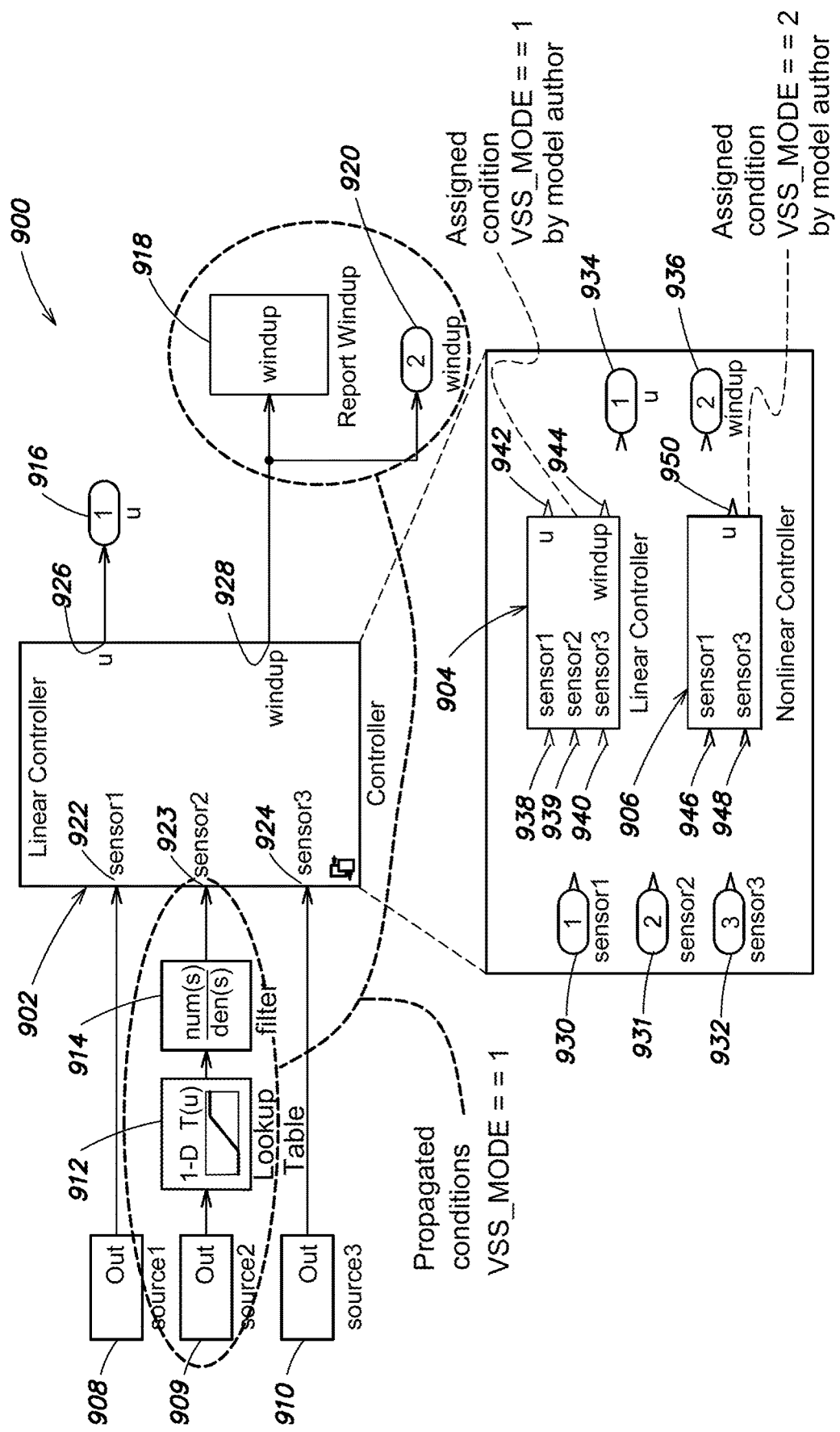
FIG. 9 is an illustration of an example model in accordance with one or more embodiments.

FIG. 9 is an illustration of an example model 900 that includes a Variant Subsystem block 902 labeled Controller that contains two variant choices: a Linear Controller variant choice 904, which is associated with the variant condition VSS_MODE==1, and a Nonlinear Controller variant choice 906, which is associated with the variant condition VSS_MODE==2. The association of variant conditions with the variant choices may be established when constructing the model 900, which may be done using either a command-line, e.g., textual Application Programming Interface (API) or a graphical affordance, such as a dialog, that allows a user define the variant condition for each variant choice, which dialog may be similar to the dialog 800.

The model 900 may also include three source blocks 908, 909, and 910, labeled 'source1', 'source2', and 'source3', respectively, a Lookup table block 912, a filter block 914, an Outport block 916 labeled 'u', a subsystem block 918 labeled 'Report Windup', and another Outport block 920 labeled 'windup'. The Controller Variant Subsystem block 902 may include three input ports 922, 923, and 924 labeled 'sensor1', 'sensor2', and 'sensor 3', respectively, and two output ports 926 and 928 labeled 'u' and 'windup', respectively.

The Controller Variant Subsystem block 902 may further include three Inport blocks 930, 931, and 932, labeled 'sensor1', 'sensor2', and 'sensor3', respectively, an Outport block 934 labeled 'u', and another Outport block 936 labeled 'windup'. The Linear Controller variant choice 904 may include three input ports 938-940, which may be connected to the three Inport blocks 930-932, and two output ports 942 and 944, which may be connected to the two Outport blocks 934 and 936, when the Linear Controller variant choice 904 is active. The Nonlinear Controller variant choice 906 may include two input ports 946 and 948, which may be connected to the first and third Inport blocks 930 and 932, and an output port 950, which may be connected to the Outport block 934, when the Nonlinear Controller variant choice 906 is active.

If the Controller Variant Subsystem 902 is manually configured for propagation of variant condition, or if the variant implementation system 114 is automatically propagating variant conditions out of variant components, then the variant condition propagation engine 124 may propagate the variant condition VSS_MODE==1 to the source2 source block 909, the Lookup Table block 907, and the filter block 911, because the model topology analyzer 122 determines that these blocks are only required when the Linear Controller variant choice is active, which occurs when VSS_MODE==1. Likewise, the variant propagation engine 124 may propagate the variant condition VSS_MODE==1 to the Report Windup subsystem block 914 and the windup Outport block 916, because the model topology analyzer 122 determines that only the Linear Controller variant choice is connected to the windup Outport block 924 within the Controller Variant Subsystem block 902, and the Linear Controller variant choice is associated with the variant condition VSS_MODE==1.

As described, the propagation of variant conditions may be performed by converting a model, such as a block diagram, to a topological graph, and initializing the graph with known variant information. The topological graph may be directed or undirected. For time-based block diagrams such models created and/or run in the Simulink® model-based design environment, the topological graph may be directed.

For example, considering the model 900 of FIG. 9, the edge in the directed graph corresponding to the sensor 1 input 922 of the Controller Variant Subsystem block 902 may be assigned the condition "true" by the model topology analyzer 122, to indicate it is always required. The edge corresponding to the sensor2 input 923 of the Controller Variant Subsystem block 902 may be assigned the variant condition VSS_MODE==1 by the model topology analyzer 122. The edge corresponding to the sensor3 input port 924 may be assigned the condition "true" by the model topology analyzer 122. Similarly, the edge corresponding to the 'u' output port 926 may be assigned the condition "true" by the model topology analyzer 122. Finally, the edge correspond to the windup port 928 may be assigned the variant condition "VSS_MODE==1".

The next step in the propagation may be to loop transferring information, e.g., variant information, from the edges for the ports of the Controller Variant Subsystem block 902 to the nodes of the directed graph that correspond to model elements of the model 900 that are outside of the Controller Variant Subsystem block 902. In the model 900 for example, the VSS_MODE==1 variant information may be propagated by the variant condition propagation engine 412 to the filter block 914 from the edge of the directed graph for the sensor2 input port 923. The VSS_MODE==1 variant information may also be propagated to both the Report Windup subsystem 918 and the windup Outport block 920 by the variant condition propagation engine 124. Next, the VSS_MODE==1 variant information may be assigned to the edge of the directed graph corresponding to the input of the filter block 914, and may then be propagated to the Lookup Table block 912 by the variant condition propagation engine 124. This process of following the edges of the directed graph to nodes corresponding to model elements of the model 900 may be repeated, thereby assigning the variant conditions to the source2 source block 909. Similarly, the "true" condition may be propagated by the variant condition propagation engine 124 to the other blocks corresponding to the respective nodes in the directed graph.

Figure 80:
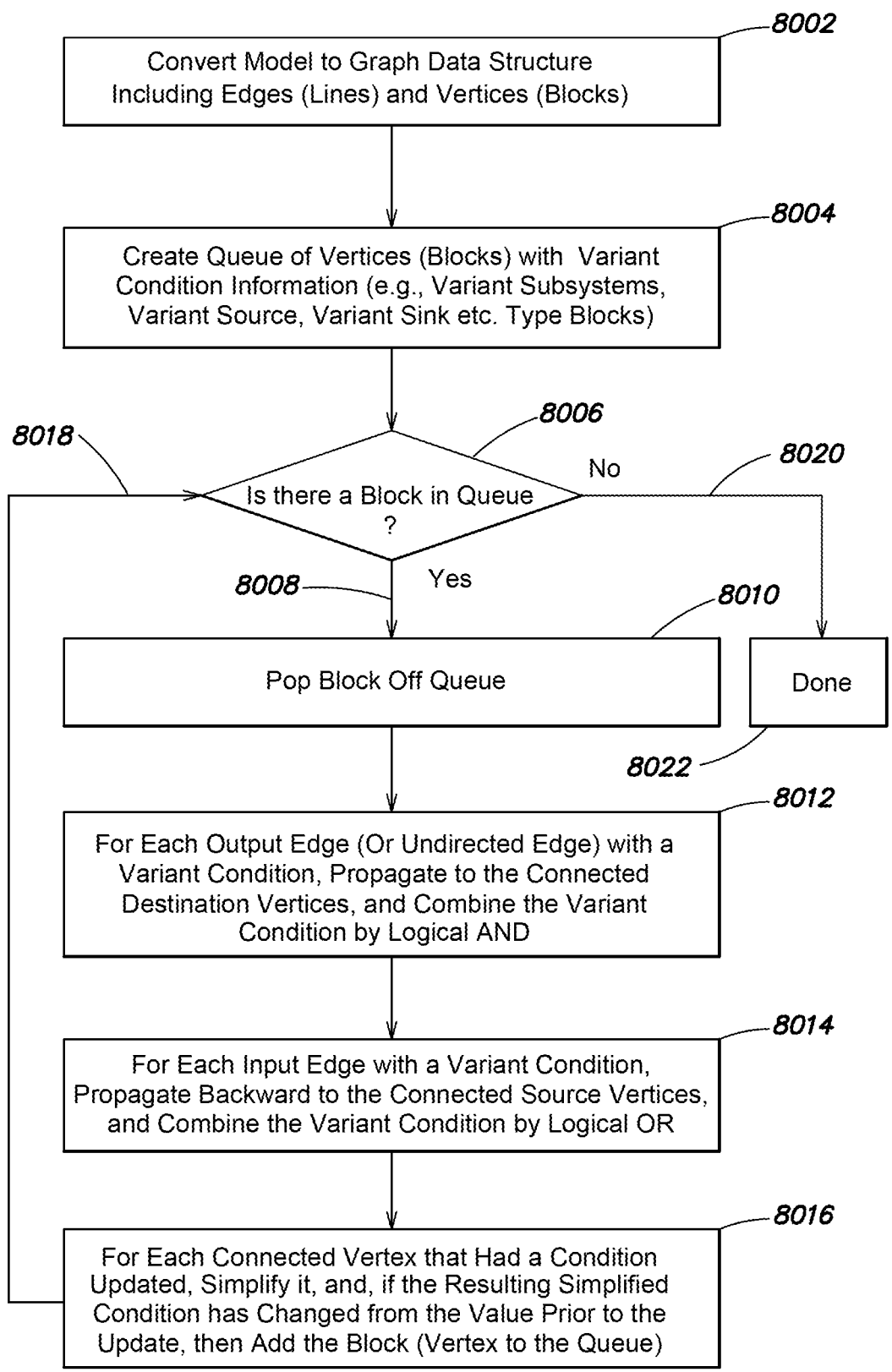
FIG. 80 is a flow chart of an example method in accordance with one or more embodiments.

FIG. 80 is a flow diagram of an example method for propagating variant conditions. A block diagram/model may first be converted to a directed or undirected graph, as indicated at step 8002. Each vertex of the graph may represent a single block, though a vertex could represent a hierarchical layer, such as a subsystem, in which case, the contents of the vertex would be another graph. After creating the graph, a queue may be created, and all vertices with variant condition expression information, such as those corresponding to Variant Subsystems, Variant Source blocks, Variant Sink blocks, and similar blocks may be added to the queue, as indicated at step 8004. A common characteristic of the blocks added to the queue at this step is that they have variant conditions on the output or input ports of the blocks. For example, a Variant Subsystem block will have information when an option is selected to propagate variant conditions outside of the Variant Subsystem. Next, a loop may be entered that starts by determining if there is a block in the queue, as indicated at decision step 8006. If so, a block may be popped off the queue, as indicated by Yes arrow 8008 leading to step 8010. Then, conditions may be propagated forward and backwards, as indicated at steps 8012 and 8014. If the conditions on a connected block were updated, the connected block is added to the queue (if it is not already present in the queue), as indicated at step 8016. This process may be repeated, as indicated by arrow 8018, until there are no more blocks in the queue, as indicated by No arrow 8020 leading to Done step 8022. Note, for subsystems, when variant conditions are propagated, the same algorithm may be used within the subsystem.

Specifying Values for Inactive Outputs of Variant Subsystems/Submodels

In some cases, the propagation of variant conditions outside of Variant Subsystem and/or Variant Submodel blocks may not be desirable. In such cases, it may be advantageous to be able to specify the value of outputs of Variant Subsystem and/or Variant Submodel blocks when the corresponding variant choice is inactive, for example to reduce memory consumption by the computer and/or data processing system and/or to increase execution speed.

In some embodiments, a Variant Subsystem and/or Variant Submodel block may be defined to include multiple output ports, which may be represented within the Subsystem or Submodel block as Outport blocks. These Outport blocks may provide information, such as data, to model elements of the model's common algorithmic structure during execution of the model. In some cases, one or more of the variant choices contained in the Variant Subsystem and/or Variant Submodel may not be connected to one or more of the Outport blocks. By default, a modeling environment may treat such an unconnected Outport block as grounded, and may assign it a predetermined value, e.g., 0. Such behavior, however, may sometimes be undesirable.

In one or more embodiments, a selected value may be specified for an Outport block of a Variant Subsystem and/or Variant Submodel. A variant hierarchical layer, such as a Variant Subsystem or a Variant Submodel, may have multiple choices. For example a Variant Subsystem may contain a subsystem labeled 'choice1' and a subsystem labeled 'choice2'. At most one choice is active. During execution of the model, the specified value may be output when the Outport block is unconnected by the active variant choice or when there is no active variant choice of the hierarchical layer. When there is no active choice or the active choice does not have a connection to the Outport block of the variant hierarchical layer, then the specified value may be used.

Figure 10:
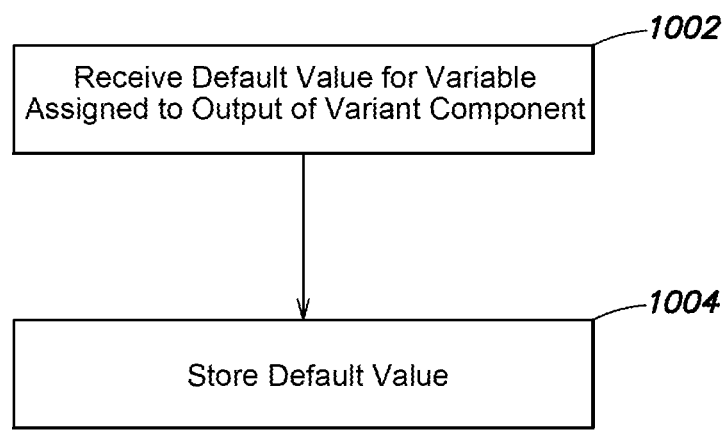
FIG. 10 is a flow diagram of an example method in accordance with one or more embodiments.
Figure 11:
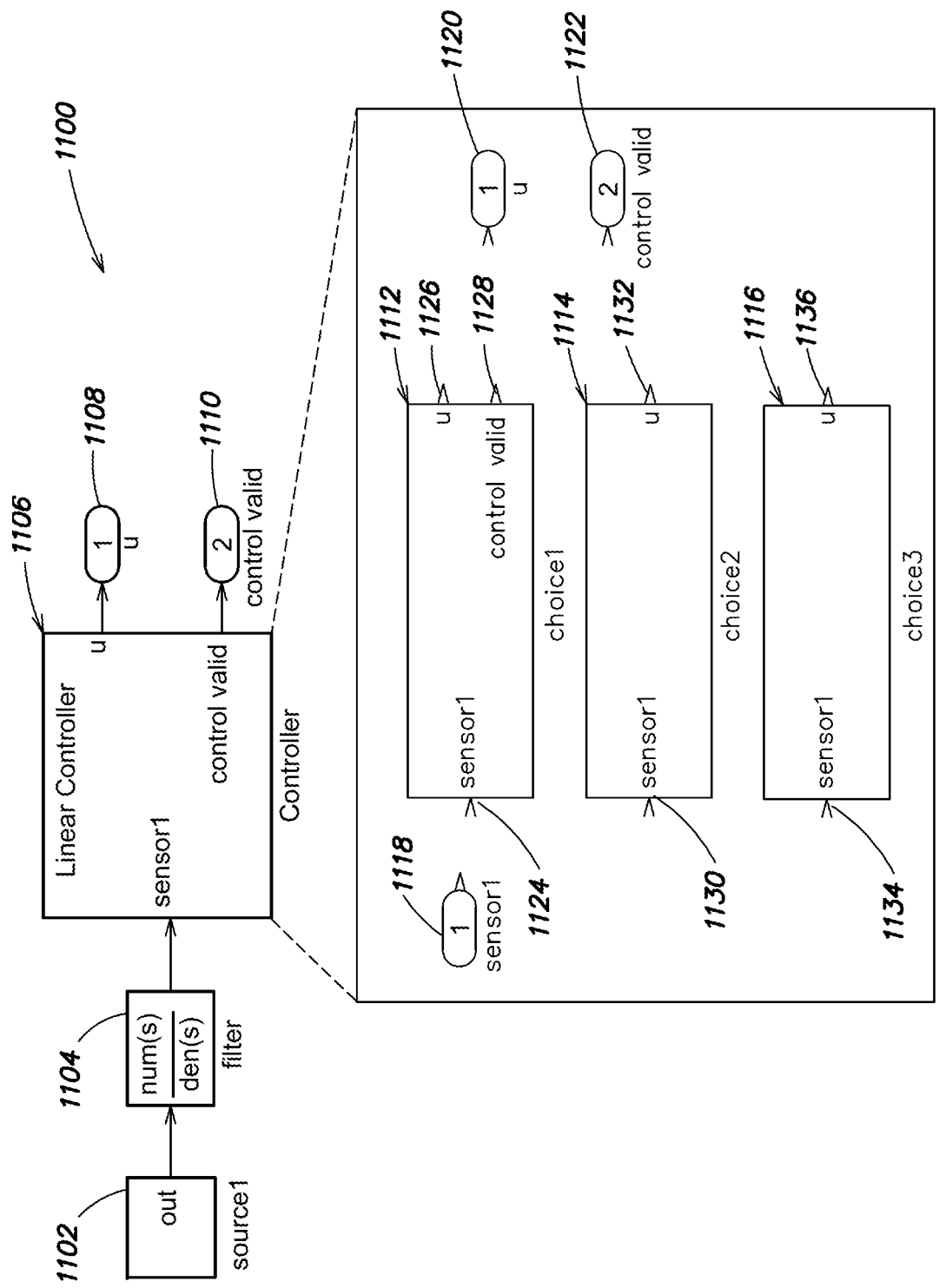
FIG. 11 is an illustration of an example model in accordance with one or more embodiments.

FIG. 10 is a flow diagram of an example method in accordance with an embodiment. The output variable assignment engine 130 may receive a default value for a variable of an output of a variant component of a model, as indicated by step 1002. The output may be an output port of the variant component, an Outport block or other model element, etc. The output variable assignment engine 130 may store the default value for the variable in memory, as indicated at step 1004. The output variable assignment engine 130 may utilize the default value during execution of and/or code generation for the model FIG. 11 is an illustration of an example model 1100. The model 1100 may include a source block 1102 labeled 'source1', a filter block 1104, a Variant Subsystem block 1106 labeled 'Controller', a Outport block 1108 labeled 'u', and another Outport block 1110 labeled 'control valid'. The Controller Variant Subsystem block 1106 may contain three variant choices 1112, 1114, and 1116 labeled 'choice1', 'choice2', and 'choice3', respectively. The Controller Variant Subsystem block 1106 also may include an Inport block 1118 labeled sensor1, and two Outport blocks 1120 and 1122 labeled 'u' and 'control valid', respectively. The choice1 variant choice 1112 may include an input port 1124 labeled sensor1, and two output ports 1126 and 1128 labeled 'u' and 'control valid'. The choice2 variant choice 1114 may include an input port 1130 labeled 'sensor1' and an output port 1132 labeled 'u'. The choice3 variant choice 1116 may include an input port 1134 labeled 'sensor1' and an output port 1136 labeled 'u'. Each variant choice 1112, 1114, and 1116 may be assigned a variant condition, such as variant conditions, V==1, V==2, and V==3 respectively, for example using a dialog box associated with the Controller Variant Subsystem block 1106 or a command line API. If variant choice choice1 1112 is active, then the sensor1 input port 1124 is connected to the sensor1 Inport block 1118, which in turn is connected to the filter block 1104, which is connected to the source1 source 1102 block. The outputs of variant choice choice1 1126 and 1128 may be fed to the 'u' Outport block 1108 and the 'control valid' Outport block 1110. Since variant choice choice1 1112 is active, variant choice choice2 1114 and variant choice choice3 1116 may be removed from execution of the model and/or code generation for the model.

Suppose variant choice choice2 1114 is active. Its sensor1 input port 1130 is connected to the sensor1 Inport block 1118 and its 'u' output port 1132 is connected to the 'u' Outport block 1120. The control valid Outport block 1122 has no input connection. As noted, in some prior systems, such unconnected ports are considered Grounded, e.g., set to zero. The output variable assignment engine 130 however, may allow the value of the control valid Outport block 1122 to be controlled, e.g., set to a desired values, such as 1. This desired operation of the model 1100 might be achieved by adding an Outport block labeled control valid within variant choice choice2, and feeding it, e.g., using a Constant block, with value of 1. However, if variant choice choice3 1116 is active, then this same pattern including the additional Outport block and the Constant block may need to be redundantly repeated for variant choice choice3 1116. Requiring such redundant patterns or specifications can be error prone. In addition, redundant patterns can waste memory resources of a computer or data processing system and/or processing resources, for example by requiring the allocation and use of addition memory locations.

In some embodiments, the present disclosure may introduce a model semantic for defining values of output ports on Variant Subsystem and/or Variant Submodel model elements, when the active choice is not feeding any value to the corresponding Outport block, thereby avoiding these disadvantages. The desired values may be user settable, for example through one or more graphical affordances and/or textually, e.g., through an API.

Figure 12:
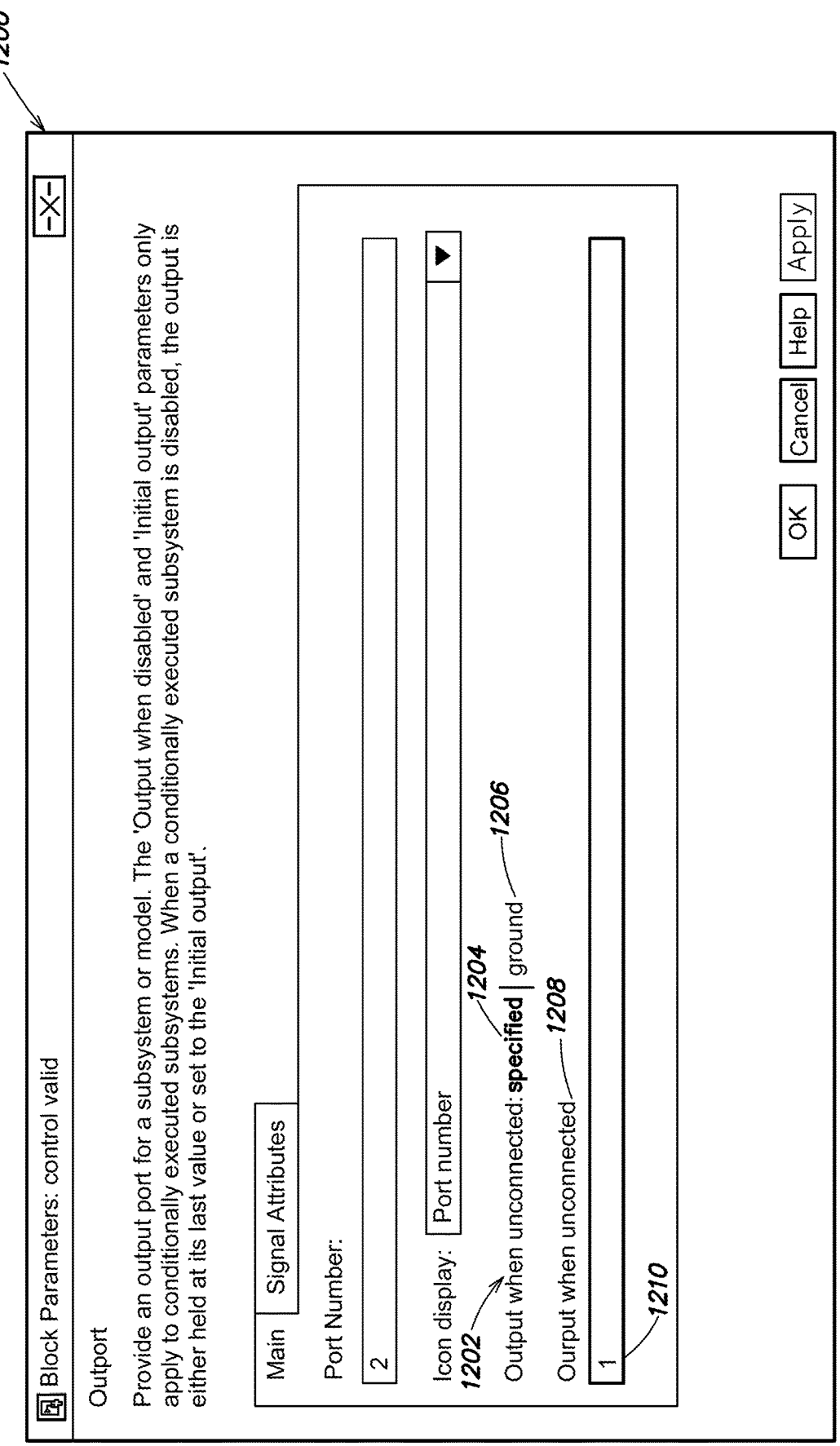
FIG. 12 is an of an example graphical affordance in accordance with one or more embodiments.

FIG. 12 is a schematic illustration of an example User Interface (UI) element 1200 that may be presented by the UI engine 102 on a display of a workstation for specifying default values for outputs of a Variant Subsystem and/or Variant Submodel model element. The UI element 1200, which may be in the form of a dialog box, may be associated with the model element for which the default value is being specified, e.g., the control valid Outport block 1110 and/or the control valid Outport block 1122. The dialog box 1200 may include a data entry field 1202 labeled 'Output when unconnected' for specifying one of two values for a block parameter. The two alternative values for the 'output when unconnected' block parameter may be 'specified' 1204 and 'ground' 1206. The second block parameter, which may be called 'Output when unconnected' 1208 may be set using a data entry box 1210. A desired value, e.g., 1, may be entered in the data entry box 1210. A desired value may be specified using the data entry box 1210 when the 'Output when unconnected' block parameter 1202 is set to 'specified' 1204.

It should be understood that other names for the block parameter besides 'Output when unconnected' may be used. For example, another name for the block parameter is 'output when source is unconnected'.

It should also be understood that these two options of specifying a value when inactive could be reduced to one block parameter. The specification may also be done via a programmatic API instead of a dialog box. Another mechanism to specify the 'output when unconnected' block parameter is to use a model elements, e.g., blocks, instead of a dialog entry.

Figure 13:
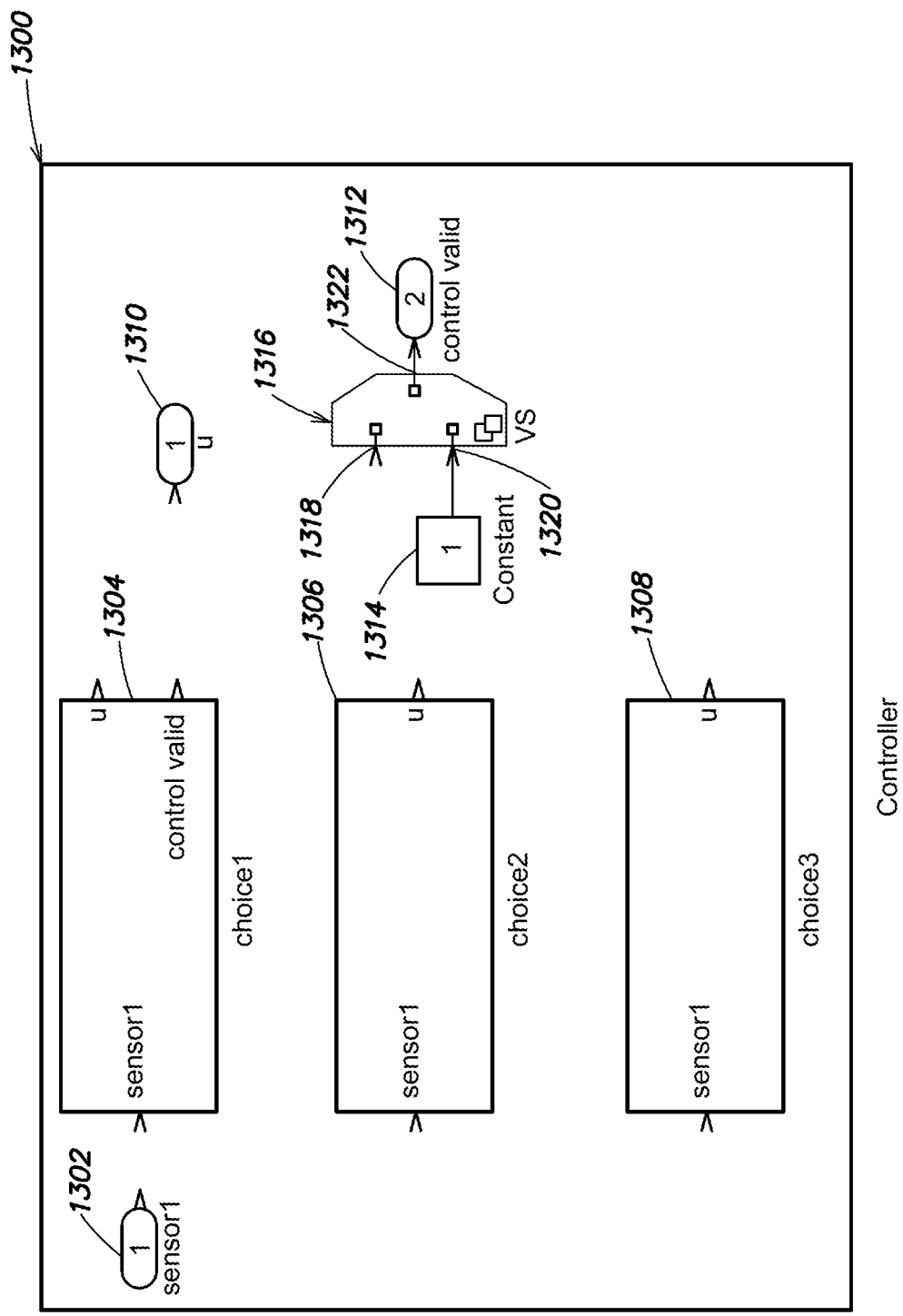
FIG. 13 is an illustration of an example model in accordance with one or more embodiments.

FIG. 13 is an illustration of an example model 1300 in which model elements are used to specify the value for an output port. The model 1300 includes an Inport block 1302 labeled sensor1, three variant choices 1304, 1306, and 1308 labeled 'choice1', 'choice2', and 'choice3', two Outport blocks 1310 and 1312 labeled 'u' and 'control valid', a Constant block 1314, and a Variant Selector block 1316 labeled 'VS'. The VS Variant Selector block 1316 has two input ports 1318 and 1320 and one output port 1322. The output port 1322 of the VS Variant Selector block 1316 is wired to the control valid Outport block 1312.

The first input port 1318 of the Variant Selector block 1316 may be automatically wired up to the active variant choice, for example by the variant implementation unit 1114, if the active choice has a correspondingly named Outport port. If there is no correspondingly named Outport of the active variant choice, then the value specified by the one or more blocks wired to the second input port 1320 to the Variant Selector block 1316, e.g., the Constant block 1314, is used to feed the control valid Outport block 1312.

The VS (Variant Source) block 1316 may be configured to activate its first input port 1318, when the active variant choice has an Outport with the corresponding name as the first input port 1318. In this case, the output of the active variant choice will feed the control valid Outport block 1312. The second input port 1320 of the VS block is active when the active variant choice does not write a value to the Outport block 1312, i.e., in this example, does not have an Outport named 'control valid'. In this example, the value at the second input port 1320 of the VS block 1316 is the Constant block 1314, which is set to the value 1. For example, if variant choice choice2 1306 is active, then the control valid Outport block 1312 will be fed a value of 1 by the Constant block.

Figure 14:
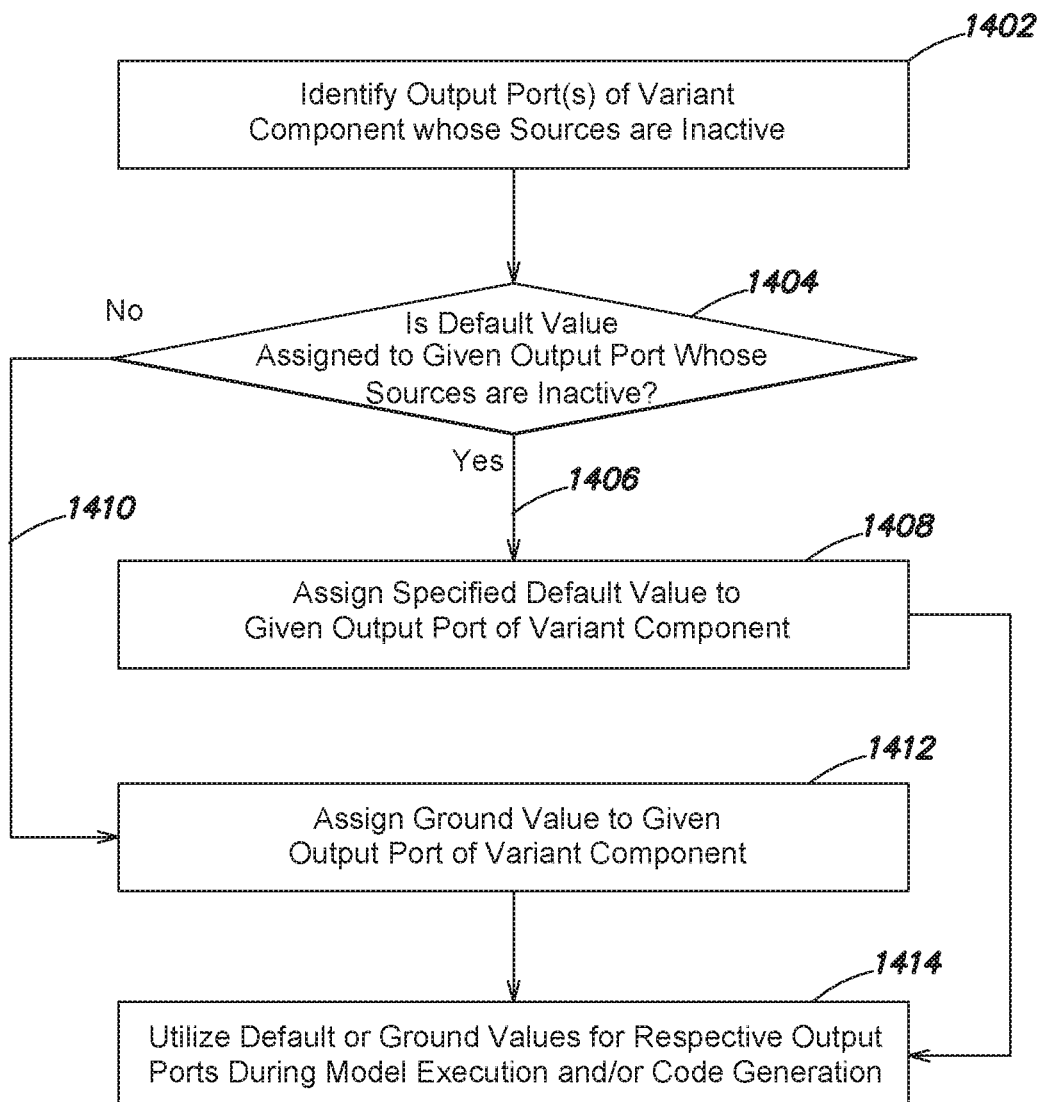
FIG. 14 is a flow diagram of an example method in accordance with one or more embodiments.

FIG. 14 is a flow diagram of an example method for executing models and/or generating code where values are specified for inactive outputs of variant components. A variant component may include zero, one, or more output ports. When the variant component is opened, Outport blocks may be presented in the variant component, and each Outport block may correspond to one of the variant component's output ports. The Outport blocks may be assigned names that correspond to respective data and/or control variables, such as signals, defined for the variant component. The variant implementation system 114 may identify those output ports of a variant component whose sources are inactive, as indicated at step 1402. The variant implementation system 114 may analyze the active variant choice, and determine whether it includes a data and/or control variable, e.g., a signal, that matches the name of a respective Outport block. If so, the respective Outport block may be deemed active. If not, the respective Outport block may be deemed inactive.

For a given output port whose source is inactive, the variant implementation system 114 may determine whether a default value is assigned to the given output port, as indicated at decision step 1404. If a default value is assigned, the default value may be output at the given output port, as indicated by Yes arrow 1406 leading to step 1408. If a default value is not assigned to the given output port, the given output port may be configured to output a ground value, such as 0, as indicated by No arrow 1410 leading to step 1412. Steps 1404-1412 may be repeated for each identified output port, e.g., each output port whose source is inactive. The execution engine 112 and/or the code generator 108 may utilize the default or ground values for the output ports of the variant component during simulation, e.g., execution, of and/or code generation for the model, as indicated at step 1414.

Propagation of Variant Conditions where there can be One of Zero Active Variant Controls, Propagation Along Non-Signal (Line) Boundaries, or Propagation Through Systems Allowing Zero Active Variant Controls to Remove Sections of Models As described, in prior modeling environments that support variants, one variant choice must be determined to be the active variant choice either by having its variant condition evaluate to True or by being designated the default variant choice. For example, one variant choice of a variant region may be designated as the default variant choice for that variant region. If none of the variant conditions associated with the variant choices evaluates to True, then the variant choice marked as the default variant choice is considered the active variant choice, and the other variant choices are considered inactive. Accordingly, with the prior modeling environments, there is always one variant choice of a variant region that is active, and thus the variant region is not removed from the model.

Figure 18A:
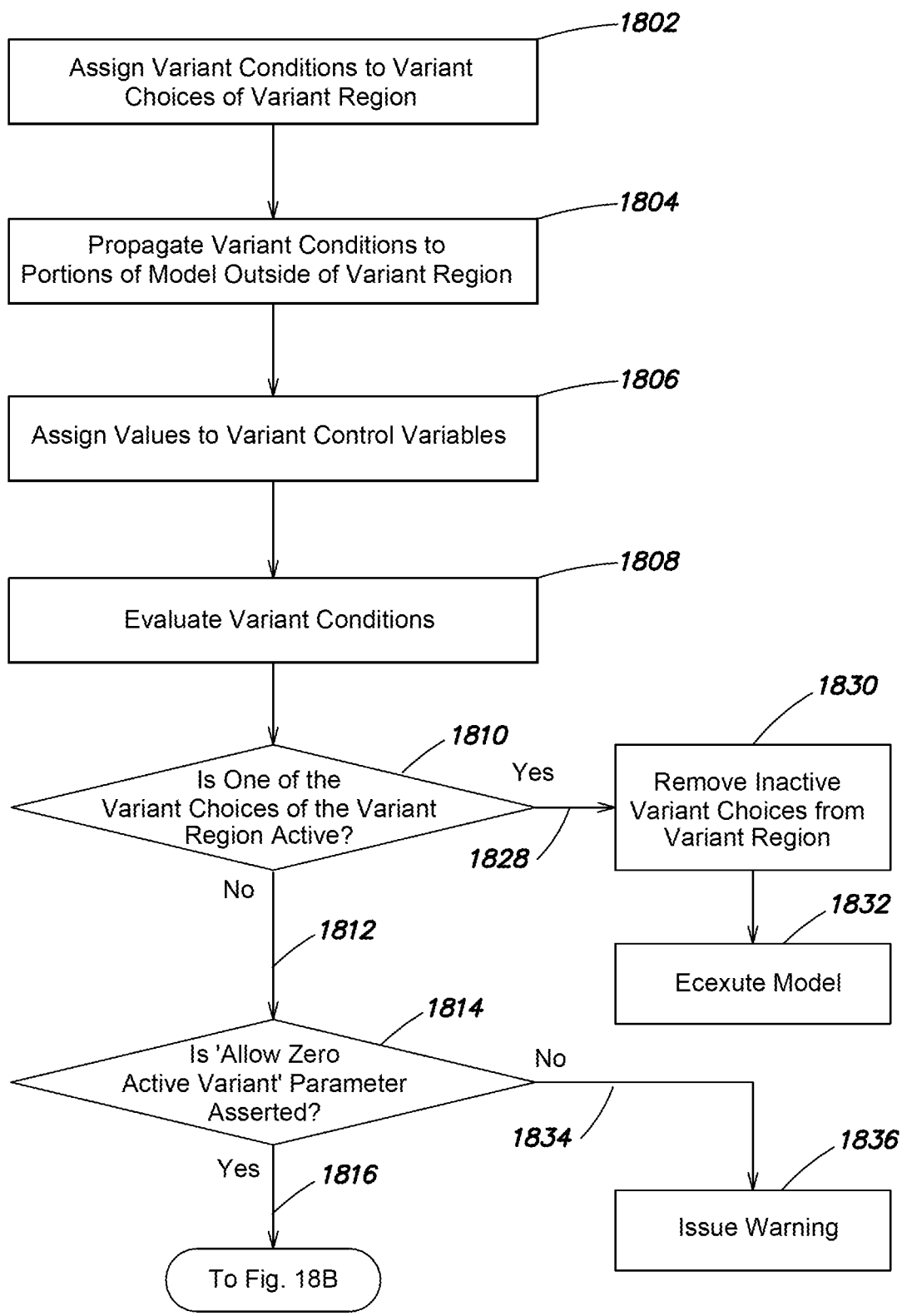
FIGS. 18A and 18B are partial views of a flow diagram of an example method in accordance with one or more embodiments.
Figure 18B:
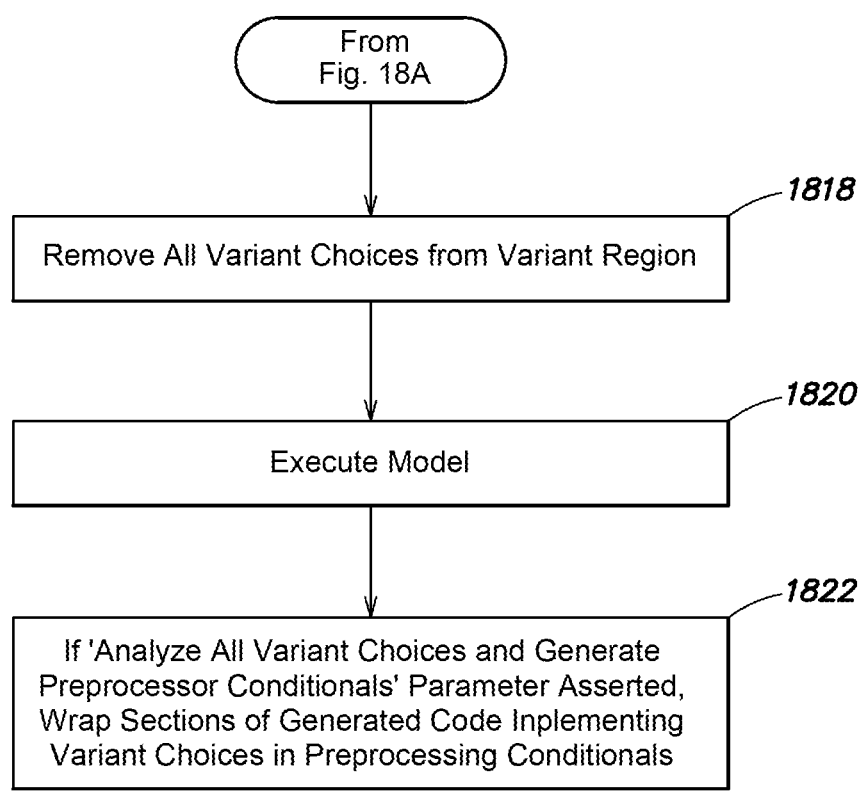

FIGS. 18A and 18B are partial views of a flow diagram of an example method in accordance with an embodiment. Variant conditions, which may include variant control variables, may be assigned to the variant choices of a variant region of a model, e.g., programmatically or manually by a developer, as indicated at step 1802. The variant condition propagation engine 124 may propagate variant conditions outside of the variant region, as indicated at step 1804. The variant implementation system 114 may assign values to variant control variables of the variant region, as indicated at step 1806. The variant condition evaluation engine 128 may evaluate variant conditions specified for the model, as indicated at step 1808. The evaluation may include variant conditions specified for the model's variant region as well as model elements outside of the variant region to which variant information was propagated. The variant condition evaluation engine 128 may determine whether one of the variant choices of the variant region is active, as indicated at decision step 1810. The active variant choice may be the variant choice whose variant condition evaluates to True, or the variant choice designated as the default variant choice if none of the variant conditions evaluate to True. If none of the variant choices is determined to be active, for example none of the variant conditions evaluate to True and no variant choice is designated as the default variant choice, the variant implementation system 114 may determine whether a parameter associated with the variant region and supporting zero active variants is asserted, e.g., set to True, as indicated by No arrow 1812 leading to decision step 1814.

The value of the parameter may indicate whether to allow zero active variant controls. The value of the parameter may be stored in one or more data structures associated with the variant region. For example, the value of the parameter may be stored in a workspace assigned to the variant region, e.g., by the modeling environment 100. If the parameter is asserted, the variant implementation system 114 may remove all of the variant choices from the model, as indicated by Yes arrow 1816 leading to step 1818. Following the removal of all of the variant choices, the execution engine 112 may execute the model, as indicated at step 1820. If code is being generated for the model, the code generator 108 may determine whether another parameter associated with the variant region is also asserted, as indicated at decisions step 1822. This other parameter may indicate whether the code generator 108 is to analyze all variant choices during an update diagram phase and generate preprocessor directives, such as preprocessor conditionals. If this other parameter is asserted, the code generator 108 may wrap the sections of the generated code that implement the variant choices in one or more preprocessor conditionals, as also indicated at step 1822.

Returning to decision step 1810 (FIG. 18A), if one of the variant choices is active, then the variant implementation system 114 may remove the inactive variant choices from the model, as indicated by Yes arrow 1828 leading to step 1830, and the execution engine 112 may execute the model, as indicated at step 1832. Returning to decision step 1814, if the 'allow zero active variant' parameter is not asserted, the variant implementation system 114 (or the execution engine 112) may issue one or more warnings, as indicated by No arrow 1834 leading to step 1836, and the model may not be executed.

Example Models

Figure 19:
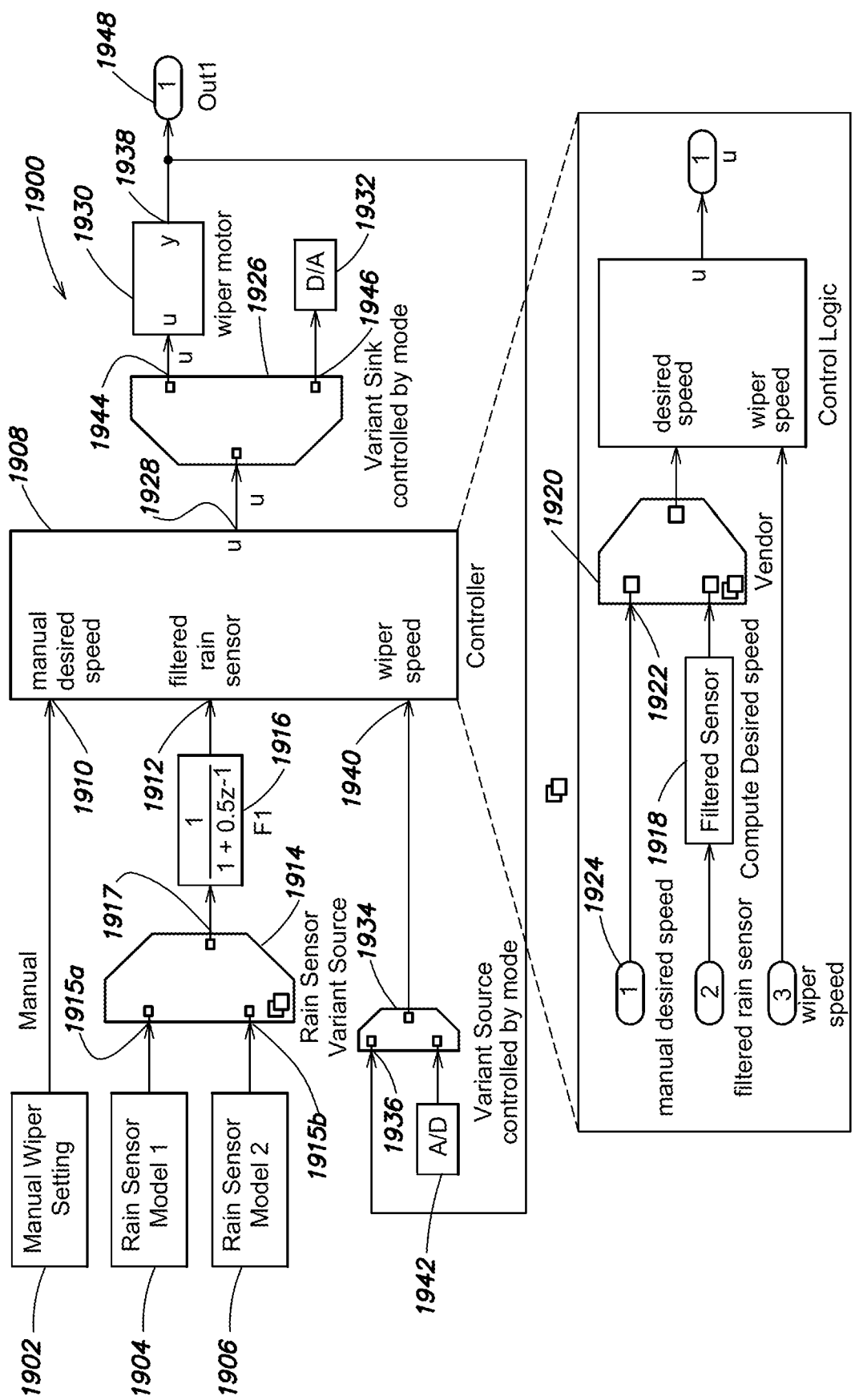
FIG. 19 is an illustration of an example model in accordance with one or more embodiments.

Consider the example model 1900 of FIG. 19. The model 1900 models a controller for windshield wipers on an automobile with a variant region having three variant choices. One variant choice of the variant region of the windshield wiper controller model 1900 may be for a lower-end vehicle, and includes a manual wiper settings (e.g. off, low, medium, high settings) block 1902. Another variant of the variant region may have a Rain Sensor Model 1 block 1904 representing hardware for a mid-range car. Another variant choice of the variant region may have Rain Sensor Model 2 block 1906 representing hardware for a high-end car. The blocks 1902, 1904, and 1904 may be subsystem blocks. A Controller subsystem 1908 may read either a Manual wiper setting, as indicated at an Inport 1910, or a filtered rain sensor setting, as indicated at another Inport 1912, from either the Rain Sensor Model 1 block 1904 or the Rain Sensor Model 2 block 1906.

In prior modeling environments, there is no way to completely remove all variant choices of a variant region.

Suppose a developer wants to only have the Manual Wiper Setting, then the Rain Sensor Model 1 block 1904, the Rain Sensor Model 2 block 1906, a Rain Sensor Variant Source block 1914, and a function block 1916 named 'F1' may need to be removed along with the Inport 1912 for the filtered rain sensor and a Compute Desired Speed block 1918 within the Controller subsystem 1908. To be able to remove all variant choices of a variant region, the execution engine 112 may build a topological graph representing the model. After this, the variant conditions may be propagated throughout the model. At this point it becomes possible to delete all variant choices of a variant region. If the variant region is driving an active region, the variant region needs to be replaced by a ground block or other block as appropriate for the model's domain.

Figure 20:
FIG. 20 is an illustration of an example graphical affordance in accordance with one or more embodiments.

An example of a dialog 2000 of the Rain Sensor Variant Source block 1914 is shown in FIG. 20. The dialog 2000 includes a checkbox 2002 labeled 'Allow zero active variant controls' that is selected, e.g., asserted. This parameter may be associated with the variant region defined by the Rain Sensor Variant Source block 1914. With the parameter asserted, if variant control variable, R, is not 1 and R is not 2, the variant implementation system 114 determines that the condition should be allowed to become false, and any blocks of the model 1900 that have propagated conditions, which become false due to R being, say 0, should be removed from execution of the model 1900. The dialog 2000 may also include a checkbox 2004 labeled 'Analyze all choices during update diagram and generate preprocessor conditionals' that is selected, e.g., asserted.

The propagation of variant conditions from the Rain Sensor Variant Source block 1914 may be achieved by the variant condition propagation engine 124 using a similar algorithm, e.g., of FIG. 80, to that of the propagation of conditions outside of variant subsystems. For example, a graph may be formed and variant conditions may be propagated both forwards and backwards relative to data dependencies in the model to all connected blocks. In this case, the Rain Sensor Model 1 block 1904 is assigned the condition 'R==1' and the Rain Sensor Model 2 block 1906 is assigned the condition 'R==2'. The Rain Sensor Variant Source block 1914, the F1 block 1916, the Inport 1912 for filtered rain sensor, and Compute Desired speed block 1918 are assigned the conditions 'R==1||R==2'. Therefore, if R is set to 0, for example, then the Rain Sensor Model 1 block 1904, the Rain Sensor Model 2 block 1906, the Rain Sensor Variant Source block 1914, and the F1 block 1916 along with the filtered rain sensor Inport 1912 and the Compute Desired Speed block 1918 within the Controller subsystem 1908 are inactive and removed from execution by the variant implementation system 114.

When generating code, the 'Allow zero active variant controls' parameter, as indicated by the checkbox 2002, combined with the 'Analyze all choices during update diagram and generate preprocessor conditionals' parameter, as indicated by checkbox 2004, capability will appear in the generated code wrapped in preprocessor directives, such as preprocessor conditionals, enabling removal of the model elements. For example, if generating C code, the code generator 108 may leverage #if's to guard the data and code that can be switched in/out or completely removed using compiler flags. For example, the generated code for the Rain Sensor Model 1 block 1904, the Rain Sensor Model 2 block 1906, and the F1 block 1916 may look like:

```
#if R==1||R==2
double rainSensor;
double f1;
#endif
#if R==1
rainSensor=RainSensorModel1( );
#elif R==2
rainSensor=RainSensorModel2( );
#endif
#if R==1||R==2
f1=filter(rainSensor);
#endif
```

Notice that data and code corresponding to these blocks in the generated code will be completely removed if R is assigned to 0 (or any value that is not 1 or 2).

The dialog 2000 may further include a checkbox 2006 labeled 'Override variant conditions and use the following variant" that is unselected, e.g., not asserted. This parameter may be associated with the variant region defined by the Rain Sensor Variant Source block 1914, and may determine the mode by which a variant choice is selected as the active variant choice. With the checkbox 2006 unselected, the variant implementation system 114 may operate in the expression evaluation mode in which the active variant choice is selected based on an evaluation of the conditions associated with the variant choices. For example, if the user sets the variant control variable 'R' to 1, the variant choice associated with a first input port 1915*a* of the Variant Source block 1914 may be active. If the user sets the variant control variable 'R' to 2, then the variant implementation system 114 may select the variant choice associated with a second input port 1915*b* of the Variant Source block 1914 as the active variant choice. If the variant control variable 'R' is set to a value other than 1 or 2, such as 0, then both the first and second input ports 1915*a* and 1915*b* may be inactive. Furthermore, a single output port 1917 of the Variant Source block 1914 may be inactive, provided that the "Allow zero active variant controls" checkbox 2002 is selected.

If the override checkbox 2006 were selected, then the variant implementation system 114 may operate in the override mode in which the active variant choice is selected by the user. For example, the 'R==1' entry 2008 and the 'R==2' entry 2010 of the dialog 2000 may be labels that may be selected by the user. With the override checkbox 2006 selected, selection of the 'R==1' entry 2008 by the user may cause the variant implementation system 114 to designate the variant choice of the first input port 1915*a* as the active variant choice, whereas selection of the 'R==2' entry 2010 by the user may cause the variant implementation system 114 to designate the variant choice of the second input port 1915*b* as the active variant choice. In the override mode, the variant implementation system 114 may ignore, e.g., not evaluate, the variant conditions.

An example of a dialog 2100 of a Vendor Variant Source block 1920 within the Controller subsystem 1908 is shown in FIG. 21. The dialog 2100 has the first choice 2102 marked as '(default)'. This means this variant choice is active if any other choice is inactive, i.e. if 'R==1||R==2' evaluates to false. The variant condition propagated to the blocks connected to a first input port 1922 of the Vendor Variant Source block 1920 are a manual desired speed Inport 1924, and the Manual Wiper Setting component 1902. Assigning the variant control variable, R, to be 0, activates the first variant choice. The condition '~(R==1||R==2)', will be true, which means the Manual Wiper Setting component block 1902 and the manual desired speed Inport 1924 will be true. Note, '~(R==1||R==2)' means R cannot be 1 or 2.

Being able to define a variant control as being present or not (all variant conditions are false) enables modeling of variant physical systems where components within the physical system are removed.

Variation on the Execution Control Signal

Figure 22:
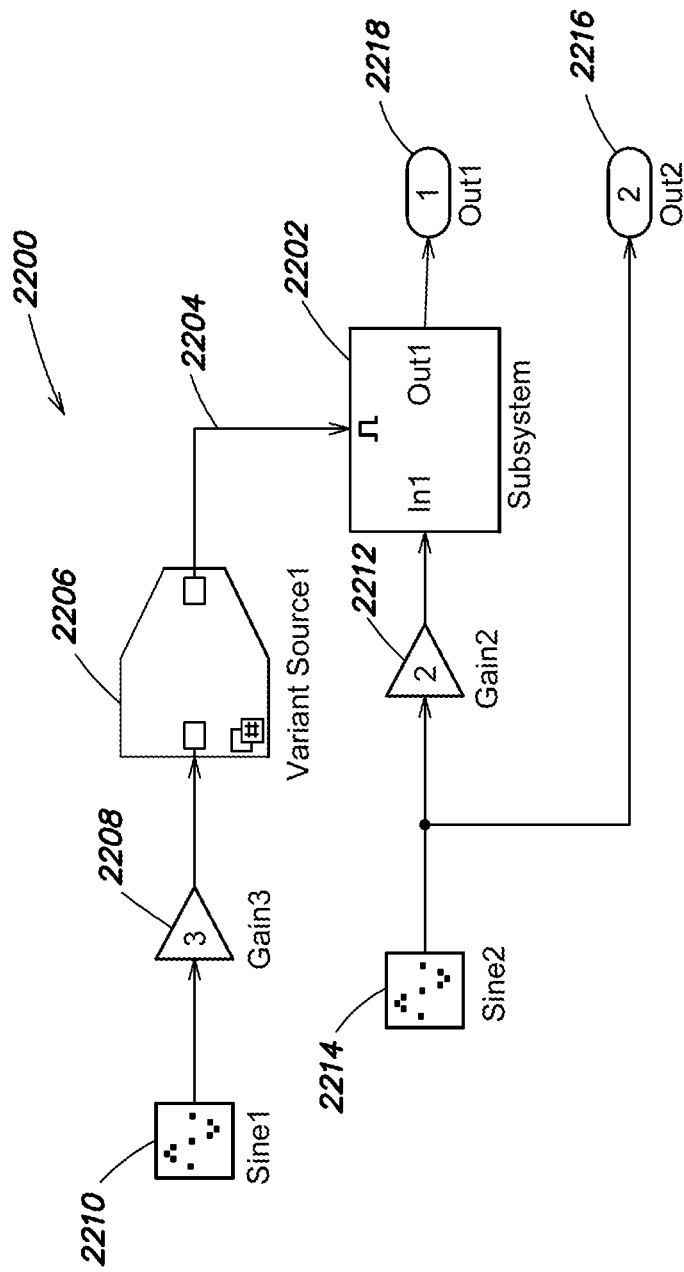
FIG. 22 is an illustration of an example model in accordance with one or more embodiments.

Enabling the complete removal of a set of variant choices lets users create systems of one variant choice, where the variant choice is present or not. This may be very helpful for removal of a conditionally executed subsystem. FIG. 22 illustrates an example model 2200. The model 2200 has a conditional executed (enabled) subsystem 2202. The execution control signal is a signal that is connected to a block that controls the execution of the block. For example, the enabling signal 2204 of the enabled subsystem 2202 is an execution control signal. The enabling signal 2204 is from a Variant Source1 block 2206, which defines a single choice, with condition V==1. This condition is back propagated to a Gain3 block 2208 and a Sine1 block 2210. The condition is forward propagated to the Enabled Subsystem 2202. The execution engine 112 may only execute an Enabled Subsystem block when the signal connected to the enable port, e.g., the enabling signal, is positive. Therefore, the condition (in this case V==1), is applied to the Enabled Subsystem 2202 and then propagated back to a Gain2 block 2212. From the Gain2 block 2212, the condition (V==1) is propagated to a Sine2 block 2214. The condition "true" is back-propagated from an Out2 Outport block 2216 to the Sine2 block 2214, and the resulting condition, in this case, is the logical OR of 'V==1' and true, which is true. The condition V==1 is also forward propagated to an Out1 Outport block 2218.

Figure 23:
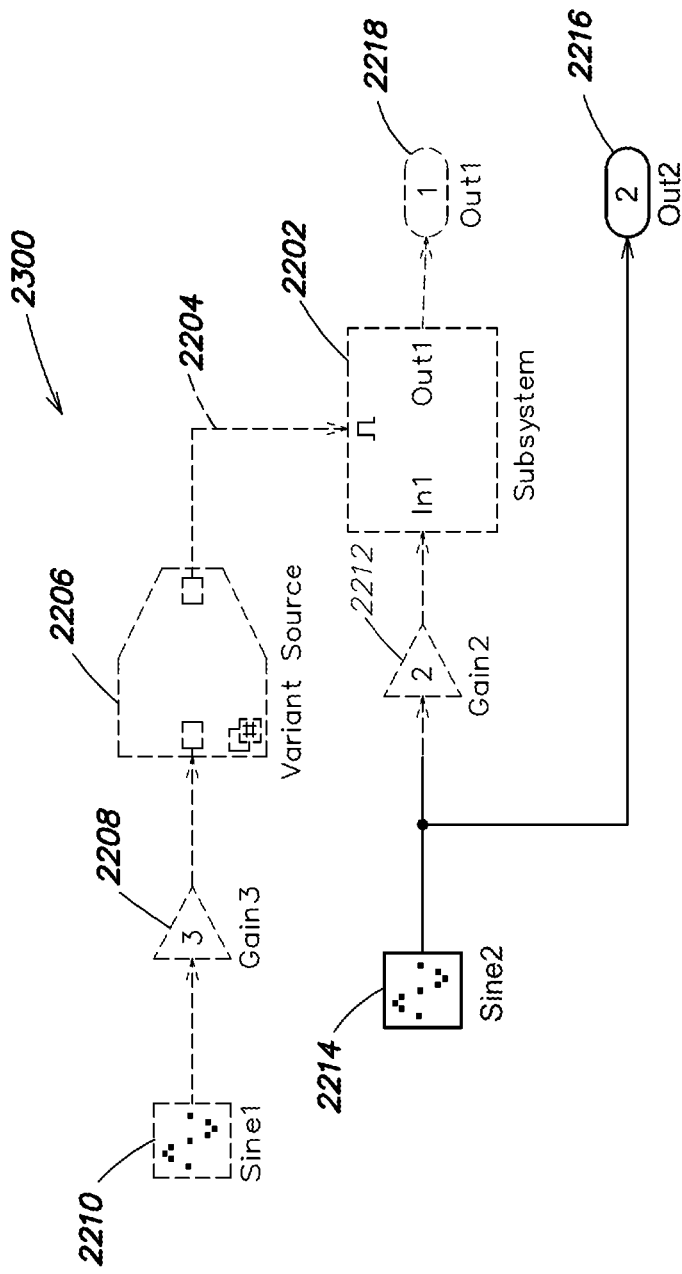
FIG. 23 is an illustration of an example model in accordance with one or more embodiments.

When V is defined to be 0, and the model 2200 is executed, the gray blocks as illustrated in FIG. 23, which have been propagated the condition V==1 are inactive and not part of the model execution. Single-choice variant blocks lets a developer remove portions of models by removing the execution control signal of blocks, such as an enable subsystem. This eliminates the need for duplicating the model and manually removing blocks. This concept applies to any regular or subsystem (hierarchical) blocks which have execution control signals. A block could have multiple execution control signals, and if one is inactive then the corresponding block will be inactive, and so will any connected block as appropriate and determined by the variant condition propagation engine 124, which defines the variant choices. As described, a variant choice is a set of blocks of a variant region of a model with a common variant condition. The variant choice can be defined by propagating variant conditions as with the Variant Source block 2206, or it can be defined by specification as with a Variant Subsystem block.

Figure 24:
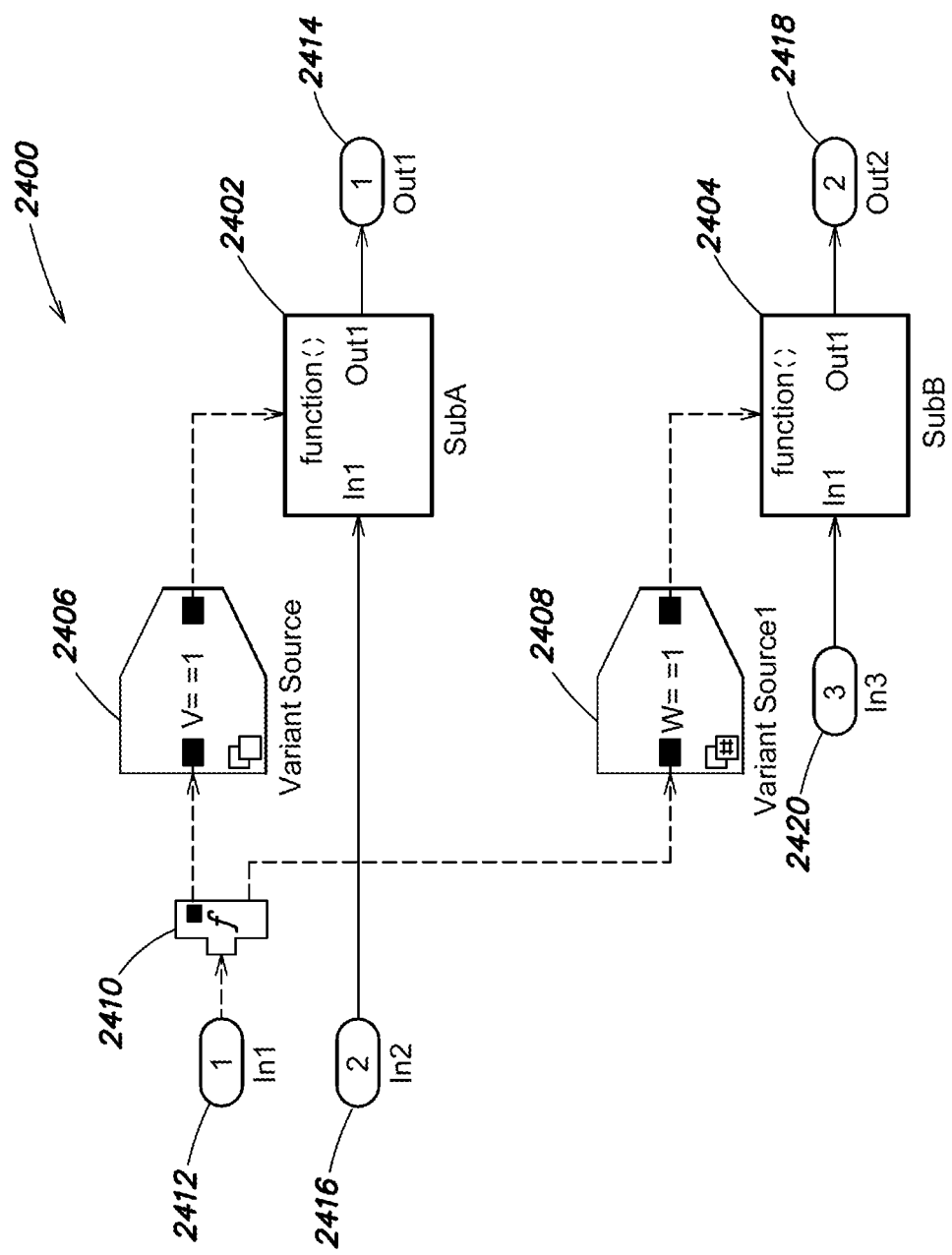
FIG. 24 is an illustration of an example model in accordance with one or more embodiments.

Another case where the variation on the execution control signal is helpful is with explicit execution controls such as the function-call or action signals of the modeling environment 100. Consider the example model 2400 illustrated in FIG. 24. The model 2400 includes two function-call subsystems 2402 and 2404 named 'SubA' and 'SubB', respectively. A Variant Source block 2406 named 'Variant Source' specifies variant condition V==1 on the function-call signal controlling the SubA subsystem 2402. A Variant Source block 2408 named 'Variant Source1' specifies variant condition W==1 on the signal controlling SubB subsystem 2404. A function-call split block 2410 named 'f' will back inherit both the condition V==1 and W==1, giving it the variant condition "V==1||W==1". This condition is then back propagated to an Inport block 2412 named 'In1', giving the In1 Inport block 2412 the condition "V==1||W==1". The condition V==1 is forward propagated to an Outport block 2414 named 'Out1', and the condition V==1 is back propagated to an Inport block 2416 named 'In2'. The condition W==1 is then forward propagated to an Outport block 2418 named 'Out2', and back propagated from the SubB subsystem 2404 to an Inport block 2420 named 'In3'.

The explicit execution control signals, such as function-calls, may behave very similar to time-based signals, such as the enabling signal of the prior example when propagating condition. The generated code will also be similar for both cases in that the blocks with conditions are either present in the generated code if their condition is active when "generate preprocessor conditionals" property of the variant blocks is off or the code corresponding to the blocks with conditions is wrapped in #if like statements, when the "generate preprocessor conditionals" property is on.

When generating code, and the "generate preprocessor conditionals" is off, both the Variant Source block 2406 and the Variant Source1 block 2408, and the variant control variable V is set to 1 and W is set to 0, the code generator 108 may produce C code similar to the following (and pattern will be similar for other languages, but using the semantics of the other programming languages, for example when generating HDL, the system may generate HDL language statements):

```
void In1(void)
{
out1=SubA(In2);
}
```

Notice that, for the code generated by the code generator 108, there is no code associated with the In3 Inport block 2420, the SubB subsystem 2404, or the Out2 Outport block 2418. This is because the Variant Source1 block expression, W==1 was propagated to these blocks, and the value of the variant control variable, W, was 0 when generating code. Therefore, these blocks are not present in the generated code for the model 2400.

If the "generate preprocessor conditionals" capability is turned on for the Variant Source block 2406 and the Variant Source1 block 2408, then the generated code will contain the code for all blocks regardless of the value of the variant control variables, V and W at the time of code generation. The code for the blocks that are conditional will be wrapped in #if statements when generating C code, and similar conditional statements when generating code for other languages. It should be understood that there are different ways of setting the "generate preprocessor conditionals" parameter (property) on the variant blocks. One means to set this property is to use the variant block dialogs associated with the respective blocks. Another means is to programmatically set the property using, for example a textual Application Programming Interface (API).

Figure 25:
FIG. 25 is an illustration of an example graphical affordance in accordance with one or more embodiments.

An example dialog 2500 for the Variant Source block 2406 is shown in FIG. 25. Here, the dialog 2500 includes a checkbox 2502 for an "Analyze all choices during update diagram and generate preprocessor conditionals" parameter, which is selected. This parameter is also selected on the Variant Source1 block 2408, and then code may be generated by the code generator 108.

The resulting code, when this "generate preprocessor conditionals" checkbox is selected, is shown below using C preprocessor #if statements. Again, code generator 108 may generate code conforming to other textual programming languages that support the semantics of the model 2400.

```
#if V==1||W==1
void In1(void)
{
#if V==1
Out1=SubA(In2);
#endif
```

```
#if W==1
Out2=SubB(In3);
#endif
}
endif
```

Propagation of Variant Conditions Along Non-Signal (Line) Boundaries Supporting Variation when Blocks are Coupled The propagation of variant conditions, which may be used to identify variant choices, in a block diagram may utilize a directed graph of nodes and edges corresponding to the blocks and lines in the block diagram. In some modeling environments such as the time-based block diagrams of the Simulink® model-based design environment, modeling constructs may specify dependent execution semantics, where the coupling between the dependent information is not described by nodes and edges.

Figure 86:
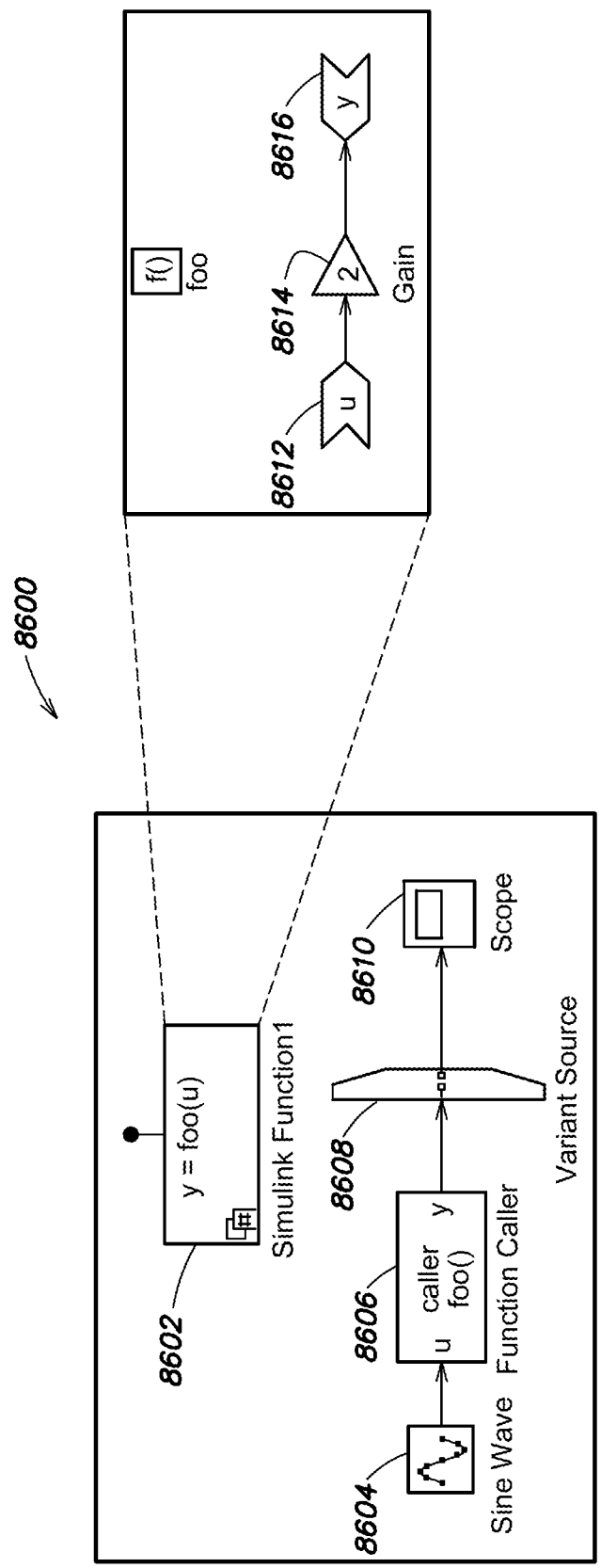
FIG. 86 is an illustration of an example model in accordance with one or more embodiments.

Consider the example model 8600 of FIG. 86, which allows for "client-server" like modeling within Simulink time-based block diagrams. The model 8600 includes a function block 8602 named 'Simulink Function 1' that implements the function y=foo(u), a Sine block 8604, a function caller block 8606, a Variant Source block 8608, and a Scope block 8610. The function block 8602 includes an argument port 8612 named 'u', a Gain block 8614, and an argument portion 8616 named 'y'.

Assuming the Variant Source block 8608 is active, the meaning, e.g., execution, of the model 8600 will show a sine wave signal modified by the function caller block 8606 in display generated by the Scope block 8610. The Scope block 8610 may plot the value of its input signal, similar to a physical oscilloscope. The function caller block 8606 invokes the Simulink Function1 block 8602 passing its input signal, in this case the value of the sine wave signal at the specified point in time, to the 'u' argument port 8612, which is multiplied by two by the Gain block 8614 and written to the 'y' argument port 8616, which is the output of the function caller block 8606.

The Variant Source block 8608 has the variant condition expression V==1, and this condition may be back propagated to the function caller block 8606 and then back to the Sine block 8604. The condition, V==1 may also be forward propagated to the Scope block 8610.

The next step in propagation may be to examine all blocks that have variant conditions, and locate any dependent blocks which are coupled to the blocks with variant conditions. In the example model 8600, the Simulink Function1 block 8602 is a dependent block, which may then be examined by the variant condition propagation engine 124 to see if it can accept the condition V==1. A Simulink Function block is a reusable concept. A Simulink Function block is a dynamic system that operates on signals through its argument ports. A Simulink Function block may be marked as global meaning that it can be used across models. One model may have a Function Caller block that invokes the Simulink Function block of another model. If a given Simulink Function block is marked as local to the model, i.e. not global, then it can be propagated a variant condition by examining all function caller blocks, and creating a variant condition expression by computing the logical OR of all the conditions of all corresponding function caller blocks. In the example model 8600, there is only one Function Caller block 8606 whose condition is V==1, and therefore the variant condition propagation engine 124 can assign the condition V==1 to the Simulink Function1 block 8602 of the example model 8600.

In some embodiments, a Simulink Function block may operate as a function callee.

Figure 87:
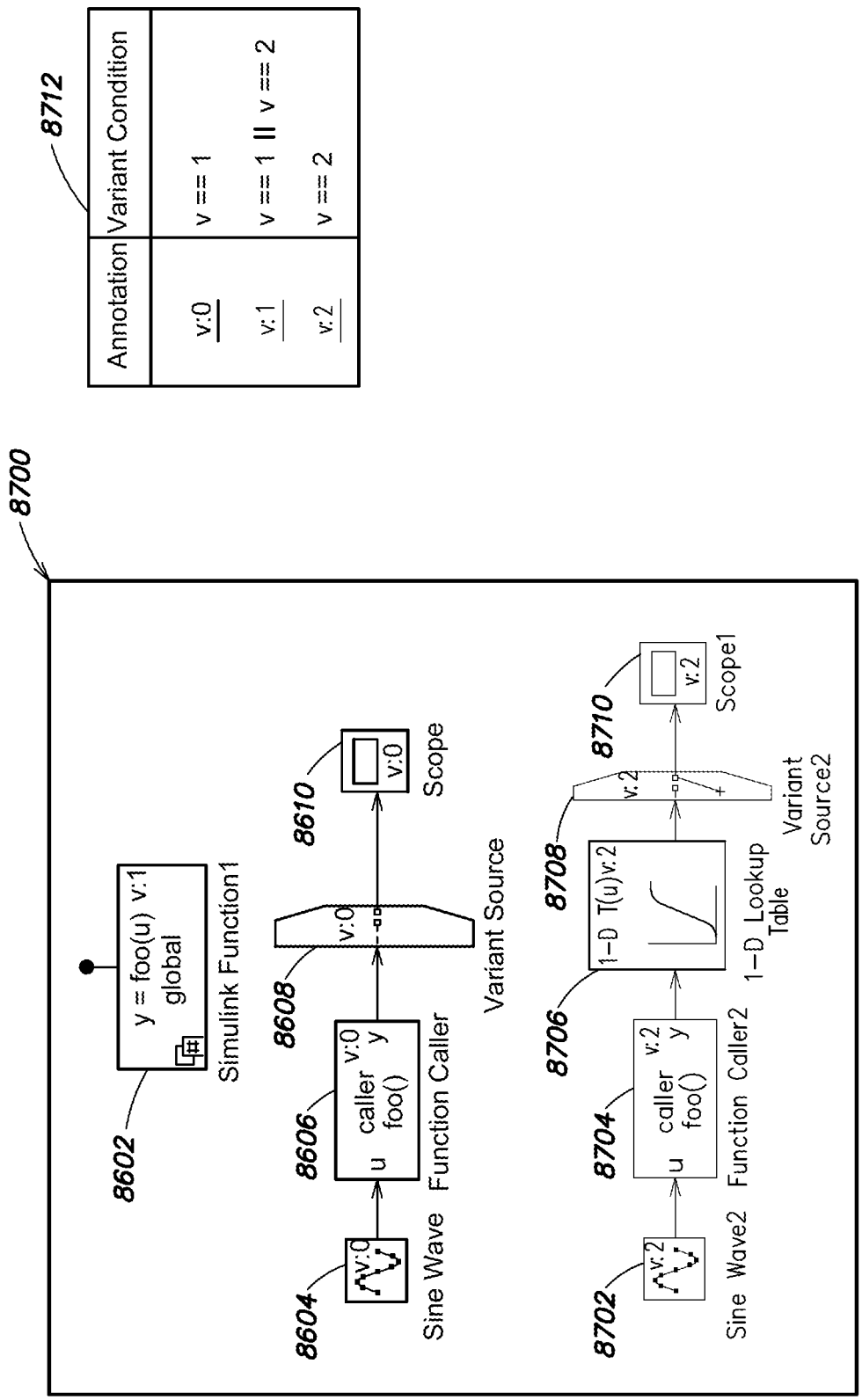
FIG. 87 is an illustration of an example model in accordance with one or more embodiments.

Suppose another function caller block were added to the model 8600 as illustrated in the example model 8700 of FIG. 87. The model 8700 further includes another Sine block 8702, another function caller block 8704 named 'Function Caller2', a look-up table block 8706 named '1-D Lookup Table', another Variant Source block 8708 named 'Variant Source2', and another Scope block 8710 named 'Scope1'. The Simulink function block 8602, the Sine block 8604, the function caller block 8606, the Variant Source block 8608, and the Scope block 8610 are active, while the Sine block 8702, the function caller block 8704, the look-up table block 8706, the Variant Source block 8708, and the Scope block 8710 are inactive, and are shown as grayed out in FIG. 87. In the model 8700, the first Function Caller block 8606 is propagated the condition V==1, and the second Function Caller block 8704 is propagated the condition V==2, as illustrated in a variant condition annotation table 8712 for the model 8700. The logical OR of these two conditions is assigned to the Simulink Function1 block 8602 resulting in V==1||V==2 being assigned to it, as also illustrated in the variant condition annotation table 8712.

In graphical programs, there may be many of these dependent blocks. The Simulink Function condition is dependent on the function-callers, and this notion of using the propagated conditions to compute dependent conditions on blocks that do not have line-based connectivity helps ensure that the variant regions within a model are accurately described. The Simulink® model-based design environment has several paradigms for dependent block patterns. Another example of such a pattern is the Data Store Memory block, which inherits its condition from the conditions propagated to Data Store Read and Data Store Write blocks.

Figure 88:
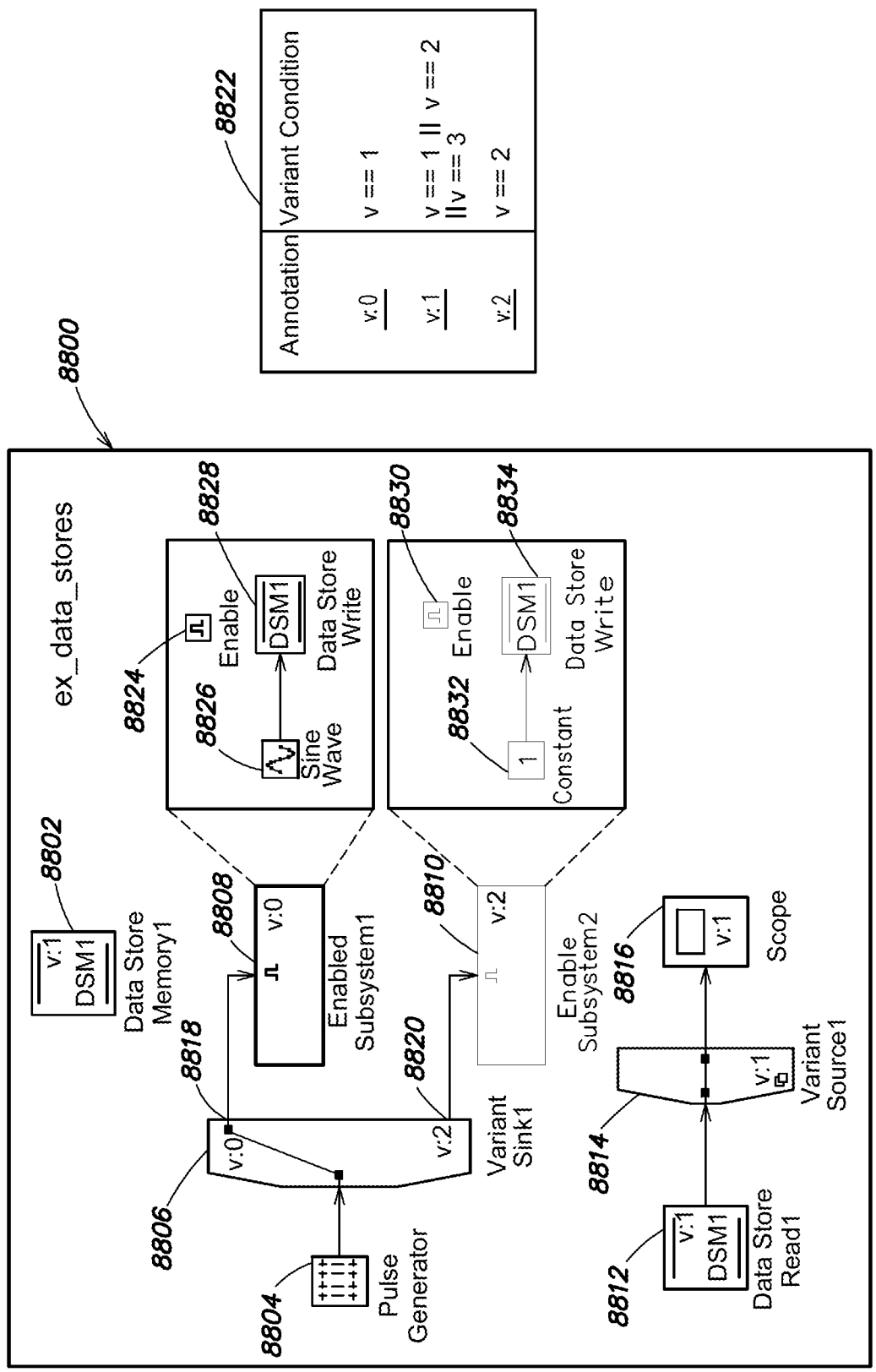
FIG. 88 is an illustration of an example model in accordance with one or more embodiments.

Consider the example model 8800 named 'ex_data_stores' of FIG. 88. The model 8800 includes a data store memory block 8802, a pulse generator block 8804, a Variant Sink block 8806 named 'Variant Sink1', two enabled subsystem blocks 8808 and 8810 named 'Enabled Subsystem1' and 'Enabled Subsystem2', respectively, a data store read block 8812, a Variant Source block 8814, and a Scope block 8816. The Variant Sink block 8806 specifies the condition V==1 on a first output port 8818, and the condition V==2 on a second output port 8820, as illustrated in a variant condition annotation table 8822 for the model 8800. The "Allow zero active variant controls" option may be unselected on the Variant Sink block 8806. Accordingly, the Pulse Generator block 8804 is unconditional, e.g., no condition to back propagate from the Variant Sink block 8806. The condition, V==1 may be forward propagated to the Enabled Subsystem1 block 8808. This condition, V==1, may apply to the contents of the Enabled Subsystem1 block 8808, which may consist of an Enable port 8824, a Sine block 8826, and a Data Store Write 8828. Thus, the effective condition of the Enabled Subsystem1/Data Store Write is V==1. The condition, V==2, may be forward propagated to the Enabled Subsystem2 block 8810 from the Variant Sink block 8806. This condition, V==2, may apply to the contents of the Enabled Subsystem2 block 8810, which may consist of an Enable port 8830, a Constant block 8832, and a Data Store Write 8834. Thus, the effective condition of the Enabled Subsystem2/Data Store Write is V==2.

The Data Store Read1 block 8812 is connected to the Variant Source1 block 8814, which has condition "V==1||V==2||V==3". This means the Data Store Read1 8812 block may back inherit the condition V==1||V==2||V==3. Notice that the Data Store Memory1 block 8802 has condition "V==1∥V==2∥V==3", which is the logical OR of all Data Store Read and Write blocks, as indicated in the variant condition annotation table 8822.

Another example of blocks that require propagation of conditions along non-signal boundaries are the Initialize, Reset, and Terminate (IRT) subsystems of the Simulink® model-based design environment, which may define dynamic systems to run when the execution of the system is initializing, being reset, or terminating. These IRT subsystems may communicate with other portions of the model though State Read/Write and/or similar Read/Write blocks that connect to the model though non-line based connections. The conditions on the corresponding blocks may be formed into an expression by combining the sub-expressions by OR, and the resulting (simplified) condition may then assigned to the corresponding IRT subsystem.

Variant Propagation Through Systems

U.S. Pat. No. 8,386,222 describes how variant blocks define design sections or variant regions within a model. As the scale of models grows, there becomes a need where larger models can be built out of smaller models. This is often referred to as hierarchical block diagrams. A hierarchal layer of a top model may be another model, which may be referenced from the top model. Alternatively, a hierarchical layer may be a subsystem, which may be referenced by another model. A model may represent a dynamic system, sometimes simply referred to as a system. When the variation occurs at the ports of a child model, there is a need to communicate this variation across models.

Figure 89:
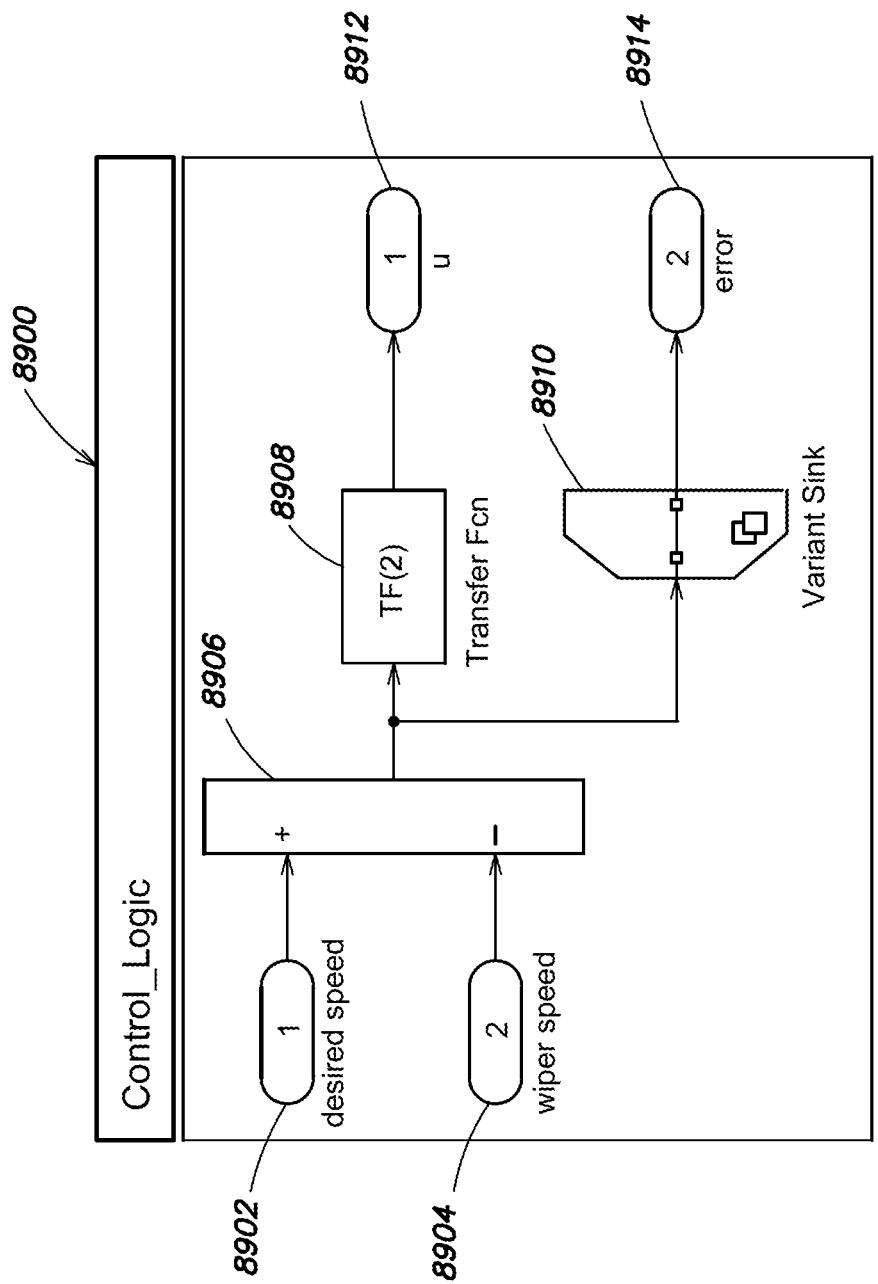
FIG. 89 is an illustration of an example model in accordance with one or more embodiments.

The following figures provide an example of hierarchical layering. FIG. 89 is an example linear system 8900, e.g., a model, named 'Control_Logic' that represents a simplified controller for a windshield wiper motor. The model 8900 includes two Inport blocks 8902 and 8904 named 'desired speed' and 'wiper speed', respectively, a Sum block 8906, a transfer function block 8908 named 'Transfer Fcn', a Variant Sink block 8910, and two Outport blocks 8912 and 8914 named 'u' and 'error', respectively. The model 8900 may be saved in a separate file, simulated, and validated without requiring the overall system, e.g., model, that includes the model 8900. Signals from the two Inport blocks 8902 and 8904 are fed to the Sum block 8906, which computes the difference between the desired speed and the wiper speed signals. The output of the Sum block 8906 may be an error signal, which is fed to the Transfer Fcn block 8908 and then to the Variant Sink block 8910. The output of the Transfer Fcn block 8908 is fed to the 'u' Outport block 8912. The output of the Variant Sink block 8910 is fed to the 'error' Outport block 8914. The Variant Sink block 8910 may contain the condition "CERROR==1", and this condition may be propagated to the error Outport block 8914.

Figure 90:
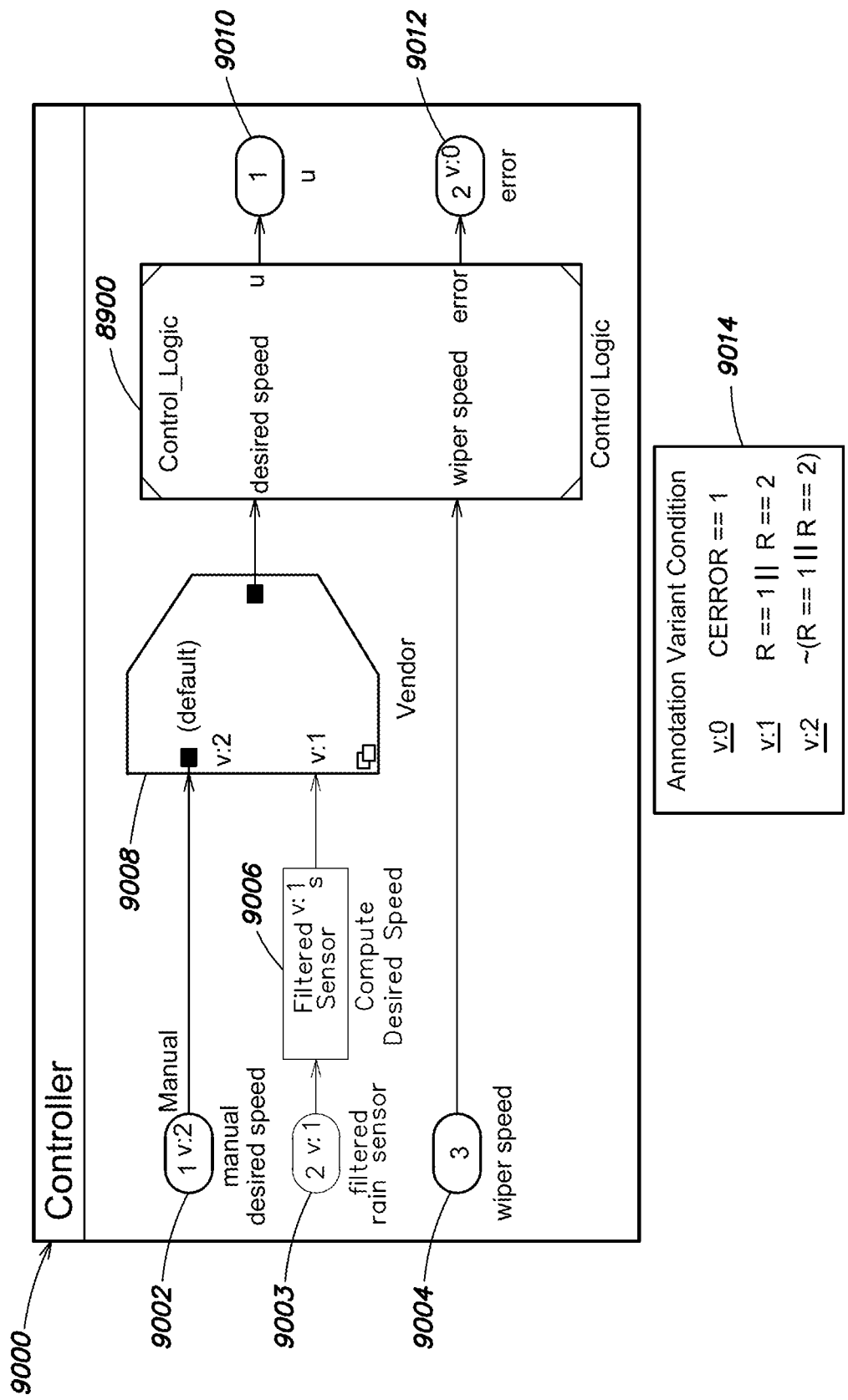
FIG. 90 is an illustration of an example model in accordance with one or more embodiments.

The Control_Logic model 8900 may be used in another larger system. FIG. 90 is an illustration of an example system, e.g., model, 9000 named 'Controller' that includes the Control_Logic model 8900. The Controller model 9000 includes three Inport blocks 9002-9004 named 'manual desired speed', 'filtered rain sensor', and 'wiper speed', respectively, a subsystem block 9006 named 'Compute Desired Speed', a Variant Source block 9008 named 'Vendor', the Control_Logic model 8900, which is represented by a model reference block, and two Outport blocks 9010 and 9012 named 'u' and 'error', respectively. Variant conditions may be propagated through the Controller model 9000, and a variant condition annotation table 9014 for the Controller model 9000 may be presented, e.g., in a model editor window along with the model 9000. The 'filtered rain sensor' Inport block 9003 and the 'Compute Desired Speed' subsystem block 9006 may be inactive as shown by being grayed out.

As described, the Controller model 6900 uses the Control_Logic model 8900. The Vendor Variant Source block 9008 specifies "(default)" as its first condition and "R==1∥R==2" as its second condition. These conditions may be back propagated to the "manual desired speed" Inport block 9002, the "Compute Desired speed" block 9006, and the "filtered rain sensor" Inport block 9003. The condition propagated forward by the Vendor Variant Source block 9008 is "true", because "(default)∥R==1∥R==2" simplifies to true. Here, "(default)" is chosen when none of the other conditions are true, and in this case when R==1∥R==2 is not true. Notice, that the error Outport block 9012 has also been propagated a condition. Its condition has been propagated across the system boundary out of the Control_Logic model 8900, and to the error Outport block 9012.

Figure 91:
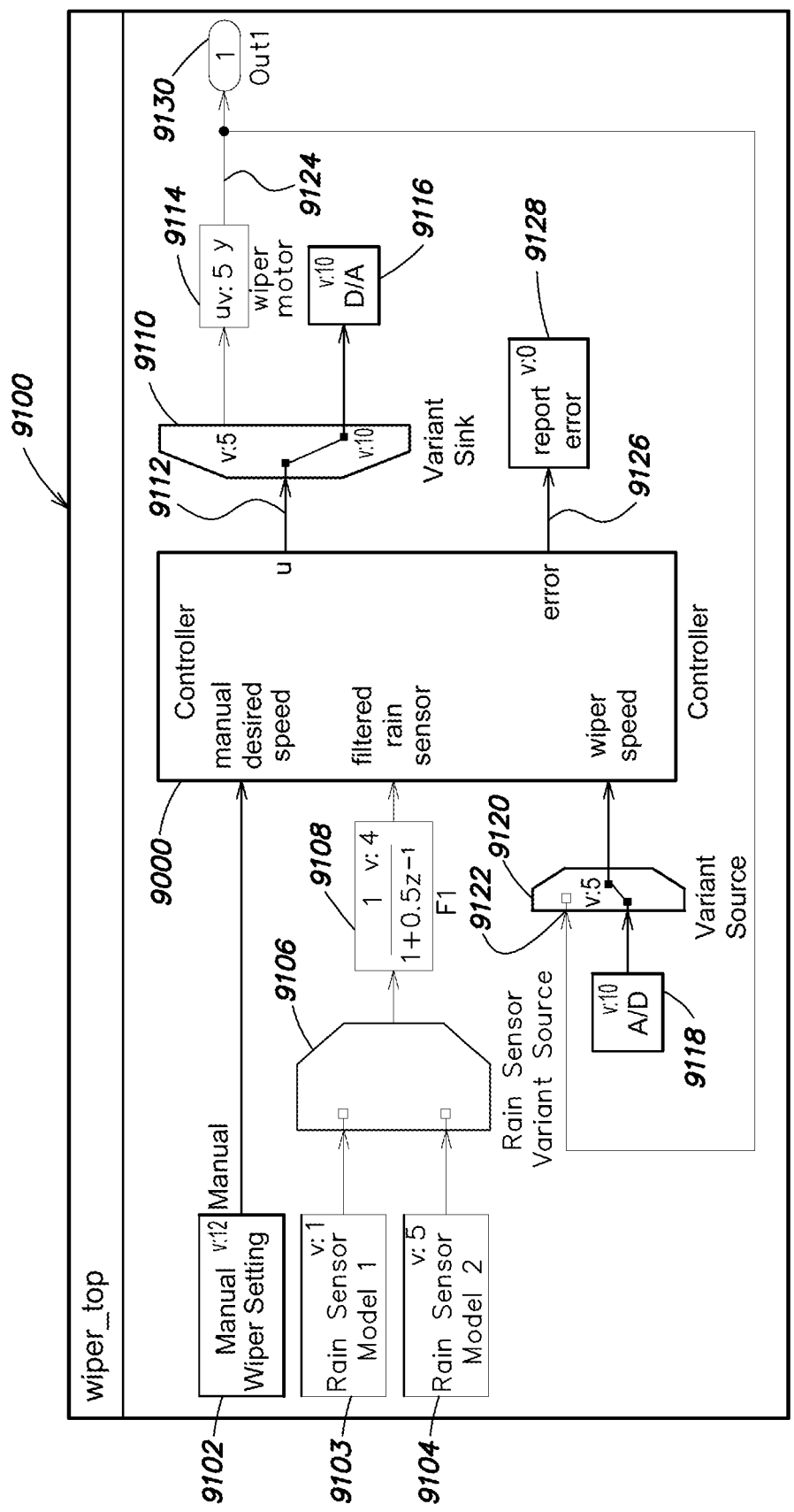
FIG. 91 is an illustration of an example model in accordance with one or more embodiments.

Continuing this pattern of using models as building blocks for larger systems, the Controller model 9000 may be used in a top-level model 9100, which may be named 'wiper_top', an example of which is shown in FIG. 91. The 'wiper_top' model 9100, which is similar to the model 1900 (FIG. 19) may model a controller for windshield wipers on an automobile with a variant region having three variant choices. The 'wiper-top' model 9100 may include three subsystems 9102-9104 named 'Manual Wiper Setting', 'Rain Sensor Model 1', and 'Rain Sensor Model 2', respectively, a Variant Source block 9106 named 'Rain Sensor Variant Source', a function block 9108 named 'F1', a Variant Sink block 9110, which provides the destination routine of an output signal named 'u' 9112 to either a subsystem block 9114 named 'wiper motor' or to a Digital to Analog (D/A) converter block 9116. The 'wiper motor' block 9114 may represent the physical dynamics of a real wiper motor. The D/A block 9116 may provide the signal 'u', produced by the Controller model 9000 to an analog-to-digital (A/D) converter block 9118. A Variant Source block 9120 of the model 9100 may accept at a first input 9122 an output signal 9124 named 'y' of the wiper motor block 9114, and provides this as a "wiper speed" input of the Controller model 9000. Alternatively, the Variant Source block 9122 may provide the output of the A/D block 9118 to the Controller model 9000. An error signal 9126 of the Controller model 9000 may be provided to a subsystem block 9128 named 'report error'. The 'y' signal 9124 of the 'wiper motor' block 9114 may also be provided to an Outport block 9130 named 'Out1'.

The 'Rain Sensor Model 1' block 9103, the 'Rain Sensor Model 2' block 9104, the 'Rain Sensor' Variant Source block 9106 the 'F1' block 9108, the 'wiper motor' block 9114, and the 'Out1' Outport block 9130 may be inactive, as shown by being grayed out.

FIG. 92 is an example variant annotation table 9100 for the 'wiper_top' model 9100. Notice that the 'report error' block 9128 is propagated the condition CERROR==1. Also notice that the 'F1' block 9108 is back propagated the condition R==1∥R==2 from the Controller model 9000.

The ability to propagate conditions across system boundaries may be very helpful in constructing large models. Without it, one may need to redundantly add variant blocks to specify the variant choices at the interface of systems.

Variant Annotations, Expression Decomposition, and Variant Control Variable Mappings Using blocks, such as the Variant Source block or Variant Subsystems, which may propagate variant conditions to other portions of the model, such as one or more connected blocks, may result in the creation of complex variant conditions within a model.

Figure 26:
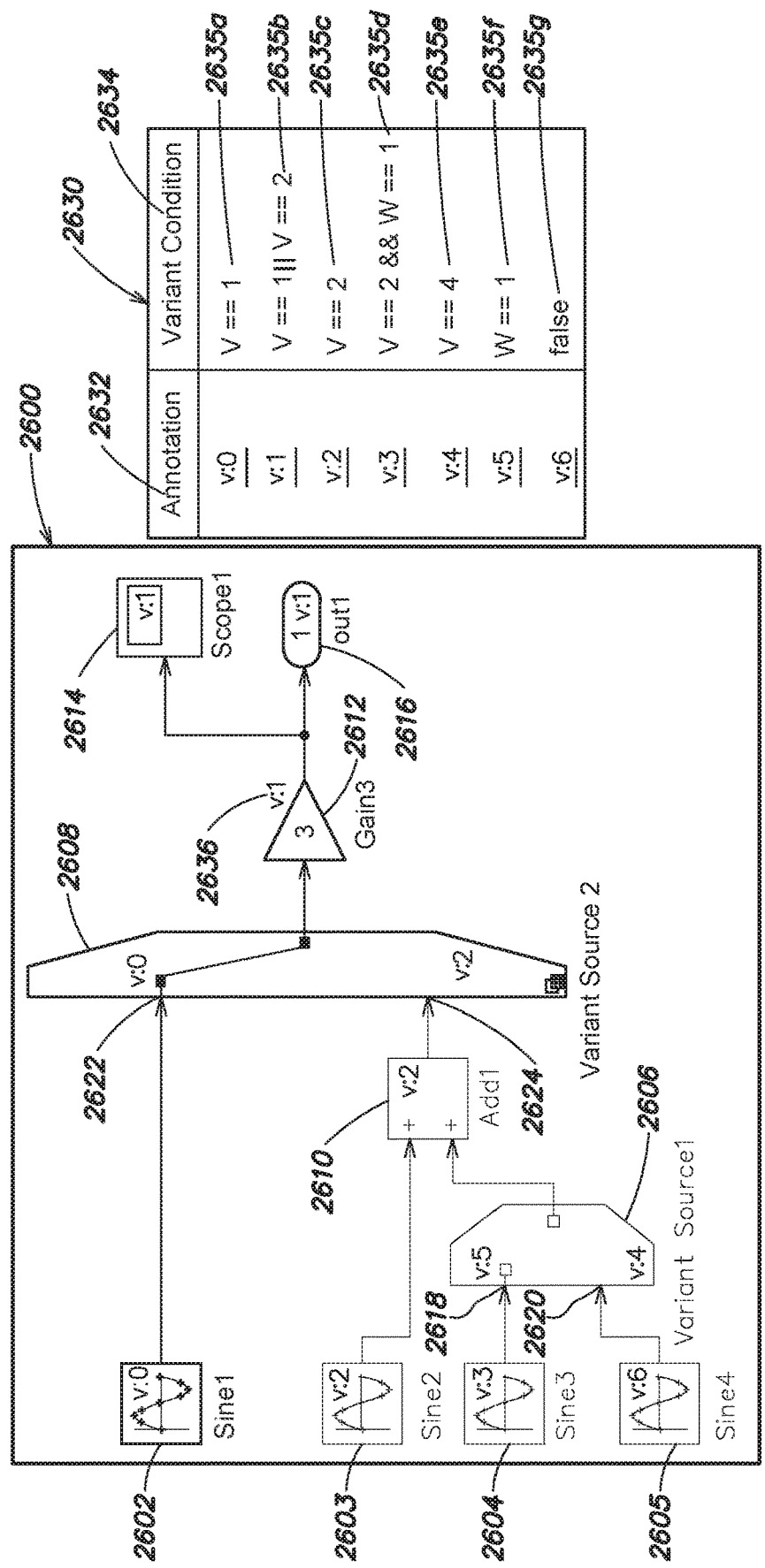
FIG. 26 is an illustration of an example model in accordance with one or more embodiments.

FIG. 26 is an illustration of an example model 2600. The model 2600 includes four Sine blocks 2602-2605, named, 'Sine1', 'Sine2', 'Sine3', and 'Sine4', respectively, which may generate sine wave signals, two Variant Source blocks 2606 and 2608 named 'Variant Source1' and 'Variant Source2' respectively, an Add block 2610, named 'Add1', a Gain block 2612, named 'Gain3', a Scope block 2614, named 'Scope1', and an Outport block 2616 named 'Out1'.

For the Variant Source1 block 2606, the variant condition W==1 may be specified for a first input port 2618, and the variant condition V==4 may be specified for a second input port 2620. For the Variant Source2 block 2608, the variant condition V==1 may be specified for a first input port 2622, and the variant condition V==2 may be specified for a second input port 2624. The variant conditions may be propagated from the Variant Source blocks 2606 and 2608 to other blocks of the model 2600 by the variant condition propagation engine 124 as described herein. In some embodiments, the variant implementation system 114 may optionally show or display the propagated variant conditions. For example, the variant condition annotation engine 138 may construct one or more data structures that contain information concerning the variant conditions propagated through the model 2600. The variant condition annotation engine 138 may direct the UI engine 102 to draw and display the propagated variant conditions in one or more graphical affordances, which may be in the form of a table, such as a variant condition annotation table 2630. The UI engine 102 may display the table 2630 in a model editor that may also display the model 2600.

The table 2630 may include an Annotation column 2632 and a Variant Condition column 2634. The variant condition annotation engine 138 may use a symbolic representation as annotations of the variant conditions utilized in the model 2600, and may present these symbolic representations in the Annotation column 2632. For example, the variant condition annotation engine 138 may use the symbolic representation 'v:#', where # represents a variant condition count within the model 2600, e.g., starting from '0'. The variant condition annotation engine 138 may include the logical expression of the respective variant condition in the Condition column 2634. The table 2630 may include a plurality of rows 2635a-g for the variant conditions defined within the model 2600.

The variant condition annotation engine 138 may further direct the UI engine 102 to associate one or more additional graphical affordances, such as a label, with at least some of the blocks and/or ports of the model 2600 that include the symbolic representations assigned to the variant conditions. For example, following the propagation of variant conditions within the model 2600, the Gain block 2612 may only be active, e.g., part of the model execution, if V==1||V==2. The variant condition annotation engine 138 may assign the symbolic representation v:1 to this variant condition, V==1||V==2. The UI engine 138 may apply a label 2636 to the Gain block 2612 that includes its annotation, e.g., v:1, which corresponds to its propagated variant condition.

In some embodiments, the variant condition annotation engine 138 may support navigation among elements of the table 2630 representing variant conditions, and corresponding blocks and/or ports of the model 2600. For example, in response to selection, e.g., through a mouse or pointer operation, such as a mouse click and/or a mouse hover, of the label 2636 for the Gain block 2612 within the model 2600, the variant condition annotation engine 138 may navigate the user to the respective row, e.g., row 2635b, of the table 2630 for the Gain block 2612. Alternatively, within the variant condition annotation table 2630, in response to receiving a mouse or pointer operation, e.g., a mouse click, on the row 2635b, which corresponds to variant condition v:1, the variant condition annotation engine 138 may direct the UI engine 102 to highlight, or otherwise mark, e.g., using some other graphical affordance, the blocks in the model 2600 that have been assigned this variant condition, namely, the Gain block 2612, the Scope block 2614, and the Outport block 2616.

Identifying variant conditions by mouse clicking (or hovering) on the annotations is one means by which to narrow in on a specific variant condition within the model 2600. As an alternative implementation, the variant condition annotation engine may direct the UI engine 102 to color all blocks with similar variant conditions with the same color, and use different colors for different variant conditions.

The Sine4 block 2605 is assigned the variant condition annotation v:6, which corresponds to the expression "false", as indicated at row 2635g of the table 2630, which means this block 2605 is never part of the model execution of the model 2600. One may be wondering where the expression false comes from. Examining the model 2600, the second input port 2624 of the Variant Source2 block 2608 is connected to the Add1 block 2610, and the variant condition V==2 is propagated to the Add1 block 2610. Next, the variant condition V==2 is propagated to the Sine2 block 2603, and to the Variant Source1 block 2606. Within the Variant Source1 block 2606, the variant condition V==4 is specified on its second input port 2620. This means the variant condition propagation engine 124 needs to back propagate the variant condition V==2 && V==4, which is false, to the Sine4 block 2605.

This is a simple example of where it is easy to see where variant conditions have come from, but even in this simple example it greatly helps to have the variant condition annotations at the blocks and/or ports of the model 2600 to enable the user to see what variant conditions each block has. Variant conditions can get much more complex as variant conditions are added to the model 2600. For example, when variant blocks, such as Variant Source blocks and Variant Subsystems, are cascaded together in a model, variant conditions combine and can become more complex. To help the user understand this complexity, the variant condition annotation engine 138 may put the variant annotations into an expanded mode, which may show the decomposition of the variant conditions.

Figures 27, 28:
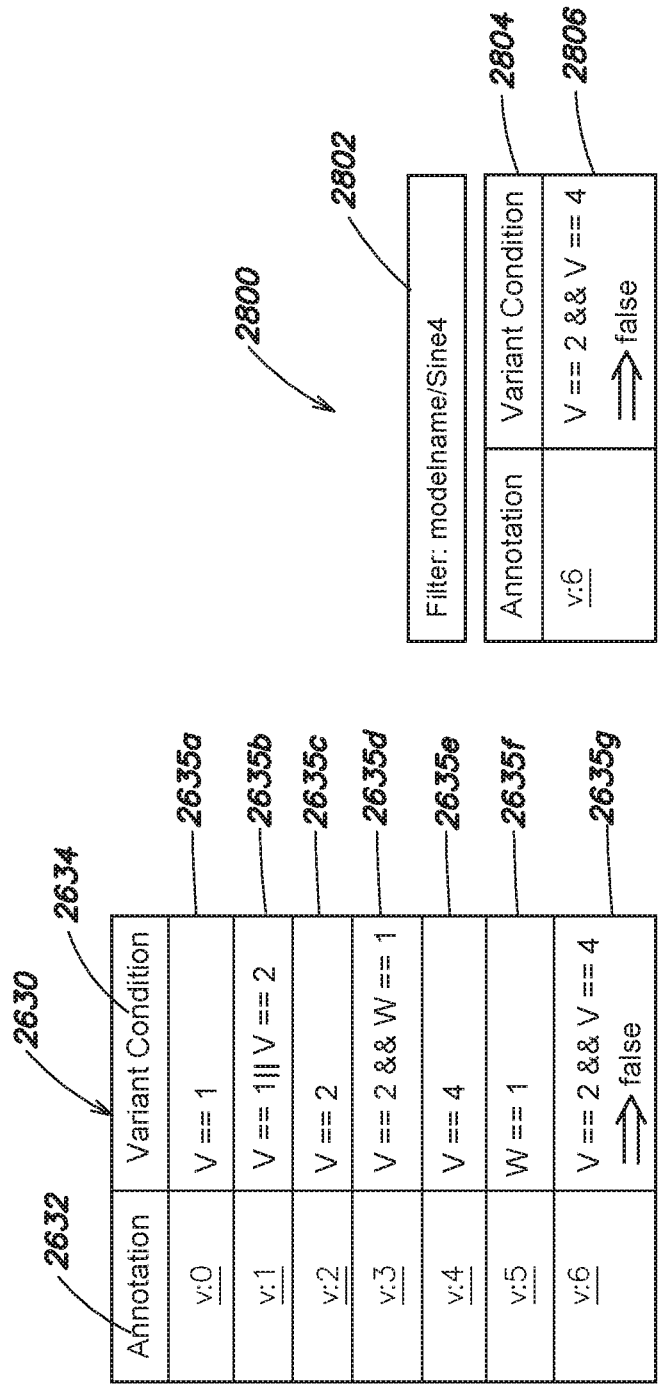
FIG. 27 is an illustration of an example data structure in accordance with one or more embodiments.
FIG. 28 is an illustration of an example data structure in accordance with one or more embodiments.

FIG. 27 is another illustration of the variant condition table 2630, in which the 'false' entry of row 2635g is decomposed. As illustrated at row 2635g, the variant condition v:6 being false comes from the condition "V==2 && V==4". Continuing with this example, it may be helpful to a user to know where the condition V==4 is coming from in the expression associated with the Sine4 block 2605. To do this the variant condition annotation engine 138 may scope the variant condition annotation within the model 2600 to just be the Sine4 block 2605 using a filtering capability. FIG. 28 illustrates a filtered variant condition table 2800. The filtered variant condition table 2800 may include a filter control 2802, which has been set, e.g., by the user to the Sine4 block 2605 of the model 2600, which may be named 'modelname', and a variant condition annotation table 2804 having a single row 2806 that includes the variant annotation symbol, e.g., v:6, and the decomposed variant condition, e.g., 'V==2 && V==4→false'.

This filtering capability as implemented by the variant condition annotation engine 138 may let a user specify a set of blocks or subsystems of a model as a filtering criterion, and the annotation view generated by the variant condition annotation engine 138 may show only the blocks matching the specified filter criterion. It should be understood that there may be other alternative filtering criterions, such as when the blocks match a specific type, regular expression, contain certain parameter values, etc. In this example, the variant condition annotation engine 138 filtered on only the Sine4 block 2605 of the model 2600, as specified in the filter control 2802. The next steps in narrowing where the variant condition V==4 came from may be found by using the mouse, e.g., to hover over the variant condition V==4 in row 2804 of the filtered variant annotation table 2800. In response to the mouse hover operation, the variant condition annotation engine 138 may direct the UI engine 102 to display a pop-up window that may indicate the source of the V==4 variant condition subexpression.

Figure 29:
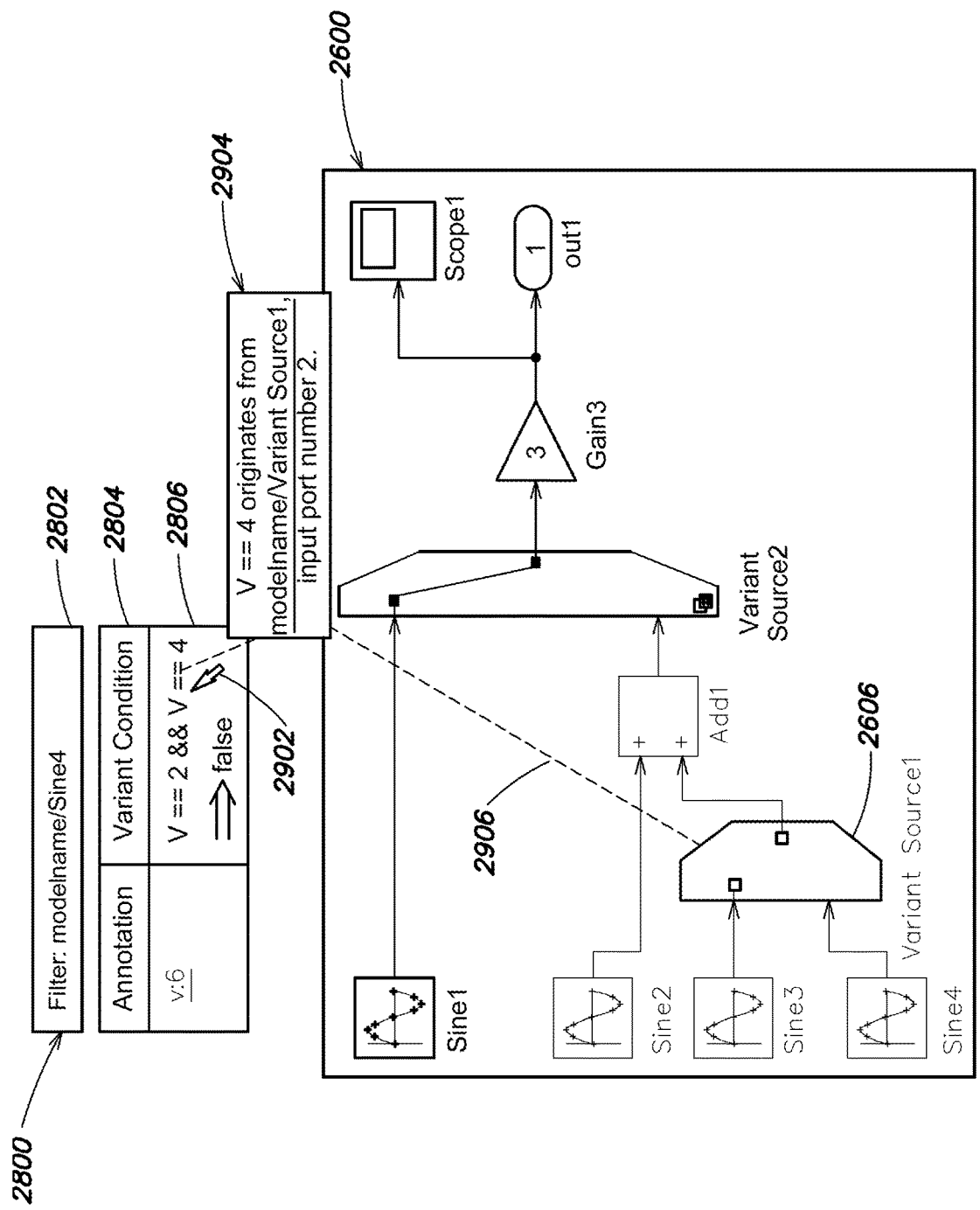
FIG. 29 is an illustration of an exemplary sequence of using a data structure in accordance with one or more embodiments.

FIG. 29 is an illustration of this sequence. As shown, a user may use a mouse to hover a pointer 2902 over the V==4 variant condition subexpression within the row 2806 of the filtered variant condition table 2800. In response, the variant condition annotation engine 138 may cause the UI engine 102 to display a pop-up window 2904 that provides an explanation of where the selected variant condition V==4 comes from, e.g., "V==4 originates from modelname/Variant Source1, input port number 2". The 'modelname/Variant Source1' portion of the explanation may be configured as a link, as indicated by the underlining, such that if the user selects this link, the variant condition annotation engine 138 may direct the UI engine 102 to navigate to and optionally highlight that block, e.g., the Variant Source1 block 2606 in the model 2600, as indicated by dashed line 2906.

At this point, using the variant implementation system 114, a user can identify the source of the V==4 error, and realize that this may not be correct. The user may change this variant condition to W==2, for example using the properties dialog for the Variant Source1 block 2606 or via a programmatic API, such as set_param(gcb,'VariantControls', {'W==1','W==2'}).

Figure 30:
FIG. 30 is an illustration of an example graphical affordance in accordance with one or more embodiments.
Figure 31:
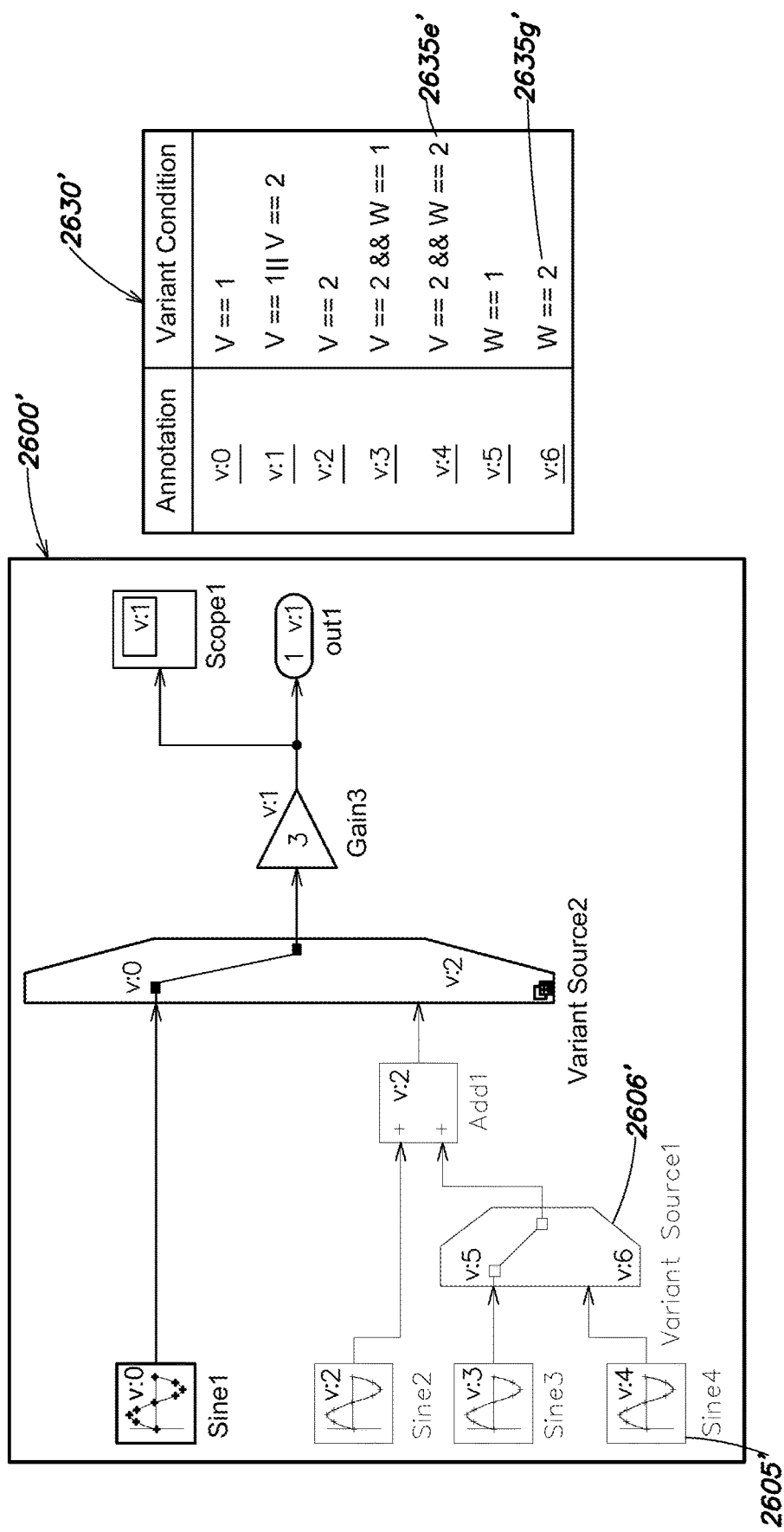
FIG. 31 is an illustration of an example model in accordance with one or more embodiments.

FIG. 30 illustrates a properties dialog 3000 for the Variant Source1 block 2606 of the model 2600. As indicated at an entry 3002, the variant condition for the second port 2624 of the Variant Source1 block 2606 has been changed from 'V==4' to 'W==2'. FIG. 31 illustrates a revised model 2600' and a revised variant condition annotation table 2630'. As indicated at revised row 2635e' of the table 2630', the variant condition represented by the symbol v:4, which is assigned to the Sine3 block 2604, is now "V==2 && W==2". In addition, as indicated at revised row 2635g' of the table 2630', the variant condition represented by the symbol v:6, which is assigned to the second input port 2620 of the Variant Source1 block 2606, is now "W==2". With this change, the revised model 2600' makes more sense than the original version of the model 2600 in that the Sine4 block 2605' will be active when the variant control variable V is set to 2 and the variant control variable W is set to 2.

The ability of the variant condition annotation engine 138 to annotate a model, present a legend of the variant conditions, and link table elements to corresponding model elements illustrates the benefits of having variant annotations that are optionally shown on a model editor. Associated with the annotations may be a variant annotation table, such as the table 2630, that provides a list of the annotations and the corresponding variant conditions. The variant condition annotation engine 138 may provide a filtering capability for use with the table 2630 that allows a user to reduce the scope of what variant conditions are shown in the variant annotation table to a subset of the blocks in a model. From within the expressions presented in the variant annotation table, a user can then select subexpressions and navigate to the source of those subexpressions in the model.

Figure 81:
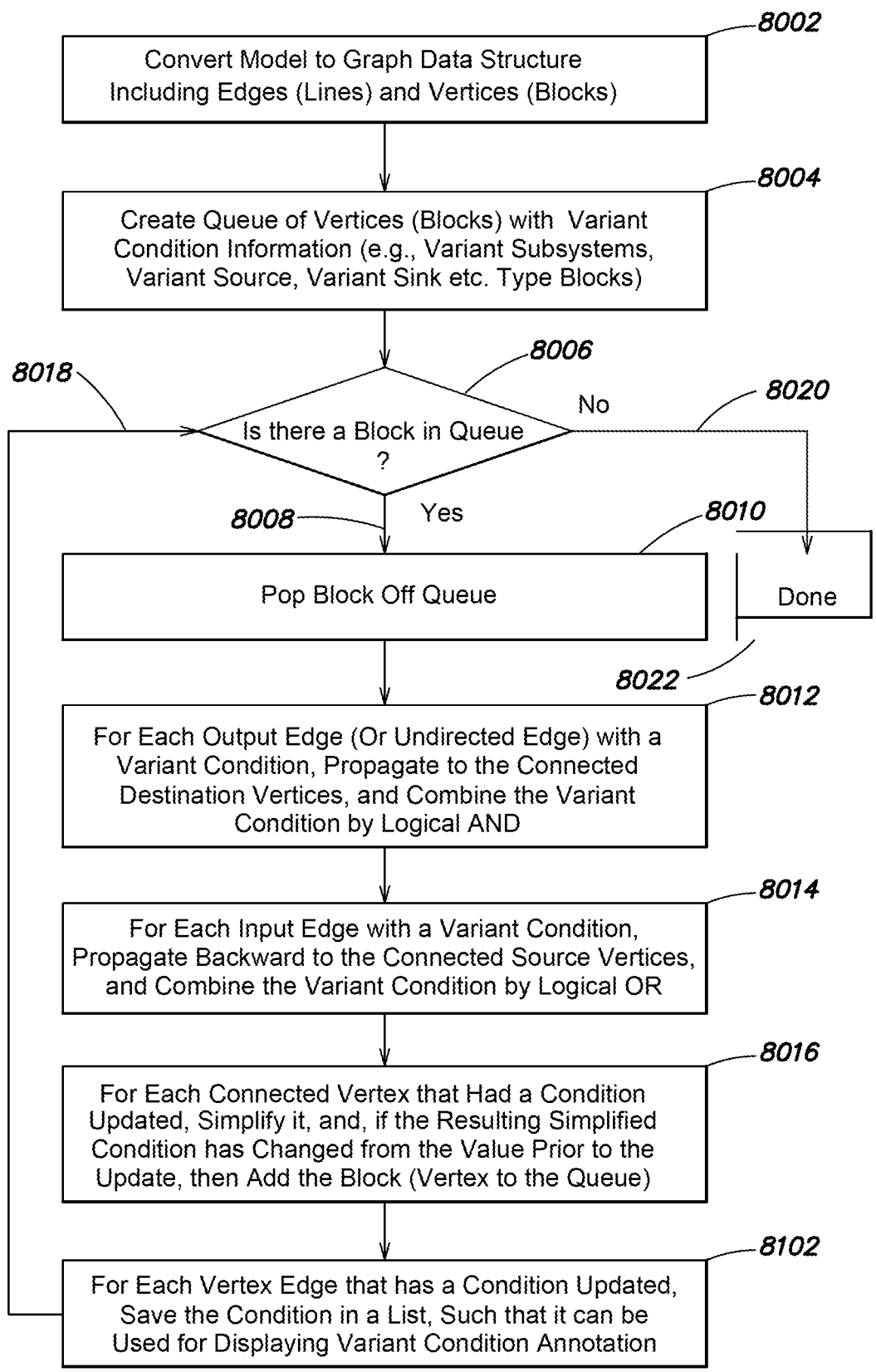
FIG. 81 is a flow chart of an example method in accordance with one or more embodiments.

FIG. 81 is a flow diagram of an example method for computing the decomposition of variant conditions. The flow-chart of FIG. 81 is similar to the flow-chart of FIG. 80. To be able to decompose the variant condition expressions, the states of the expression computation may be saved in a list, as indicated at new step 8102 following step 8016. Each block port connection (vertex/edge) will have a variant condition associated with it. In addition, each block (vertex) will have an overall variant condition that is the logical OR of all block port connections. The variant annotation display can then use the list of conditions associated with a given variant condition expressions to show the decomposition.

Another aspect of understanding the variants of a model may occur when a user wants to identify where in a model the variant control variables are used.

Figure 32:
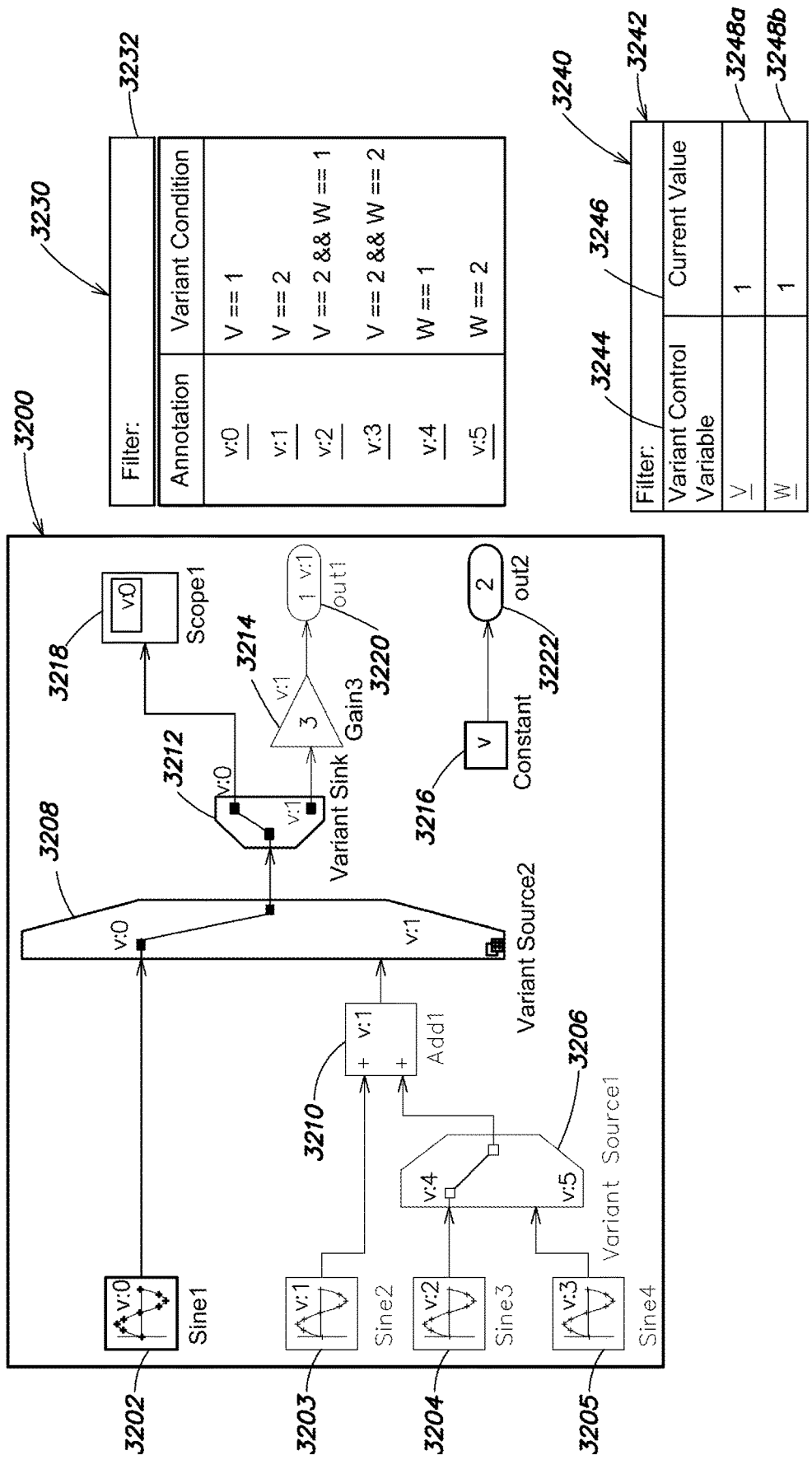
FIG. 32 is an illustration of an example model in accordance with one or more embodiments.

FIG. 32 illustrates an example model 3200. The model 3200 includes four Sine blocks 3202-2605, named, 'Sine1', 'Sine2', 'Sine3', and 'Sine4', respectively, which may generate sine wave signals, two Variant Source blocks 3206 and 3208 named 'Variant Source1' and 'Variant Source2' respectively, an Add block 3210, named 'Add1', a Variant Sink block 3212, named Variant Sink', a Gain block 3214, named 'Gain3', a Constant block 3216, a Scope block 3218, named 'Scope1', and two Outport blocks 3220 and 3222, named 'Out1' and 'Out2', respectively. The Variant Source1 block 3206, the Variant Source2 block 3208, and the Variant Sink block 3212 provide variation to the model 3200. A variant annotation table 3230, which includes a filter control 3232, is also displayed. In an embodiment, the variant condition annotation engine 138 may also direct the UI engine 102 to generate and display a Variant Control Variable graphical affordance, such as a window 3240, which may shows the variant control variables and their size or value. Note, the term window is being used in its general sense. For example, it may be a region of the display and this can be a subsection of a larger window. The Variant Control Variable window 3240 may include a filter control 3242. A user may specify a filtering criterion, such as a subset of blocks of the model 3200, in the filter control 3242. In response, the variant control annotation engine 138 may present the variant control variables associated with the specified subset of blocks and their sizes in the window 3240. The Variant Control Variable window 3240 may be in the form of a table, and may include a Variant Control Variable column 3244 and a Current Value column 3246. The table 3240 may further include rows 3248a-b for the corresponding variant control variables and their sizes.

In some embodiments, the variant control variables presented in the Variant Control Variable column 3244 may be configured as mark-ups, such as hyperlinks. If a user selects, e.g., with a mouse click or programmatically, one of the variables, e.g., V, in the variant control variable column 3244 of the window 3240, the variant condition annotation engine 138 may direct the UI engine 102 to mark the blocks of the model 3200 that are using the variant control variable V using one or more graphical affordances, such as highlighting, shading, bolding, animations, etc.

Figure 33:
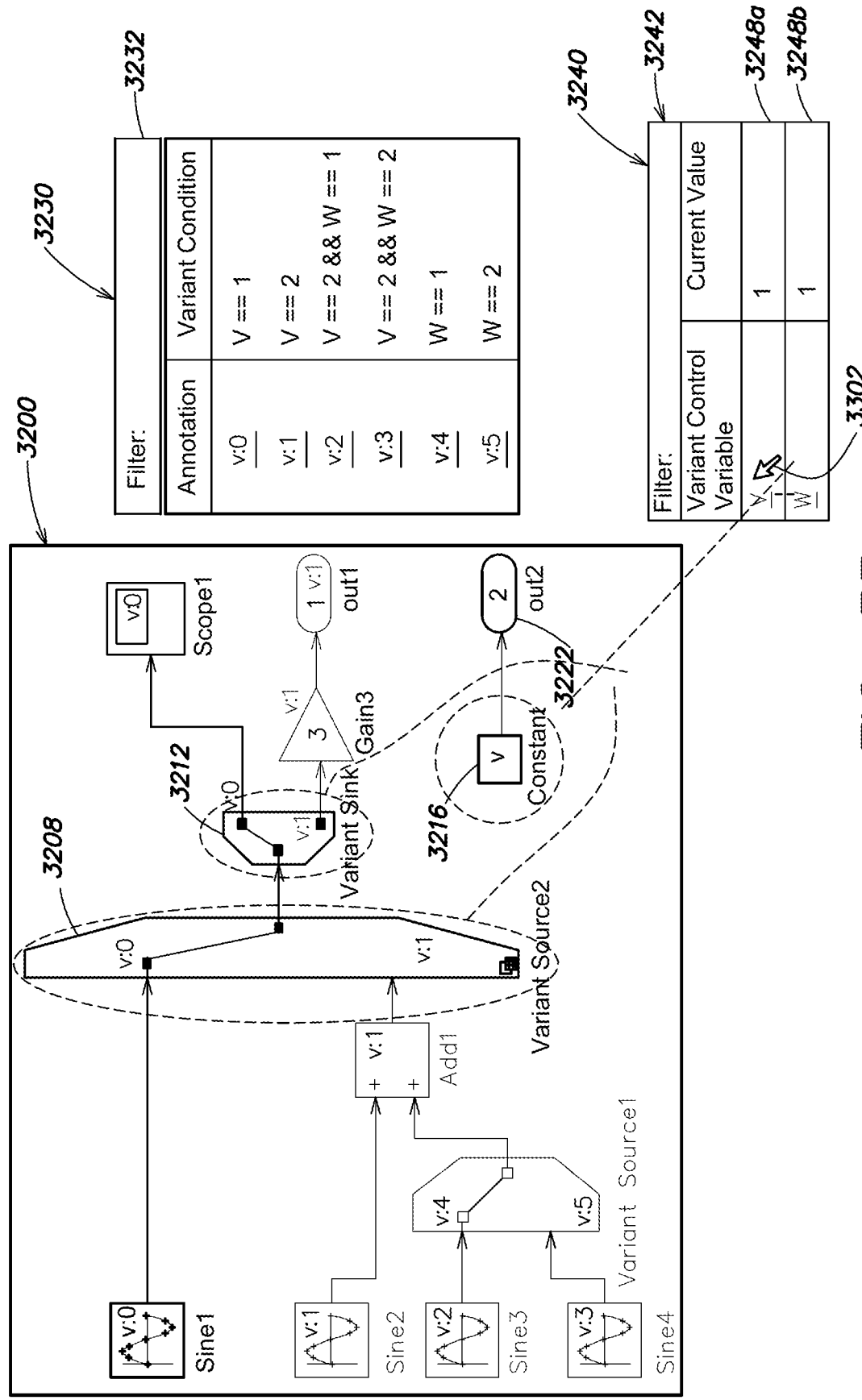
FIG. 33 is an illustration of an example model in accordance with one or more embodiments.

FIG. 33 illustrates the model 3200 with the variable V selected, as indicated by the cursor 3302. The variant tracing engine 140 may analyze an in-memory representation of the model 3200, and trace the use of the selected variant control variable, e.g., V, in the model 3200. The variant tracing engine 140 may determine that the variant control variable V is used in three blocks of the model 3200, i.e., the Variant Source2 block 3208, the Variant Sink block 3212, and the Constant block 3216. A Constant block may write is value, in the case of the Constant block 3216 the value of V, to its output signal to be passed along to the appropriate portion of the model or physical system. The output of the Constant block 3216 is connected to the Outport Out2 block 3222. A user of the modeling environment 100 may not want V to be used as both a regular parameter and a variant control variable. If so, the variant condition annotation engine 138 and the variant tracing engine 140 can help the user identify an incorrect use of V in the Constant block 3216, so the user can replace it with an appropriate value. The annotation engine 138 and the variant tracing engine 140 are able to help the user because the user can see the decomposition of the variant condition expressions, and how they are assigned to blocks and ports throughout the model.

The filter control 3242 of the Variant Control Variable window 3240 may allow a user to filter the model 3200 to a set of blocks. This functionality may become useful especially when looking at very large models where the user may want to "zoom" into a region of interest of the large model. For example, a user could specify the path to a particular subsystem within the filter control 3242, and in response the variant condition annotation engine 138 may determine the variant control variables utilized by that particular subsystem, and only display the variant control variables utilized within that particular subsystem in the Variant Control Variable window 3240.

Graphical programs, such as models, have execution semantics, and therefore can be translated into other languages. For example, the model 3200 of FIG. 32 can be converted to generated code by the code generator 108. FIGS. 34A and 34B are partial views of a partial listing of code 3400 generated for the model 3200 by the code generator 108. Only the step function for the model 3200 is shown in the code 3400. The global variable declaration code, initialization code, block comments, etc. are removed.

In the generated code 3400 for the model 3200, the code generator 108 includes comments of the form "v:1", which match the variant annotations described herein. Code viewers may be created that look for comments of this syntax, and create links, such as hyperlinks, back to the original model 3200. When a user clicks on such a link in the generated code 3400, the modeling environment 100 may navigate to the variant annotation window 3230 from which the user can explore the variant conditions in the model 3200. The code generator 108 may realize this code viewer with links functionality by using the HyperText Markup Language (HTML), and creating special hyperlinks within the generated code that link back to the model 3200. For example, the code for "#if V==1/*v:0*/" could be placed in the HTML using one or more HTML elements, such as the following URL embedded within the comment associated with the preprocessor conditional:

if V==1/*<a href="model:open_annotation('example', 'v:0')">v:0</a>*/

Here, the "model: . . . " URL may be configured to run a command. In this case, the command may be open_annotation( ), which may open the annotations window 3230 for the model 3200, which may be named 'example'.

The code shown in FIGS. 34A and 34B is C code and is an illustrative example of code the code generator 108 may generate for the model 3200 of FIG. 32. Since block diagram models are executable specifications, they can be converted to any language that supports the execution semantics of the model. For example, a model could be converted to C++, Java, JavaScript, Perl, Python, MATLAB, and other high level textual programming languages. In some embodiments, the model may be converted to "byte-codes" for execution on a virtual machine. The model may also be converted assembly language. The model could also be converted to a hardware definition language (HDL), such as Verilog for hardware synthesis. A common characteristic of the languages is that they all can support the execution semantics of the model, and they all have a commenting ability.

The example generated code 3400 of FIGS. 34A and 34B uses the direct variant conditions expressions translated to the preprocessor conditionals. An alternative implementation is to use the variant annotations within the preprocessor conditionals. For example, the code generator 108 may be configured to write Va1 for the variant annotation "v:1". FIGS. 35A and 35B are partial views of a partial listing of code 3500 generated by the code generator 108 utilizing this alternative implementation.

Figure 36:
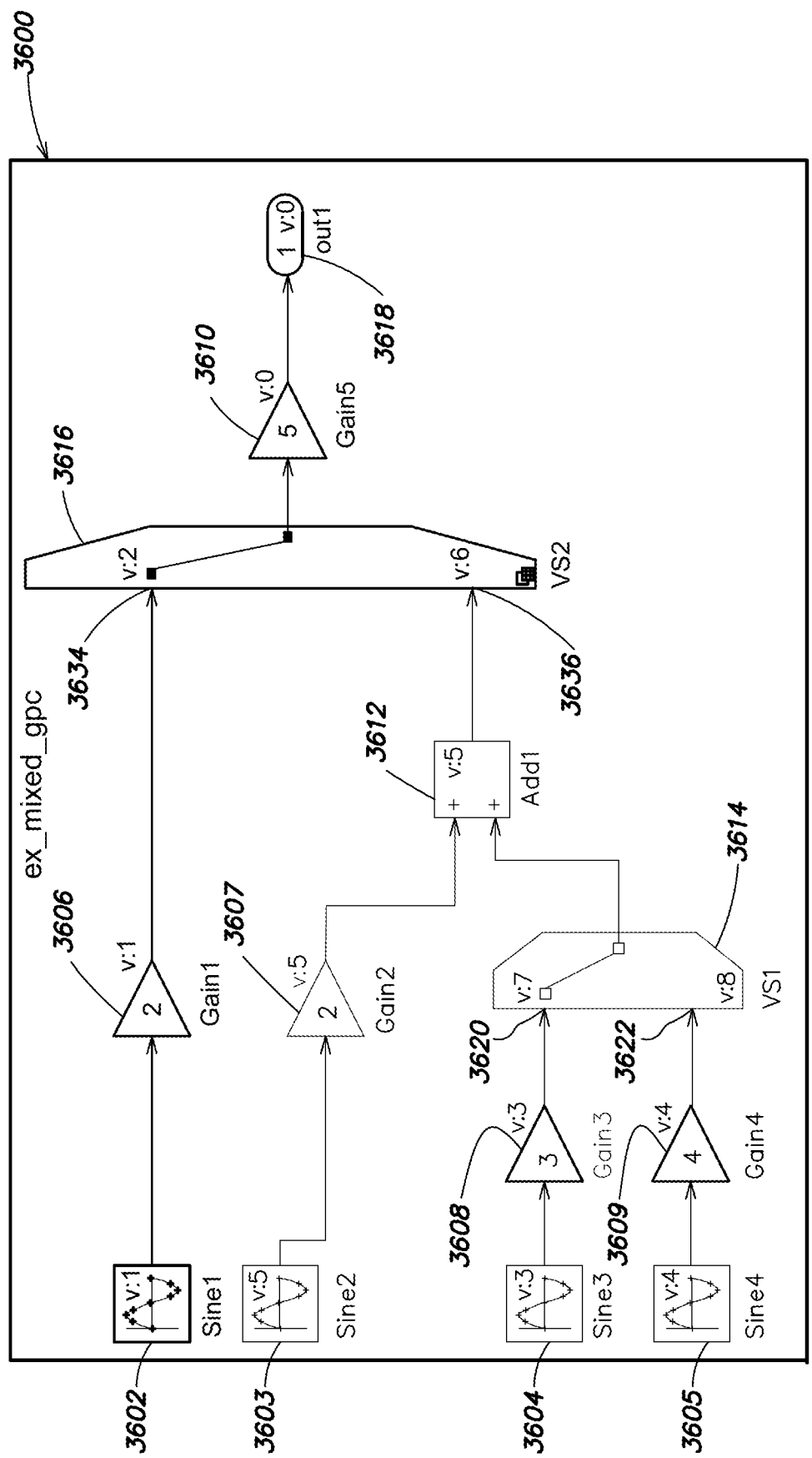
FIG. 36 is an illustration of an example model in accordance with one or more embodiments.

FIG. 36 illustrates an example model 3600. The model 3600 includes four Sine blocks 3602-3605, named, 'Sine1', 'Sine2', 'Sine3', and 'Sine4', respectively, five Gain blocks 3606-3610, named 'Gain1', 'Gain2', 'Gain3', 'Gain4', and 'Gain5', respectively, an Add block 3612, named 'Add1', two Variant Source blocks 3614 and 3616, named 'VS1' and 'VS2', and an Outport block 3618, named 'Out1'. The Variant Source block VS1 3614 may have variant condition W==1 assigned to its first input port 3620, and variant condition W==2 assigned to its second input port 3622. The Variant Source block VS2 3616 may have variant condition V==1 assigned to its first input port 3634, and variant condition V==2 assigned to its second input port 3636.

Figure 37:
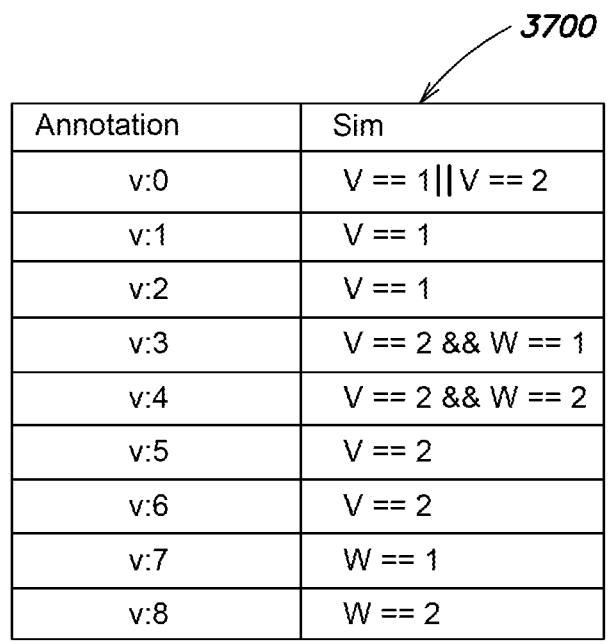
FIG. 37 is an illustration of an example data structure in accordance with one or more embodiments.

FIG. 37 is an example variant annotation table 3700 generated by the variant annotation engine 138 for the model 3600. The Variant Source VS1 block 3614 may have its 'generate preprocessor conditionals' option unselected, which means that the inactive portions of the model 3600 corresponding to the variant choices that Variant Source VS1 block 3614 creates will not be part of the model execution or generated code. The Variant Source VS2 block 3616 may have its 'generate preprocessor conditionals' option selected, which means that all variant choices that Variant Source VS2 block 3616 creates will be placed within preprocessor conditionals when generating code, e.g., for the C language the code generator 108 will use #if statements.

If the user defines the variant variable W to be 1, and then enters a command to generate code for the model 3600, the code generator 108 may generate code. FIGS. 38A and 38B are partial vies of an example listing of code 3800 generated by the code generator 108 for the model 3600. Notice that in the generated code 3800 there are no #if statements associated with the variant control variable, W, because the code generator 108 is configured to not generate such statement in response to detecting that the user turned off the generate preprocessor capability. This processing of the model 3600 may be handled by propagating all variant condition expressions through the model 3600, then converting the sub-expressions involving the conditions with the generate preprocessor conditionals (gpc) to either true or false statements and simplifying the expression. Examining the code 3800, one sees that the code corresponding to the Gain3 block 3608 and the Sine3 block 3604 are present. This is because the variant condition associated with these two blocks 3608 and 3604 is "V==2 && W==1", which becomes "V==2 && true", which simplifies to V==2.

Notice that there is no code related to the Gain4 block 3609 or the Sine4 block 3605, because the variant condition "V==2 && W==2" becomes "V==2 && false", which simplifies to false.

As shown, there are two different variant conditions. One is formed when ignoring the generate preprocessor conditionals setting, and one is formed when taking into account the generate preprocessor conditionals setting of the variant blocks 3614 and 3616. These two different variant conditions may be referred to as the "sim" and "codegen" conditions, because the "sim" condition is used when simulating the model 3600, and the "codegen" condition is what is seen in the generated code 3800. The variant condition annotation engine 138 may be configured to display both conditions in a version of the variant annotation window. When the user selects or issues a command to display additional information in the variant annotation window, the UI engine 102 will use the information computed by the variant annotation engine 138, and the variant tracing engine 140 to update the display.

FIG. 39 illustrates an example of a variant annotation window 3900 for the model 3600. The window 3900 may be arranged as a table having a column 3902 named 'Annotation', a column 3904 named 'Sim', and a column 3906 named 'CodeGen'. The window 3900 may further include a plurality of rows 3908a-g for the variant conditions defined within the model 3600. The Sim column 3904 presents the variant conditions when simulating the model 3600, while the CodeGen column 3906 presents the variant conditions when code is generated for the model 3600 by the code generator 108.

Auto-Layout after Variant Reduction where the Layout Leverages Existing Layout Information, Plus the Ability to Package Up the Reduced Variant Model Containing Artifacts, Packaging, and Reports Ability to Reduce a Variant Model for Multiple Configurations U.S. Pat. No. 8,386,222 illustrates how to reduce a model for a single configuration. This may be useful for supplying a given variant configuration to an Original Equipment Manufacturer (OEM), where a variant configuration may represent and/or include a combination of variant choices defined in one or more variant design regions of a model. However, there may be times when a user wants to reduce a model for a subset of the allowed variant configurations.

Example Models

Figure 40A:
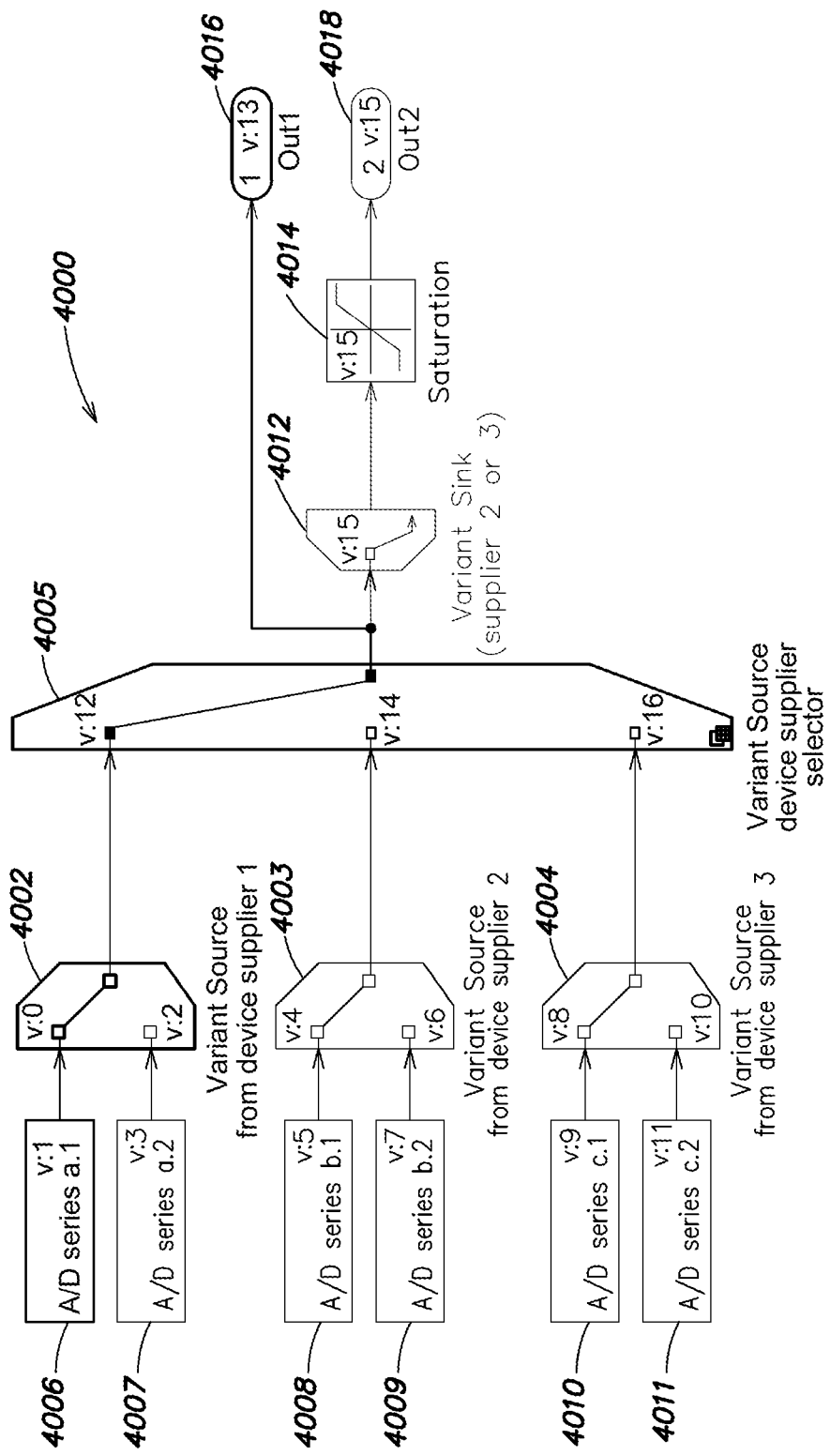

FIGS. 40A and 40 B are partial views illustrating an example model 4000. The model 4000 includes four Variant Source blocks 4002-4005 named 'Variant Source from device supplier 1', 'Variant Source from device supplier 2', 'Variant Source from device supplier 3', and 'Variant Source device supplier selector', respectively. The model 4000 further includes six Analog to Digital (A/D) converter blocks 4006-4011 named 'A/D series a.1', 'A/D series a.2', 'A/D series b.1', 'A/D series b.2', 'A/D series c.1', and 'A/D series c.2', respectively, pairs of which are connected to the Variant Source blocks 4002-4004. The model 4000 further includes a Variant Sink block 4012 named 'Variant Sink (supplier 2 or 3)', a Saturation block 4014, and two Outport blocks 4016 and 4018 named 'Out1' and 'Out2', respectively. A variant condition annotation table 4020 for the model 4000 is also presented.

A user may wish to have a reduced model be generated from the model 4000 where the user allows selection from device supplier (DSUPPLIER) 1 or 2, and would like to remove any reference to DSUPPLIER==3. Furthermore, the user may like to be able to select both series A/D converters for DSUPPLIER==1 or DSUPPLIER==2. Notice that the variant condition on the 'Variant Sink (supplier 2 or 3)' block 4012 has condition DSUPPLIER==2||DSUPPLIER==3, as illustrated by the annotation "v:15".

For this example, the user may create six variant configurations. FIG. 41 is a schematic illustration of an example data structure in the form of a table 4100. The table 4100 may include one column 4102 for variant configuration names, and another column 4104 for values of variant control variables. The table 4100 may also include a plurality of rows 4106a-f for associating particular variant configuration names to values of variant control variables.

Figure 42:
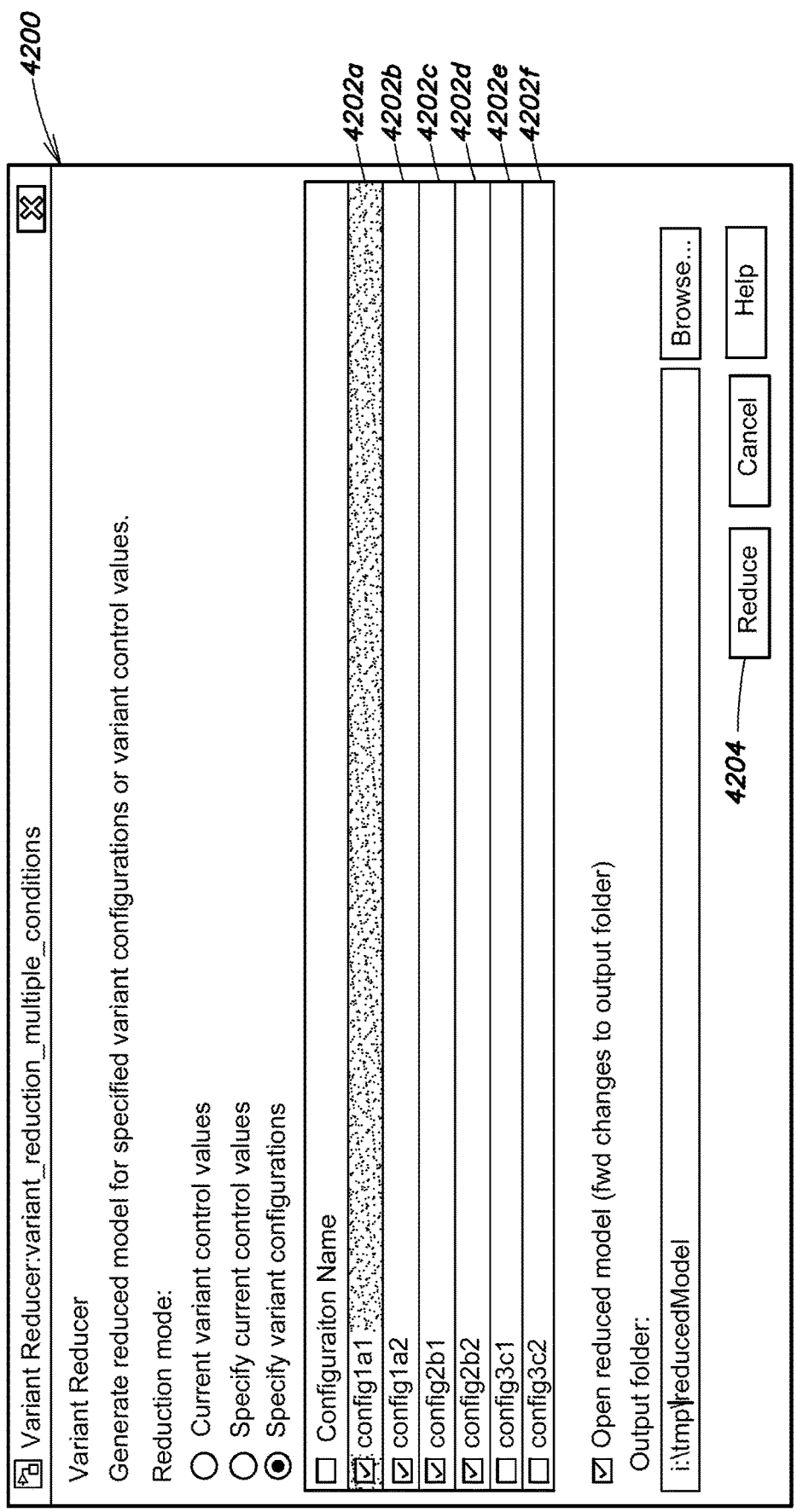
FIG. 42 is an illustration of an example graphical affordance in accordance with one or more embodiments.

The UI engine 102 may generate and present a graphical affordance, such as a dialog, through which a user may select particular ones of the variant configurations as defined within the table 4100. FIG. 42 is an illustration of an example dialog 4200. The dialog 4200 may be used to select the variant configurations corresponding to DSUPPLIER==1 or DSUPPLIER==2, which the user would like to have reduced. In some embodiments, the variant reducer interface may either be programmatic, e.g. reducemodel ('name','config1a1', . . . ) or it can be a GUI as shown in FIG. 42. The dialog 4200 may include a plurality of entries 4202a-f that may correspond to the variant configurations defined for the model. Each entry 4202 may include an associated checkbox that may be selected or unselected by a user. By checking respective checkboxes, a user may select the variant configurations to be retained in the model. The dialog 4200 also may include a Reduce command button 4204.

Figure 43:
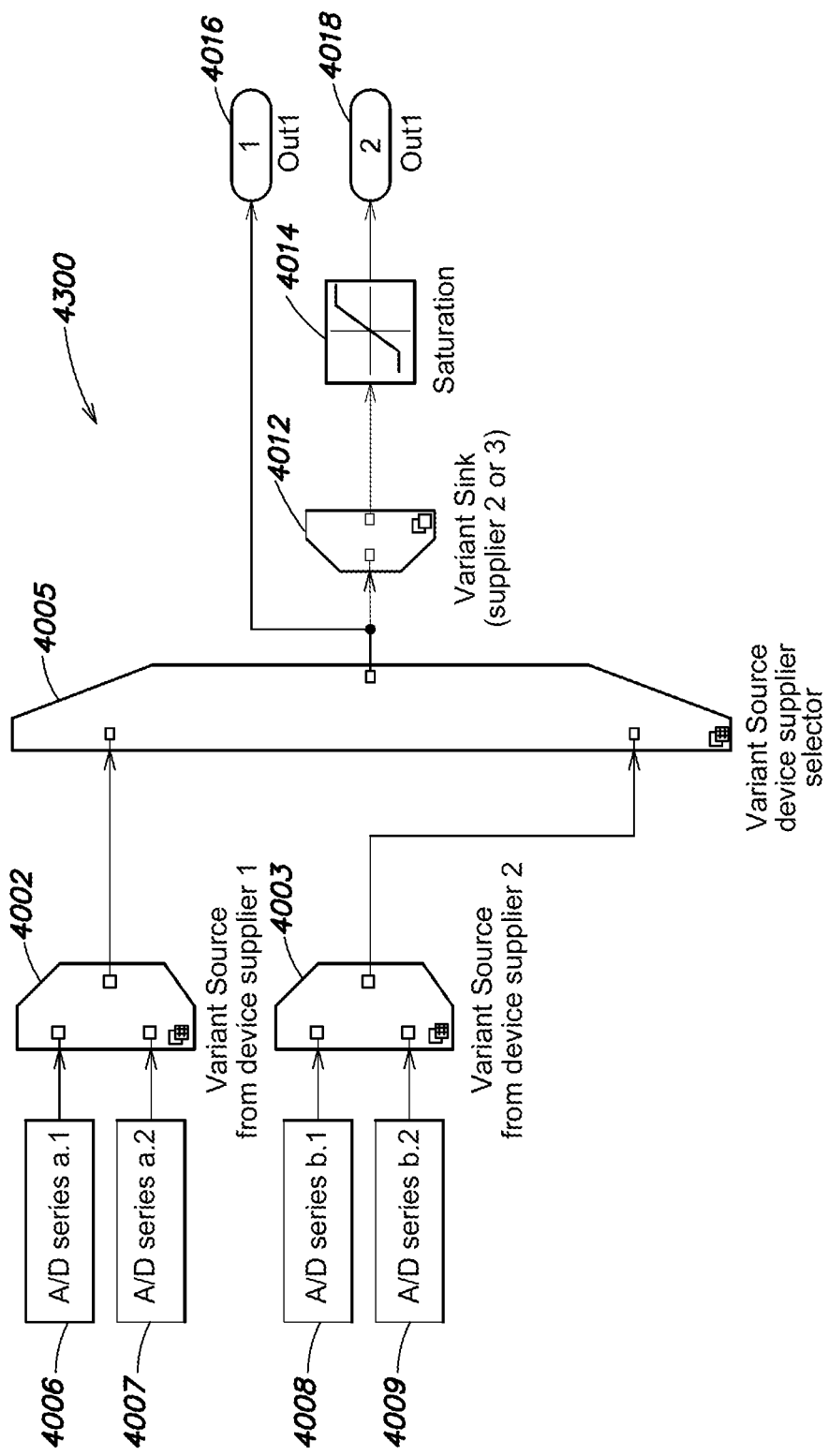
FIG. 43 is an illustration of an example model in accordance with one or more embodiments.

In response to a user clicking the Reduce command button 4204, the variant reducer tool 142 may create a reduced version of the original model 4000. FIG. 43 is an example of a reduced model 4300. In the reduced model 4300, the variant reducer tool 142 removed the 'Variant Source from device supplier 3' block 4004 (FIG. 40A). It also removed the third variant choice from the 'Variant Source device supplier selector' block 4005, because there is no longer a third option. The 'Variant Sink (supplier 2 or 3)' blocks' condition was altered from "DSUPPLIER==2||DSUPPLIER==3" to be DSUPPLIER==2.

Figure 44A:
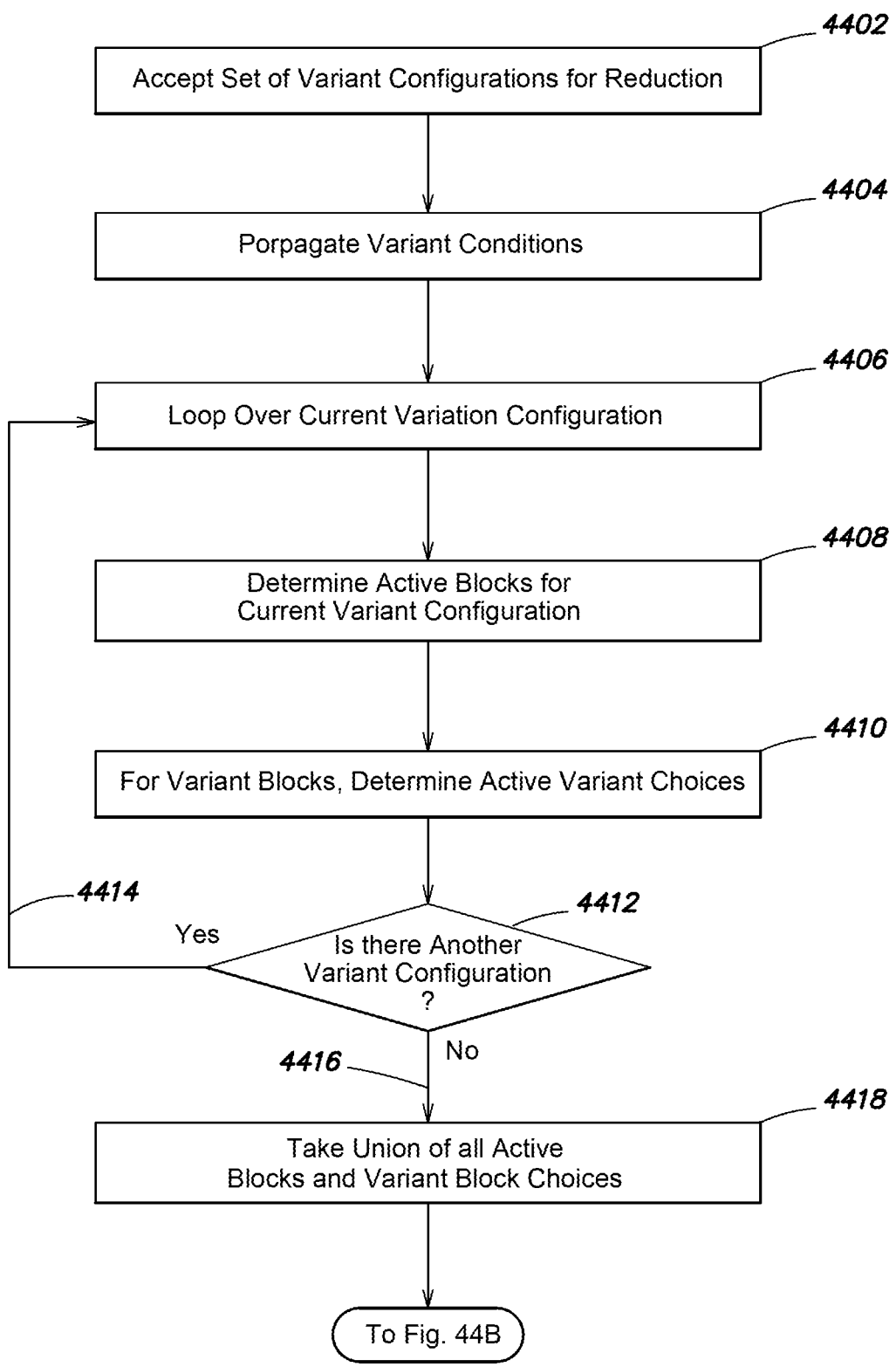
FIGS. 44A-B are partial views of a flow diagram of an example method in accordance with one or more embodiments.
Figure 44B:
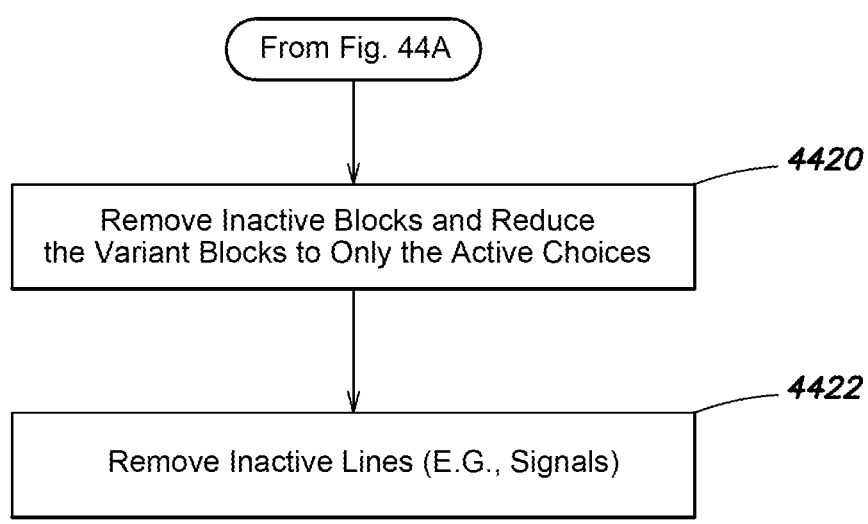

FIGS. 44A and 44B are partial views of a flow diagram of an example method. To implement variant reduction, the variant reducer tool 142 may accept the set of variant configurations for reduction, as indicated at step 4402. The variant reducer tool 142 may first propagate all variant conditions to all blocks in the model, as indicated at step 4404. For our example, the variant conditions are shown in the variant annotation table 4020 of FIG. 40B. The variant reducer tool 142 may then loop over each variant configuration starting with a current configuration, as indicated at step 4406. The variant reducer tool 142 may determine active blocks for the current variant configuration, as indicated at step 4408. For example, the variant reducer tool 142 may start with config1a1 which sets DSUPPLIER=1 and A=1 (the values of B and C may or may not be defined for this configuration). For this configuration, the expressions corresponding to all blocks except the "A/D series a.1" and "Out1" are inactive. In addition, the two Variant Source blocks, "Variant Source from device supplier 1" 4002 and "Variant source device supplier selector" 4005 are active in that they have active signals passing through them. Therefore, from this configuration, the variant reducer tool 142 may compute a set of blocks that should remain in the model, and know which variant choices of the variant blocks should remain in the model, as indicated at step 4410. The first port of these two Variant Source blocks 4002 and 4005 is active. These first two ports may be referred to as the active variant choice ports. If the model had contained variant subsystems, there may be active variant choices of the Variant Subsystems blocks.

Next, the variant reducer tool 142 may determine whether there is a next configuration, as indicated at decision block 4412. If so, the variant reducer tool 142 may take the next configuration, e.g., config1a2 which sets DSUPPLIER=1 and A=2 (again the values of B and C may or may not be defined for this configuration), as indicated by Yes arrow 4414 leading to step 4406. As seen in config1a2, the variant reducer tool 142 may assign variant conditions to the blocks, which resulted in all blocks being inactive except the "A/D series a.2" block 4007 and the Out1 block 4016. In addition, the two Variant Source blocks, "Variant Source from device supplier 1" 4002 and "Variant source device supplier selector" 4005 are active in that they have active signals passing through them. The second input of both of these Variant Source blocks 4002 and 4005 is active. This process may be repeated for each configuration. As indicated by No arrow 4416 leading to block 4418, the variant reducer tool 142 may then take the union of all active blocks and corresponding choice of the variant blocks. The variant reducer tool 142 may remove inactive blocks and reduce the variant blocks to only the active variant choices, as indicated at step 4420 (FIG. 44B). The variant reducer tool 142 may also remove inactive lines from the model, as indicated at step 4422. This results in the reduced model 4300 of FIG. 43.

Auto-Layout

In the reduced model 4300 illustrated in FIG. 43, the blocks are in the same position as that of the original model 4000 (FIG. 40A) and at least some of the lines are bent or crooked. For example the lines from blocks 4002 and 4003 to block 4005 are bent or crooked. The aesthetics of the reduced model 4300 may hurt the readability, especially in larger models where a user may get distracted by the odd layout of the reduced model. Therefore, it may be desirable to re-layout the blocks of a reduced model, for example such that at least some of the lines are not bent or crooked.

There are several auto-layout algorithms, for example, M. Sponemann *On the Automatic Layout of Data Flow Diagrams* (Diploma Thesis, Christian-Albrechts-Universität zu Kiel, Department of Computer Science, Mar. 19, 2009), Y. Koren *Drawing Graphs by Eigenvectors: Theory and Practice* Journal Computers & Mathematics with Applications (June 2005), and S. Kobourov *Spring Embedders and Force-Directed Graph Drawing Algorithms* (January 2012). One issue with these algorithms is that they perform layout, readjusting all blocks in the model. In our case, this may not be desirable. Instead, in some embodiments, it may be desirable to layout the blocks keeping as much of the original layout as possible. To solve this, the model layout tool 115 may use the layout of the blocks as found in the original (e.g., pre-reduced) model coupled with a layout algorithm.

An auto-layout process for a given graph (e.g., a set of blocks and lines connected in a window) may include:
Cycle Removal:
Reverse all the feedback loops in the model and make the model acyclic.
Layer Assignment:
Create a minimal set of layers and assign a layer to each vertex such that all edges span adjacent layers.
Crossing Reduction:
Find an ordering of the vertices of each layer that minimizes the number of edge crossings.
Node Placement:
Determine exact position of all nodes in their corresponding layers. There should not be any overlap and order from previous steps should be maintained.
Edge Routing:
Draw the edges between the nodes avoiding crossing over node drawing.

The initial layout may be leveraged by the model layout tool 115, so the cycle removal step need not be performed because layering is to be used from an initial model sketch. A requirement may be to avoid modification of user defined initial node placements of the original model.

Figure 45:
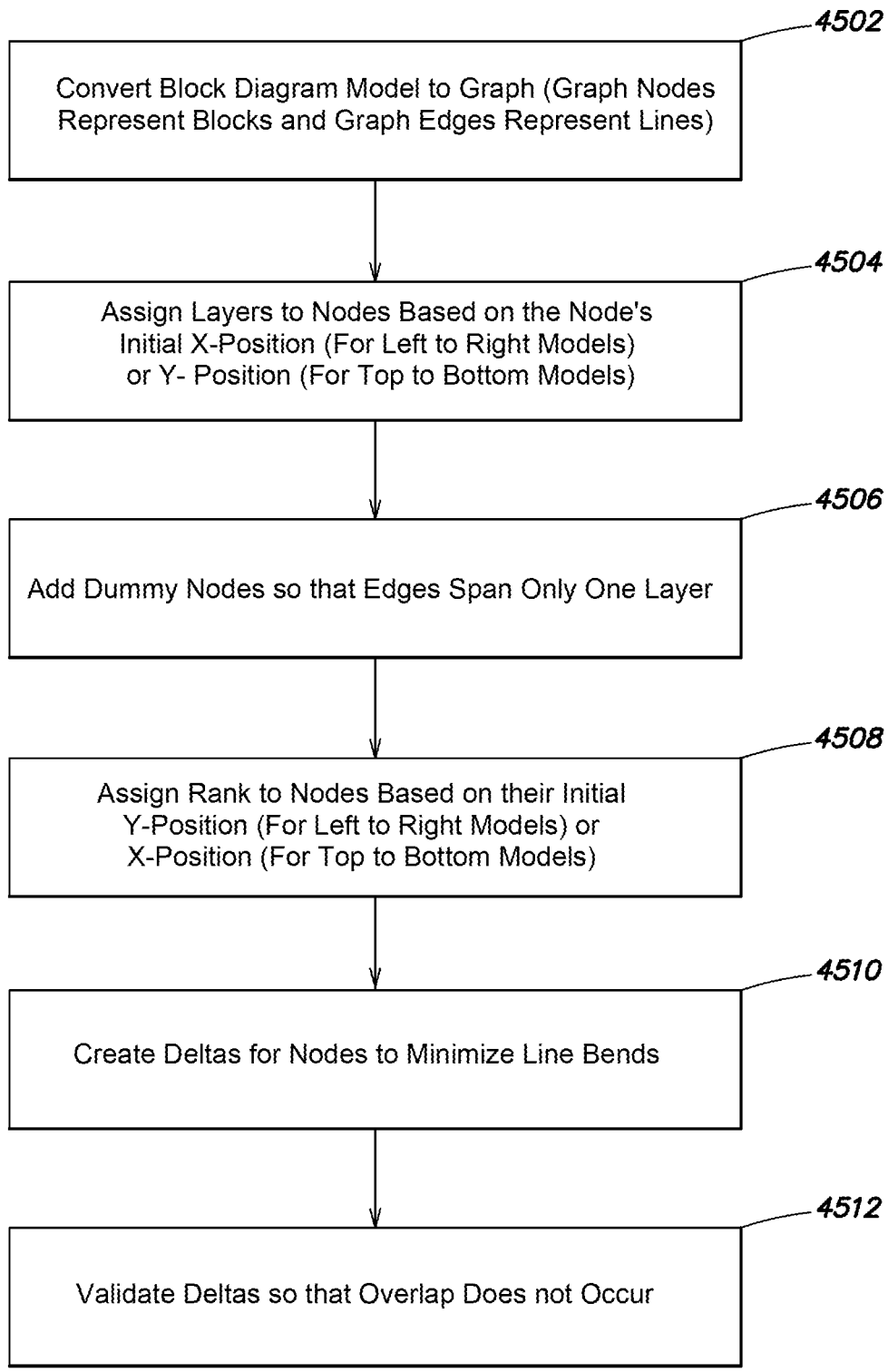
FIG. 45 is a flow diagram of an example method in accordance with one or more embodiments.

FIG. 45 is a flow diagram of an example method. The model layout tool 115 may convert a block diagram model to a graph in which nodes of the graph represent model elements, e.g., blocks, and edges of the graph represent lines among the blocks, which may represent signals, as indicated at step 4502. Next, the model layout tool 115 may need to define layers for the blocks in a graph, and assign layers to nodes, as indicated at step 4504. The layer assignment may be done based on initial x coordinate of nodes (e.g., nodes may be the blocks in the graph). This assumes that model hierarchy is left to right. For top-down modeling cases, the model layout tool needs to consider initial y coordinate for layer assignment. The model layout tool 115 may also add "dummy nodes" (e.g., nodes that are not present in the actual block diagram model) if some edge spans multiple layers, as indicated at step 4506. This step may help in getting a proper "layered graph" such that all edges in this graph span only adjacent layers.

After this, the model layout tool 115 may perform "crossing reduction". The order of nodes in a layer need not be changed from what the user has specified. Rank may be given to nodes based on their initial y-position for horizontal layout, or initial x-position for vertical layout, as indicated at step 4508. Nodes with higher value of y-position may get a higher rank. The model layout tool 115 may then find out the amount of distance by which a node should be moved to minimize line, e.g., signal, bends, creating a delta for each node, as indicated at step 4510. The model layout tool 115 may validate these deltas in the next step so that the blocks do not overlap each other, as indicated at step 4512.

In some embodiments, the model layout tool 115 may apply a horizontal auto-layout algorithm for placing/moving nodes followed by a vertical auto-layout algorithm for placing/moving nodes. In the node placement algorithm for horizontal layout, the model layout tool 115 may begin by picking a reference layer. The layer with maximum size may be considered to be the reference layer. The model layout tool 115 may then proceed to modify the block positions in layers left of the reference layer and then towards the right of reference layer. The blocks inside the reference layer may not be moved.

For a layer which is towards the left of the reference layer, while finding the amount of distance by which it should be moved (e.g., the delta), the model layout tool 115 may consider the port's position with respect to its destination ports. For horizontal layout, the model layout tool 115 may only consider ports that have horizontal orientation. Ports that have vertical orientation may be considered in vertical layout.

The node placement may be balanced with respect to its number of Outports and destination ports. For layers towards the right of the reference layer, a similar procedure may be followed with the difference that Inports and source ports are considered for balanced placement. In the next step, the model layout tool 115 may validate this distance to ensure that block overlap does not occur. The model layout tool 115 may check the modified positions of blocks adjacent in rank within a layer.

Node placement for horizontal layout only changes the y-coordinate of nodes. Hence, the vertical layout of nodes is not changed, which means some signal bends might still exist in top-down oriented signal lines. To address this issue, the model layout tool 115 may modify the vertical layout of the graph by applying vertical auto-layout algorithm.

Figure 46:
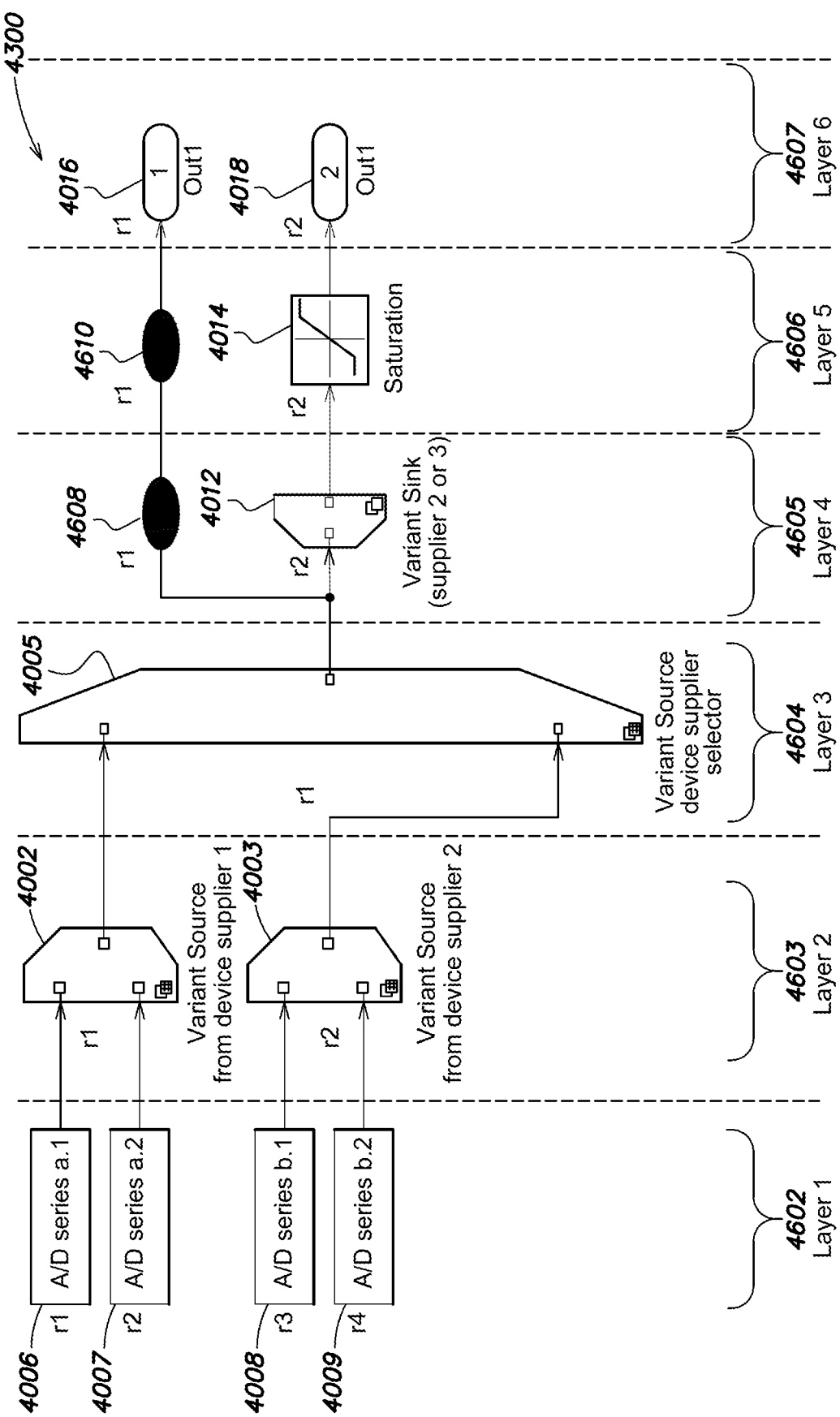
FIG. 46 is an illustration of an example model in accordance with one or more embodiments.

FIG. 46 is an illustration of the reduced model 4300 in which model elements, e.g., blocks, have been assigned layers by the model layout tool 115. The model element tool 115 may define six layers 4602-4607 named Layer 1 to Layer 6 for the reduced model 4300. The model layout tool 115 may also insert two dummy nodes 4608 and 4610 into the reduced model at the fourth and fifth layers 4605 and 4606. The model layout tool 115 also may assign rankings to the blocks within each layer 4602-4607. The rankings are illustrated in FIG. 46 using the abbreviation 'r#'. With reference to layer 1 4602 for example, the four A/D converter blocks 4006-4009 are assigned rankings r1, r2, r3, and r4, respectively.

FIGS. 47A-C are partial views of code describing an example algorithm to implement the model layout tool 115.

Once the node placement is done, for signal routing, the model layout tool 115 may delete the existing signal connections and may add new signal lines, for example using an autorouting technique, such as the autorouting technique used in the Simulink® model-based design environment.

The reduction of a model for multiple variant conditions may apply to any variant blocks or constructs. For example, if there were a variant subsystem with multiple choices and some of the choices were not needed, then they too could be reduced.

Another improvement on the ability to reduce a model for multiple variant configurations is to create the concept of "don't cares" for variant control variables. In the above variant reduction example, four configurations, config1a1, config1a2, config2b1, and config2b2 were specified. In larger models, a user may need to specify many more configurations. To simplify this reduction, in the above example, a user may want to reduce the original model 4000 (FIG. 40A) for DSUPPLIER equal to 1 or 2, and let all other variant control variables be 'don't cares'. To do this, a user could specify the information in a graphical affordance, such as a dialog.

Figure 48:
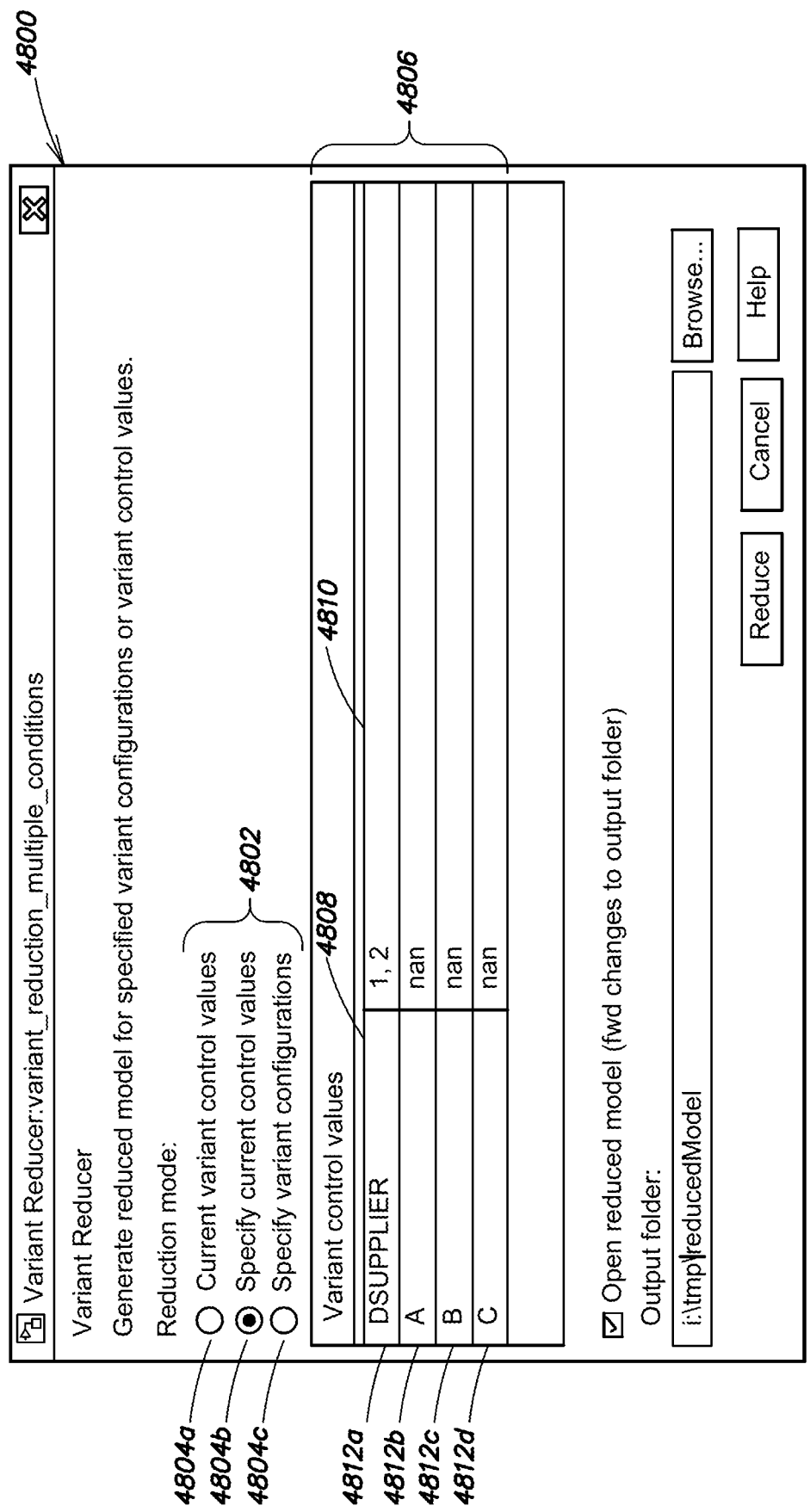
FIG. 48 is an illustration of an example graphical affordance in accordance with one or more embodiments.

FIG. 48 is an illustration of an example graphical affordance 4800, in the form of a dialog. The dialog 4800 may include an area 4802 for specifying a reduction mode to be applied. A particular reduction mode may be selected, e.g., by a user, through user interface elements, such as radio buttons 4804a-c, which may be named 'Current variant control values', 'Specify variant control values', and 'Specify variant configurations', respectively. In this example, the 'Specify variant control values' radio button 4804b is selected. The dialog 4800 may include another area 4806 for specifying values for variant control variables. The area 4806 may be in the form of a table having rows and columns. For example, the area 4806 may include a column 4808 that lists the names of the variant control variables, and another column 4810 for receiving values for the respective variant control variables. The area 4806 may include a plurality of rows 4812a-d, and each row may correspond to a respective variant control variable. As indicated at row 4812a, the value for the variant control variable 'DSUPPLIER' is specified as 1 or 2. As indicated at rows 4812b-d, values for the variant control variables 'A', 'B', and 'C', are specified as don't care values. In an embodiment, don't care values may be indicated through a not a number (nan) value. A nan value may be a numeric datatype defined by the modeling environment 100 for use when an operation returns an undefined numeric result for the variable, such as division by zero. The modeling environment 100 may provide one or more nan values that may be assigned to variables. In alternative implementations, don't cares may be specified using checkboxes.

The variant reducer tool 142 may use the information specified in the dialog 4800 to reduce the model. Since the values of A, B, C are don't cares, the prior algorithm cannot be used to loop over all configurations because there are too many of them. For example, we know that A must be an integer, but there are an infinite number of integers. Therefore, the system needs to use the information in the original model 4000 to determine a finite set of variant configurations. One implementation may examine all of the expressions to see what are the permissible values of A, B, and C. Examination of the model 4000 shows that A can be 1 or 2, likewise for B and C. However, the variant control expressions can be general such as V>100 or X<10. Therefore, examining the variant control expressions assigned to blocks to determine the permissible values may only work when the expressions consist of equalities.

Therefore, to support general expressions the variant reducer tool 142 may reformulate all variant control expressions into Boolean expressions, and use a satisfiability (sat) solver, which solves the Boolean satisfiability problem that is presented here. Sat solvers are NP-complete; therefore, the variant reducer tool 142 can use another algorithm to analyze the model 4000 to see which blocks should be removed. The variant reducer tool 142 can take all variant condition expressions in the model 4000, and for all variant control variables that are "don't cares", can replace them with the value "true". The variant reducer tool 142 can then apply the prior algorithm to reduce the model 4000.

Figure 49:
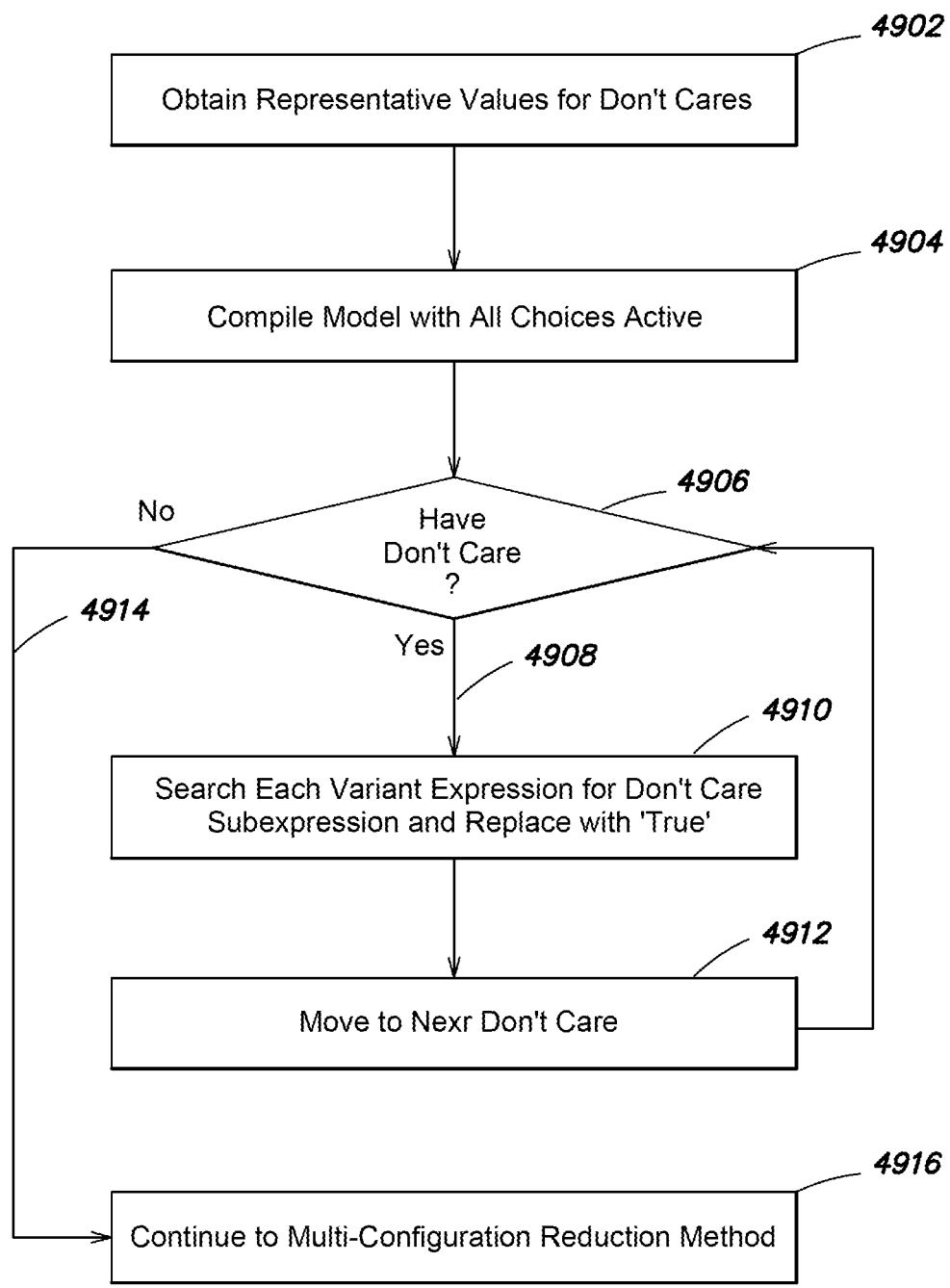
FIG. 49 is a flow diagram of an example method in accordance with one or more embodiments.

FIG. 49 is a flow diagram of an example method. The variant reducer tool 142 may receive representative values for don't cares, as indicated at step 4902. The model compiler 118 may compile the model with all variant choices active, as indicated at step 4904. The variant reducer tool 142 may determine whether any of the variant control variables have a value of don't care, as indicated at decision step 4906. If so, the variant reducer tool 142 may search each variant expression for don't care subexpression and replace it with True, as indicated by Yes arrow 4908 leading to step 4910. The variant reducer tool 142 may then move to the next don't care, as indicated at step 4912. Returning to decision step 4906, if the there are no more variant control variables with don't care values, then the variant reducer tool 142 may utilize the method illustrated at FIGS. 44A-B, as indicated by No arrow 4914 leading to step 4916.

A challenge with implementing this procedure is the symbolic manipulation of the expressions. In the example, the variant reducer tool 142 may start by asking for one valid value for each "don't care" variant control variable. The variant reducer tool 142 may then compile the model 4000 ensuring that all choices are active. That is, the variant reducer tool 142 may ensure that any block with a variant expression involving one of the don't cares or variant control variables of interest is active during analysis. This may be achieved by assuming all blocks are active as if they were to be part of the executing model. The variant reducer tool 142 may then use this structure to identify all the subexpressions which map to don't cares. Revisiting the prior example, the variant control variables A, B, and C have don't cares values. After the compile the model with all choices active step (step 4904), the variant condition expression for the "A/D series a.1" block is "A==1 && DSUP-PLIER==1" which is then replaced with "true && DSUP-PLIER==1" which then reduces to DSUPPLIER==1. As illustrated by loop back arrow, this process repeats for each "don't care".

Variant Configuration Selection by Incremental Narrowing of Configuration Choices In a system comprising multiple variant components, the number of variant configurations may be large and may be difficult to manage in a flattened way. If one or more variant components are chosen, a narrowed down (e.g., a subset) set of relevant configurations can be presented that may help in selecting from the remainder of variant components, in order to completely define the system configuration. This may help with improved variant management. To perform this narrowing, the variant implementation system 114 of the modeling environment 100 may display a dependency tree that illustrates dependencies between the variant condition expressions. As variant components are chosen, the dependency tree can be reduced.

Figure 50:
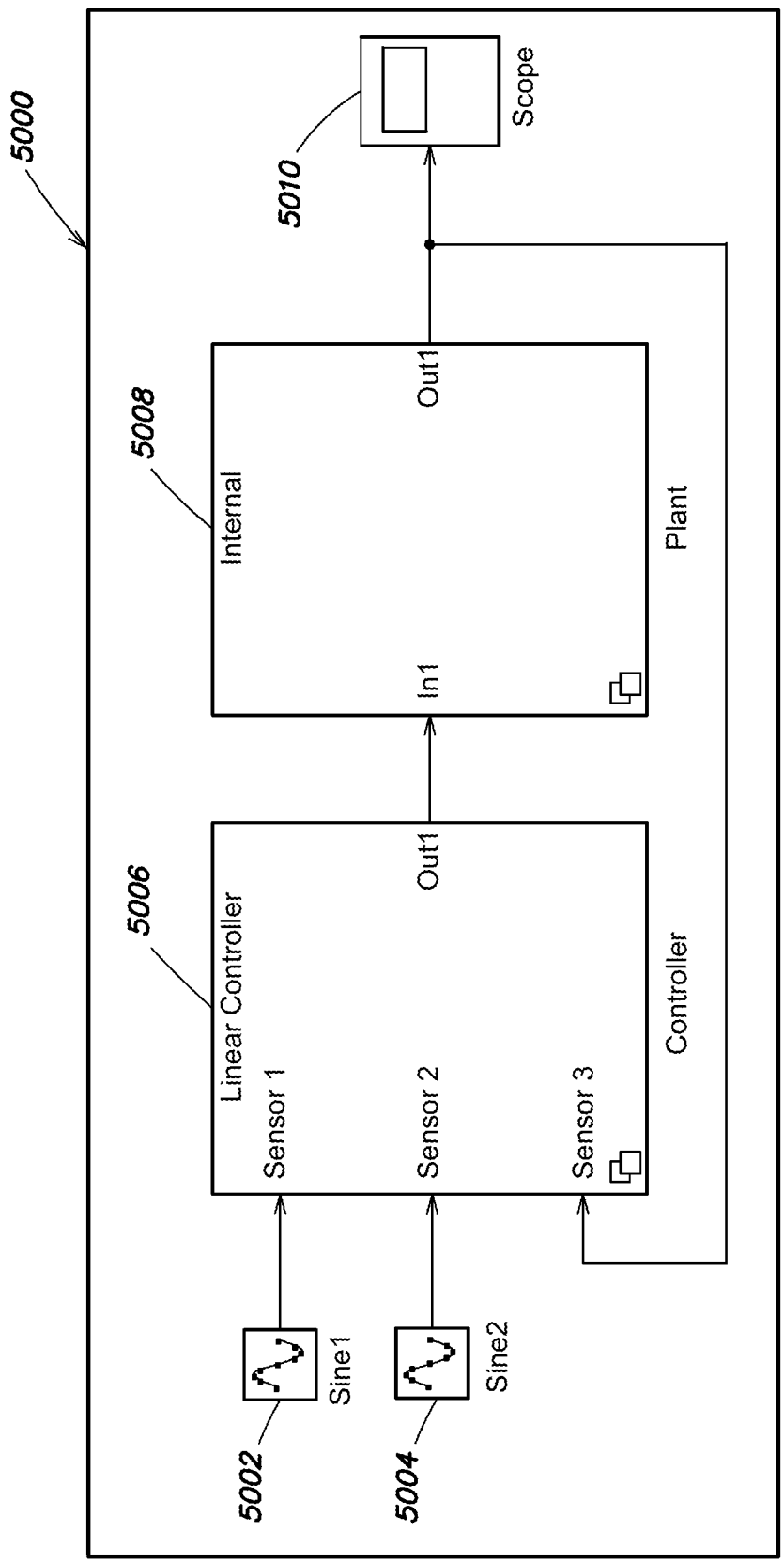
FIG. 50 is an illustration of an example model in accordance with one or more embodiments.
Figure 51:
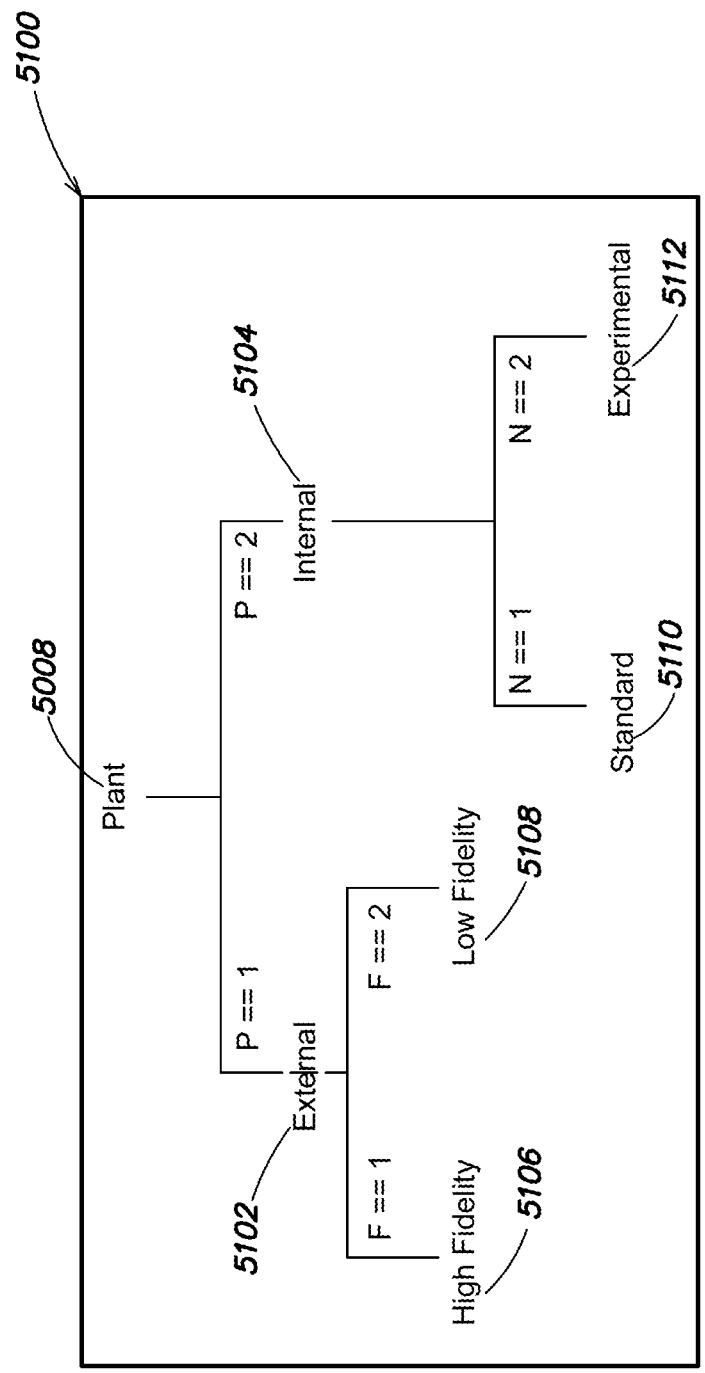
FIG. 51 is an illustration of an example data structure in accordance with one or more embodiments.
Figure 52:
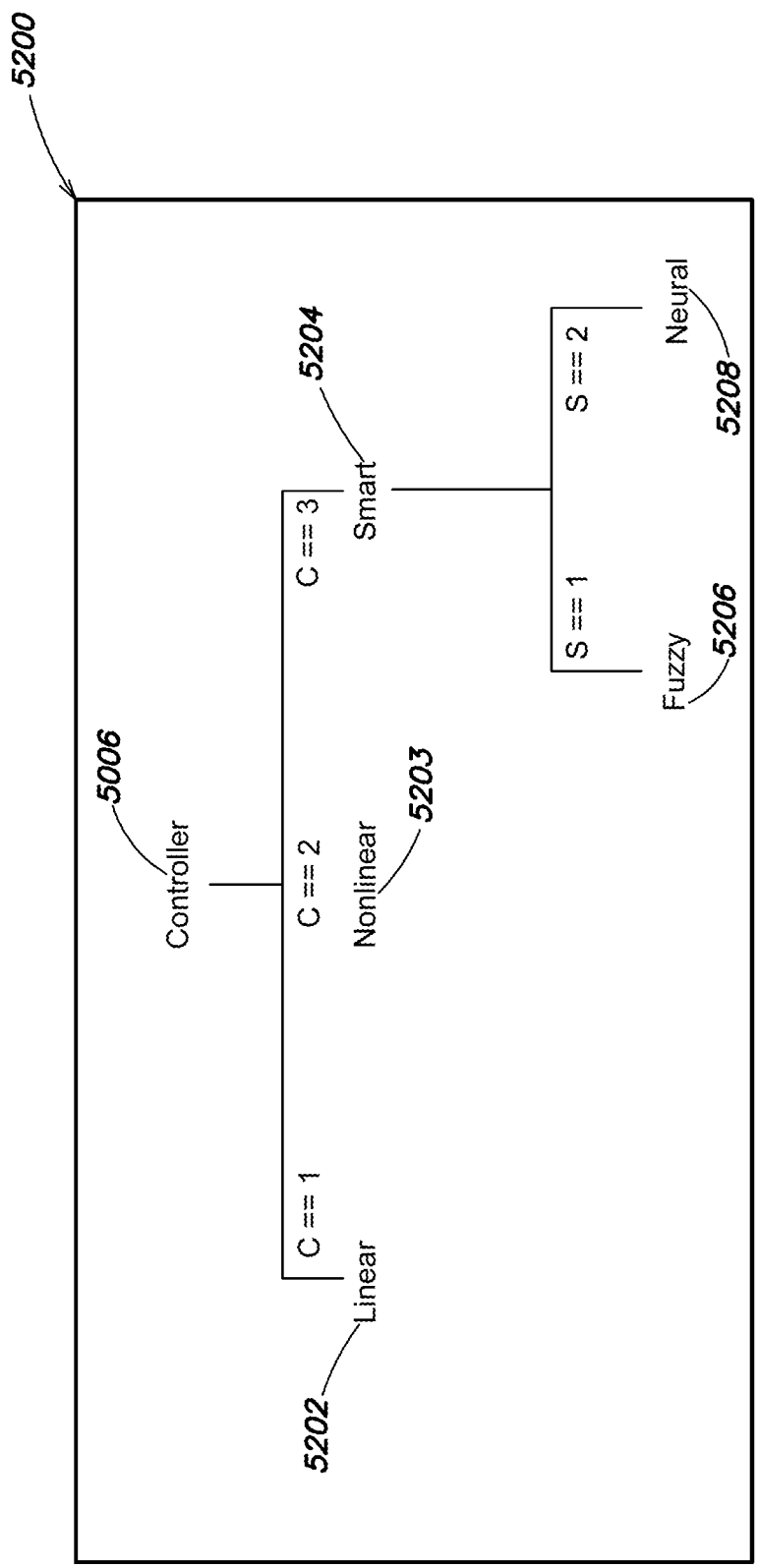
FIG. 52 is an illustration of an example data structure in accordance with one or more embodiments.

For example, consider FIG. 50 which shows an example plant-controller model 5000. The model 500 includes two Sine blocks 5002 and 5004, two subsystems 5006 and 5008 named 'Controller' and 'Plant', respectively, and a Scope block 5010. FIG. 51 is a tree 5100 illustrating the components that make up the Plant subsystem 5008 and the variant control variables associated with those components. At a first hierarchical level, the Plant subsystem 5008 includes a component named 'External' 5102 and another component named 'Internal' 5104. The External component 5102 and the Internal component 5104 are assigned a variable control variable named T'. At a next hierarchical level, the External component 5102 includes a component 5106 named 'High Fidelity' and another component 5108 named 'Low Fidelity', which are assigned a variant control variable named 'F'. The Internal component 5104 includes a component 5110 named 'Standard' and another component 5112 named 'Experimental', which are assigned a variant control variable named 'N'. Values of parameters (variant control variables) P, F or N indicate which plant variant is to be used. For example, P=1 and F=1 implies that a "High fidelity External" plant should be used during execution and/or code generation of the model 5000. FIG. 52 is a tree 5200 illustrating the components that make up the Controller subsystem 5006 and the variant control variables associated with those components. At a first hierarchical level, the Controller subsystem 5006 includes three components 5202-5204 named 'Linear', 'Nonlinear', and 'Smart', respectively. Components 5202-5204 are associated with a variant control variable named 'C'. At a next hierarchical level, the Smart component 5204 includes two components 5206 and 5208 named 'Fuzzy' and 'Neural', which are assigned a variant control variable named 'S'.

Figure 53:
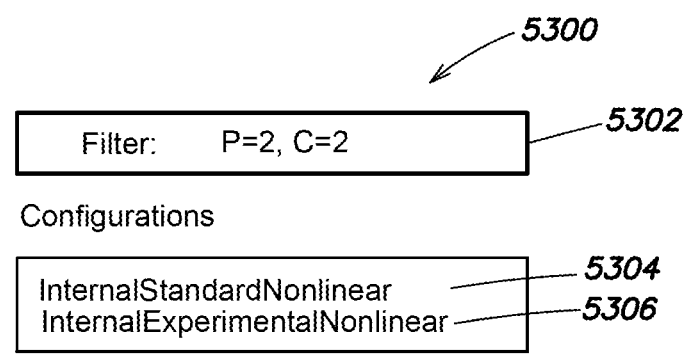
FIG. 53 is an illustration of an example graphical affordance in accordance with one or more embodiments.

For the model 5000, there are four plant variants and four controller variants, leading to a potential 16 variant configurations (or combinations). If a user selects the Plant to be Internal (P=2) and the Controller to be Nonlinear (C==2), then the number of valid configurations reduces to two, i.e., the user only needs to choose between "InternalStandardNonlinear" or "InternalExperimentalNonlinear". The variant implementation system 114 may present these narrowed-down configuration options may be presented graphically (or via a command-line option) by either explicitly specifying a subset of variant control variable values, or by choosing subset of variant choice labels. FIG. 53 is an illustration of a graphical affordance in the form of a menu 5300. The menu 5300 includes a field 5302 indicating that the available options have been filtered by variant control variables P=2 and C=2. The menu 5300 includes two selectable options 5304 and 5306. The option 5304 is for the "InternalStandardNonlinear" configuration, and the option 5306 is for the "InternalExperimentalNonlinear" configuration.

Ability to Switch Variant Conditions Based on Keywords and/or Model Execution Modes Ability to Switch Variant Activation Based on Keywords Referring back to FIG. 19, which is an illustration of an example model 1900 that represents the operation of windshield wipers on a car. The model 1900 further includes a Variant Sink block 1926, which provides the destination routine of a Controller output signal named 'u' 1928 to either a wiper motor block 1930 or to a Digital to Analog (D/A) block 1932. The wiper motor block 1930 may be a dynamic system (e.g., a set of blocks and lines) that represent the physical dynamics of a real wiper motor. The D/A block 1932 may provide the signal 'u', produced by the Controller 1908 to an analog-to-digital converter. Similarly, a Variant Source block 1934 may accept at a first input 1936 an output named 'y' 1938 of the wiper motor block 1930, and provides this as a "wiper speed" input 1940 of the Controller 1908. Alternatively, the Variant Source block 1934 may provide an Analog to Digital (A/D) block 1942 output to the wiper speed input 1940 of the Controller 1908. Typically, the use of the D/A and A/D choices are done when generating code for deployment on a microcontroller or code for hardware synthesis for connection to the physical wiper motor. Alternatively, the D/A and A/D blocks could be activated when the model 1900 is run in real time and the blocks are connected to the physical wiper motor. The other choices (the connection to the wiper motor) is typically activated when a closed-loop simulation is being performed.

The Variant Sink and Variant Source blocks 1926, 1914 and 1934 can provide switching based on a variant expression, e.g. MODE==1 to select the first output port and first input port respectively, and MODE==2 to select the second output port and second input port respectively. However, this requires switching MODE before running a simulation of the model 1900 or generating code for the model 1900. An improved solution may be to define keywords that activate based on how the model 1900 is being executed.

Figure 54:
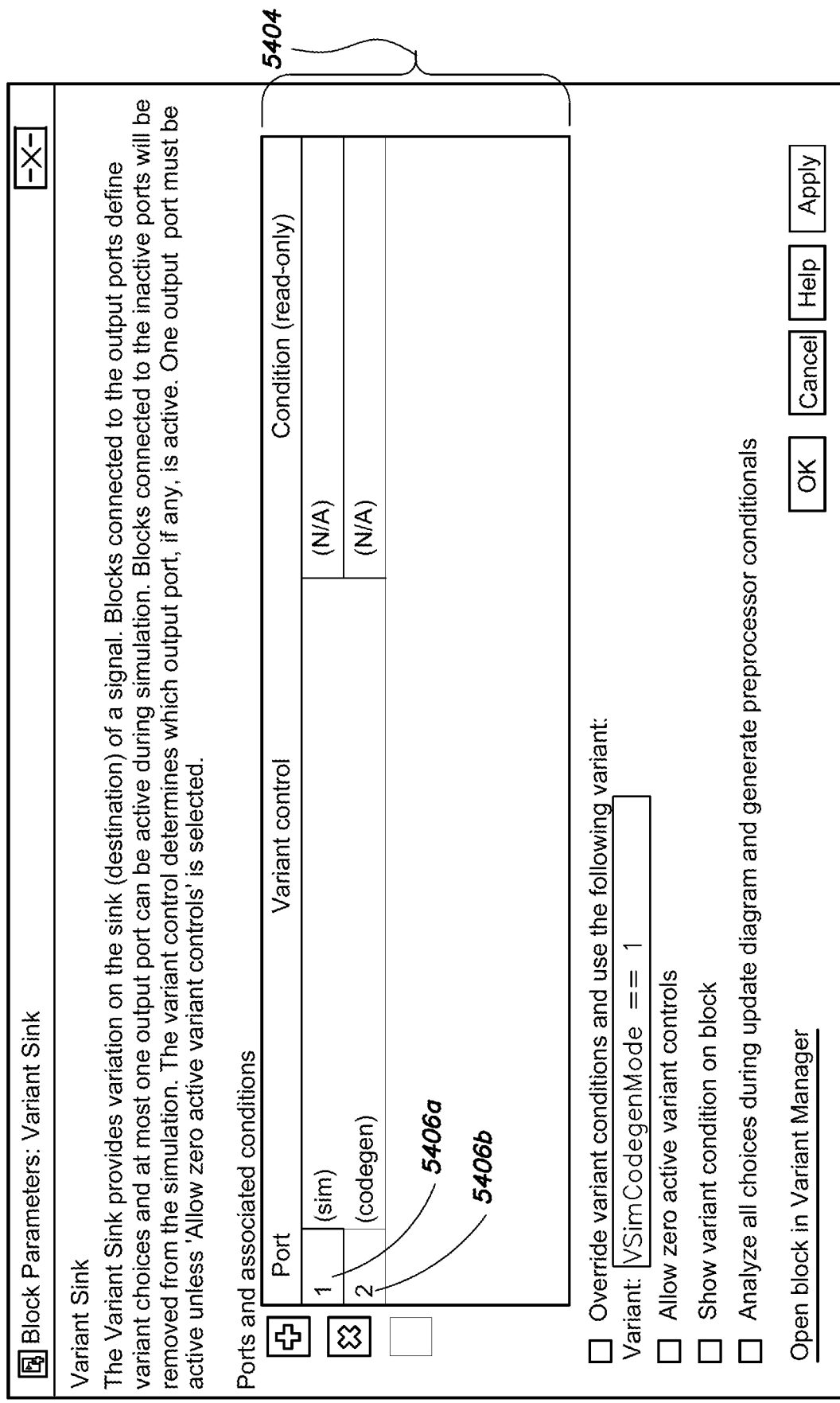
FIG. 54 is an illustration of an example graphical affordance in accordance with one or more embodiments.

For example, FIG. 54 is an example of a graphical affordance in the form of a dialog 5400 for the Variant Sink block 1926 with keywords. The dialog 5400 may include a region 5402 at which values for variant controls and conditions may be specified for ports of the Variant Sink block 1926. The region 5402 may include separate rows 5406a and 5406b for the output ports of the Variant Sink block 1926, which may be named 'Port 1' and 'Port 2' respectively. The first choice, Port 1, 5406 may have a variant control specified as "(sim)" and the second choice, Port 2', 5406b may have the variant control specified as "(codegen)". With this setup, the propagated condition may be the keyword "(sim)" at a first output port 1944 of the Variant Sink block 1926, and the propagated condition of a second output port 1946 will have the keyword "(codegen)". The same conditions "(sim)" and "(codegen)" may then be specified on the Variant Source block 1934. On the model 1900, this will result in the wiper motor block 1930 having the condition "(sim)", and the D/A block 1932, and the A/D block 1942 will have the keyword condition "(codegen)". An Out1 block 1948 may be assigned the condition "(sim)". The third input port 1940 of the Controller 1908 is supplied the condition "(sim)||(codegen)" which simplifies to true, meaning always present.

The switching of the variant conditions based on keywords instead of variant control variables may be handled by propagating the keywords as if they were variant control variables. The activation of the keywords may be done based on the model execution by the execution engine 112. If executing the model 1900 for simulation, then the "(sim)" keyword will be true. In this example, this means the wiper motor block 1938 will be active and the A/D block 1942 and the D/A block 1932 will be inactive. If compiling the model 1900 for execution on a microcontroller, then when generating code, the "(codegen)" condition will be true. In this example, this means the wiper motor block 1938 will be inactive (not part of the model execution) and the A/D block 1942 and the D/A block 1932 will be active.

It should be noted that there may be multiple execution modes for a model. For example, the execution engine 112 may be simulating a model via an interpretive execution engine, such as the interpreter 116, or the execution engine 112 could be simulating the model by first generating code, such as C code, for the model or a portion thereof, and then using the C code to run the simulation. This later form of execution is sometimes referred to as accelerated simulation mode. When executing a model on a real-time system, the model first may be converted to generated code, and then the generated code may be executed. If there is only one real-time system "target" defined, then this mode can be referred to as "(codegen)". However, if multiple real-time system targets are defined, say one for a 16-bit microcontroller, one for a single precision 32-bit microcontroller, and one for an HDL (hardware definition language) target, then the particular real time target being used may need to be specified. The number of possibilities of the different model execution modes is potentially limitless, therefore the system needs a way to identify these, and switch the variants based on where or how the model will be executing.

Figure 55:
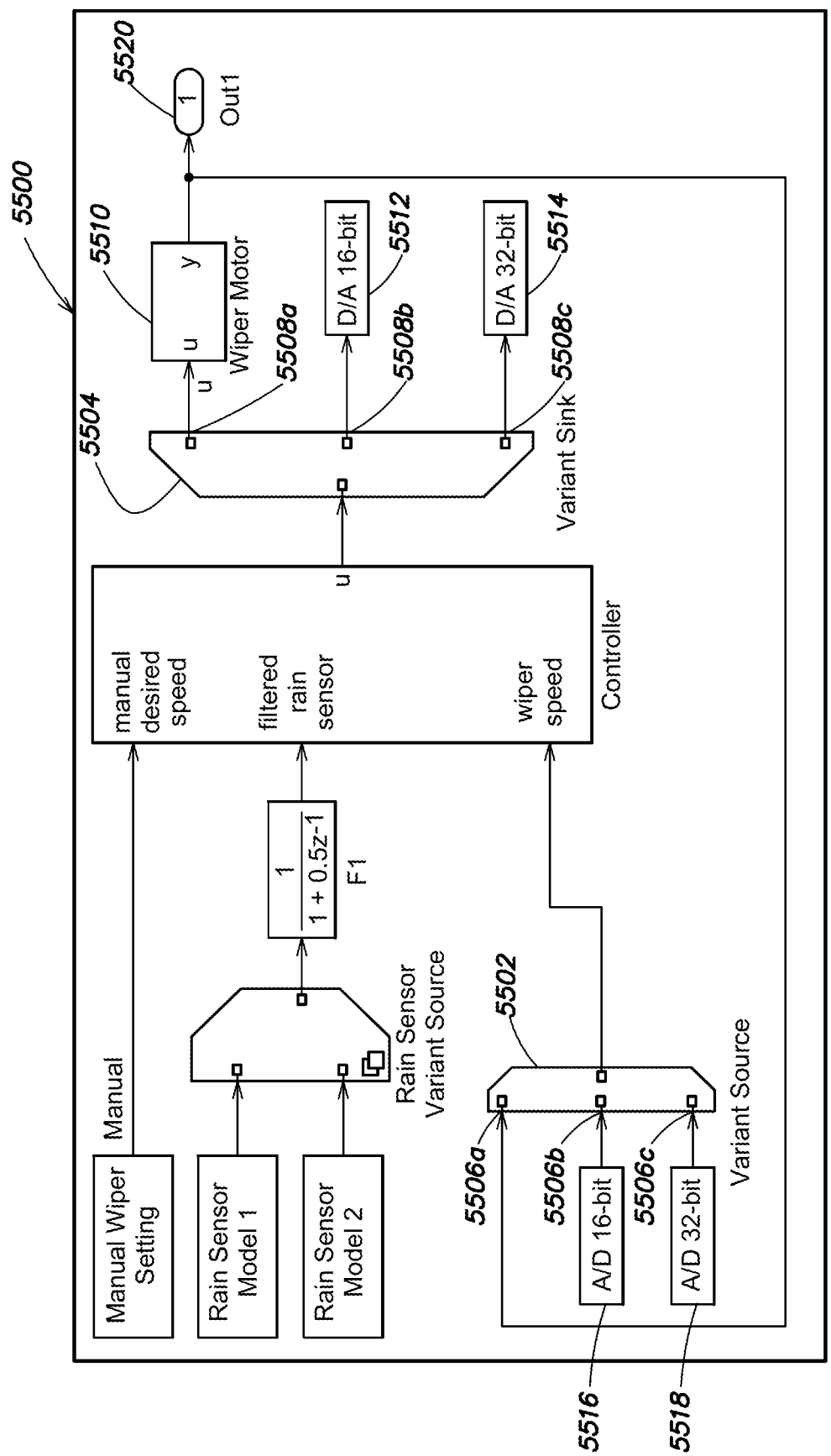
FIG. 55 is an illustration of an example model in accordance with one or more embodiments.

Assume that all various forms of simulation will be treated the same. However, suppose that there are two different targets for the code generation, one for a 16-bit microcontroller and one for a 32-bit microcontroller. The model may be modified to account for these two code generation targets. FIG. 55 is an example model 5500 representing a modified version of the model 1900.

The model 5500 may include a Variant Source block 5502 and a Variant Sink block 5504. The Variant Source block 5502 may have three input ports 5506*a-c*. The Variant Sink block 5504 may have three output ports 5508*a-c*. The output ports 5508*a-c* may be connected to a wiper motor block 5510, a D/A 16-bit block 5512, and a D/A 32-bit block 5514. The input ports 5506*a-c* may be connected to the wiper motor block 5510, an A/D 16-bit block 5516, and an A/D 32-bit block 5518. The wiper motor block 5510 may be connected to an Outport block named 'Out1' 5520.

The Variant Source block 5502 and the Variant Sink block 5504 may have conditions specified as "(sim)" for their respective first ports 5506*a* and 5508*a*, "(codegen:16-bit)" for their respective second ports 5506*b* and 5508*b*, and "(codegen:32-bit)" for their respective third ports 5506*c* and 5508*c*. Here, the names of the targets are being used as the keywords, which happened to be called 16-bit and 32-bit. When executing the model 5500 for a closed-loop simulation, the wiper motor block 5510 will be active and the four D/A, A/D blocks 5512, 5514, 5516, and 5518 will be inactive (not part of the simulation). When generating code for the 16-bit target, the wiper motor block 5510, the Out1 block 5520, the D/A 32-bit block 5514, and the A/D 32-bit block 5518 will be inactive (not part of the generate code). When generating code for the 32-bit target, the wiper motor block 5510, the Out1 block 5520, the D/A 16-bit 5512, and the A/D 16-bit 5516 will inactive (not part of the generated code). This pattern of specifying keyword conditions may be extended to any number of model execution modes, whether they are simulation or code generation modes.

Figure 82:
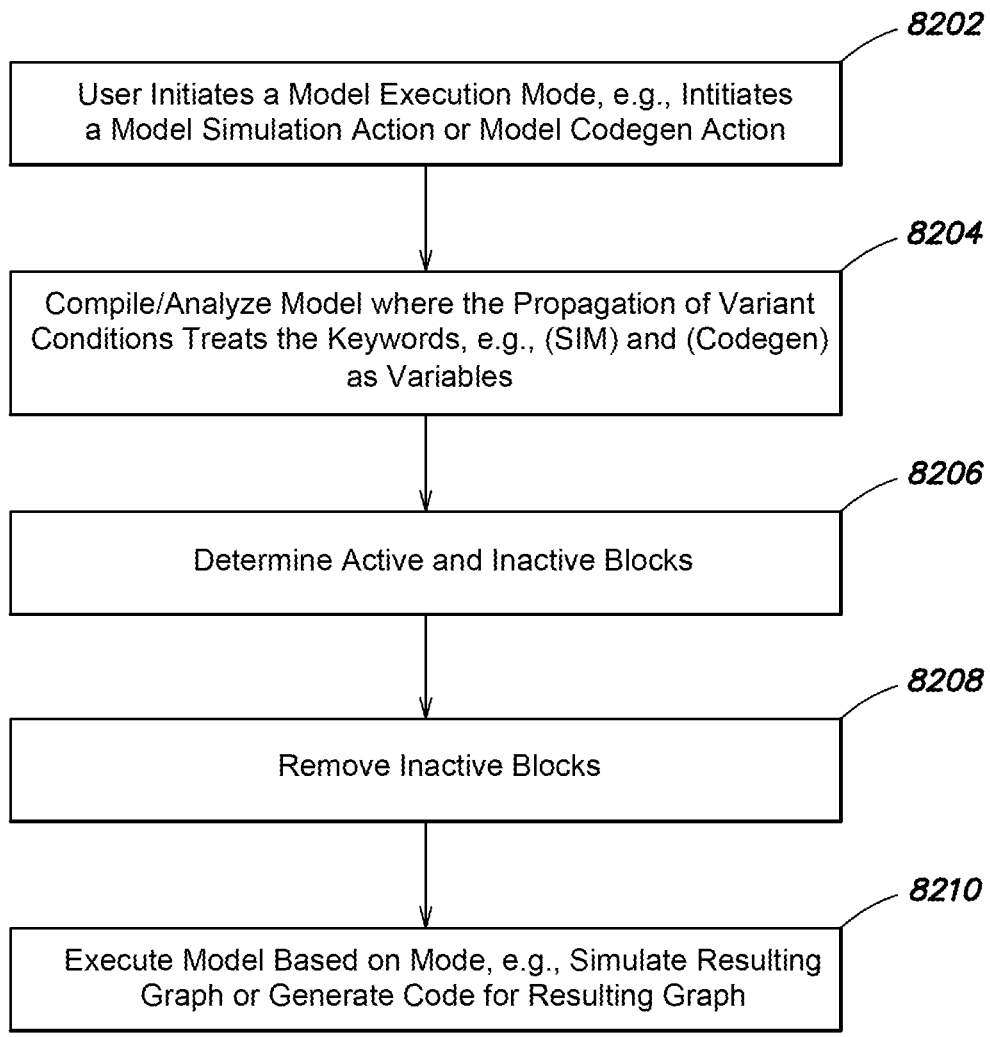
FIG. 82 is a flow chart of an example method in accordance with one or more embodiments.

FIG. 82 is a flow diagram of an example method for processing keywords and model execution modes. Given a model with keywords, such as "(sim)" and "(codegen)" entered in one or more variant blocks, a user may initiate a model execution based on a mode, as indicated at step 8202. For example, the user may ask to perform a simulation which is referred to as a "simulation model execution mode". Similarly, the user could have asked to generate code for the model which is referred to as "codegen model execution mode." After initiating a model execution, the model may be compiled, as indicated at step 8204. During compilation, variant condition propagation is performed where the keywords, e.g. "(sim)" and "(codegen)", are propagated to other blocks. The keywords may be propagated as if they are special variables. The next step is to determine which blocks are active and which are inactive, as indicated at step 8206. A block will be active if it has no variant condition, otherwise a block is active if it's variant condition evaluates to true. If it's variant condition evaluates to false, then it is inactive. The keywords may be treated as variables within the variant condition expressions. These keyword-variables are assigned the value true or false based upon the model execution mode. For example, if the user requests to perform a simulation, then the keyword-variable corresponding to "(sim)" is set to true, and the keyword-variable corresponding to "(codegen)" is set to false. The active and inactive blocks may reside in a topological graph representing the model. After determining which blocks are active and inactive, inactive blocks may be removed from the topological graph, as indicated at step 8208. The model may then be executed using the topological graph based on the model execution mode, as indicated at step 8210.

Ability to Switch Variant Activation Based on a Startup Condition

With existing systems, selection of an active variant condition for a graphical program, such as a model, may be made at an update-diagram time. The update-diagram time may be when the model is being analyzed for example by the execution engine 112 to prepare it for execution, which may be simulation using the interpreter 116 or generation of code that is then executed. After the update-diagram time, when the model is executing, the inactive blocks (those whose variant condition expressions are false) may not be present in the executing model. The inactive blocks are effectively removed or deleted from the execution. The variant condition expressions propagated to blocks through the model may identify variant choices that define design sections in the model which can be programmatically swapped in and out of the model by setting the value of variant control variables prior to running the simulation.

Also, with existing systems, the variant conditions propagated throughout a model may be specified as being active at code-compile time. This is when the model is analyzed and code is generated for the model for example by the code generator 108. In the generated code, for computer programming languages such as C, the code generator 108 may leverage preprocessor conditionals (#if s) to define when the variant choices are active.

Figure 56:
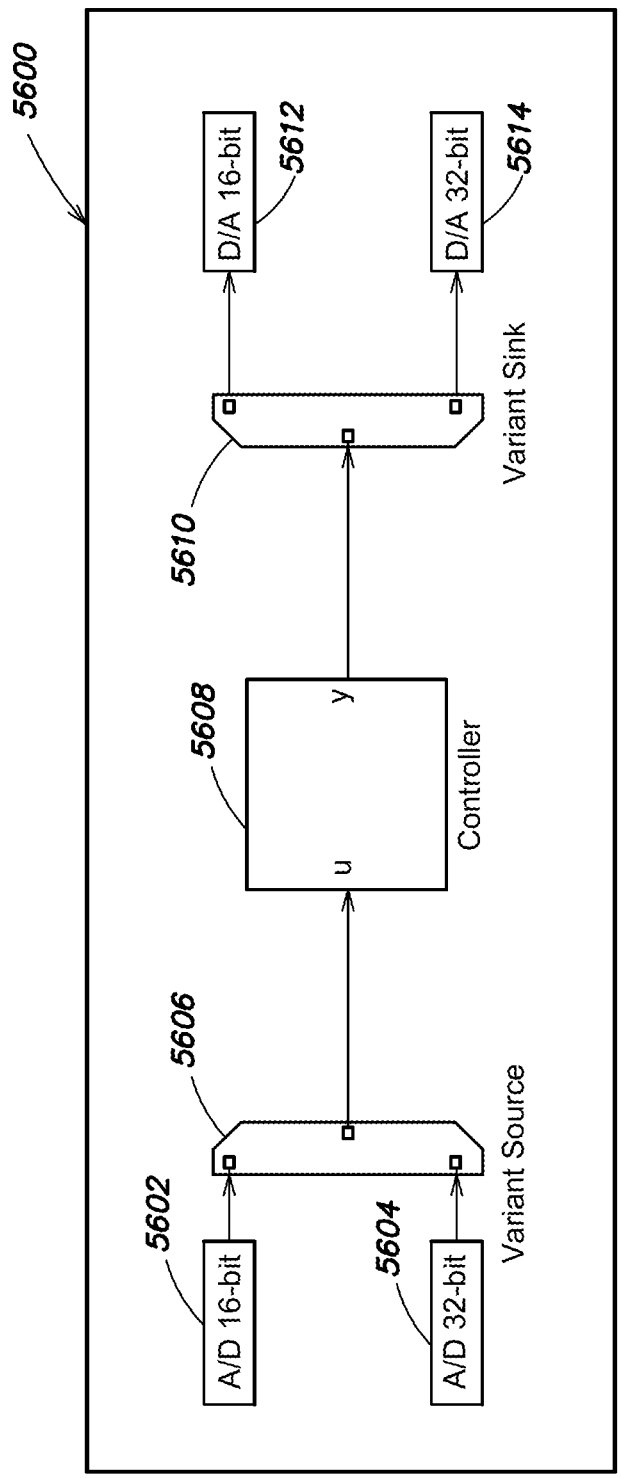
FIG. 56 is an illustration of an example model in accordance with one or more embodiments.

This ability to switch between variant activation at update-diagram time or code-compile time may be achieved by specifying the switching condition at the source of the variation within the model. FIG. 56 is an illustration of an example model 5600. The model 5600 includes two A/D blocks 5602 and 5604 named 'A/D 16-bit' and 'A/D 32-bit', respectively, a Variant Source block 5606, a subsystem block 5608 named 'Controller', a Variant Sink block 5610, and two D/A blocks 5612 and 5614 named 'D/A 16-bit' and 'D/A 32-bit', respectively. The Variant Source block 5606 switches between one of the two A/D converters 5602 and 5604 to supply the input to the Controller subsystem block 5608. Similarly, the Variant Sink block 5610 switches to the D/A converters 5612 and 5614 on the output of the Controller subsystem block 5608.

Figure 57:
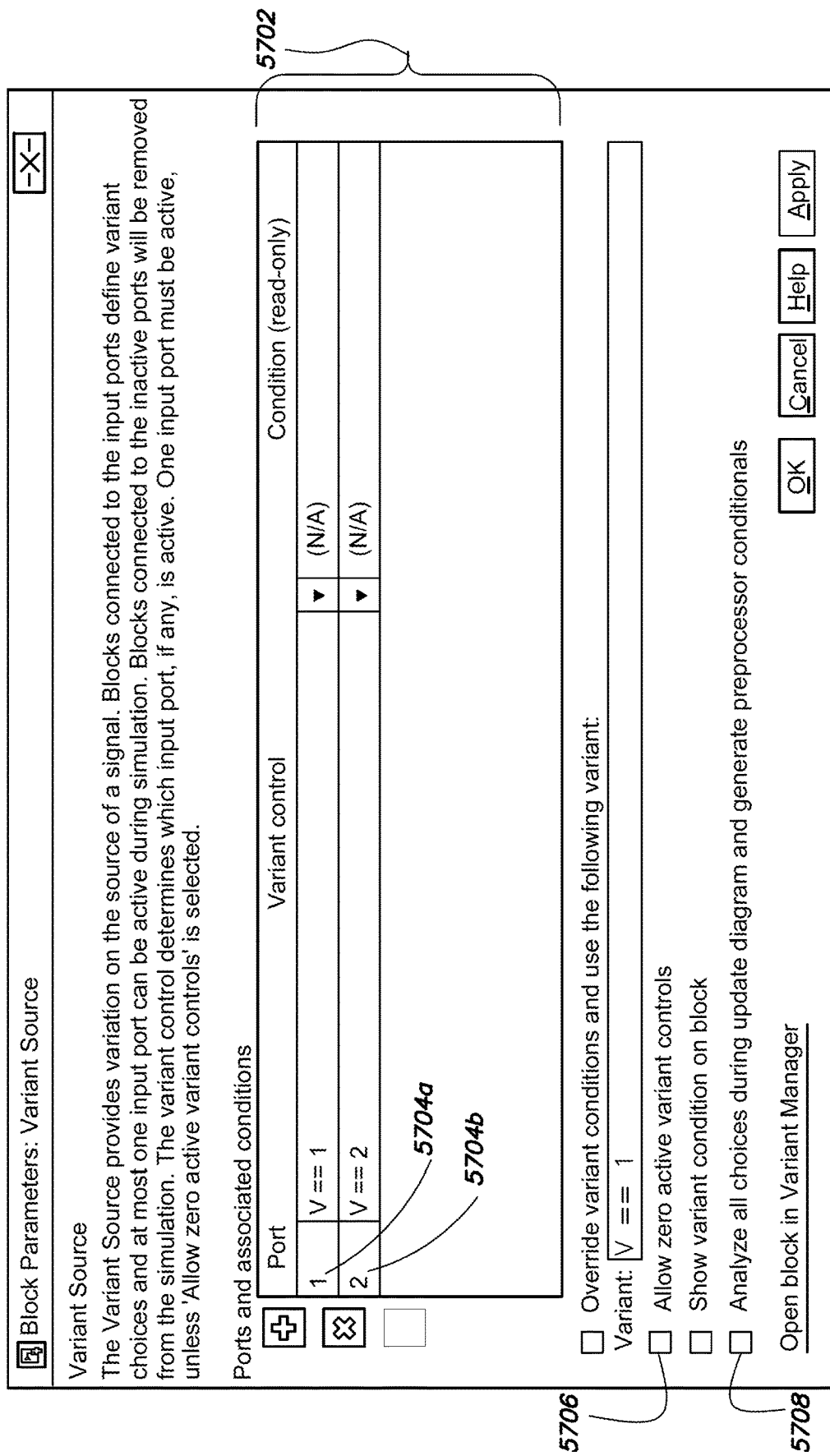
FIG. 57 is an illustration of an example graphical affordance in accordance with one or more embodiments.

FIG. 57 is an example dialog 5700 for the Variant Source block 5606. The dialog for the Variant Sink block 5610 may be very similar to the dialog 5700 for the Variant Source block 5606. The dialog 5700 may include a region 5702 at which values for variant controls and conditions may be specified for ports of the Variant Source block 5606. The region 5702 may include separate rows 5704a and 5704b for the input ports of the Variant Source block 5706, which may be named Port '1' and Port '2', respectively. As illustrated in the dialog 5700, the variant conditions are V==1 for the first port 5704a and V==2 for the second port 5704b. The Variant Source block 5606 defines two design sections (variant regions), one containing the A/D 16-bit block 5602 which is propagated the condition V==1, and one containing the A/D 32-bit block 5604 which is propagated the condition V==2. The Controller block 5608 is always present (not part of any variant region) because an "Allow zero variant controls" checkbox 5706 of the dialog 5700 is unselected. Therefore, the Controller block 5608 may be propagated the condition "true", which means it is always present. If the "Allow zero variant controls" checkbox 5706 had been selected, then the Controller block 5608 would have the variant condition "V==1||V==2".

The Variant Sink block 5610 defines two design sections (variant regions), one containing the D/A 16-bit block 5612 which is propagated the condition V==1, and one containing the D/A 32-bit block 5614 which is propagated the condition V==2. On the dialog 5700 there is a checkbox 5708 labeled "Analyze all choices during update diagram and generate preprocessor conditionals". When this checkbox is unselected (as shown), the variant implementation system 114 may analyze the model 5600 at update-diagram time using the value of the variant control variable V. If V is 1, then the A/D 32-bit block 5604 and the D/A 32-bit block 5614 are removed from the model 5600 during the analysis process, and the execution of the model (simulation or code generation) may occur as if these two blocks 5604 and 5614 were deleted.

When the "Analyze all choices during update diagram and generate preprocessor conditionals" checkbox 5708 is selected, then during the analysis phase (update diagram) of preparing a model for simulation, the variant implementation system 114 may keep all blocks that receive the propagated conditions with this property active. In the example of the model 5600, if the checkbox 5708 is selected on both the Variant Source block 5606 and the Variant Sink block 5610, then the four A/D and D/A converter blocks 5602, 5604, 5612, and 5614 will remain in the model 5600 for analysis during update diagram. When simulating the model 5600 only the active A/D, D/A blocks will be used, the inactive A/D, D/A blocks are removed from execution just prior to the start of simulation. When generating code, the code implementing the functionality of all four A/D, D/A converter blocks may be present in the generated code wrapped in some type of preprocessor conditional. If using the C language, the code implementing the functionality of all four A/D, D/A converter blocks may be wrapped in #if s. If generating Verilog, code implementing the functionality of all four A/D, D/A converter blocks may be wrapped in 'ifdef statements. For example, in the C language, we may see statements in the generated code, an example of which is illustrated in FIG. 54. FIG. 58 illustrates a code snippet 5800 where code implementing the functionality of the A/D, D/A converter blocks 5602, 5604, 5612, 5614 produce a single precision float. The code snippet 5800 is for illustrative purposes, and a block may define what type of data types, etc. it uses.

The ability of the variant implementation system 114 to activate variant conditions at either update-diagram time or code-compile time is useful, but may have short comings. Suppose a supplier wants to provide a model (say a controller model) to different OEMs (original equipment manufacturers). The supplier may need to rebuild the generated code for each different configuration the different OEMs may have. In the example of the model 5600, there are two different A/D, D/A sets of blocks. The number of differences may be much higher. For example, there may be many (hundreds or even thousands) of different forms of A/D and D/A converters which may result in a high number of A/D, D/A blocks in a model with different variant conditions propagated to them by the variant condition propagation engine 124. The supplier may need to rebuild the generated code (assuming they generated the code with preprocessor conditionals) corresponding to the model for each unique A/D, D/A configuration, and supply that binary to the OEM. This can be time consuming and error prone.

A solution to this problem may be to add a means by which to do variant selection at "startup time". Startup time may be after a model is analyzed, but before a run-time loop of the model is active. Another name for startup time may be initialization time. For example, when running an interpretive simulation, startup time may be after update-diagram and just before the interpretive simulation starts. When executing a model though generated code, startup time may be defined as a "startup" or initialization subroutine that may run in the generated code before the dynamics of the model are active.

To enable startup-time, there may need to be a way to specify the logic used in making the selection of the active variant. For the example of the model 5600, the computation of whether V is to be assigned 1 or 2 may be dependent upon what type of A/D and D/A converters are present on the hardware in which the binary corresponding to the generated code is executing. Two different ways of specifying the startup logic may be defined. The startup logic may be specified as text code within the block dialogs or it may be specified using graphical programming via blocks and lines.

Figure 59:
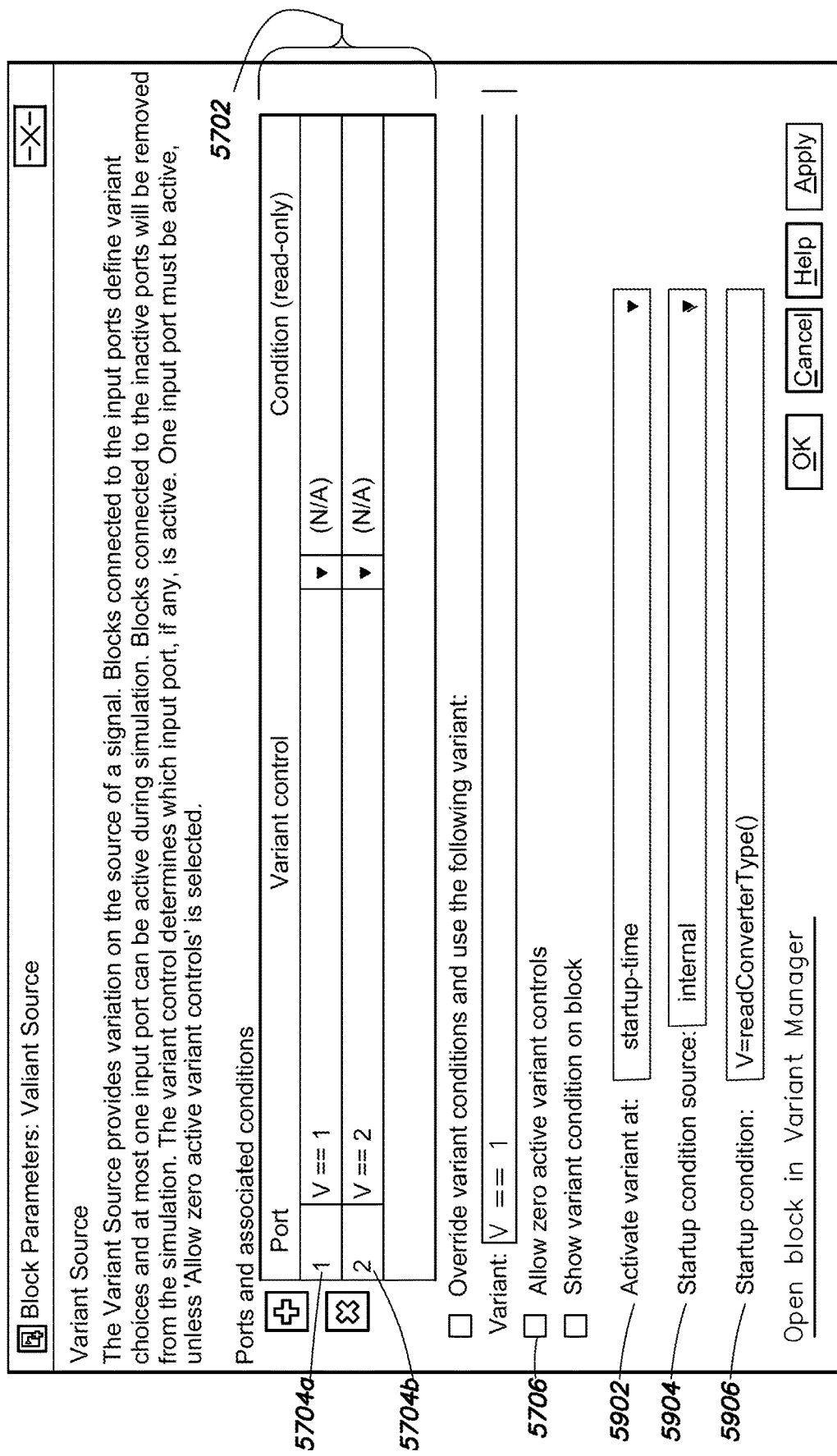
FIG. 59 is an illustration of an example graphical affordance in accordance with one or more embodiments.

FIG. 59 is an example of a dialog 5900 for the Variant Source block 5606 revised with the new startup capability. The dialog 5900 includes an "Active variant at:" combination box pull-down 5902 that may have different options, such as "update-diagram time", "code-compile time", "startup-time", or 'inherited". When the "startup-time" option is selected, as shown in FIG. 59, a "Startup condition source:" combination box pull-down 5904 may be enabled that may have different options, such as "internal" or "external". When the internal option is selected, as shown in FIG. 59, a "Startup condition:" data entry box 5906 may become active. In the "Startup condition:" data entry box 5906, startup condition code that is to be executed may be specified, e.g., by a user. The specified startup condition code, e.g., 'V=readConverterType( )', may set the value of the variant control variables used in the variant condition expressions.

In the example, the model 5600 includes two variant blocks, a Variant Source block 5606 and a Variant Sink block 5610. The variant implementation system 114 could redundantly specify the startup condition for both blocks 5606 and 5610, but this may be over kill. Therefore, in some embodiments, the variant implementation system 114 may specify the startup condition on one of these blocks, say the Variant Source block 5606, and for the other block, e.g., the Variant Sink block 5610, the system may specify the "Active variant at" value as "inherited", which means that the variant will be activated at startup-time because the variant control variables used by the Variant Sink block 5610 are defined by the Variant Source block 5606 to be startup-time variant control variables.

Figure 60:
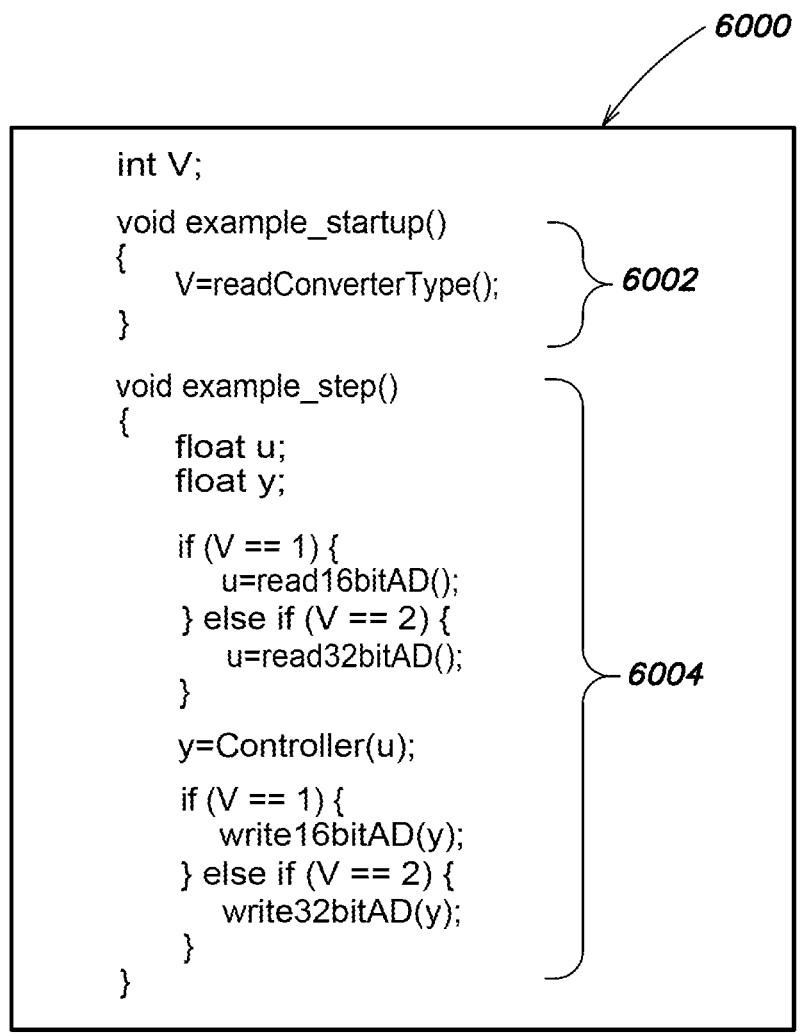
FIG. 60 is an illustration of example code in accordance with one or more embodiments.

FIG. 60 is sample generated code 6000 for the startup-time variants. The generated code 6000 includes a subroutine 6002 named 'example startup( )' and a subroutine 6004 named 'example_step( )'. The environment in which the code is running may execute the "example_startup" subroutine 6002 before calling the "example_step" subroutine 6004 in a run-time loop at the rate the model requests.

Figure 61:
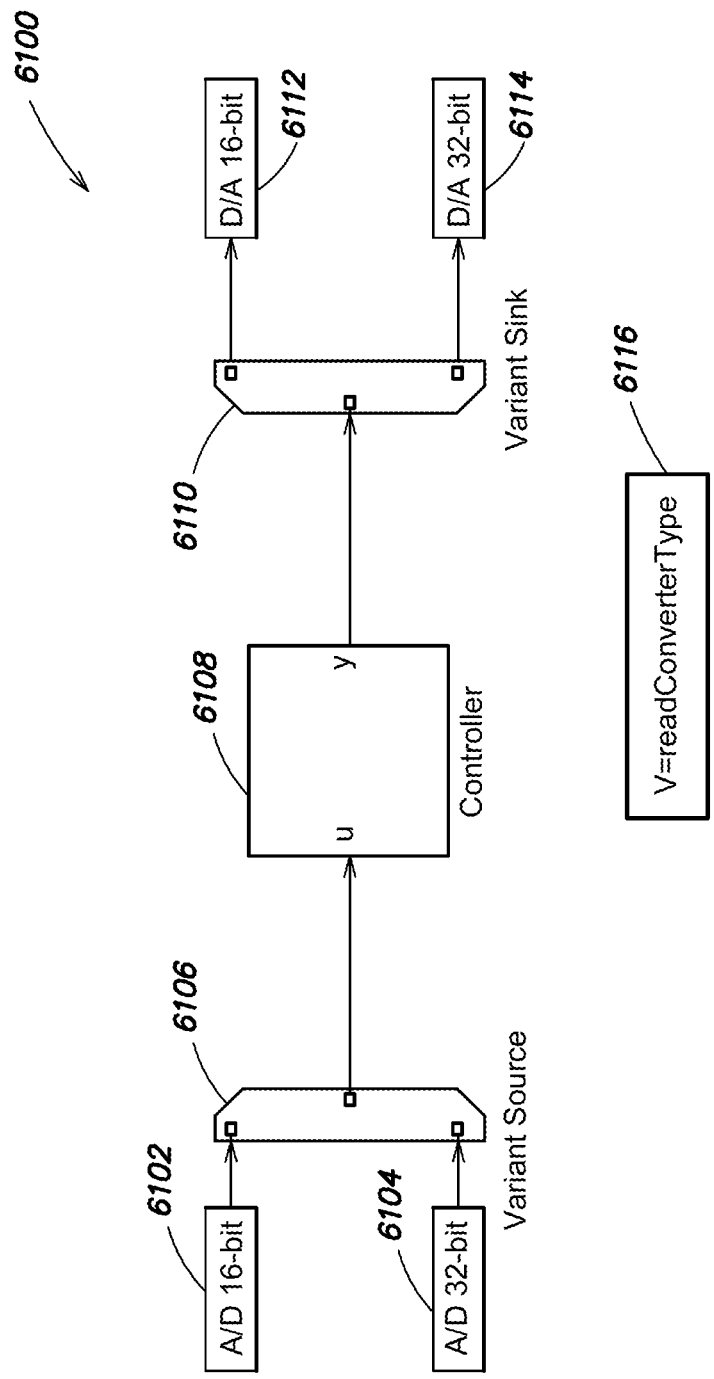
FIG. 61 is an illustration of an example model in accordance with one or more embodiments.

When the "Startup condition source" is specified as external at the combination pull-down box 5904, there may be several ways in which to define the startup condition. One exemplary way is to provide a block that writes to a variant control variable. FIG. 61 is an illustration of an example model 6100. The model 6100 includes two A/D blocks 6102 and 6104 named 'A/D 16-bit' and 'A/D 32-bit', respectively, a Variant Source block 6106, a subsystem block 6108 named 'Controller', a Variant Sink block 6110, two D/A blocks 6112 and 6114 named 'D/A 16-bit' and 'D/A 32-bit', respectively, and a Variant Control Variable Assignment block 6116 that writes to the variant control variable V. Block 6116 may run during model initialization at startup in the generated code or in simulation. It may be responsible for setting the value of the variant control variable, V, that is used during the run-time execution of the generated code or in the simulation loop.

Figure 62:
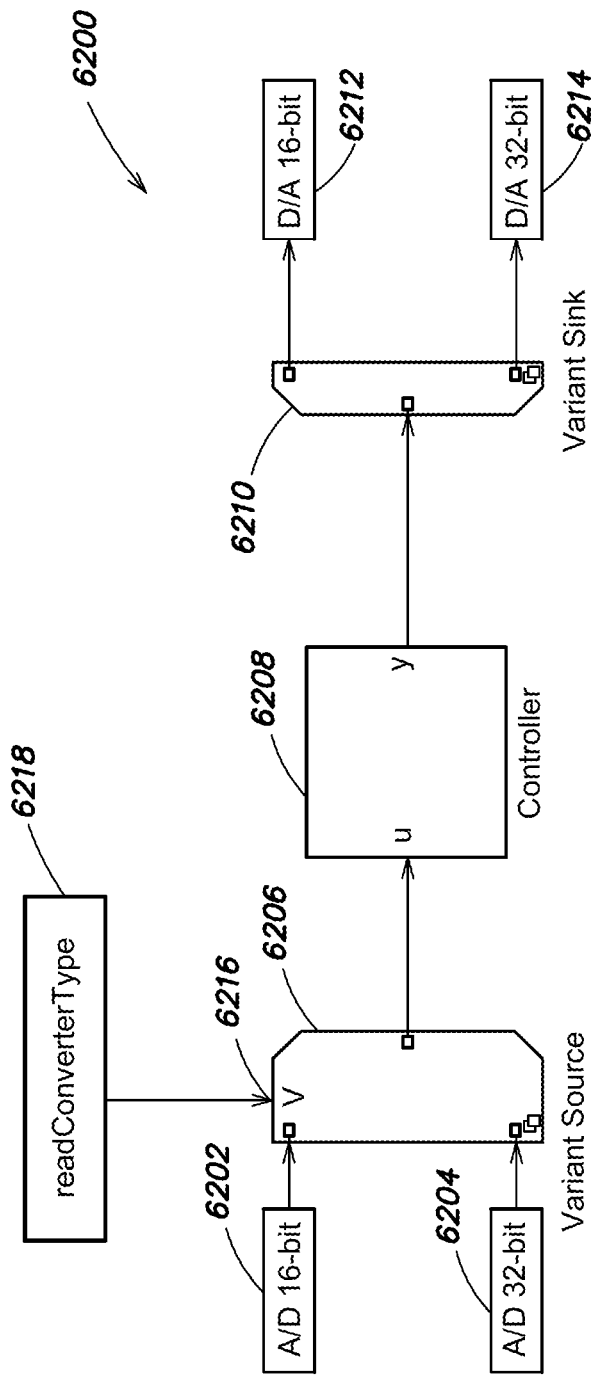
FIG. 62 is an illustration of an example model in accordance with one or more embodiments.

Another way of defining the startup condition is to provide one port per variant control variable on the variant block. In the example of the model 5600, the expression is simple, so only one port may be needed. FIG. 62 is an illustration of an example model 6200. The model 6200 includes two A/D blocks 6202 and 6204 named 'A/D 16-bit' and 'A/D 32-bit', respectively, a Variant Source block 6206, a subsystem block 6208 named 'Controller', a Variant Sink block 6210, and two D/A blocks 6212 and 6214 named 'D/A 16-bit' and 'D/A 32-bit', respectively. The Variant Source block 6206 includes a port 6216 for the variant control variable V. The model 6200 further includes a Startup block 6218 that writes to the port 6216 of the Variant Source block 6206 during model initialization.

When startup-time is specified within the variant specification blocks, such as the Variant Source block 5606 of the example model 5600, having the startup code to run defined by a model may help in improving model readability and expressiveness. In our example, the system only used one block. However, any number of blocks may be used to define the startup logic and the logic may be placed in the "startup" function within the generated code when generating code for the model 5600.

Whether using an internal or external definition of the variant condition code, it may need to be provided in a target independent language fashion. When using external conditions, the system may be using the block semantics of the model, and hence this is by definition target independent. Specifying target dependent code (internal or external) is allowed. When target dependent code is specified, the model 5600 may only be executed in environments supporting the dependent code semantics.

There can be redundant specifications of the startup-time code. For example, both the Variant Source block 5606 and the Variant Sink block 5610 of the example model 5600 could have defined internal code. The processing of the model 5600 may need to verify there is no conflict, and then use the one definition when emitting the generated code.

With the variant condition selection (definition of the active variant choices) specified at startup-time, code for use by a supplier may be generated for the model 5600, for example by the code generator 108. The generated code may be compiled into one binary, then the binary may be provided to different OEMs and the binary, when it starts executing, will sense the environment in which it is executing and will activate the valid variant.

Figure 83:
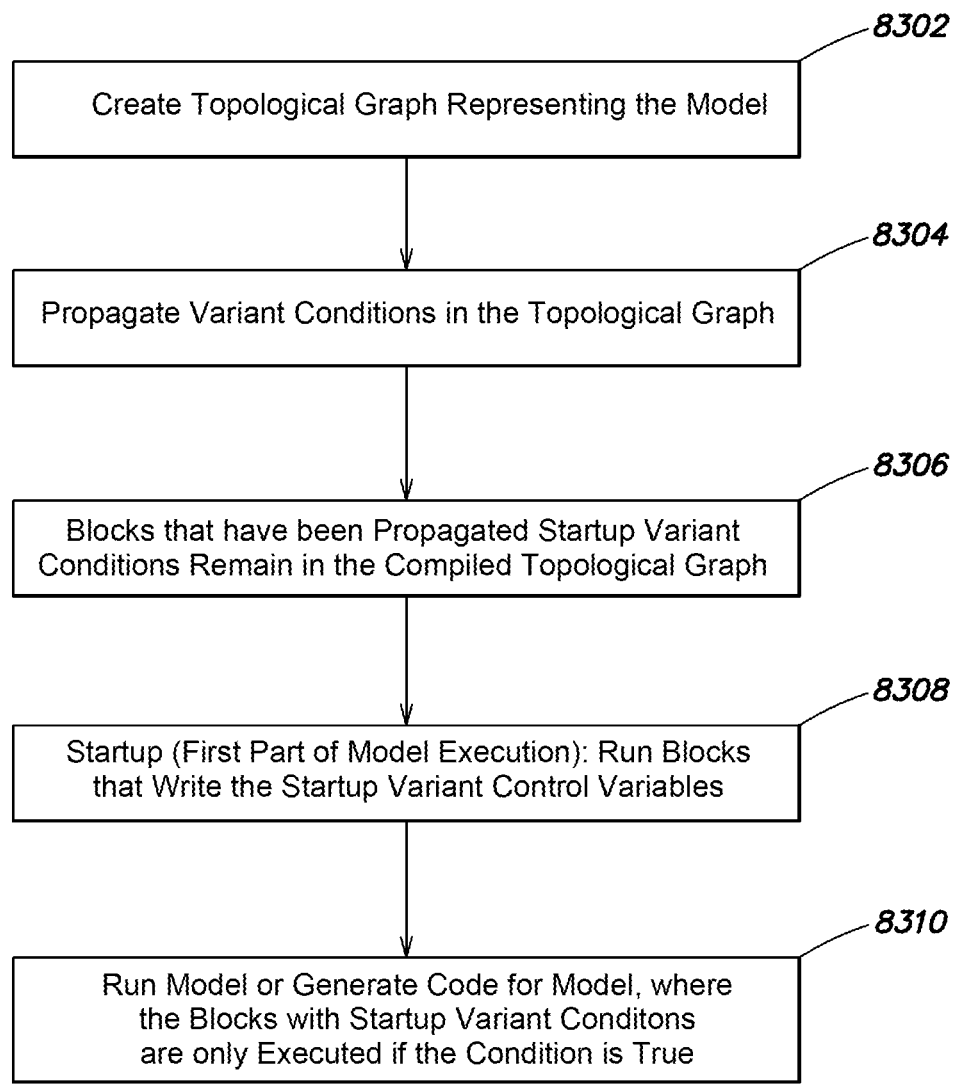
FIG. 83 is a flow chart of an example method in accordance with one or more embodiments.

FIG. 83 is a flow diagram of an example method for processing startup-time variants. Given a model with variant blocks where the conditions have been specified as startup-time, e.g., "startup variant control variables", the execution engine 112 may compile the model. As part of model compilation, a topological graph representing the model may be created, as indicated at step 8302. The propagation of variant conditions will propagate the variant condition expressions from the variant blocks such as Variant Source, Variant Sink, and Variant Subsystem blocks to other blocks in the model, as indicated at step 8304. The blocks with startup-time variant conditions remain in the topological graph, as indicated at step 8306. When the model is executed, the first part is at startup (when the model first starts executing), as indicated at step 8308. In this step, the execution engine 112 or the generated code will run the blocks that define the value of the startup variant control variables, as also indicated at step 8308. Next, the model may be executed in simulation mode or code may be generated, and blocks that have a startup-time variant condition are only executed if the condition is true, as indicated at step 8310.

Ability to Switch Variant Activation at Run-Time and Optionally Hand Off States

Previously, we saw how startup-Time variant selection may be used to simplify the development process by reducing the number of binaries needed when generating code for a model with variants and compiling the code. There are scenarios where the switching of the active variant choice should be done at run-time. The semantics of diagrams, such as Simulink's time-based models, is such that the model defines a run-time loop that executes a step (or other run-time methods such as output, update, derivatives) function on periodic events such as a clock timer or aperiodic events, such as a piston reaching top-dead center. For example, the run-time loop when simulating a model with discrete states would be generated similar to:

Model_Startup( )
RunTimeLoop {
Model_Step( )
t=t+H
}

Where, t, is for time and, H, is the step size. This loop may become complicated as continuous states or other modeling primitives are added to the block diagram.

Figure 63:
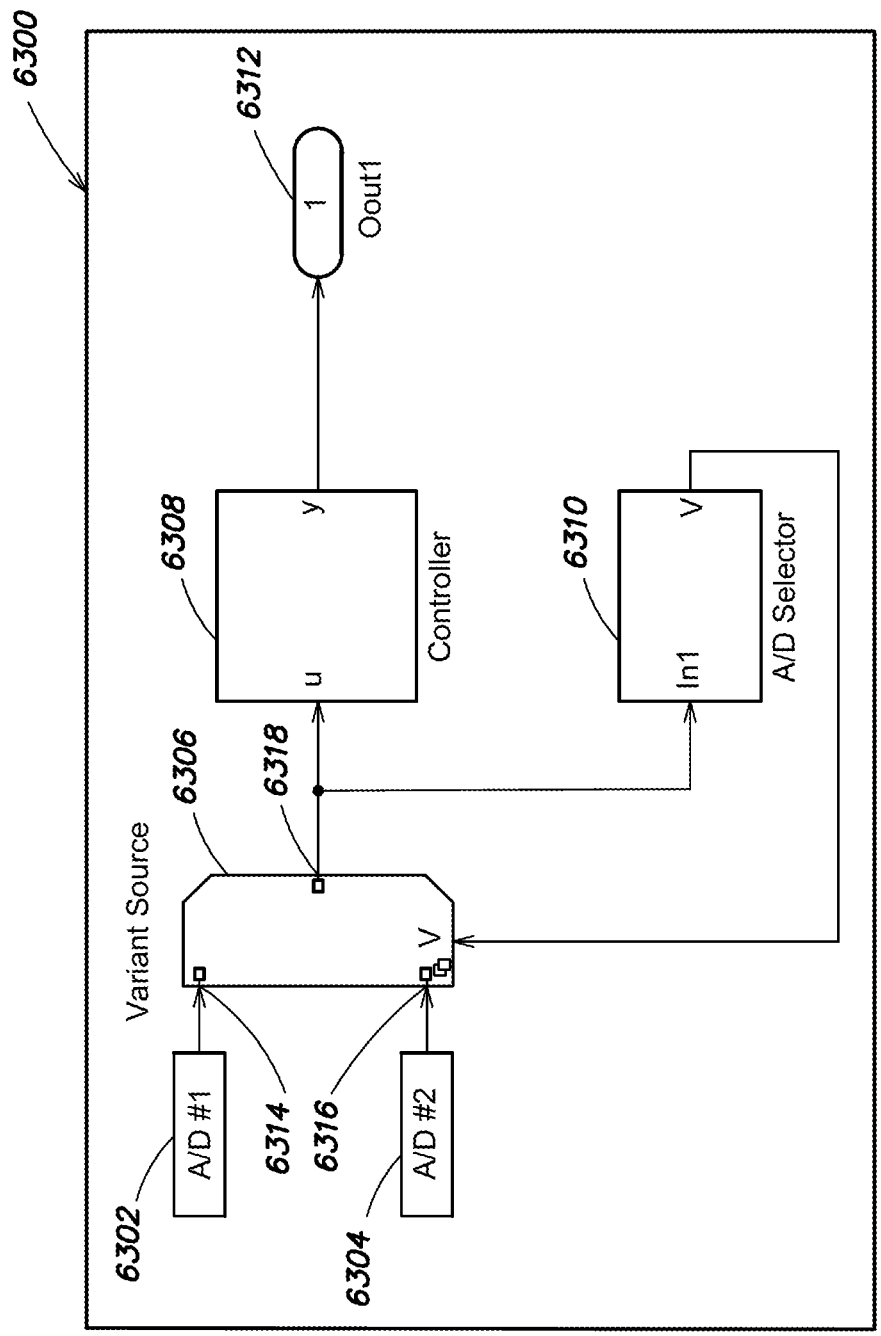
FIG. 63 is an illustration of an example model in accordance with one or more embodiments.

At run-time, it may be beneficial to allow switching of the conditions. One example is where there may be redundant A/D converters that are present on the physical hardware. By default, the redundant converters and other logic are deactivated to save power. If a fault is detected in the active converter, then it could be powered down, and an inactive converter could be powered up and used to run the controller. FIG. 63 is an illustration of an example model 6300. The model 6300 includes two A/D blocks 6302 and 6304 named 'A/D #1' and 'A/D #2', respectively, a Variant Source block 6306, a subsystem block 6308 named 'Controller', another subsystem block 6310 named 'A/D selector', and an Outport block 6312 named 'Out1'.

The A/D selector block 6310 reads the output of the Variant Source block 6306, which is either the output of the A/D #1 block 6302 or the A/D #2 block 6304. The Variant Source block 6306 has variant condition expression, "V==1" on a first input port 6314 and the condition "V==2" on a second input port 6316. The Variant Source block 6306 may further include an output port 6318. The output of the A/D selector block 6310 is the value for the variant control variable, V, and this determines which variant choice of the model 6300 is active, either the A/D #1 block 6302 or the A/D #2 block 6304.

Figure 64:
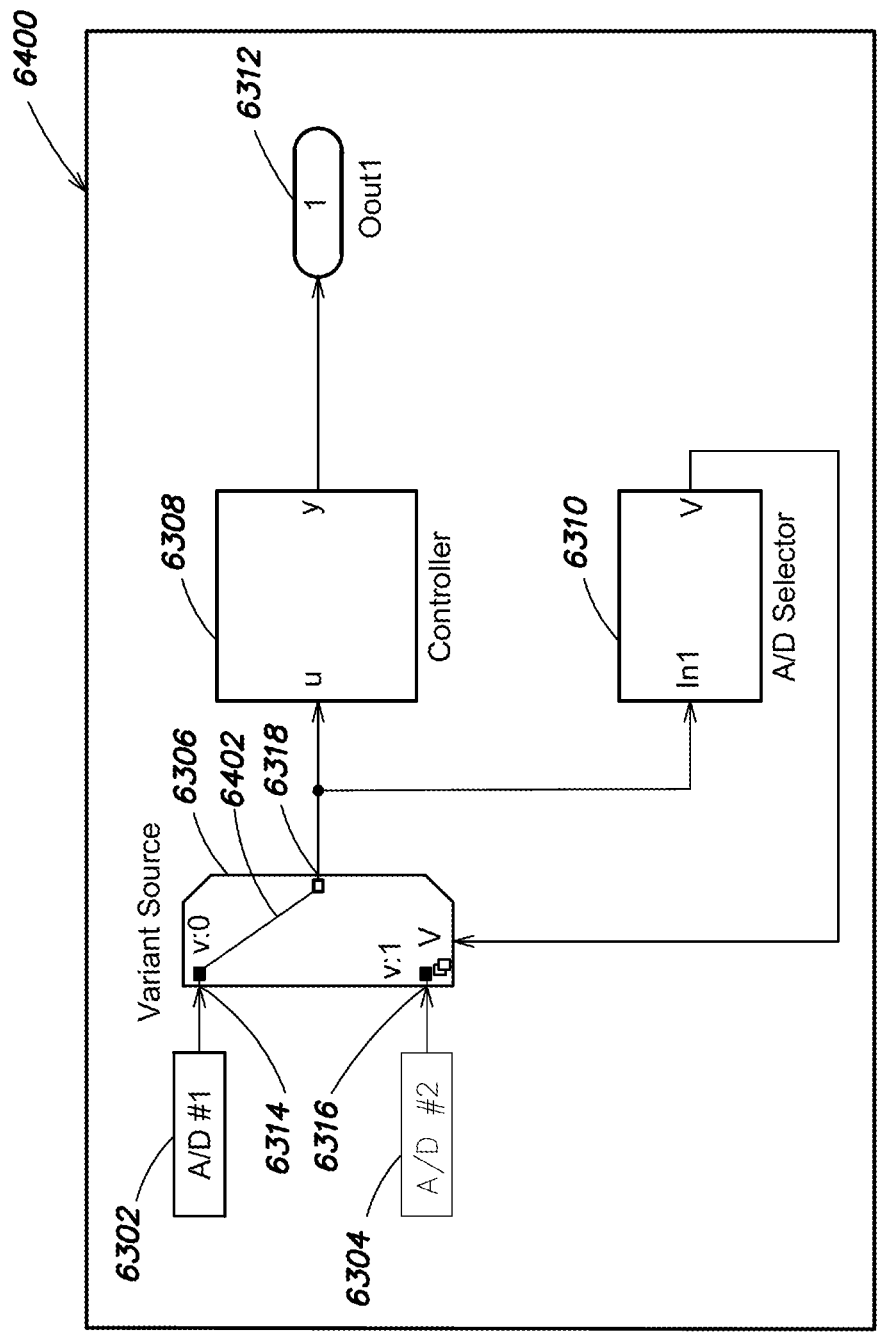
FIG. 64 is an illustration of an example model in accordance with one or more embodiments.

As shown in FIG. 63, there is currently no active branch. After determining the active branch, the icon of the Variant Source block 6306 will show which is active. For example, if the first variant choice is active, then there may be a line connecting the first input port 6314 of the Variant Source block 6306 to its Output port 6318. FIG. 64 is an illustration of an example model 6400 that is similar to the model 6300. In the model 6400, there is a connection line 6402 that connects the first input port 6314 of the Variant Source block 6306 to the output port 6318 of the Variant Source block 6306.

During model execution, when simulating or running the generated code, the icon on the Variant Source block 6306 can optionally be redrawn when the V changes value. When the generated code is running, one can use "external mode" to connect the generated code back up to the block diagram editor. External mode is a capability in the Simulink® model-based design environment that provides a communication channel between a model and code generated for the model. This communication channel can be a TCP/IP connection for example. Because the model can observe the execution, the system 114 can update the icon to show which choice is currently active. If the system 114 were to update the graphics every time step, simulation may slow down or cause time-out issues for the generated code when running on the hardware. Therefore, the update of the graphics may be performed at "human" rate of a second or slightly less than a second, and only when the active choice changes.

Variant choices need not be limited to stateless blocks such as the A/D blocks in the prior example model 6300. The system may use state full blocks, such as discrete integrators in the variant choices. This may present an issue. When switching variant choices at run-time, the system may need to ensure that the system starting up (being switched to) is initialized correctly. To do this, the system may place an initialize subsystem in each of the variant choices that read states from the previously active variant choice, and then computes the new states for the activating variant choice, and assigns them to the blocks.

Figure 65:
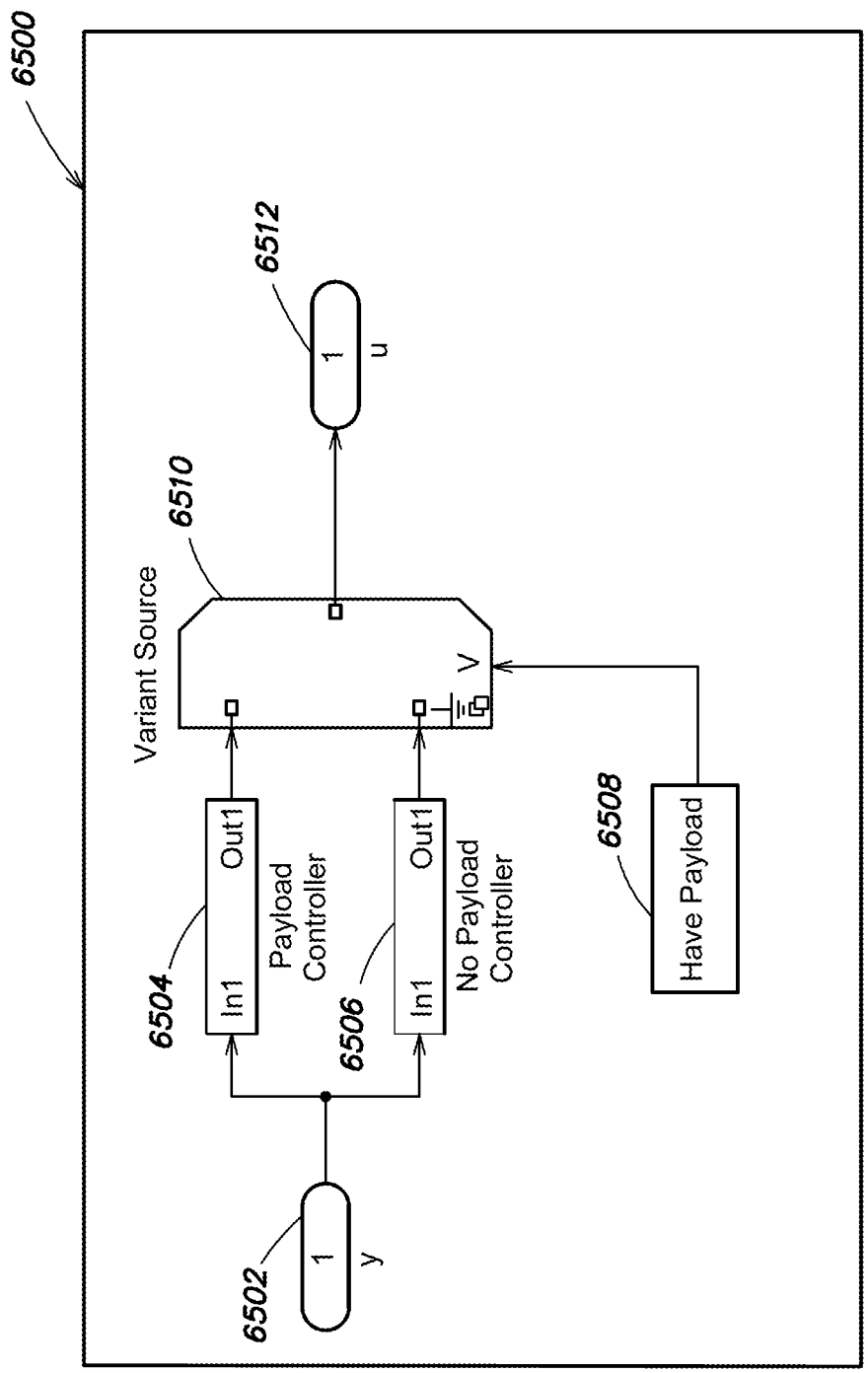
FIG. 65 is an illustration of an example model in accordance with one or more embodiments.

FIG. 65 is an illustration of an example model 6500. The model 6500 includes an Inport block 6502 named 'y', three subsystem blocks 6504, 6506, 6508 named 'Payload Controller', 'No Payload Controller', and 'Have Payload', respectively, a Variant Source block 6510, and an Outport block 6512 named 'u'. The Variant Source block 6510 is configured for run-time activation. The Have Payload block 6508 detects if the system under control has a payload, such a system could be a rocket carrying a payload. The model 6500 assumes a linear controller is sufficient. However, a linear controller will have different coefficients if the system has a payload or does not have a payload. When the system has a payload, the Payload Controller subsystem 6504 will be active, when the variant control variable, v, is true as computed by the Have Payload block 6508. If the 'Have Payload' block 6508 computes that there is no payload (sets V to false), then the No Payload controller block 6506 will be active.

Figure 66:
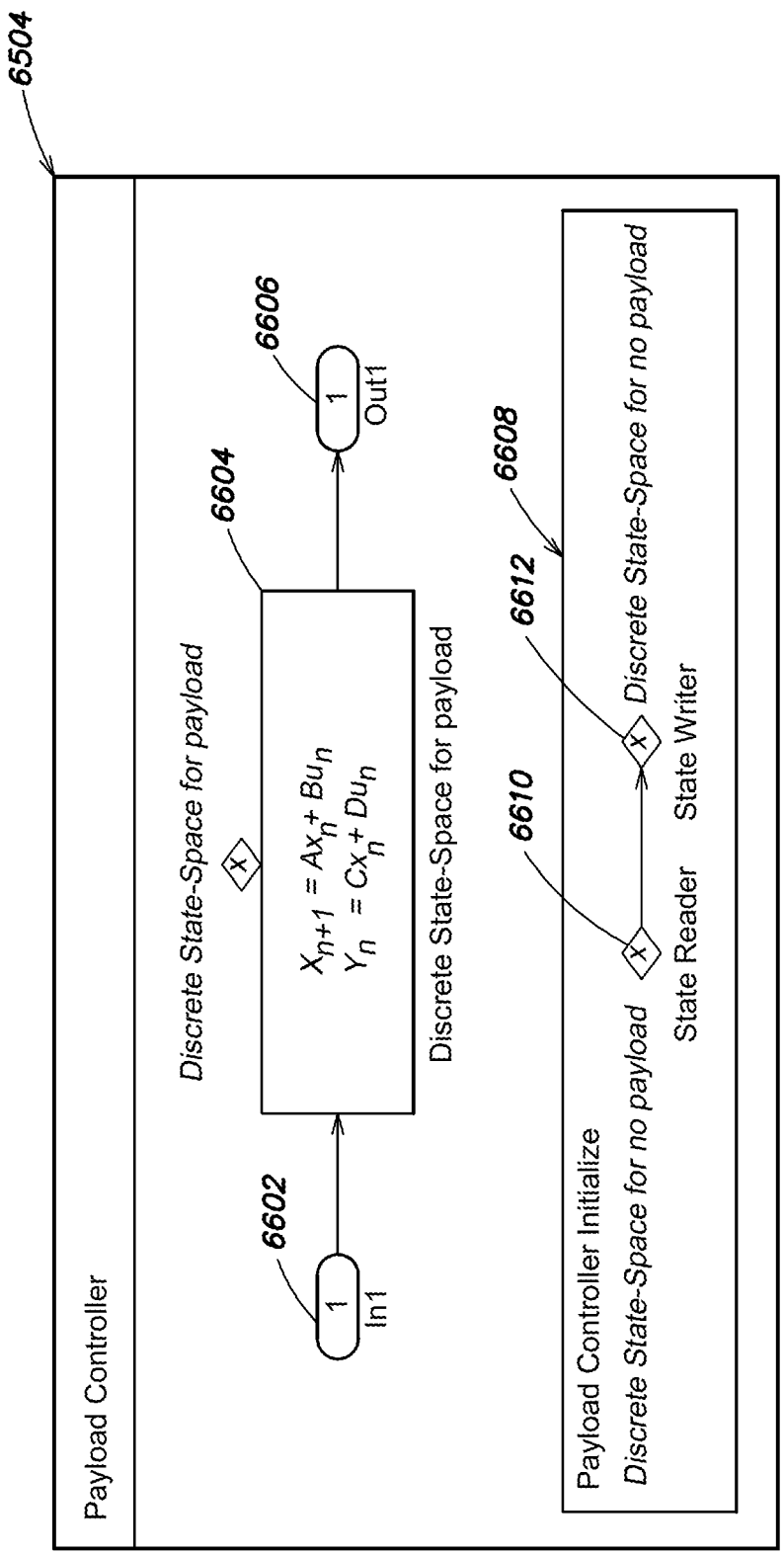
FIG. 66 is an illustration of an example model component in accordance with one or more embodiments.
Figure 67:
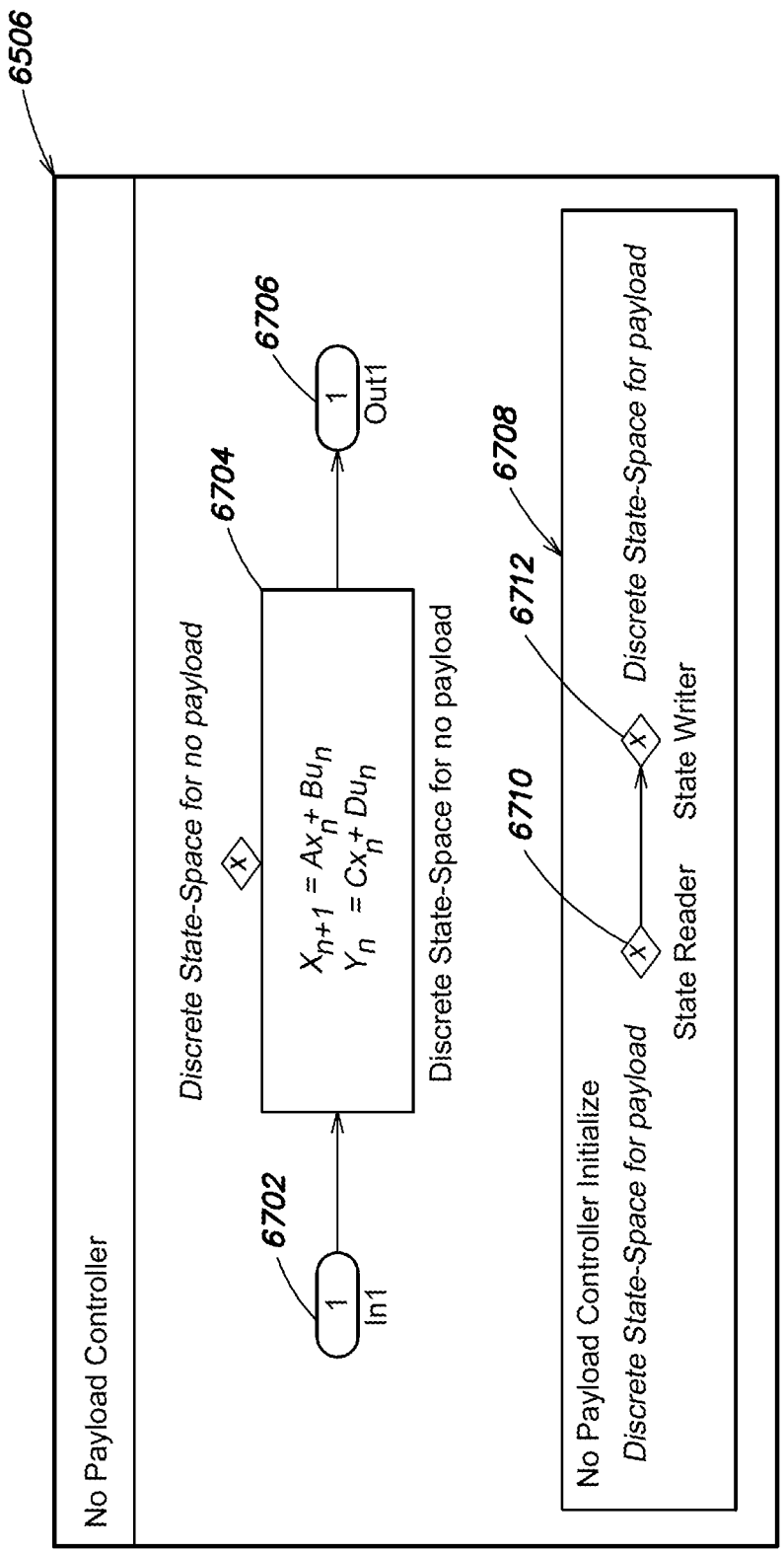
FIG. 67 is an illustration of an example model component in accordance with one or more embodiments.

FIG. 66 is an illustration of the Payload Controller subsystem 6504. The Payload Controller subsystem 6504 includes an Inport block 6602 named 'In1', a subsystem block 6604 named 'Discrete State-Space for payload', an Outport block 6606 named 'Out1', and an initialize block 6608 named 'Payload Controller Initialize' that includes a State Reader block 6610 and a State Writer block 6612. FIG. 67 is an illustration of the No Payload Controller block 6506. The No Payload Controller subsystem 6506 includes an Inport block 6702 named 'In1', a subsystem block 6704 named 'Discrete State-Space for no payload', an Outport block 6706 named 'Out1', and an initialize block 6708 named No 'Payload Controller Initialize' that includes a State Reader block 6710 and a State Writer block 6712.

Inside the Payload Controller block 6504, the State Reader block 6610 reads the state from the No Payload Controller block 6506, and writes the state to its Discrete State-Space for payload block 6604. The state handling behavior of the No Payload Controller block 6506 is the inverse of the Payload Controller block 6504. The reading and writing of the states may only be done when the system initializes. The system may initialize when it is activated. This may occur once at model startup for the active variant choice, and whenever the active variant choice switches at run-time.

The implementation of run-time variants may be similar to that of startup-time variants. Run-time variant conditions may be propagated throughout a model. There may be blocks that write to run-time variant control variables. The values of these run-time variant control variables may be used by blocks that have been assigned run-time variant conditions to determine if the blocks should be executed during the run-time.

Manual Variant Blocks

Thus far, several forms of variant choice activation have been described, and selection of the active variant choice can be done at model update-diagram time, code-compile time, startup-time, or run-time. Another form of variant choice activation may be referred to as "manual" selection. Manual variant selection may be done by double clicking, e.g., with a mouse, a variant block icon as displayed on a screen to toggle the active variant choice.

Figure 68:
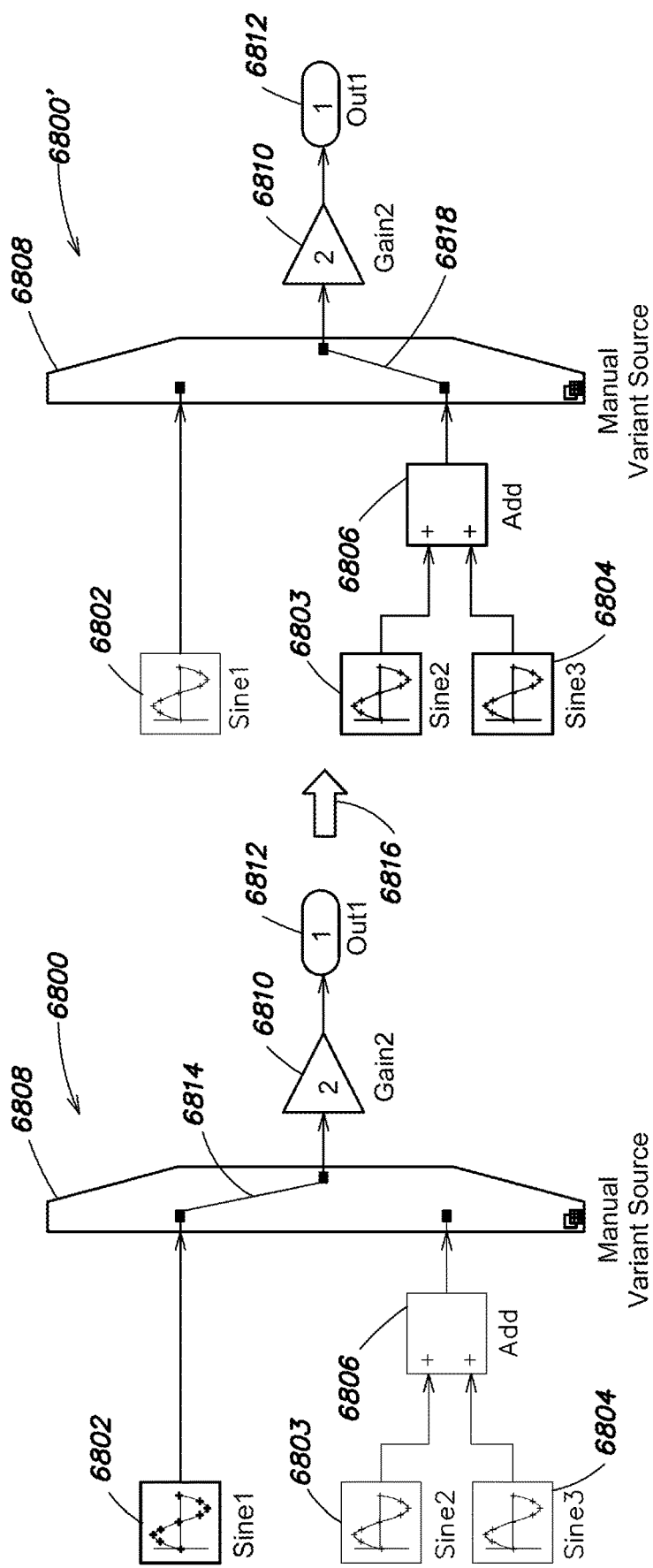
FIG. 68 is an illustration of an example model in accordance with one or more embodiments.

FIG. 68 is an illustration of an example model 6800. The model 6800 includes three Sine blocks 6802-6804, an Add block 6806, a Variant Source block 6808 named 'Manual Variant Source', a Gain block 6810 named 'Gain2', and an Outport block 6812 named 'Out1'. The Sine block 6802 is the active choice as indicated by connection line 6814 of the Manual Variant Source block 6808. The Sine blocks 6803 and 6804 and the Add block 6806 is the inactive choice, and these blocks are shown as grayed out. In response to double clicking the Manual Variant Source block icon 6808, e.g., with a mouse or other pointing device, the active variant choice selector 144 may switch the active choice, as indicated by arrow 6816, and revised or updated model 6800'. In the revised or updated model 6800', the Sine block 6802 is now inactive and is shown as grayed out. The Sine blocks 6803 and 6804 and the Add block 6806 are the active variant choice as indicated by connection line 6818, and are no longer grayed out.

Figure 69:
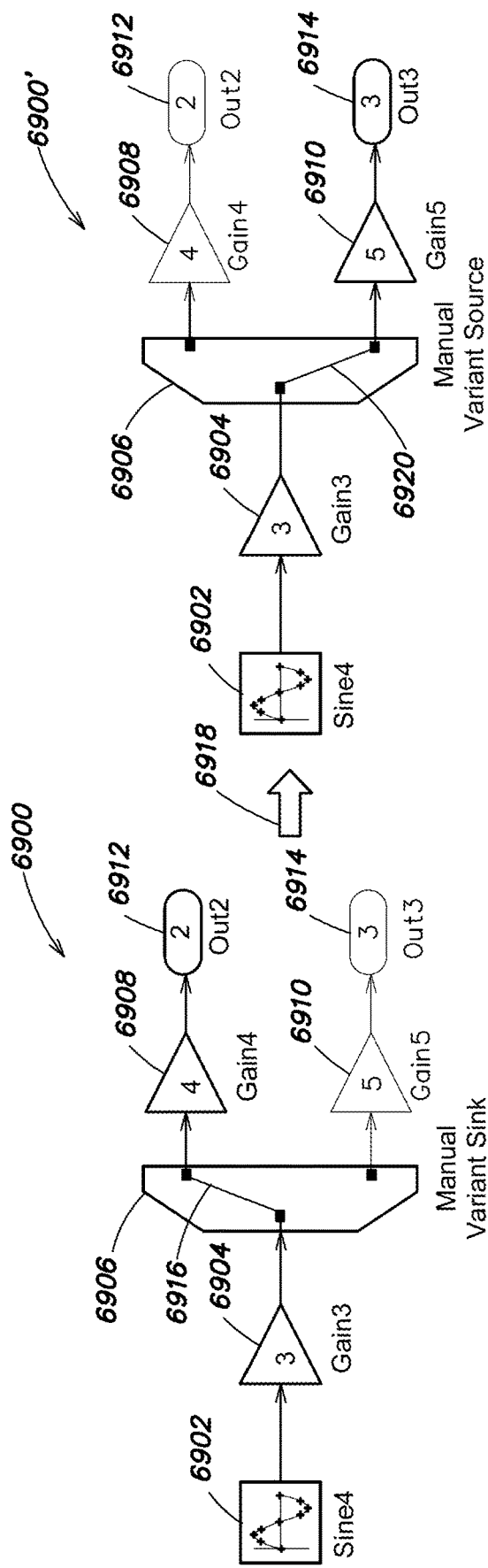
FIG. 69 is an illustration of an example model in accordance with one or more embodiments.

FIG. 69 is an illustration of an example model 6900. The model 6900 includes a Sine block 6902, a Gain block 6904 named 'Gain3', a Variant Sink block 6906 named 'Manual Variant Sink', two Gain blocks 6908 and 6910 named 'Gain4' and 'Gain5', respectively, and two Outport blocks 6912 and 6914 named 'Out2' and 'Out3', respectively. The Gain block 6908 and the Outport block 6912 are the active choice as indicated by connection line 6916 of the Variant Sink block 6906. The Gain block 6910 and the Outport block 6914 are inactive, and are shown as grayed out. Double clicking the Manual Variant Sink block icon 6906 results in the active variant choice selector 144 switching the active variant choice as indicated by arrow 6918 and revised or updated model 6900'. In the revised or updated model 6900', the Gain block 6908 and the Outport block 6912 are now inactive and are shown as grayed out. The Gain block 6910 and the Outport block 6914 are the active variant choice as indicated by connection line 6920, and are no longer grayed out.

The implementation of the manual variant blocks may be achieved by setting up a mouse click listener at the active variant choice selector 144 that is configured to toggle the active variant to a next choice. A given variant can have more than two choices. For example, the Manual Variant Source block 6808 may have three input ports corresponding to three choices. To configure the Manual Variant Source block 6808, a user may right-click it and bring up a dialog that lets the user specify the number of variant choices.

Figure 70:
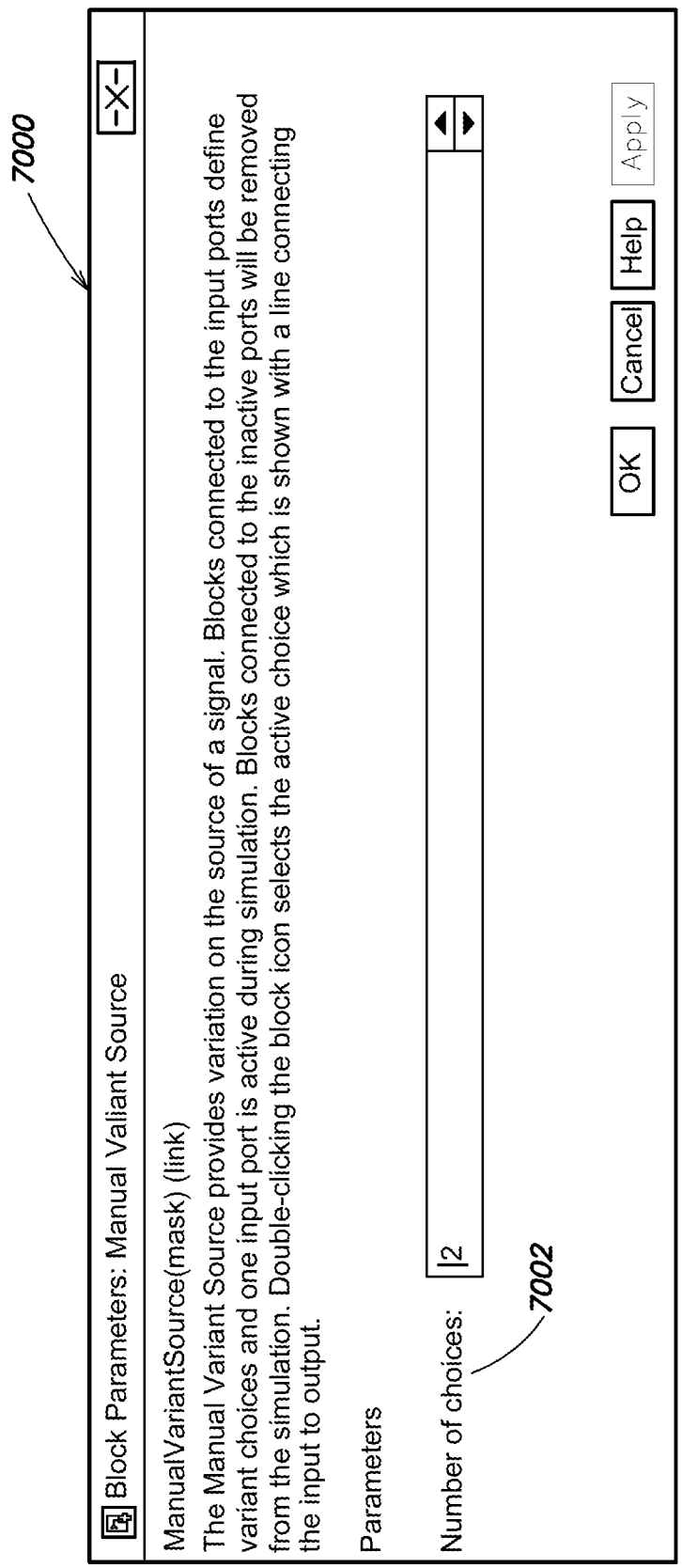
FIG. 70 is an illustration of an example graphical affordance in accordance with one or more embodiments.

FIG. 70 is an example dialog 7000 for the Manual Variant Source block 6808. The dialog 7000 may include a data entry box 7002 labeled 'Number of Choices'. A user may specify the number of variant choices for the Manual Variant Source block 6808 by entering a value, e.g., 2, in the data entry box 7002.

The ability to activate variant choices by double-clicking the variant block icon may apply to all types of variants ranging from hierarchical variants such as a Variant Subsystem block to Variant Start/End pairs. Variant Start/End pairs may define regions of variant choices where the start of the variant region may be demarcated by the Variant Start block and ends with the Variant End block.

In other graphical programming environments, such as the state charts of the Stateflow state chart tool by The MathWorks, Inc., there may be new graphical elements that specify variant conditions similar to the blocks described herein in time-based block diagrams. The graphical elements in state charts may be of the form of a variant node that may specify a variant condition, and corresponding variant activation type, which can range from update-diagram, code-compile, startup-time, run-time, or manual. This may be true of all graphical programming environments where the semantics of the diagram define how the model can be executed.

Visualization of Results Between Different Modes, e.g. Simulation Results Vs Code Generation Results Variants allow one model to be used for many systems. One configuration of a model may be used for simulation and a different configuration may be used for code generation (codegen). In many scenarios, the simulation configuration is supposed to match the codegen configuration. Therefore, there is a need to determine if the simulation execution results are in agreement with the codegen execution results. To satisfy this need, a "variant execution recorder" object may be created. Each time a model is executed, the runs may be recorded and what configuration was active.

Figure 71:
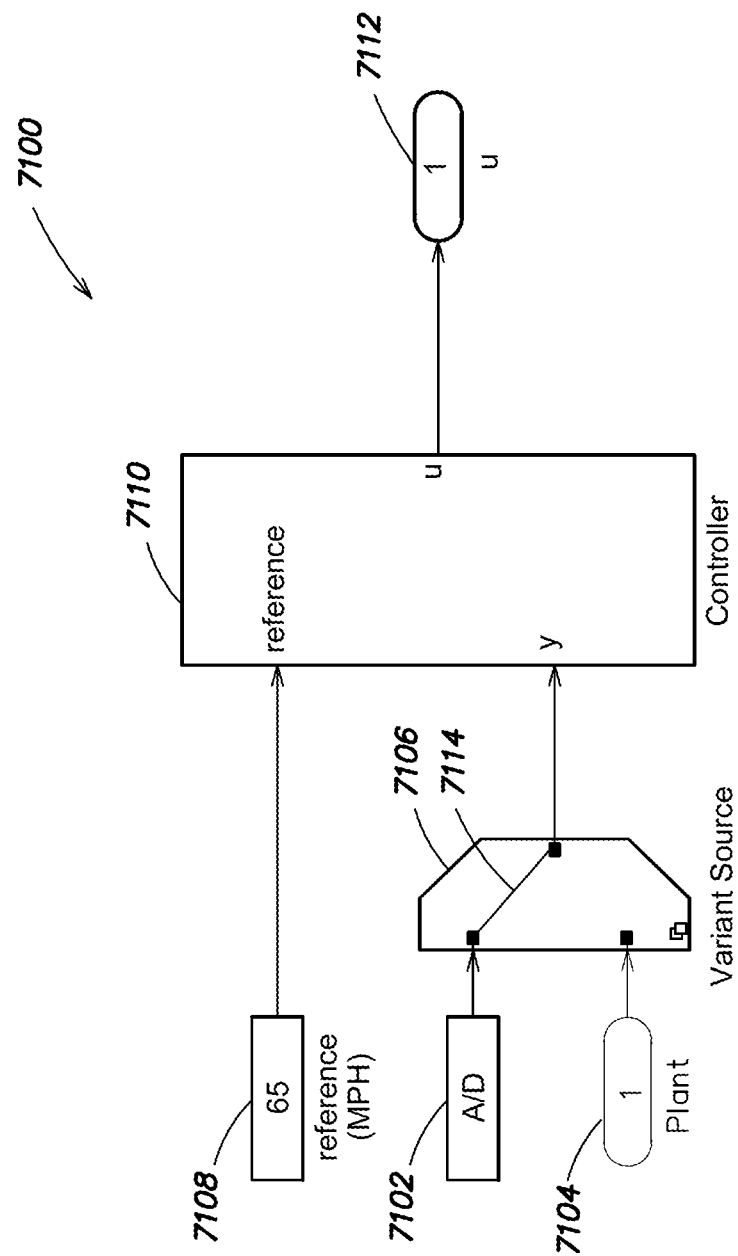
FIG. 71 is an illustration of an example model in accordance with one or more embodiments.

FIG. 71 is an illustration of an example model 7100. The model 7100 includes an A/D block 7102, an Inport block 7104 named' plant, a Variant Source block 7106, a Constant block 7108 named 'reference (MPH)', a subsystem block 7110 named 'Controller', and an Outport block 7112 named 'u'. The Controller block 7110 may compute an actuating signal, 'u', that either feeds to a plant, when running simulation, or to a physical system under control. The model 7100 has two different variants as defined by the Variant Source block 7106, which selects between the A/D block 7102 and the "plant" block 7104. When generating code, a first branch 7114 of the Variant Source block 7106 may be activate, and the second input (choice) may be inactive, as shown in grayed out form. When running a simulation, the model 7100 may be used as part of a larger closed-loop model, such as the controller feeding a plant. The output of the plant may be fed to the first "plant" Inport block 7104, which is then fed though the Variant Source block 7114 to the Controller block 7110.

A user may setup a recorder option, which records the simulation result or the result of executing the generated code for the model 7100. The recorder option may be configured through one or more graphical affordances, such as a dialog.

Figure 72:
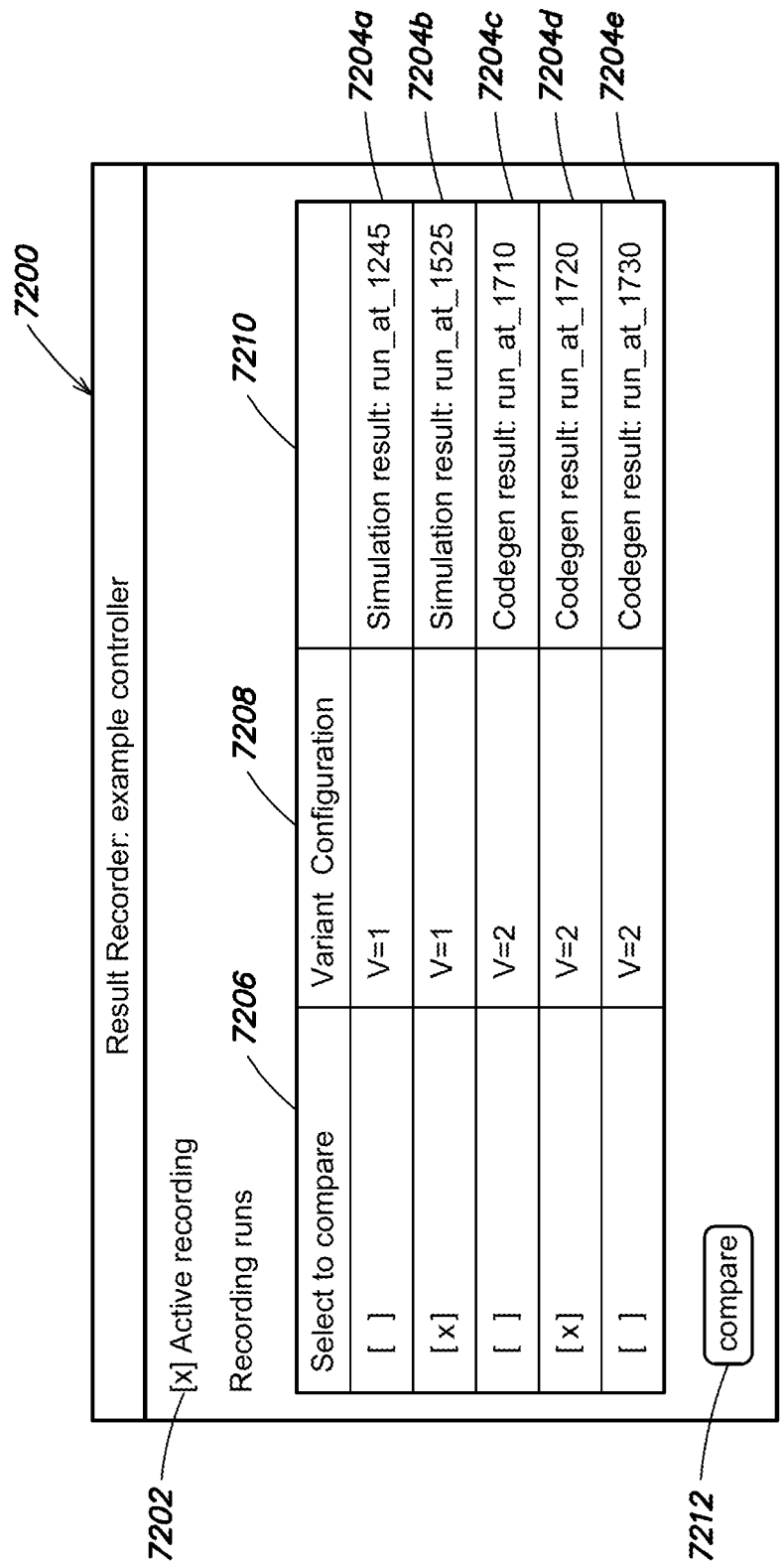
FIG. 72 is an illustration of an example graphical affordance in accordance with one or more embodiments.

FIG. 72 is an illustration of an example dialog 7200. The dialog 7200 may include a checkbox 7202 named 'Active recording'. When the "Activate recording" checkbox 7202 is selected, all signals meeting some criterion may be recorded. By default, the signals meeting this criterion may be root-level Inport and Outport blocks (in this case, the plant Inport block 7104 and 'u' Outport block 7112) along with one or more observer blocks, such as Scope blocks or test pointed signals. Alternatively, when the Active recording checkbox 7202 is selected, a dialog may appear showing the signals and states within the model 7100, and from this list a user may select which signals and states to record.

Once recording has been active, every time the model 7100 is executed, the results may be saved. The recorder dialog 7200 may include an entry for each recorded run. The entries may be listed in the dialog 7200 as rows 7204*a-e*. For each row 7204, there may be a column 7206 named 'Select to compare', which may include checkboxes, a column 7208 named 'Variant Configuration', which may present the values of one or more variant condition variables, and a column 7210 named 'Description'. The dialog 7200 may also include a command button 7212 named 'compare'. To make a recording, the marked signals and states for recording may be instrumented for recording. In the generated code, the code generator 108 may do this with reduced overhead by making the signals available after the run-time methods (e.g. output method) have run, and then saving them away to a location in persistent memory. The process may be similar when running an interpretive simulation, the code generator 108 may instrument an in-memory compiled representation of the model 7100 to have recording nodes that capture the values of the signals as the model 7100 is executed.

Figure 73:
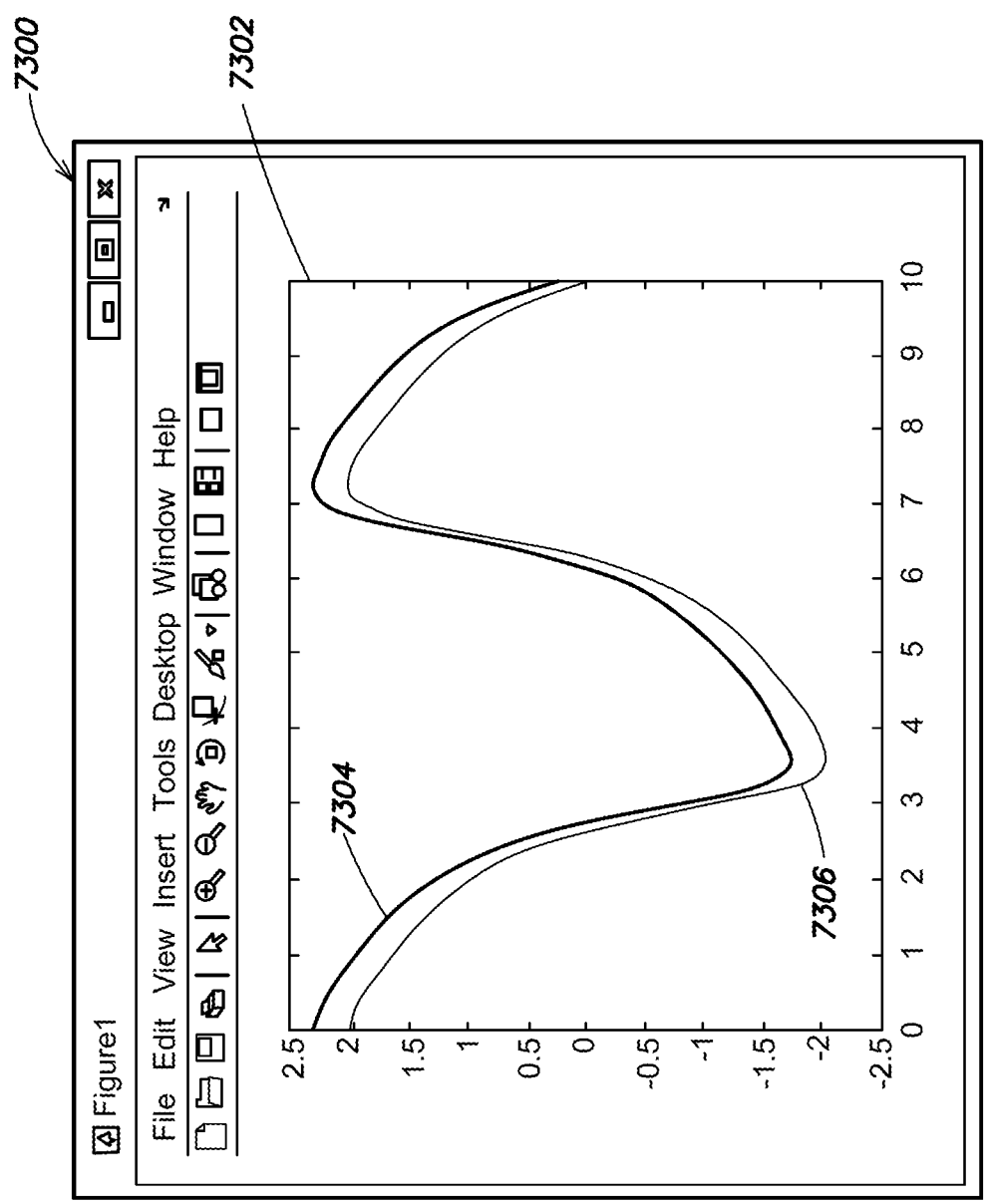
FIG. 73 is an illustration of an example graphical affordance in accordance with one or more embodiments.

As signals are recorded, the dialog 7200 may show the runs. A user may also use the recording dialog 7200 to compare runs. In the example dialog 7200, the second and fourth runs 7204*b* and 7204*d* are selected for comparison, then when the user selects the compare button 7212, the UI engine 102 may present one or more graphical affordances, such as a window. FIG. 73 is an example window 7300 containing a plot 7302. Alternatively, the results may be shown in other graphical forms or in textual spreadsheet like form.

This comparison illustrated in the plot 7302 of the example window 7300 may be programmatically specified, and may generally be model specific. Here, the user requested that the two runs indicated at rows 7204*b* and 7204*d* be differenced. It should be understood that other forms of flexible comparison of results may be used, such as comparisons of results supported by the MATLAB environment. In the plot 7302, a first results plot line 7304 may corresponds to when the variant control variable V==1, and a second results plot line 7306 may corresponds to when the variant control variable V==2. As shown in the plot 7302, there is a difference between the simulation and codegen results. A user could examine the workings of the model 7100 in both environments to see if there is something wrong with the model 7100 in codegen or simulation, and then fix it.

Figure 84:
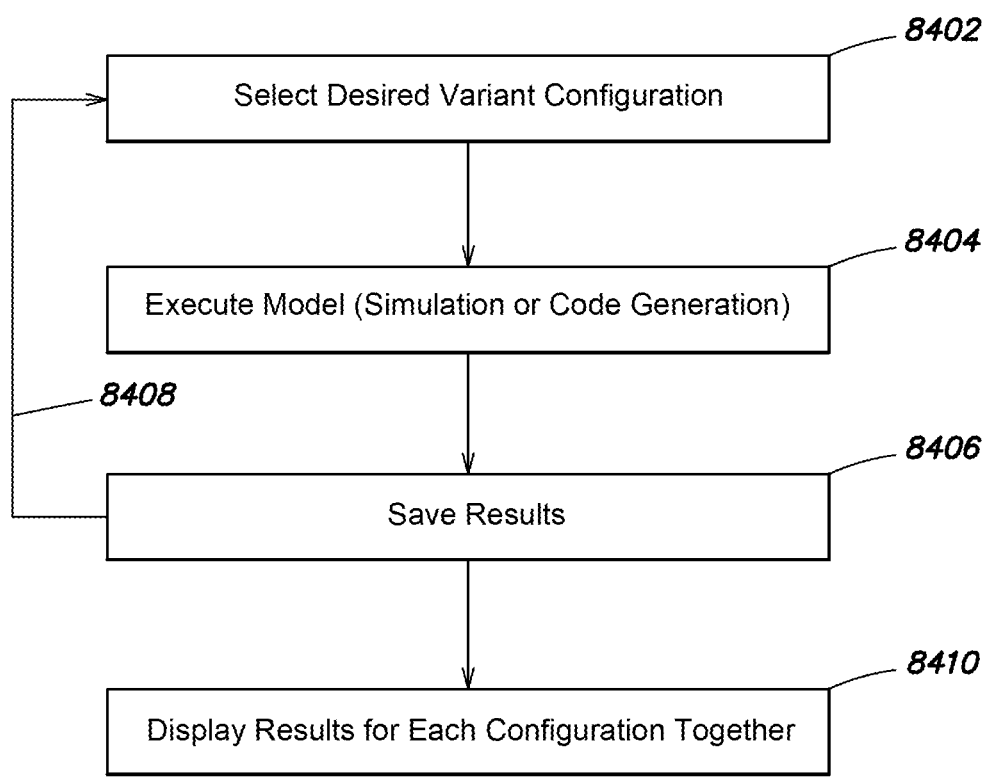
FIG. 84 is a flow chart of an example method in accordance with one or more embodiments.

FIG. 84 is a flow chart of an example method for visualizing results of different modes. Given a model with variants, a user may select a desired variant configuration, as indicted at step 8402. Next, the user may instruct the execution engine 112 to run a simulation or generate code and run the code, as indicated at step 8404. The results may be saved, as indicated at step 8406. Another variant configuration may be selected, and the process repeated, as indicated by arrow 8408. After all configurations have been run, the results may be displayed together, or a set of the results are displayed together, as indicated at step 8410.

Composite Ports for Variation Blocks to Simplify Diagram Wiring

Inline variant blocks, such as Variant Source, Variant Sink, and Variant Start/End pairs, as described in U.S. Pat. No. 8,386,222, may operate on a single signal and may create a number of variant choices for that signal. Signals may be "grouped" together into bundles, similar to the way one can group a physical set of wires into a bundle such as an analog telephone cord. The telephone cord appears as a single wire, but inside of it there are multiple wires. This concept also applies to graphical programs. In the Simulink® model-based design environment, there is the concept of buses which represent these "tie-wraps" or grouped signals.

Figure 74:
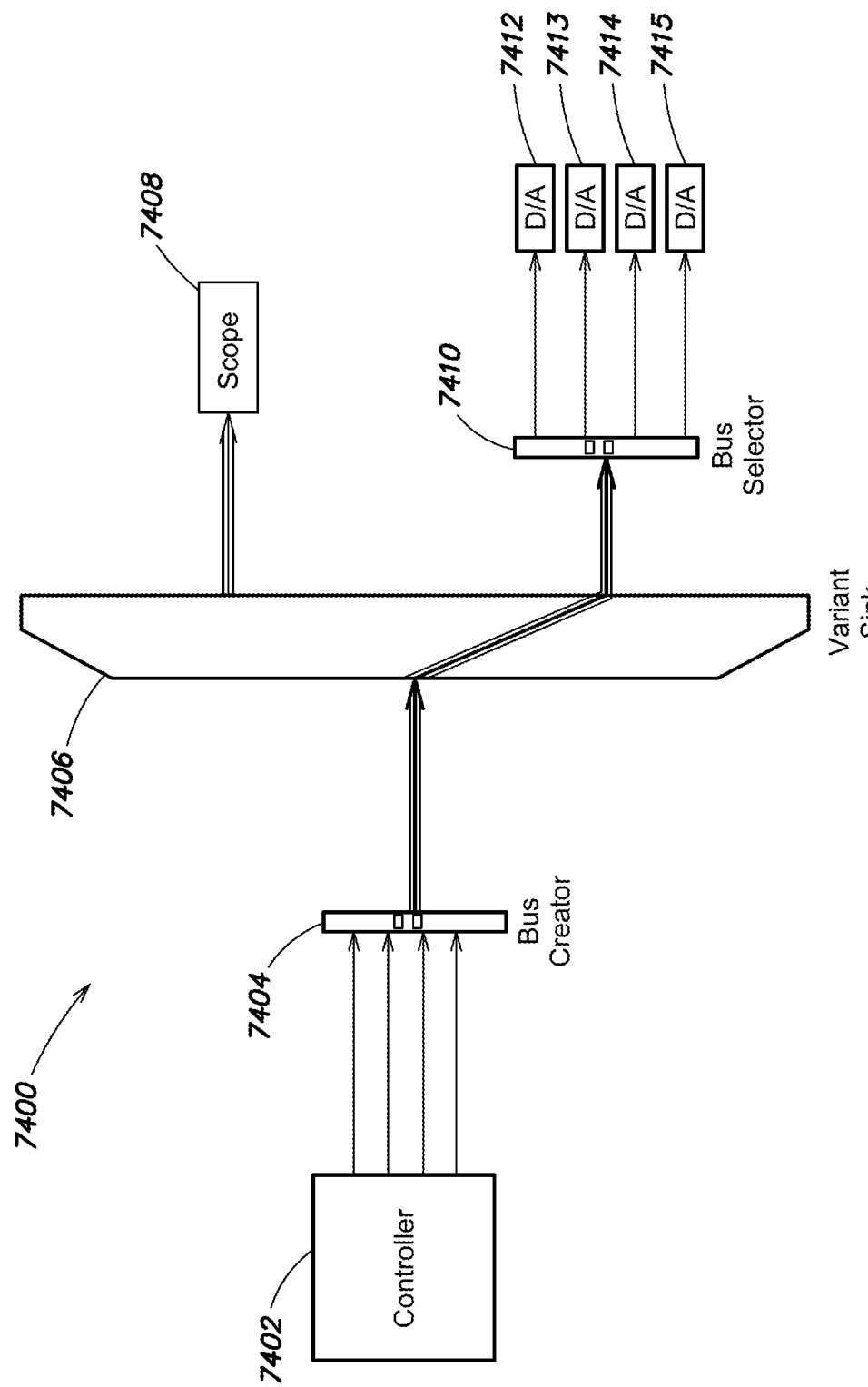
FIG. 74 is an illustration of an example model in accordance with one or more embodiments.

FIG. 74 is an illustration of an example model 7400. The model 7400 includes a subsystem 7402 named 'Controller', a Bus Creator block 7404, a Variant Sink block 7406, a Scope block 7408, a Bus Selector block 7410 and four D/A converter blocks 7412-7415. The controller block 7402 produces four signals. These signals feed the Bus Creator block 7404. The Bus Creator block 7404 groups the four signals into a single signal bundle (wire). The output of the Bus Creator block 7404 then feeds the Variant Sink block 7406. The Variant Sink block 7406 defines two variant choices of the model 7400. The first variant choice has variant condition V==1 and the second choice has variant condition V==2. The first variant choice condition, V==1, may be propagated to the Scope block 7408, and the second variant choice condition, V==2, may be propagated to the Bus Selector block 7410 and the four D/A converter blocks 7412-7415. The Bus Selector block 7410 "ungroups" the signals.

This modeling pattern works, but may suffer from the drawback of requiring Bus Creator and Selector blocks. To make the inline variant blocks more versatile, a new type of multi-signal port may be created on one or more of the inline variant blocks. A typical port may accept or produce one signal. Having a port that can accept multiple signals and route them though the inline variant blocks is possible because these blocks do not have any dynamics associated with them, e.g., they do not manipulate the signals passing through them. The feature of a single port accepting or producing multiple signals is not restricted to variant blocks. The feature may be applied to any block that can operate on bus signals.

Figure 75:
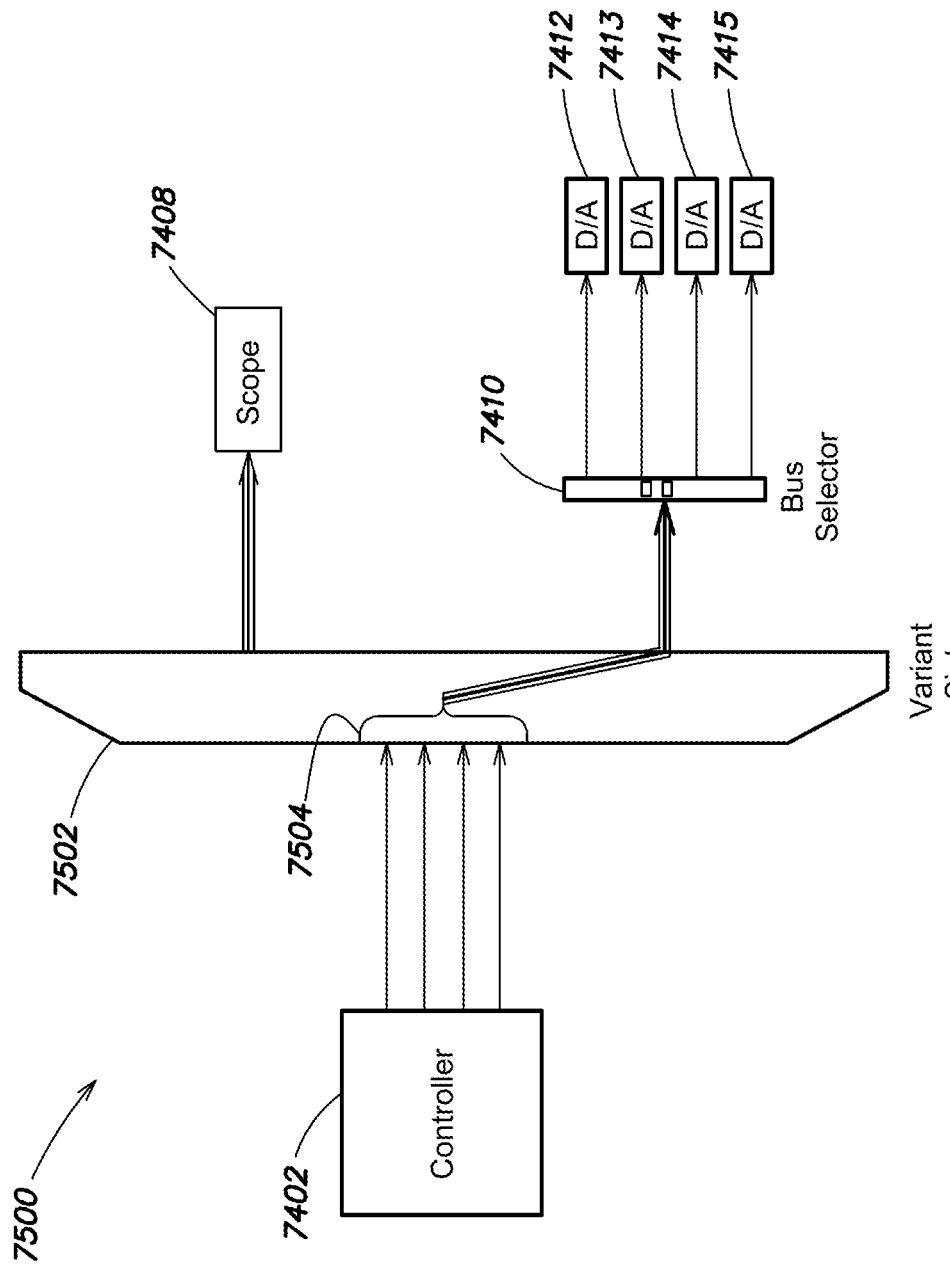
FIG. 75 is an illustration of an example model in accordance with one or more embodiments.

FIG. 75 is an illustration of an example model 7500. The model 7500 is similar to the model 7400, and includes the Controller block 7402, the Scope block 7408, the Bus Selector block 7410 and the four D/A converter blocks 7412-7415. The model 7500 further includes a new Variant Sink block 7502 that accepts multiple signals on a single port 7504. In another implementation, there could be a property on the block dialog for the Variant Sink block 7502 that specifies the input port that should allow multiple connections. Yet, in another implementation, the Variant Sink block 7502 could dynamically allow multiple connections to the same port. As a user drags a signal to the input port 7504 of the Variant Sink block 7502, a new "subconnector" input may appear. The demarcation of this multiport concept may be shown on the block icon using one or more graphical affordance as illustrated in FIG. 75.

Figure 76:
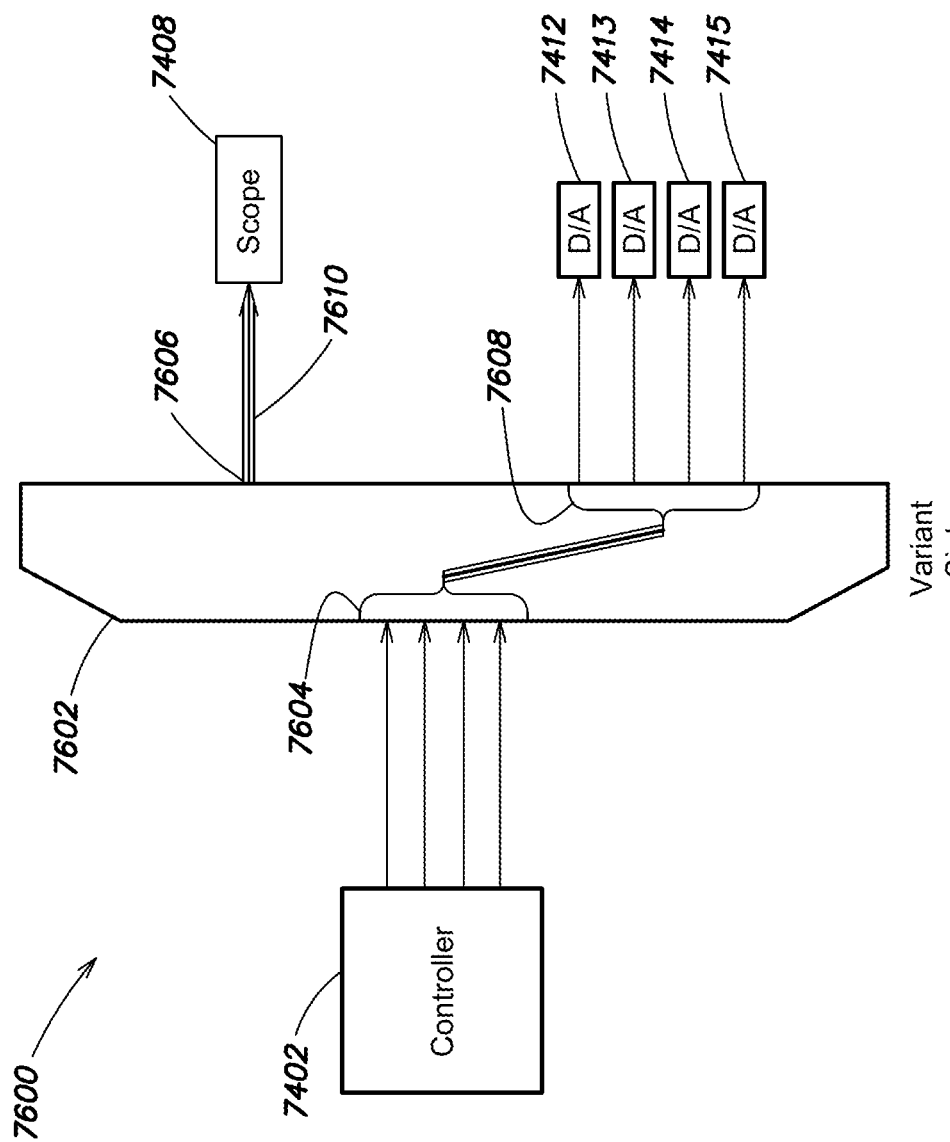
FIG. 76 is an illustration of an example model in accordance with one or more embodiments.

The notion of a multi-signal port may also apply to an output port. FIG. 76 is an illustration of an example model 7600. The model 7600 is similar to the model 7400, and includes the Controller block 7402, the Scope block 7408, and the four D/A converter blocks 7412-7415. The model 7600 further includes a Variant Sink block 7602 having an input port 7604, an output port 7606, and another output port 7608. The second output port 7608 is a multi-signal port and the four sub-signals are selected to feed to the four D/A converter blocks 7412-7415. This way, the system can programmatically swap out the design sections (choice V==1 Scope or choice V==2 for the D/A blocks) without modifying the model 7600, and the visualization may be improved in that there are less blocks and therefore the model 7600 is easier to read. Also notice that, in the example of the model 7600, the first output port 7606 is a traditional signal port, which in this case is a bus 7610, and this bus signal 7610 is fed to the Scope block 7408, which understands bus structure and may plot the four separate signals as they vary with time.

When connecting up a signal to a multi-signal port, a dialog or other graphical affordance may appear which may let a user decide how to structure the sub-signal. When grouping signals, the user can create groups of groups, specify ordering, etc.

Figure 77:
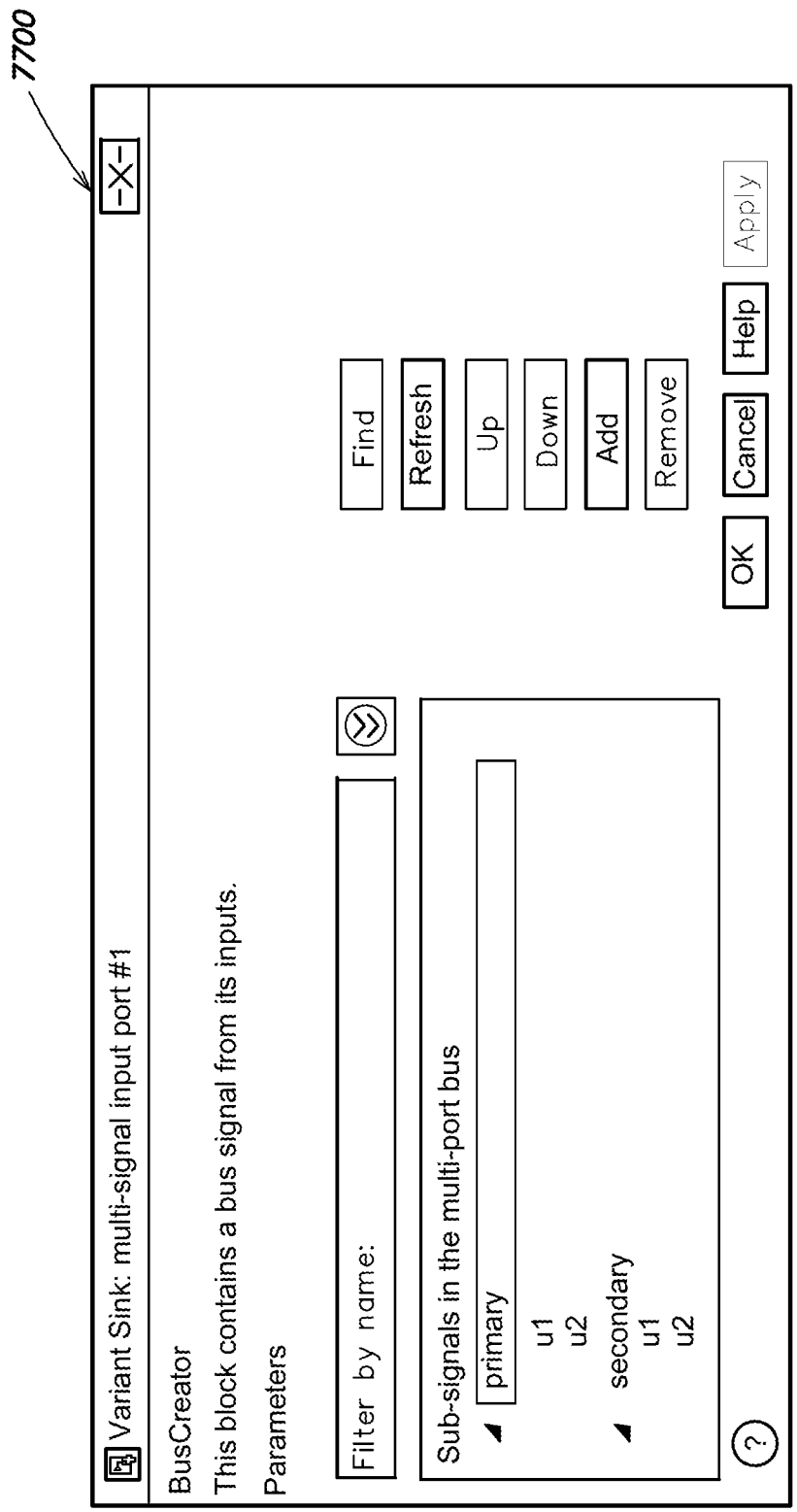
FIG. 77 is an illustration of an example graphical affordance in accordance with one or more embodiments.

FIG. 77 is an illustration of an example dialog 7700 that specifies how the grouping of a sub-signal is to be performed. The dialog 7700 corresponds to the signals being connected to the multi-signal input port 7604 of the Variant Sink block 7602. Conceptually, the input port 7604 may be transforming the four signals into a single group of signals, where within that group of signals there may be have two sub-groups, one labeled primary and the other labeled secondary. Within each of these two groups there are signals labeled 'u1' and 'u2'. The ability to assign structure may make the multi-signal output port selection easier. The dialog for the second output port 7608 of the Variant Sink block 7602 may be similar to the dialog 7700 shown in FIG. 77 in that a user may be selecting the primary.u1, primary.u2, secondary.u1, and secondary.u2 signals in the order shown. The selection may be done in any order, or the user could do a sub-selection.

Figure 78:
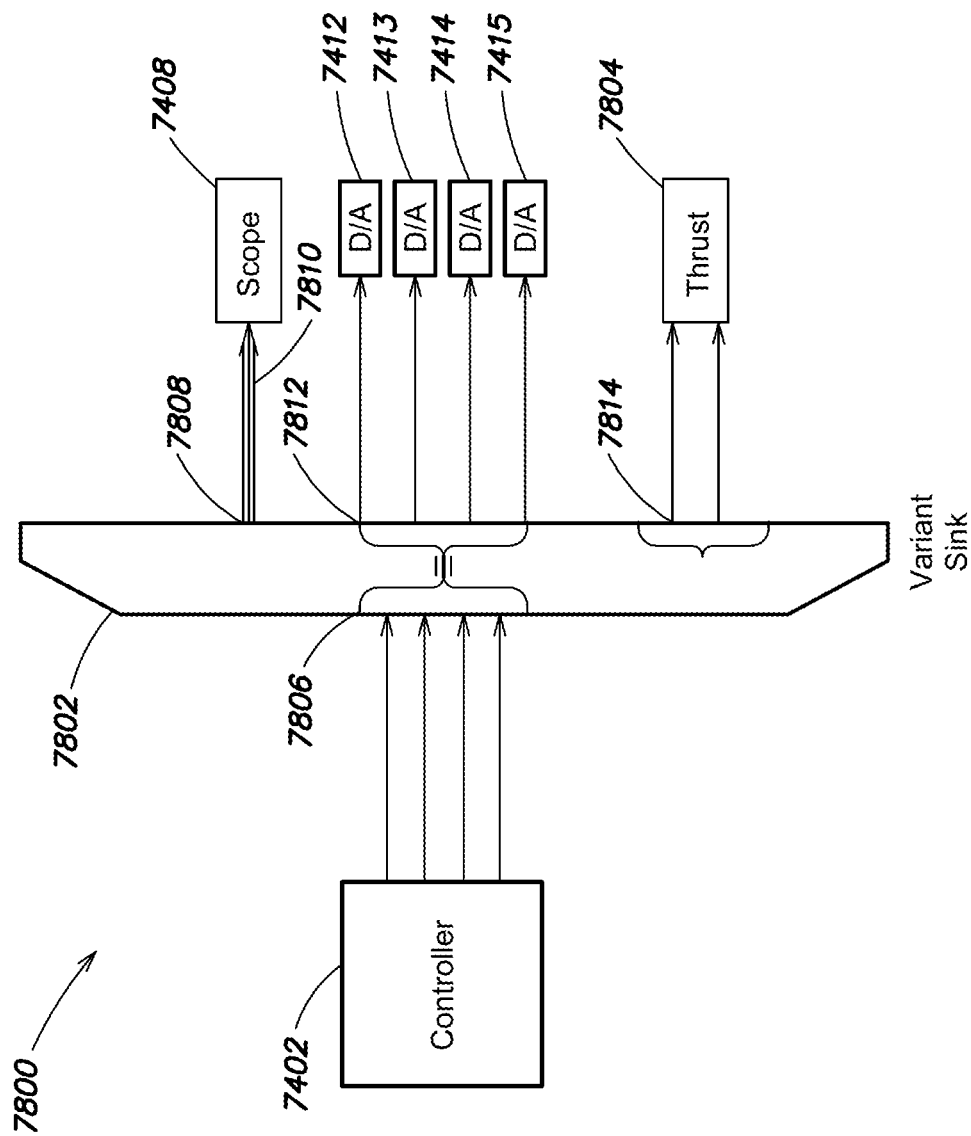
FIG. 78 is an illustration of an example model in accordance with one or more embodiments.

FIG. 78 is an illustration of an example model 7800 that is similar to model 7600. The model 7800 includes the Controller block 7402, the Scope block 7408, and the four D/A converter blocks 7412-7415. The model 7800 further includes a Variant Sink block 7802 and a subsystem block 7804 named 'Thrust'. The Variant Sink block 7802 has a multi-signal input port 7806, a first output port 7808 that may feed a bus signal 7810 to the Scope block 7408, a second output port 7812 that is a multi-signal port connected to the four D/A converter blocks 7412-7415, and a third output port 7814 that is a multi-signal port connected to the thrust block 7804.

Figure 79:
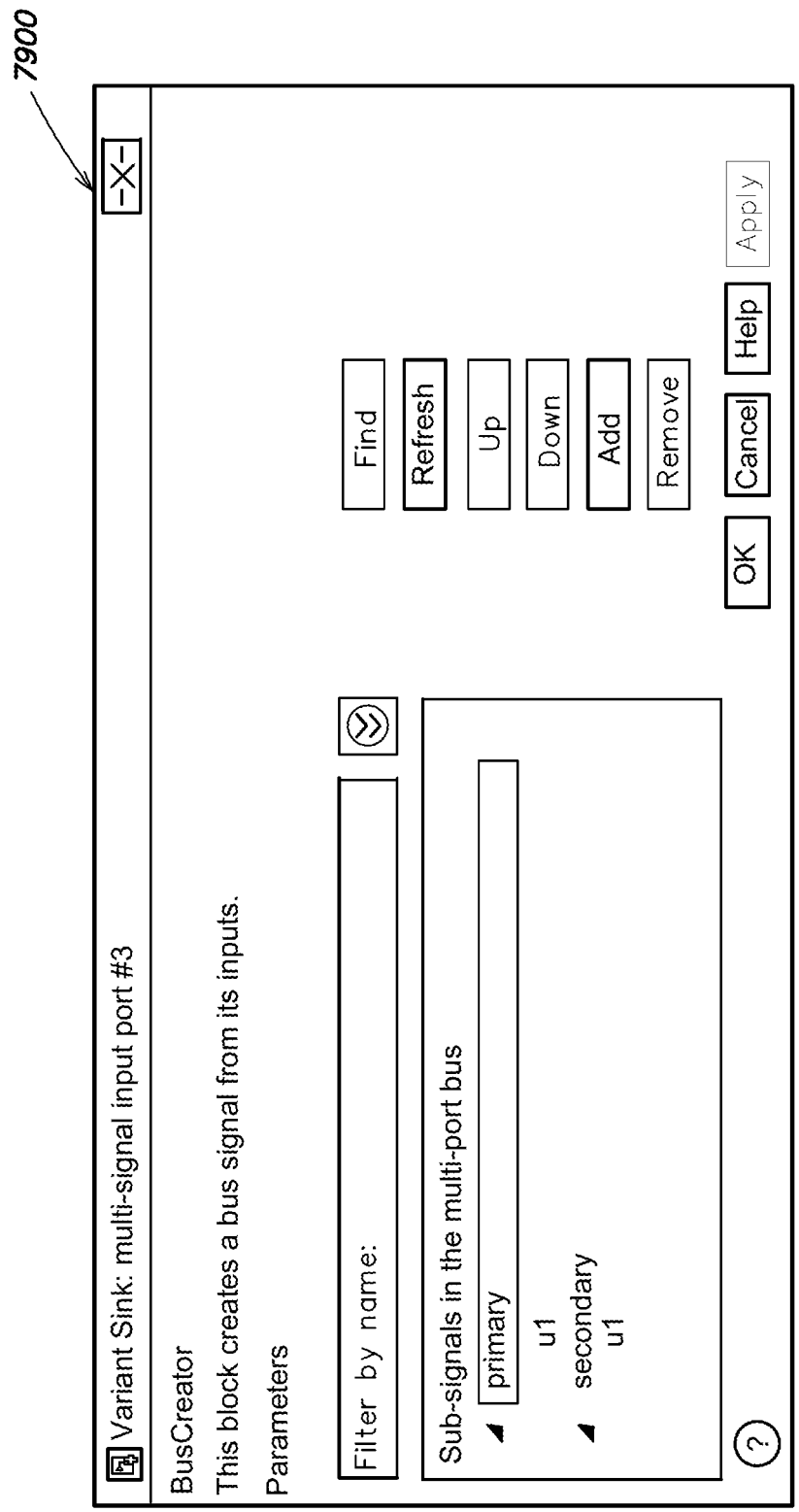
FIG. 79 is an illustration of an example graphical affordance in accordance with one or more embodiments.

FIG. 79 is an illustration of an example dialog 7900 for the third port 7814 of the Variant Sink block 7802. The dialog 7900 illustrates the selection of the primary.u1 and secondary.u1 signals.

An aspect in the realization of the multi-signal port is being able to select which signals the user wants to operate on. The second output port 7812 of the model 7800 of FIG. 78 is selecting all signals, whereas the third output port 7814 is selecting two of the signals. The order and which signals are selected is user defined, and the mapping is via names. The names of the signals in the model 7800 of FIG. 78 originated from within the Controller block 7402, which in this example, is a hierarchical layer (e.g. a subsystem) that contains other blocks, and the signals from these other blocks have been labeled. The grouping of the signals into the primary and secondary buckets was done by the multi-signal input port #1 dialog. Alternatively, the model 7800 could have been constructed using bus creators to define the primary and secondary groups, then these two groups (two signals) could have been fed to the multi-signal input port 7806 on the Variant Sink block 7802.

Figure 85:
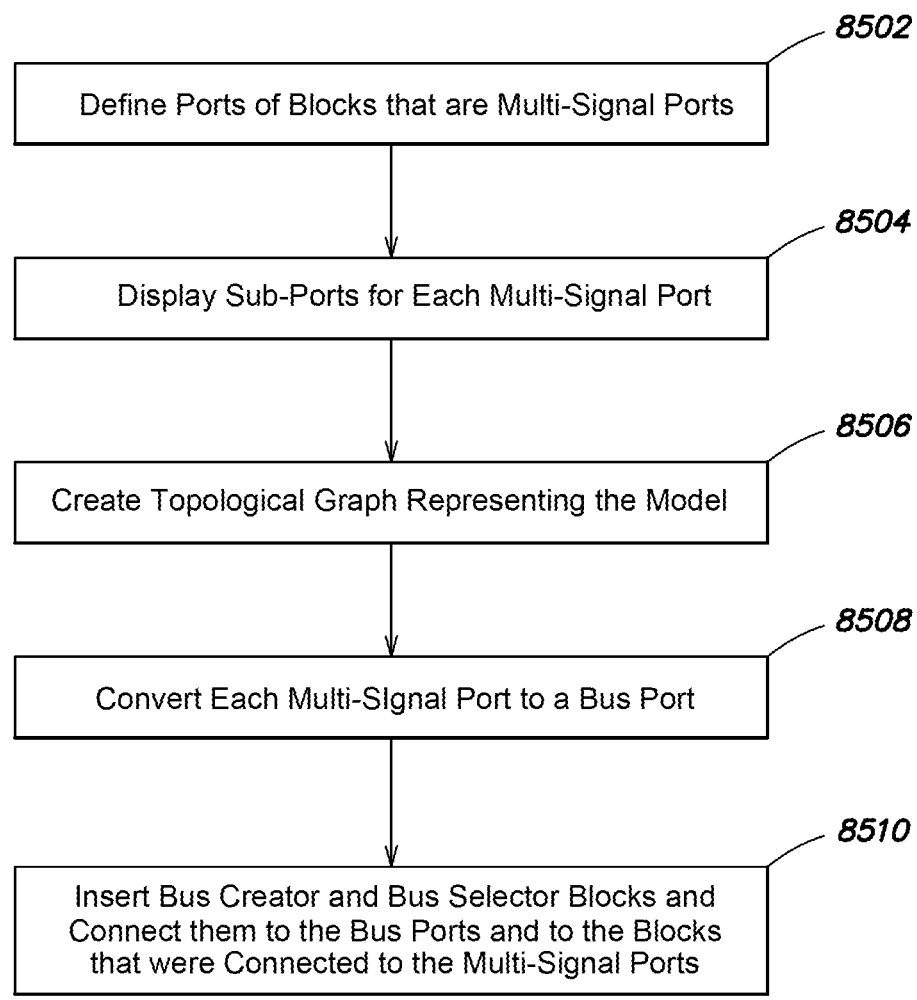
FIG. 85 is a flow chart of an example method in accordance with one or more embodiments.

FIG. 85 is a flow chart of an example method for processing multi-signal ports. A block may initially define which of its ports are multi-signal ports, as indicated at step 8502. A multi-signal port is a port that can accept more than one signal or connection line. When a block is rendered by the UI engine 102, it may be displayed using multiple port connectors in the location on the block icon where the multi-signal port was registered, as indicated at step 8504. When the model is compiled for execution, e.g., simulation or code generation, a topological graph representing the model may be created, as indicated at step 8506. Within the topological graph, each multi-signal port may be converted to a bus port, as indicated at step 8508. Next, Bus Creator and Bus Selector blocks may be inserted into the topological graph to reestablish graph connectivity, such that there is no semantic difference in the resulting topological graph, as indicated at step 8510. This makes the topological graph equivalent to a model which is uses Bus Creator and Bus Selector blocks instead of the multi-signal ports.

Exemplary Data Processing System Architecture

Figure 15:
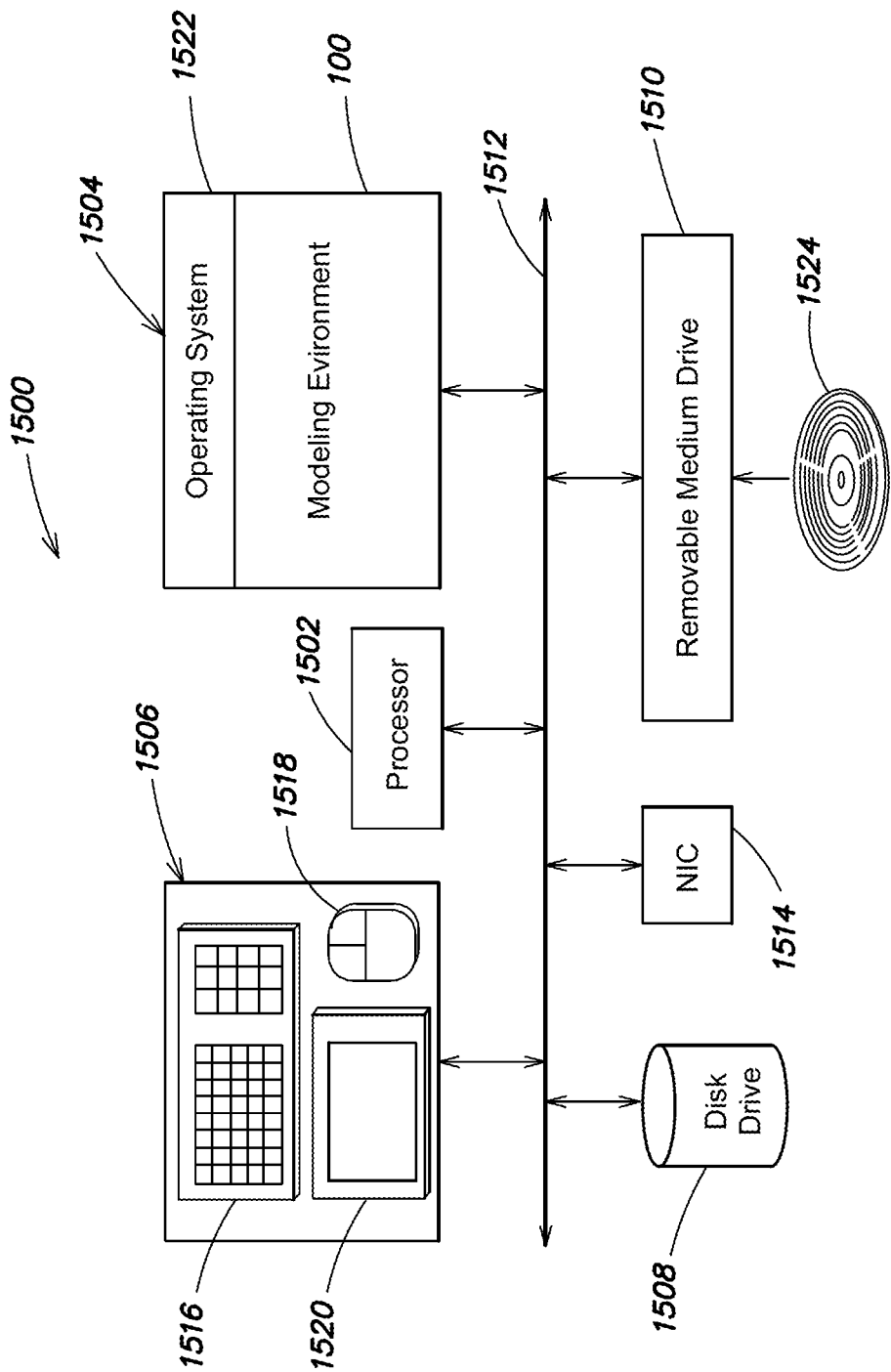
FIG. 15 is a schematic illustration of an example data processing system in accordance with one or more embodiments.

FIG. 15 is a schematic illustration of an example computer or data processing system 1500 for implementing an embodiment of the invention. The computer system 1500 may include one or more processing elements, such as a processor 1502, a main memory 1504, user input/output (I/O) 1506, a persistent data storage unit, such as a disk drive 1508, and a removable medium drive 1510 that are interconnected by a system bus 1512. The computer system 1500 may also include a communication unit, such as a network interface card (NIC) 1514. The user I/O 1506 may include a keyboard 1516, a pointing device, such as a mouse 1518, and a display 1520. Other user I/O 1506 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1504, which may be a Random Access Memory (RAM), may store a plurality of program libraries or modules, such as an operating system 1522, and one or more application programs that interface to the operating system 1522, such as the modeling environment 1500.

The removable medium drive 1510 may accept and read a computer readable medium 1526, such as a CD, DVD, floppy disk, solid state drive, tape, flash memory or other non-transitory medium. The removable medium drive 1510 may also write to the computer readable medium 1524.

Suitable computer systems include personal computers (PCs), workstations, servers, laptops, tablets, palm computers, smart phones, electronic readers, and other portable computing devices, etc. Nonetheless, those skilled in the art will understand that the computer system 1500 of FIG. 15 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 1500 may be hosted on one or more cloud servers or devices, and accessed by remote clients through a web portal or an application hosting system, such as the Remote Desktop Connection tool from Microsoft Corp.

Suitable operating systems 1522 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1522 may provide services or functions for applications or modules, such as allocating memory, organizing data objects or files according to a file system, prioritizing requests, managing I/O, etc. The operating system 1522 may run on a virtual machine, which may be provided by the data processing system 1500.

As indicated above, a user, such as an engineer, scientist, programmer, developer, etc., may utilize one or more input devices, such as the keyboard 1516, the mouse 1518, and the display 1520 to operate the modeling environment 1500, and construct and revise one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Exemplary modeling environments include the MATLAB® algorithm development environment and the Simulink® model-based design environment from The MathWorks, Inc., as well as the Simscape™ physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., and the Rational Rhapsody Design Manager software from IBM Corp. of Somers, N.Y. Models created in the high-level modeling environment may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In some embodiments, a lower level programming language relative to the high-level modeling environment 400, such as the C, C++, C#, and SystemC programming languages, among others, may be used to create one or more models.

Models constructed within the modeling environment 400 may include textual models, graphical models, such as block diagrams, state-based models, and combinations thereof. A given model may simulate, e.g., approximate the operation of, a system.

Exemplary code generators include, but are not limited to, the Simulink® Coder™, the Embedded Coder®, and the HDL Coder™ products from The MathWorks, Inc. of Natick, Mass., and the TargetLink product from dSpace GmbH of Paderborn Germany.

Figure 16:
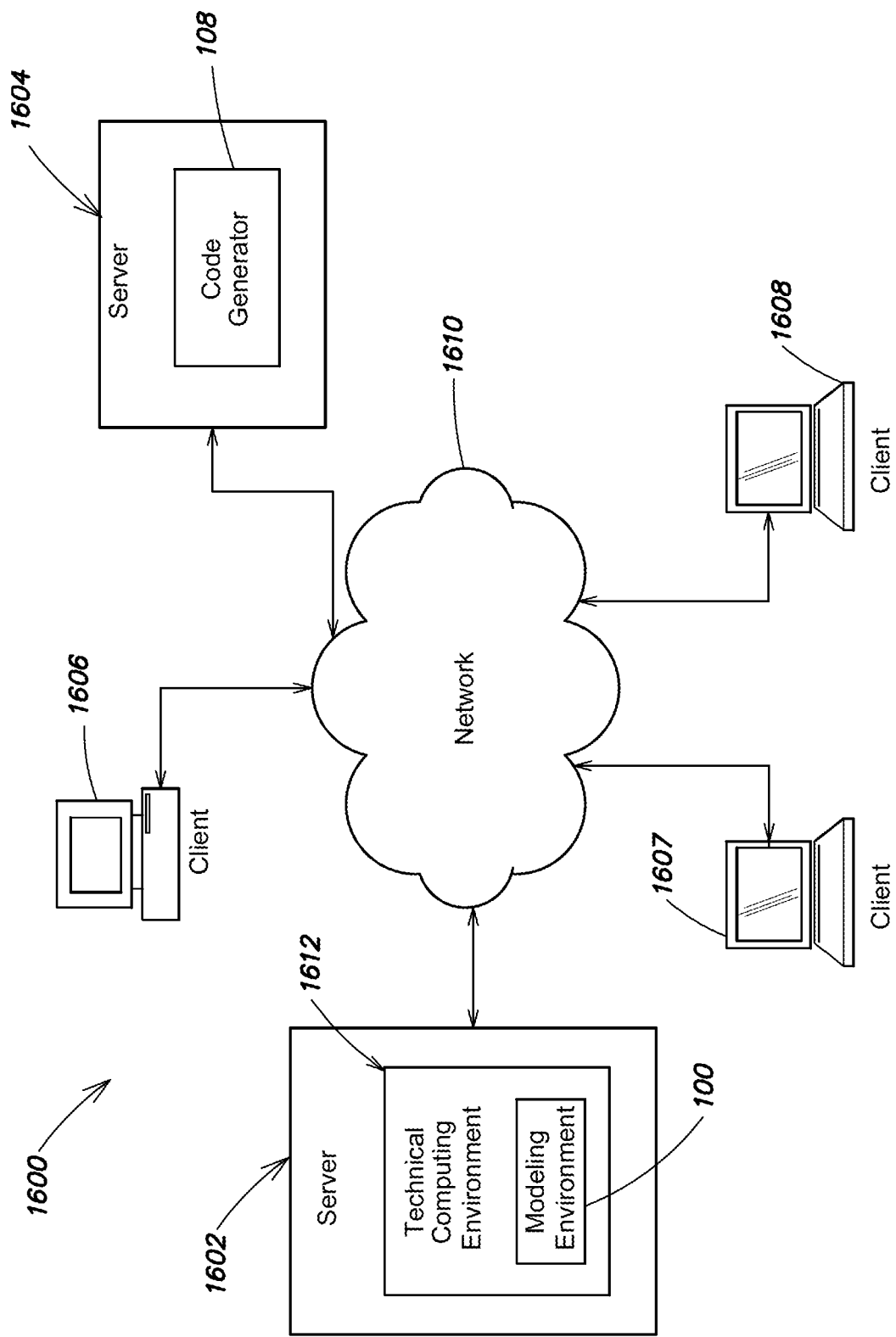
FIG. 16 is a schematic illustration of an example distributed computing environment in accordance with one or more embodiments.

FIG. 16 is a schematic diagram of an example distributed computing environment 1600 in which systems and/or methods described herein may be implemented. The environment 1600 may include client and server devices, such as two servers 1602 and 1604, and three clients 1606-1608, interconnected by one or more networks, such as network 1610. The servers 1602 and 1604 may include applications or processes accessible by the clients 1606-1608. For example, the server 1602 may include a technical computing environment (TCE) 1612, which may include or have access to a modeling environment, such as the modeling environment 1500. The server 1604 may include a code generator, such as the code generator 1506. The devices of the environment 1600 may interconnect via wired connections, wireless connections, or a combination of wired and wireless connections.

The servers 1602 and 1604 may include one or more devices capable of receiving, generating, storing, processing, executing, and/or providing information. For example, the servers 1602 and 1604 may include a computing device, such as a server, a desktop computer, a laptop computer, a tablet computer, a handheld computer, or a similar device. In some implementations, the servers 1602 and 1604 may host the TCE 1612, the modeling environment 1500, and/or the code generator 1506.

The clients 1606-1608 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1606-1608 may download data and/or code from the servers 1602 and 1604 via the network 1610. In some implementations, the clients 1606-1608 may be desktop computers, workstations, laptop computers, tablet computers, handheld computers, mobile phones (e.g., smart phones, radiotelephones, etc.), electronic readers, or similar devices. In some implementations, the clients 1606-1608 may receive information from and/or transmit information to the servers 1602 and 1604.

The network 1610 may include one or more wired and/or wireless networks. For example, the network 1610 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 16 is provided as an example. In practice, there may be additional devices and/or networks, fewer devices and/or networks, different devices and/or networks, or differently arranged devices and/or networks than those shown in FIG. 16. Furthermore, two or more devices shown in FIG. 16 may be implemented within a single device, or a single device shown in FIG. 16 may be implemented as multiple, distributed devices. Additionally, one or more of the devices of the distributed computing environment 1600 may perform one or more functions described as being performed by another one or more devices of the environment 1600.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1500. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, while functionality of a model is illustrated as being graphically linked to exposed access points of an adaptation layer interface, in other embodiments, functionality of the model may be linked in other ways, such as textually. Therefore, it is the object of the appended claims to cover all such variations and modifications as come within the true spirit and scope of the disclosure.

What is claimed is:

1. A computer-implemented method comprising:
   providing, as part of a graphical model having executable semantics, a region for providing variants, the region including
      one or more computational choices that define alternative execution implementations of the region, and
      one or more conditions assigned to the one or more computational choices, the one or more conditions indicating which one of the one or more computational choices is active, where
         the one or more conditions assigned to the one or more computational choices specify one or more logical expressions of one or more variables for controlling activation of the one or more computational choices, and
         the one or more logical expressions evaluate to either an asserted value or a de-asserted value based on a given value of the one or more variables;
   propagating, by one or more processors, the one or more conditions to model elements included in the one or more computational choices;
   evaluating, by the one or more processors, the one or more logical expressions specified for the one or more conditions; and
   for a given execution of the graphical model or a given generation of code for the graphical model, determining that the one or more logical expressions specified for all of the one or more conditions evaluate to the de-asserted value.

2. The computer-implemented method of claim 1 wherein the asserted value is True and the de-asserted value is False.

3. The computer-implemented method of claim 1 wherein the region includes only a single computational choice.

4. The computer-implemented method of claim 3 wherein the single computational choice is implemented through at least one of a variant source block, a variant sink block, a variant start block, a variant end block, or a variant subsystem block.

5. The computer-implemented method of claim 1 wherein the region includes a plurality of computational choices.

6. The computer-implemented method of claim 5 wherein the plurality of computational choices are implemented through at least one of a variant source block, a variant sink block, a variant start block, a variant end block, or a variant subsystem block.

7. The computer-implemented method of claim 1 wherein the model elements include two or more model elements coupled by a non-signal boundary, and the propagating is performed along the non-signal boundary.

8. The computer-implemented method of claim 7 wherein at least one of the two or more model elements is a data store block, a callee function block, a caller function block, an initialize subsystem block, a reset subsystem block, or a terminate subsystem block.

9. The computer-implemented method of claim 1 wherein at least one of the model elements is a subsystem block or a model block representing a hierarchical layer of the graphical model, and the propagating is performed through the hierarchical layer.

10. The computer-implemented method of claim 1 further comprising:
    removing from the region of the graphical model the one or more computational choices in response to the one or more logical expressions for all of the one or more conditions evaluating to the de-asserted value.

11. One or more non-transitory computer-readable media, having stored thereon instructions that when executed by a computing device, cause the computing device to perform operations comprising:
    provide, as part of a graphical model having executable semantics, a region for providing variants, the region including
       one or more computational choices that define alternative execution implementations of the region, and
       one or more conditions assigned to the one or more computational choices, the one or more conditions indicating which one of the one or more computational choices is active, where
          the one or more conditions assigned to the one or more computational choices specify one or more logical expressions of one or more variables for controlling activation of the one or more computational choices, and
          the one or more logical expressions evaluate to either an asserted value or a de-asserted value based on a given value of the one or more variables;
    propagate, by one or more processors, the one or more conditions to model elements included in the one or more computational choices;
    evaluate, by the one or more processors, the one or more logical expressions specified for the one or more conditions; and
    for a given execution of the graphical model or a given generation of code for the graphical model, determine that the one or more logical expressions specified for all of the one or more conditions evaluate to the de-asserted value.

12. The one or more non-transitory computer-readable media of claim 11 wherein the asserted value is True and the de-asserted value is False.

13. The one or more non-transitory computer-readable media of claim 11 wherein
the region includes only a single computational choice, and
the single computational choice is implemented through at least one of a variant source block, a variant sink block, a variant start block, a variant end block, or a variant subsystem block.

14. The one or more non-transitory computer-readable media of claim 11 wherein
the region includes a plurality of computational choices, and
the plurality of computational choices are implemented through at least one of a variant source block, a variant sink block, a variant start block, a variant end block, or a variant subsystem block.

15. The one or more non-transitory computer-readable media of claim 11 wherein the model elements include two or more model elements coupled by a non-signal boundary, and the propagating is performed along the non-signal boundary.

16. The one or more non-transitory computer-readable media of claim 15 wherein at least one of the two or more model elements is a data store block, a callee function block, a caller function block, an initialize subsystem block, a reset subsystem block, or a terminate subsystem block.

17. The one or more non-transitory computer-readable media of claim 11 wherein at least one of the model elements is a subsystem block or a model block representing a hierarchical layer of the graphical model, and the propagating is performed through the hierarchical layer.

18. The one or more non-transitory computer-readable media of claim 11 wherein the operations further comprise:
remove from the region of the graphical model the one or more computational choices in response to the one or more logical expressions for all of the one or more conditions evaluating to the de-asserted value.

19. An apparatus comprising:
a memory configured to store a graphical model having executable semantics, the graphical model including a region for providing variants, the region including
one or more computational choices that define alternative execution implementations of the region, and
one or more conditions assigned to the one or more computational choices, the one or more conditions indicating which one of the one or more computational choices is active, where
the one or more conditions assigned to the one or more computational choices specify one or more logical expressions of one or more variables for controlling activation of the one or more computational choices, and
the one or more logical expressions evaluate to either an asserted value or a de-asserted value based on a given value of the one or more variables; and
one or more processors coupled to the memory, the one or more processors configured to:
propagate the one or more conditions to model elements included in the one or more computational choices;
evaluate the one or more logical expressions specified for the one or more conditions; and
for a given execution of the graphical model or a given generation of code for the graphical model, determine that the one or more logical expressions specified for all of the one or more conditions evaluate to the de-asserted value.

20. The apparatus of claim 19 wherein
the region includes only a single computational choice, and
the single computational choice is implemented through at least one of a variant source block, a variant sink block, a variant start block, a variant end block, or a variant subsystem block.

21. The apparatus of claim 19 wherein
the region includes a plurality of computational choices, and
the plurality of computational choices are implemented through at least one of a variant source block, a variant sink block, a variant start block, a variant end block, or a variant subsystem block.

22. The apparatus of claim 19 wherein the model elements include two or more model elements coupled by a non-signal boundary, and the propagating is performed along the non-signal boundary.

23. The apparatus of claim 22 wherein at least one of the two or more model elements is a data store block, a callee function block, a caller function block, an initialize subsystem block, a reset subsystem block, or a terminate subsystem block.

24. The apparatus of claim 19 wherein at least one of the model elements is a subsystem block or a model block representing a hierarchical layer of the graphical model, and the propagating is performed through the hierarchical layer.

25. The apparatus of claim 19 wherein the operations further comprise:
remove from the region of the graphical model the one or more computational choices in response to the one or more logical expressions for all of the one or more conditions evaluating to the de-asserted value.

* * * * *

UNITED STATES PATENT AND TRADEMARK OFFICE
CERTIFICATE OF CORRECTION

| | | |
|---|---|---|
| PATENT NO. | : 10,545,731 B1 | Page 1 of 1 |
| APPLICATION NO. | : 15/829302 | |
| DATED | : January 28, 2020 | |
| INVENTOR(S) | : John E. Ciolfi et al. | |

It is certified that error appears in the above-identified patent and that said Letters Patent is hereby corrected as shown below:

In the Specification

Column 8, Line 9:
"or more User Interfaces (Uls), such as Graphical User"
Should read:
--or more User Interfaces (UIs), such as Graphical User--

Column 21, Line 25:
"edge in the directed graph corresponding to the sensor 1"
Should read:
--edge in the directed graph corresponding to the sensor1--

Column 40, Line 51:
"are partial vies of an example listing of code 3800 generated"
Should read:
--are partial views of an example listing of code 3800 generated--

Column 41, Line 47:
"FIGS. 40A and 40 B are partial views illustrating an"
Should read:
--FIGS. 40A and 40B are partial views illustrating an--

Column 47, Line 37:
"variable named T'. At a next hierarchical level, the External"
Should read:
--variable named 'P'. At a next hierarchical level, the External--

Signed and Sealed this
First Day of July, 2025

Coke Morgan Stewart
*Acting Director of the United States Patent and Trademark Office*